(12) United States Patent
Liu et al.

(10) Patent No.: US 12,349,565 B2
(45) Date of Patent: Jul. 1, 2025

(54) DISPLAY PANEL, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Changchang Liu, Beijing (CN); Ling Shi, Beijing (CN); Ke Liu, Beijing (CN); Yipeng Chen, Beijing (CN); Zhenhua Zhang, Beijing (CN); Hui Lu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 623 days.

(21) Appl. No.: 17/637,340

(22) PCT Filed: Feb. 24, 2021

(86) PCT No.: PCT/CN2021/077740
§ 371 (c)(1),
(2) Date: Feb. 22, 2022

(87) PCT Pub. No.: WO2022/165874
PCT Pub. Date: Aug. 11, 2022

(65) Prior Publication Data
US 2023/0165052 A1    May 25, 2023

(30) Foreign Application Priority Data
Feb. 7, 2021   (WO) ................ PCT/CN2021/075839

(51) Int. Cl.
*H10D 86/60* (2025.01)
*G09G 3/32* (2016.01)
(Continued)

(52) U.S. Cl.
CPC ......... *H10K 59/131* (2023.02); *G09G 3/3241* (2013.01); *H10K 59/1216* (2023.02);
(Continued)

(58) Field of Classification Search
CPC ............. H10K 59/131; H10K 59/1216; H10K 59/122; H10K 59/65; H10K 59/1213;
(Continued)

(56) References Cited

U.S. PATENT DOCUMENTS

2002/0074551 A1   6/2002  Kimura
2010/0127264 A1*  5/2010  Bang .................. H10K 59/131
                                                  438/151
(Continued)

FOREIGN PATENT DOCUMENTS

CN    105336752 A    2/2016
CN    105609531 A    5/2016
(Continued)

OTHER PUBLICATIONS

Extended European search report of counterpart European application No. 21923816.9 issued on Aug. 31, 2023.
(Continued)

*Primary Examiner* — Omar F Mojaddedi
(74) *Attorney, Agent, or Firm* — Lippes Mathias LLP

(57) ABSTRACT

Provided is a display panel, including: a base substrate provided with a first display region and a second display region; a first auxiliary electrode layer, a first anode layer, a first light-emitting layer and a first cathode layer that are sequentially laminated, in a direction away from the base substrate, in the first display region; and a second auxiliary
(Continued)

electrode layer, a second anode layer, a second light-emitting layer, and a second cathode layer that are sequentially laminated, in the direction away from the base substrate, in the second display region; wherein the first auxiliary electrode layer is connected to the first cathode layer and the second auxiliary electrode layer, and the second cathode layer is connected to the first cathode layer, the second cathode layer is provided with at least one hollowed-out region.

20 Claims, 88 Drawing Sheets

(51) Int. Cl.
G09G 3/3241 (2016.01)
H10K 59/12 (2023.01)
H10K 59/121 (2023.01)
H10K 59/122 (2023.01)
H10K 59/131 (2023.01)
H10K 59/65 (2023.01)
H10D 86/40 (2025.01)
H10K 59/35 (2023.01)

(52) U.S. Cl.
CPC .......... *H10K 59/122* (2023.02); *H10K 59/65* (2023.02); *G09G 2300/0465* (2013.01); *G09G 2300/0819* (2013.01); *G09G 2300/0842* (2013.01); *G09G 2360/14* (2013.01); *H10D 86/441* (2025.01); *H10D 86/60* (2025.01); *H10K 59/1213* (2023.02); *H10K 59/35* (2023.02)

(58) Field of Classification Search
CPC .... H10K 59/35; H10K 59/124; H10K 59/353; H10K 59/80521; G09G 3/3241; G09G 2300/0465; G09G 2300/0819; G09G 2300/0842; G09G 2360/14; G09G 2300/0439; H01L 27/124; H04M 1/0266; H04M 1/0264; H10D 86/60; H10D 86/441

See application file for complete search history.

(56) References Cited

U.S. PATENT DOCUMENTS

| | | |
|---|---|---|
| 2015/0021627 A1* | 1/2015 | Fujita ................. H10F 71/00 257/82 |
| 2015/0371075 A1 | 12/2015 | Lin |
| 2016/0141339 A1* | 5/2016 | Prushinskiy ......... H10K 50/805 257/40 |
| 2016/0141350 A1 | 5/2016 | Kim et al. |
| 2016/0155755 A1 | 6/2016 | Liu et al. |
| 2016/0322595 A1 | 11/2016 | Choi et al. |
| 2017/0011685 A1 | 1/2017 | Jeon |
| 2018/0198092 A1* | 7/2018 | Choi .................... H10K 59/873 |
| 2019/0326370 A1* | 10/2019 | Lu ...................... H10K 59/1315 |
| 2020/0203640 A1* | 6/2020 | Yang .................... H10K 59/122 |
| 2020/0258947 A1 | 8/2020 | Chung et al. |
| 2020/0312927 A1* | 10/2020 | Bae ..................... H10K 59/123 |
| 2021/0257581 A1 | 8/2021 | Wang et al. |
| 2022/0123025 A1 | 4/2022 | Wang et al. |

FOREIGN PATENT DOCUMENTS

| | | |
|---|---|---|
| CN | 108538890 A | 9/2018 |
| CN | 110085648 A | 8/2019 |
| CN | 110797379 A | 2/2020 |
| CN | 110824797 A | 2/2020 |
| CN | 110942041 A | 3/2020 |
| CN | 111490069 A | 8/2020 |
| CN | 111613654 A | 9/2020 |
| CN | 112259588 A | 1/2021 |
| CN | 112259589 A | 1/2021 |
| CN | 112271205 A | 1/2021 |
| KR | 20160015060 A | 2/2016 |

OTHER PUBLICATIONS

Extended European search report of counterpart European application No. 21923884.7 issued on Oct. 30, 2023.

Non-final office Action of U.S. Appl. No. 18/354,028 issued on Feb. 15, 2024.

Non-final office Action of U.S. Appl. No. 17/612,274 issued on Feb. 2, 2023.

China National Intellectual Property Administration, First office action of Chinese application No. 202180000160.4 issued on Mar. 21, 2023, which is foreign counterpart application of this US application.

International search report of PCT application No. PCT/CN2021/075839 issued on Oct. 20, 2021.

* cited by examiner

DISPLAY PANEL, METHOD FOR MANUFACTURING SAME, AND DISPLAY DEVICE

This application is a 371 of PCT application No. PCT/CN2021/077740, filed on Feb. 24, 2021, which claims priority to the patent application No. PCT/CN2021/075839, filed on Feb. 7, 2021, and entitled "DISPLAY SUBSTRATE, DISPLAY PANEL AND DISPLAY DEVICE", the disclosures of which are incorporated herein by reference in their entireties.

TECHNICAL FIELD

The present disclosure relates to the field of display technologies and in particular relates to a display panel, a method for manufacturing a display panel and a display device.

BACKGROUND

Organic light-emitting diode (OLED) display panels have been widely used due to their advantages of self-luminescence, low driving voltage, fast response, etc.

SUMMARY

The present disclosure provides a display panel, a method for manufacturing the same and a display device. The technical solutions are described as below.

In one aspect, a display panel is provided. The display panel includes:
a base substrate provided with both a first display region and a second display region;
a first auxiliary electrode layer, a first anode layer, a first light-emitting layer, and a first cathode layer that are sequentially laminated, in a direction away from the base substrate, in the first display region; and
a second auxiliary electrode layer, a second anode layer, a second light-emitting layer and a second cathode layer that are sequentially laminated, in the direction away from the base substrate, in the second display region;
wherein the first auxiliary electrode layer is connected to the first cathode layer and the second auxiliary electrode layer, and the second cathode layer is connected to the first cathode layer, the second cathode layer is provided with at least one hollowed-out region;
the display panel further includes a plurality of pixel circuits disposed in the second display region, and each of the pixel circuits includes at least one layer of opaque patterns; wherein the second auxiliary electrode layer includes a plurality of auxiliary electrode patterns electrically connected; and at least 50% of regions of orthographic projections of the at least one layer of opaque patterns in at least one of the pixel circuits onto the base substrate is overlapped with orthographic projections of the auxiliary electrode patterns onto the base substrate.

Optionally, the orthographic projections of the auxiliary electrode patterns onto the base substrate cover the orthographic projections of the at least one layer of opaque patterns in at least one of the pixel circuits onto the base substrate.

Optionally, edges of the orthographic projection of the auxiliary electrode pattern onto the base substrate are at least partially arc-shaped.

Optionally, the auxiliary electrode patterns includes a first pattern and a second pattern;
an orthographic projection of the first pattern onto the base substrate is overlapped with 50% or more of the areas of the orthographic projections of the at least one layer of opaque patterns in at least one of the pixel circuits onto the base substrate; and
the second pattern is configured to be electrically connected to the auxiliary electrode patterns adjacent to the second pattern.

Optionally, the orthographic projection of the first pattern onto the base substrate is circular.

Optionally, the base substrate is further provided with a peripheral region surrounding both the first display region and the second display region; and
the first auxiliary electrode layer and the first cathode layer are further disposed in the peripheral region, and a portion disposed in the peripheral region of the first auxiliary electrode layer is electrically connected to a portion disposed in the peripheral region of the first cathode layer.

Optionally, an orthographic projection of the first auxiliary electrode layer onto the base substrate covers the first display region;
the peripheral region includes a first region and a second region that are arranged oppositely and in parallel, as well as a third region and a fourth region that are arranged oppositely and in parallel, a direction in which the first region extends is perpendicular to a direction in which the third region extends, and a distance between the second display region and the first region is less than a distance between the second display region and the second region;
wherein a portion disposed in the first region of the first auxiliary electrode layer is connected to a portion disposed in the first region of the first cathode layer, a portion disposed in the third region of the first auxiliary electrode layer is connected to a portion disposed in the third region of the first cathode layer, and a portion disposed in the fourth region of the first auxiliary electrode layer is connected to a portion disposed in the fourth region of the first cathode layer; and
a portion disposed in the second region of the first auxiliary electrode layer is not connected to a portion disposed in the second region of the first cathode layer.

Optionally, the plurality of auxiliary electrode patterns are overlapped with each other.

Optionally, the display panel further includes a plurality of first connection electrodes disposed in the second display region, and the plurality of auxiliary electrode patterns are electrically connected by the plurality of first connection electrodes.

Optionally, the display panel further includes an active layer, a buffer layer, a first gate insulation layer, a first gate layer, a second gate insulation layer, a second gate layer, an interlayer dielectric layer and a first source/drain layer that are sequentially laminated, in the direction away from the base substrate, in both the first display region and the second display region;
the first source/drain layer includes a plurality of sets of first source/drain layer patterns corresponding to the pixel circuits, the active layer includes a plurality of sets of active patterns corresponding to the pixel circuits, the first gate layer includes a plurality of sets of first gate layer patterns corresponding to the pixel circuits, and the second gate layer includes a plurality of sets of second gate layer patterns corresponding to the pixel circuits; and the at least one layer of opaque patterns of the pixel circuit include one set of the first source/drain layer patterns disposed in the first source/drain layer, one set of the active patterns disposed in the active layer, one set of the first gate patterns disposed in the first gate layer, and one set of the second gate patterns disposed in the second gate layer.

Optionally, the display panel further includes a first conduction layer disposed in a same layer as the first source/drain layer, and a second conduction layer disposed in a same layer as the second gate layer, wherein the buffer layer, the first gate insulation layer, the second gate insulation layer and the interlayer dielectric layer are all provided with a first via hole, and the second conduction layer and the first conduction layer are electrically connected to the auxiliary electrode patterns through the first via holes;

the display panel further includes a passivation layer and a first planarization layer that are disposed on a side, distal from the base substrate, of the first source/drain layer, as well as a plurality of first connection electrodes disposed between the passivation layer and the first planarization layer; and the passivation layer is provided with a second via hole, at least part of the first connection electrodes is disposed in the second via hole and connected to the first conduction layer, and the plurality of first connection electrodes are configured to connect the plurality of auxiliary electrode patterns.

Optionally, the display panel further includes a passivation layer and a first planarization layer that are disposed on a side, distal from the base substrate, of the first source/drain layer, a plurality of second connection electrodes disposed between the passivation layer and the first planarization layer, a first signal transmission layer disposed in a same layer as the first source/drain layer, and a third conduction layer disposed in a same layer as the first gate layer;

the first gate insulation layer, the second gate insulation layer and the interlayer dielectric layer are all provided with a third via hole, and the first signal transmission layer is electrically connected to the third conduction layer through the third via hole; and the passivation layer is provided with a fourth via hole, and at least part of the second connection electrodes is disposed in the fourth via hole and connected to the first signal transmission layer.

Optionally, the third conduction layer includes a plurality of first signal line segments, a plurality of second signal line segments and a plurality of third signal line segments;

wherein each of the plurality of first signal line segments, the plurality of second signal line segments, and the plurality of third signal line segments is connected to one of the pixel circuits; and the plurality of second connection electrodes include a plurality of first-type second connection electrodes connected to the plurality of first signal line segments, a plurality of second-type second connection electrodes connected to the plurality of second signal line segments, and a plurality of third-type second connection electrodes connected to the plurality of third signal line segments.

Optionally, the plurality of first signal line segments are gate signal line segments for transmitting gate signals, the plurality of second signal line segments are reset control signal line segments for transmitting reset control signals, and the plurality of third signal line segments are emission control signal line segments for transmitting emission control signals.

Optionally, the display panel further includes a plurality of third connection electrodes, and a fourth conduction layer, wherein the fourth conduction layer includes a plurality of fourth signal line segments;

each of the fourth signal line segments is connected to at least one of the pixel circuits, and at least part of the plurality of fourth signal line segments are electrically connected by at least part of the third connection electrodes.

Optionally, the display panel further includes a passivation layer and a first planarization layer disposed on a side, distal from the base substrate, of the first source/drain layer, and a second source/drain layer disposed on a side, distal from the first source/drain layer, of the first planarization layer, wherein the fourth conduction layer and the first source/drain layer are disposed in a same layer, and the plurality of third connection electrodes are disposed between the passivation layer and the first planarization layer; the display panel further includes a fifth conduction layer disposed in a same layer as the second source/drain layer; the fifth conduction layer includes a plurality of fifth signal line segments; the passivation layer is provided with a fifth via hole; and at least part of the third connection electrodes is disposed in the fifth via hole and connected to the fourth signal line segments, the first planarization layer is provided with a sixth via hole, and at least part of the fifth signal line segments is disposed in the sixth via hole and connected to the third connection electrodes.

Optionally, the plurality of fourth signal line segments and the plurality of fifth signal line segments are all positive power signal line segments for transmitting positive power signals.

Optionally, the fourth conduction layer and the first source/drain layer are disposed in a same layer, and the plurality of third connection electrodes are disposed between the passivation layer and the first planarization layer; the passivation layer is provided with a seventh via hole; and at least part of the third connection electrodes is disposed in the seventh via hole and connected to the fourth signal line segments.

Optionally, the plurality of fourth signal line segments are data signal line segments for transmitting data signals.

Optionally, the fourth conduction layer and the second gate layer are disposed in a same layer, and the plurality of third connection electrodes are disposed between the passivation layer and the first planarization layer; the display panel further includes a second signal transmission layer disposed in a same layer as the first source/drain layer; both the second gate insulation layer and the interlayer dielectric layer are provided with an eighth via hole; the second signal transmission layer is disposed in the eighth via hole, and the second signal transmission layer is connected to the fourth signal line segments; and the passivation layer is provided with a ninth via hole, and at least part of the third connection electrodes is disposed in the ninth via hole and connected to the second signal transmission layer.

Optionally, the plurality of fourth signal line segments are initialization signal line segments for transmitting initialization signals.

Optionally, the display panel further includes an active layer, a buffer layer, a first gate insulation layer, a first gate layer, a second gate insulation layer, a second gate layer, an interlayer dielectric layer, a first source/drain layer, a passivation layer and a first planarization layer that are sequentially laminated, in the direction away from the base substrate, in both the first display region and the second display region; wherein the display panel further includes a plurality of connection electrodes disposed between the passivation layer and the first planarization layer; at least part of the plurality of connection electrodes is configured to electrically connect at least one of the first gate layer, the second gate layer and the first source/drain layer in the first display region, and electrically connect at least one of the first gate layer, the second gate layer and the first source/drain layer in the second display region, and/or, at least part of the plurality of connection electrodes are configured to electrically connect at least two of the auxiliary electrode patterns disposed in the second display region, and/or, at least part of the plurality of connection electrodes are configured to connect the at least one layer of opaque patterns in at least two of the pixel circuits in the second display region;

wherein the plurality of connection electrodes are provided with a plurality of joints, the joints include connection via holes or lap structures, corresponding to the plurality of connection electrodes and patterns connected by the plurality of connection electrodes, and an overlap area is present between the orthographic projections of the auxiliary electrode patterns onto the base substrate and an orthographic projection of at least one of the joints onto the base substrate.

Optionally, the orthographic projections of the auxiliary electrode patterns onto the base substrate cover the orthographic projection of at least one of the joints onto the base substrate.

Optionally, the second anode layer includes a plurality of anode patterns spaced apart from each other, and the display panel further includes a pixel definition layer disposed on a side, distal from the base substrate, of the second anode layer;

the pixel definition layer is provided with a plurality of tenth via holes, through which the corresponding anode patterns are exposed, and the second light-emitting layer includes a plurality of light-emitting layer patterns at least partially disposed in the tenth via holes; and the second cathode layer at least partially covers the tenth via holes, and the at least one hollowed-out region of the second cathode layer is not overlapped with the tenth via holes.

Optionally, a boundary of the at least one hollowed-out region at least partially includes an arc shape.

Optionally, the first cathode layer and the second cathode layer are of an integral structure.

Optionally, an overlap between an orthographic projection of the hollowed-out region onto the base substrate and the orthographic projections of the auxiliary electrode patterns onto the base substrate has an area that is 10% smaller than an area of the hollowed-out region.

In another aspect, a method for manufacturing a display panel is provided. The method includes:

providing a base substrate, wherein the base substrate is provided with a first display region and a second display region;

forming a first auxiliary electrode layer, a first anode layer, a first light-emitting layer, and a first cathode layer that are sequentially laminated in the first display region;

forming a second auxiliary electrode layer, a second anode layer, a second light-emitting layer, and a second cathode layer that are sequentially laminated in the second display region; and forming a plurality of pixel circuits in the second display region, wherein each of the pixel circuits comprises at least one layer of opaque patterns;

wherein the first auxiliary electrode layer is connected to the first cathode layer and the second auxiliary electrode layer, and the second cathode layer is connected to the first cathode layer, the second cathode layer is provided with at least one hollowed-out region; the second auxiliary electrode layer includes a plurality of auxiliary electrode patterns electrically connected; and at least 50% of areas of orthographic projections of the at least one layer of opaque patterns in at least one of the pixel circuits onto the base substrate is overlapped with an orthographic projection of one of the auxiliary electrode patterns onto the base substrate.

In yet another aspect, a display device is provided. The display device includes an image sensor and the display panel as described in the foregoing aspect, wherein the image sensor is disposed on a side, distal from a second anode layer, of a base substrate in the display panel and is overlapped with a second display region of the base substrate.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

In order to make the objects, technical solutions, and advantages of the present disclosure clearer, the following further describes the embodiments of the present disclosure in detail with reference to the accompanying drawings.

In the related art, in order to increase the screen-to-body ratio of a display panel, a camera of a display device may be disposed in a display region of the display panel. The display region of the display panel includes an anode layer, a light-emitting layer, and a cathode layer that are sequentially laminated in a direction away from a base substrate. The camera is disposed on a side, distal from the light-emitting layer, of the anode layer.

However, since the cathode layer adversely affects the transmittance, the camera disposed in the display region of the display panel has a poor imaging effect.

Figure 1:
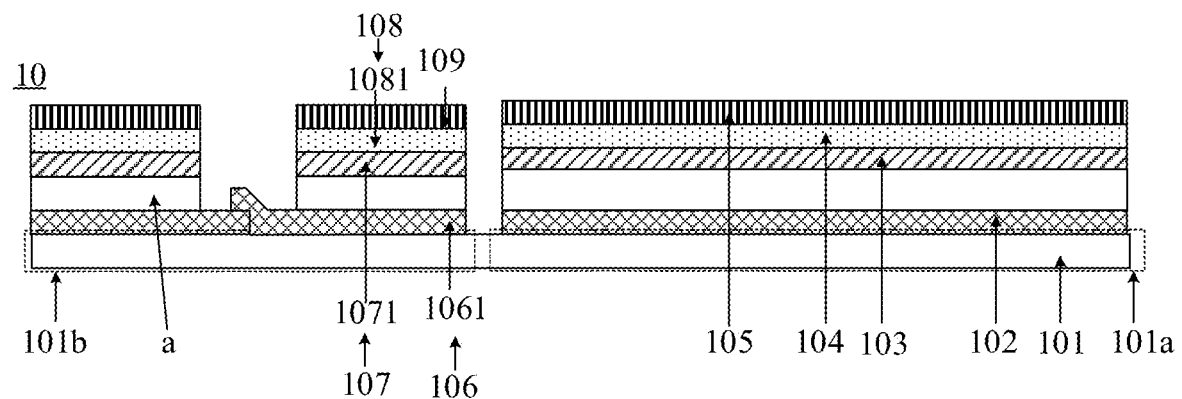
FIG. 1 is a schematic structural diagram of a display panel according to an embodiment of the present disclosure.

FIG. 1 is a schematic structural diagram of a display panel according to an embodiment of the present disclosure. As can be seen from FIG. 1, the display panel 10 may include a base substrate 101, a first auxiliary electrode layer 102, a first anode layer 103, a first light-emitting layer 104, a first cathode layer 105, a second auxiliary electrode layer 106, a second anode layer 107, a second light-emitting layer 108 and a second cathode layer 109.

Figure 2:
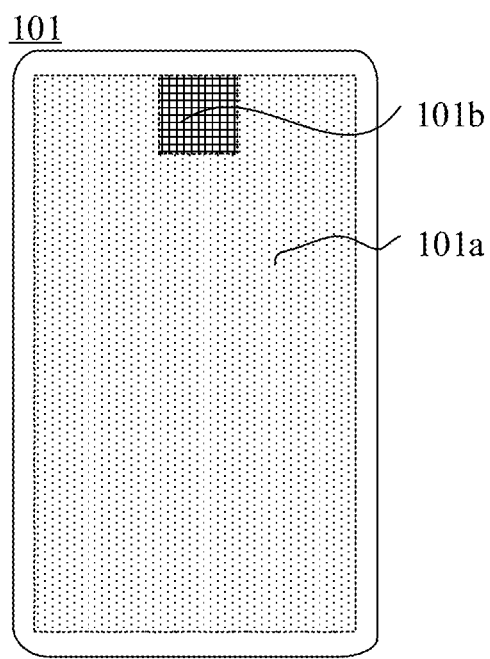
FIG. 2 is a top view of a base substrate according an embodiment of the present disclosure.

FIG. 2 is a top view of a base substrate 101 according to an embodiment of the present disclosure. With reference to FIGS. 1 and 2, the base substrate 101 may be provided with a first display region 101a and a second display region 101b. The first auxiliary electrode layer 102, the first anode layer 103, the first light-emitting layer 104 and the first cathode layer 105 may be sequentially laminated, in a direction away from the base substrate 101, in the first display region 101a. The second auxiliary electrode layer 106, the second anode layer 107, the second light-emitting layer 108 and the second cathode layer 109 may be sequentially laminated, in a direction away from the base substrate 101, in the second display region 101b. The second cathode layer 109 may be provided with at least one hollowed-out region.

Since the second cathode layer 109 included in the display panel 10 is provided with at least one hollowed-out region, the second cathode layer 109 does not entirely cover the second display region 101b. Compared with a cathode layer that entirely covers the second display region 101b, the second cathode layer can effectively reduce the impact on the light transmittance. Thus, a camera disposed in the second display region 101b has an excellent imaging effect.

In an embodiment of the present disclosure, the first auxiliary electrode layer 102 may be connected to the first cathode layer 105 and the second auxiliary electrode layer 106, and the second cathode layer 109 may be connected to the first cathode layer 105. That is, the first auxiliary electrode layer 102, the first cathode layer 105, the second auxiliary electrode layer 106, and the second cathode layer 109 are communicated with one another, and the first auxiliary electrode layer 102, the first cathode layer 105, the second auxiliary electrode layer 106 and the second cathode layer 109 may transmit the same signal.

Since the first auxiliary electrode layer 102, the first cathode layer 105, the second auxiliary electrode layer 106, and the second cathode layer 109 are all connected, a voltage difference between power signals received by the first cathode layer 105 and the second cathode layer 109 is small, which ensures the luminance uniformity of the display panel 10. Therefore, the display panel 10 has an excellent display effect.

Figure 3:
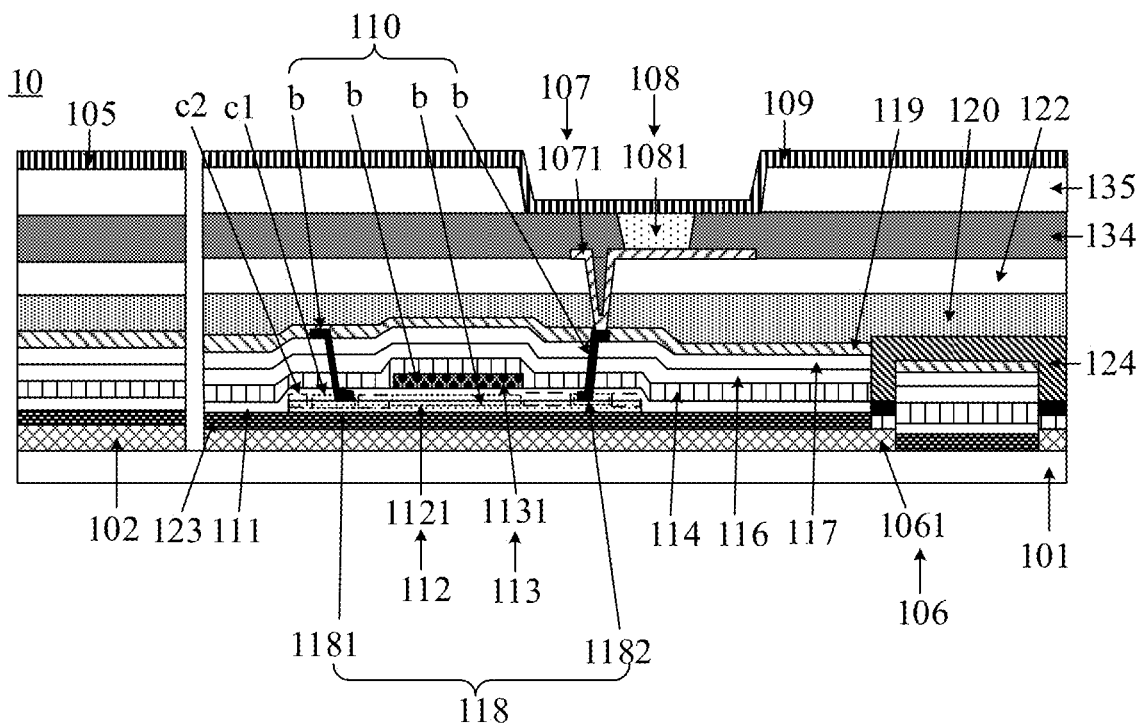
FIG. 3 is a schematic structural diagram of another display panel according to an embodiment of the present disclosure.

FIG. 3 is a schematic structural diagram of another display panel according to an embodiment of the present disclosure. Referring to FIG. 3, in the embodiment of the present disclosure, the display panel 10 may further include a pixel circuit 110 (one pixel circuit 110 is shown in FIG. 3) disposed in the second display region 101b. Each pixel circuit 110 may include at least one layer of opaque patterns b. A film layer a in FIG. 1 includes at least one layer of opaque patterns b of the pixel circuit 110.

It can also be seen with reference to FIGS. 1 and 3 that the second auxiliary electrode layer 106 may include a plurality of auxiliary electrode patterns 1061 electrically connected. Since the plurality of auxiliary electrode patterns 1061 may be electrically connected, the communication among the plurality of auxiliary electrode patterns 1061 can be guaranteed, and the reliability of signal transmission by the plurality of auxiliary electrode patterns 1061 can be ensured.

In addition, at least 50% of areas of orthographic projections of the at least one layer of opaque patterns b in the at least one pixel circuit 110 onto the base substrate 101 is overlapped with orthographic projections of the auxiliary electrode patterns 1061 onto the base substrate 101. Alternatively, boundaries of the at least one layer of opaque patterns b in the at least one pixel circuit 110 are at least partially disposed within the orthographic projections of the auxiliary electrode patterns 1061 onto the base substrate 101.

Thus, the orthographic projections of the auxiliary electrode patterns 1061 onto the base substrate 101 may cover the at least one layer of opaque patterns b in the at least one pixel circuit 110 to a great extent. A diffraction effect on a camera disposed in the second display region 101b from the pixel circuit 110 may be small, such that the display effect of the display panel 10 can be guaranteed. The opaque patterns may be patterns in a film layer, of which the transmittance is less than a transmittance threshold. For example, the transmittance threshold is 10%.

Optionally, that at least 50% of the areas of the orthographic projections of the at least one layer of opaque patterns b in the at least one pixel circuit 110 onto the base substrate 101 is overlapped with the orthographic projections of the auxiliary electrode patterns 1061 onto the base substrate 101 may mean that a target proportion of the areas of the orthographic projections of at least one layer of opaque patterns b in at least one pixel circuit 110 onto the base substrate 101 is overlapped with the orthographic projections of the auxiliary electrode patterns 1061 onto the base substrate 101. The target proportion may be 60%, 65%, 70%, 75%, 80%, 85%, 90% or 100%.

In summary, the embodiment of the present disclosure provides the display panel. The second cathode layer included in the display panel is provided with the hollowed-out region. Therefore, the second cathode layer does not entirely cover the second display region. Compared with a cathode layer that entirely covers the second display region, the second cathode layer can effectively reduce the impact on the light transmittance. Thus, the camera disposed in the second display region has an excellent imaging effect.

Optionally, both the first auxiliary electrode layer 102 and the second auxiliary electrode layer 106 may be made of metal. For example, both the first auxiliary electrode layer 102 and the second auxiliary electrode layer 106 are made of molybdenum (Mo), or aluminum alloy.

The first auxiliary electrode layer 102 and the second auxiliary electrode layer 106 may be made of the same or different materials, which is not limited in the embodiment of the present disclosure.

In an embodiment of the present disclosure, the orthographic projections of the auxiliary electrode patterns 1061 onto the base substrate 101 may cover the orthographic projections of at least one layer of opaque patterns b in the at least one pixel circuit 110 onto the base substrate 101. The plurality of pixel circuits 110 may be disposed on a side, proximal to the base substrate 101, of the second anode layer 107.

Since the orthographic projections of the auxiliary electrode patterns 1061 onto the base substrate 101 cover the orthographic projections of at least one layer of the opaque patterns b in the at least one pixel circuit 110 onto the base substrate 101, a diffraction effect on the camera disposed in the second display region 101b from the pixel circuit 110 can be avoided. Therefore, the display panel 10 has an excellent display effect.

It can also be seen with reference to FIG. 3 that the display panel 10 may further include an active layer 112, a buffer layer 111, a first gate layer 113, a first gate insulation layer 114, a second gate layer 115 (not shown in FIG. 3), a second gate insulation layer 116, an interlayer dielectric layer 117, a first source/drain layer 118, a passivation layer 119, a first planarization layer 120, a second source/drain layer 121 (not shown in FIG. 3) and a second planarization layer 122 that are sequentially laminated, in the direction away from the base substrate 101, in both the first display region 101a and the second display region 101b. In addition, the display panel 10 may further include another buffer layer 123 disposed on sides, distal from the base substrate 101, of the first auxiliary electrode layer 102 and the second auxiliary electrode layer 106.

The first source/drain layer 118 includes a plurality of sets of first source/drain layer patterns corresponding to all the pixel circuits 110. Each set of first source/drain layer pattern includes a source 1181 and a drain 1182. The second source/drain layer 121 includes a plurality of sets of second source/drain layer patterns corresponding to all the pixel circuits 110. The active layer 112 includes a plurality of sets of active patterns 1131 corresponding to all the pixel circuits 110. The first gate layer 113 includes a plurality of sets of first gate patterns 1151 corresponding to all the pixel circuits 110. The second gate layer 115 includes a plurality of sets of second gate patterns corresponding to all the pixel circuits 110. The source 1181 and the drain 1182 may be connected to one active pattern 1131. The drain 1182 may also be connected to the second anode layer 107.

Referring to FIG. 3, the at least one layer of opaque patterns b of each pixel circuit 110 include one set of first source/drain layer pattern disposed in the first source/drain layer 118, one set of active layer pattern disposed in the active layer 112, one set of first gate pattern 1151 disposed in the first gate layer 113 and one set of second gate pattern disposed in the second gate layer 115. That is, each pixel circuit 110 may include a plurality of layers of opaque patterns. The transmittance of each layer of opaque patterns is less than the transmittance threshold.

One set of first source/drain layer pattern disposed in the first source/drain layer 118 is a pattern belonging to the same pixel circuit 110. For example, one set of first source/drain layer pattern of the first source/drain layer 118 includes a source 1181 and a drain 1182 belonging to a transistor in the same pixel circuit 110. In addition, the first source/drain layer pattern further includes a transit pattern. One set of active pattern 1151 disposed in the active layer 112 includes the active layers of the transistors in all the pixel circuits 110. One set of first gate pattern 1151 disposed in the first gate layer 113 includes gates of the transistors in all the pixel circuits 110. One set of second gate pattern disposed in the second gate layer 115 includes a capacitor plate.

Figure 4:
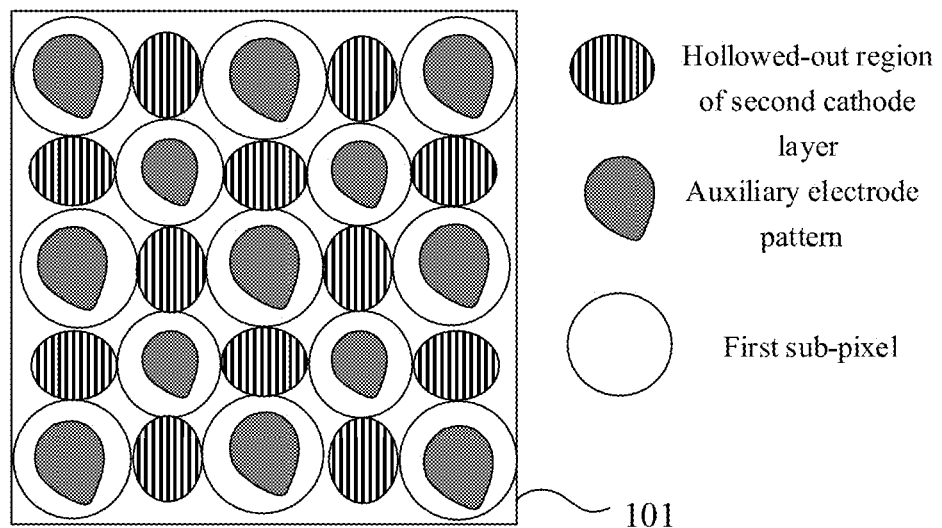
FIG. 4 is a top view of a display panel according to an embodiment of the present disclosure.

Referring to FIG. 4, the plurality of layers of opaque patterns b may include an overlap c1 and a non-overlap c2. The orthographic projections of the auxiliary electrode patterns 1061 onto the base substrate 101 cover the orthographic projections of at least one layer of opaque patterns b in the at least one pixel circuit 110 onto the base substrate 101, which may be intended to indicate that an orthographic projection of at least part of the overlap c1 onto the base substrate 101 is disposed within the orthographic projections of the auxiliary electrode patterns 1061 onto the base substrate 101. In addition, an orthographic projection of at least part of the non-overlap c2 onto the base substrate 101 is disposed within the orthographic projections of the auxiliary electrode patterns 1061 onto the base substrate 101.

Due to limitation from a manufacturing process, the auxiliary electrode patterns 1061 may not completely cover an orthographic projection of the pixel circuit 110 onto the base substrate 101, i.e., it may not completely cover the orthographic projections of the plurality of layers of opaque patterns b included by the pixel circuit 110 onto the base substrate 101. Therefore, in order to avoid an excessive diffraction effect on the camera disposed in the second display region 101b from the pixel circuit 110, the orthographic projections of the auxiliary electrode patterns 1061 onto the base substrate 101 may cover the orthographic projections of the overlaps c1 of the plurality of layers of opaque patterns b onto the base substrate 101 as much as possible. That is, portions that cannot be covered by the orthographic projections of the auxiliary electrode patterns 1061 onto the base substrate 101 are mainly the non-overlaps c2 of the plurality of layers of opaque patterns b. For example, the orthographic projections of only part of the regions of the active patterns 1131 included in the plurality of layers of opaque patterns onto the base substrate 101 cannot be covered by the orthographic projections of the auxiliary electrode patterns 1061 onto the base substrate 101.

In an embodiment of the present disclosure, the second anode layer 107, the second light-emitting layer 108, and the second cathode layer 109 may be divided into light-emitting units of a plurality of first sub-pixels. Orthographic projections of light-emitting regions of the light-emitting units of the first sub-pixels onto the base substrate 101 may be disposed in overlap regions between the auxiliary electrode patterns 1061 and the second cathode layer 109. In addition to the light-emitting unit, each first sub-pixel further includes one pixel circuit 110 disposed in the second display region 101b.

Referring to FIG. 1, the second anode layer 107 may include a plurality of anode patterns 1071 spaced apart from each other. The second light-emitting layer 108 may include a plurality of light-emitting layer patterns 1081. In addition, the plurality of anode patterns 1071 correspond to the plurality of light-emitting layer patterns 1081. Each anode pattern 1071, the corresponding light-emitting layer pattern 1081 and the second cathode layer 109 form the light-emitting unit of one first sub-pixel. Two adjacent anode patterns 1081 may be disposed on the same side of one hollowed-out region of the second cathode layer 109, or may be disposed on two sides of one hollowed-out region, which is not limited in the embodiment of the present disclosure.

In an embodiment of the present disclosure, the first anode layer 103, the first light-emitting layer 104 and the first cathode layer 105 may be divided into light-emitting units of a plurality of second sub-pixel. Orthographic projections of light-emitting regions of the light-emitting units of the second sub-pixels onto the base substrate 101 may be disposed within an orthographic projection of the first cathode layer 105 onto the base substrate 101.

The first anode layer 103 may also include a plurality of anode patterns (not shown in the figure). The first light-emitting layer 104 may include a plurality of light-emitting layer patterns (not shown in the figure). The plurality of anode patterns and the plurality of light-emitting layer patterns are in one-to-one correspondence. Each anode pattern, the corresponding light-emitting layer pattern and the first cathode layer 105 may form the light-emitting unit of one second sub-pixel.

In an embodiment of the present disclosure, the display panel 10 may further include a pixel circuit disposed in the first display region 101a. In addition to the light-emitting unit, each second sub-pixel further includes one pixel circuit disposed in the first display region 101a.

FIG. 4 is a top view of a display panel according to an embodiment of the present disclosure. It can be seen with reference to FIG. 4 that edges of the orthographic projections of the auxiliary electrode patterns 1061 onto the base substrate 101 may be at least partially arc-shaped.

Optionally, the edges of the orthographic projections of the auxiliary electrode patterns 1061 onto the base substrate 101 may include an arc line segment. A ratio of a length of the arc line segment to a perimeter of the edge may be greater than or equal to 50%.

In an exemplary embodiment, the ratio of the length of the arc line segment to the perimeter of the edge may be 100%, i.e., the edges of the orthographic projections of the auxiliary electrode patterns 1061 onto the base substrate 101 may all be arc line segments.

In order to avoid the diffraction effect on the camera disposed in the second display region 101b from the pixel circuit 110 of the first sub-pixel, the orthographic projections of the auxiliary electrode patterns 1061 onto the base substrate 101 may cover the orthographic projections of at least one layer of opaque patterns b in the pixel circuit 110 onto the base substrate 101. That is, the orthographic projections of the auxiliary electrode patterns 1061 onto the base substrate 101 may cover the orthographic projections of at least one layer of opaque patterns in one pixel circuit 110 onto the base substrate 101.

Figure 5:
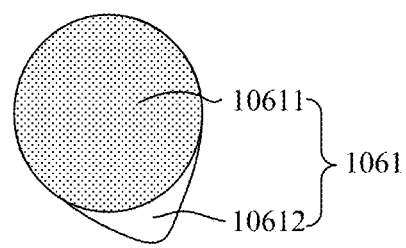
FIG. 5 is a schematic structural diagram of an auxiliary electrode pattern in FIG. 4.

FIG. 5 is a schematic structural diagram of the auxiliary electrode pattern 1061 in FIG. 4. As can be seen from FIG. 5, the auxiliary electrode patterns 1061 may include a first pattern 10611 and a second pattern 10612. An orthographic projection of the first pattern 10611 onto the base substrate 101 is overlapped with 50% or more of the areas of the orthographic projections of the at least one layer of opaque patterns b in the at least one pixel circuit 110 onto the base substrate 101. The second pattern 10612 may be configured to be electrically connected to the adjacent auxiliary electrode patterns 1061. In an exemplary embodiment, the orthographic projection of the first pattern 10611 onto the base substrate 101 may cover the orthographic projections of at least one layer of opaque patterns b in one pixel circuit 110 onto the base substrate 101.

It should be noted that edges of at least one layer of opaque patterns b included in the pixel circuit 110 include at least two sub-edges and at least one corner disposed between the at least two sub-edges. An angle formed by the two sub-edges is less than 150°. That is, the edges of at least one layer of opaque patterns b included by the pixel circuit 110 may be broken line segments.

Figure 6:
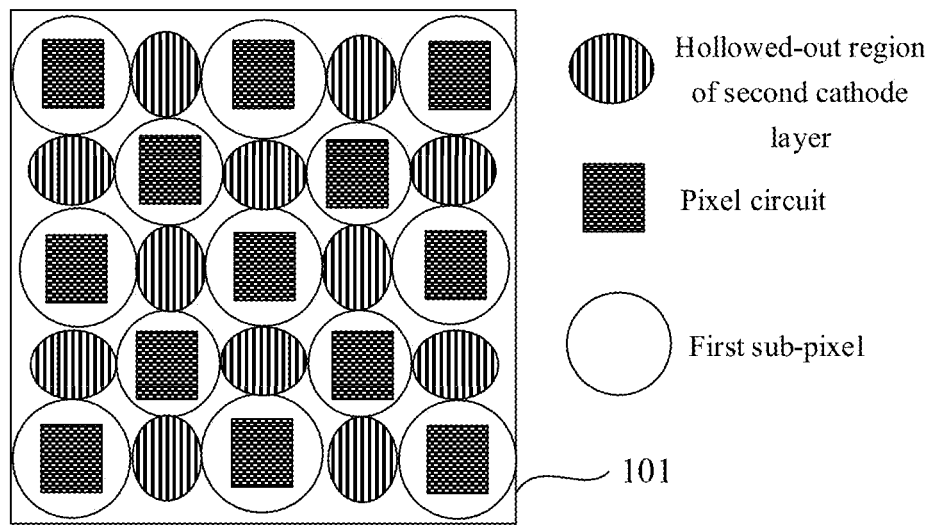
FIG. 6 is a top view of a display panel without an auxiliary electrode pattern according to an embodiment of the present disclosure.

In an embodiment of the present disclosure, the display panel without the auxiliary electrode patterns 1061 (for example, FIG. 6) and the display panel with the auxiliary electrode patterns 1061 may be respectively subjected to diffraction simulation tests. The diffraction simulation test may include the following steps: respectively disposing a point light source and a charge coupled device (CCD) on two sides of the display panel; and when the point light source emits light, testing, by use of the CCD, diffraction of the light emitted from the point light source after passing through the display panel. Central luminous points in FIGS. 7 and 8 may indicate the center of the point light source. The higher the luminance of peripheral luminous points is, the more divergent the energy of the point light source is after passing through the display panel, and the more severe the diffraction is.

Figure 7:
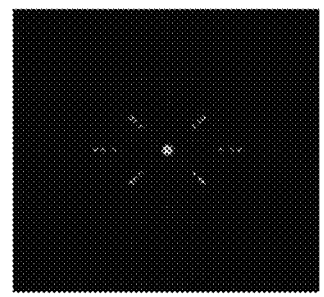
FIG. 7 is a schematic diagram of a diffraction simulation test on the display panel shown in FIG. 6.
Figure 8:
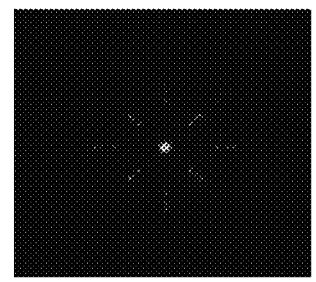
FIG. 8 is a schematic diagram of a diffraction simulation test on the display panel shown in FIG. 4.

It can be seen from FIGS. 7 and 8 that a test image shown in FIG. 7 indicates a strong diffraction effect (the peripheral luminous points are high in luminance) of the display panel without the auxiliary electrode patterns 1061, while a test image shown in FIG. 8 indicates a weak diffraction effect of the display panel with the auxiliary electrode patterns 1061 (the peripheral luminous points are low in luminance).

In an embodiment of the present disclosure, the first patterns 10611 of different shapes are disposed in a plurality of display panels, and a diffraction simulation test is performed on the plurality of display panels provided with the first patterns 10611 of different shapes. According to test results, it can be determined that when the orthographic projections of the first patterns 10611 onto the base substrate 101 are circular, the display panel has the weakest diffraction effect, i.e., the effect of reducing diffraction is the best with respect to the display panel without the auxiliary electrode patterns 1061. Therefore, it can be seen with reference to FIG. 5 that the orthographic projections of the first patterns 10611 in the auxiliary electrode patterns 1061 onto the base substrate 101 may be circular.

In an optional embodiment, referring to FIG. 1, the plurality of auxiliary electrode patterns 1061 are overlapped with one another to be in electrical connection. For example, the second pattern 10612 of a certain auxiliary electrode pattern 1061 may be overlapped with the second pattern 10612 of another adjacent auxiliary electrode pattern 1061.

That is, for two adjacent auxiliary electrode patterns 1061 in the plurality of auxiliary electrode patterns 1061, an overlap area is present between the orthographic projection of one auxiliary electrode pattern 1061 onto the base substrate 101 and the orthographic projection of the other auxiliary electrode pattern 1061 onto the base substrate 101. A ratio of the area of the overlap area to the area of the orthographic projection of the auxiliary electrode pattern 1061 onto the base substrate ranges from 5% to 10%.

In another optional embodiment, referring to FIG. 3, the display panel 10 may further include a plurality of first connection electrodes 124 disposed in the second display region 101b, and the plurality of auxiliary electrode patterns 1061 are electrically connected by the plurality of first connection electrodes 124.

Figure 9:
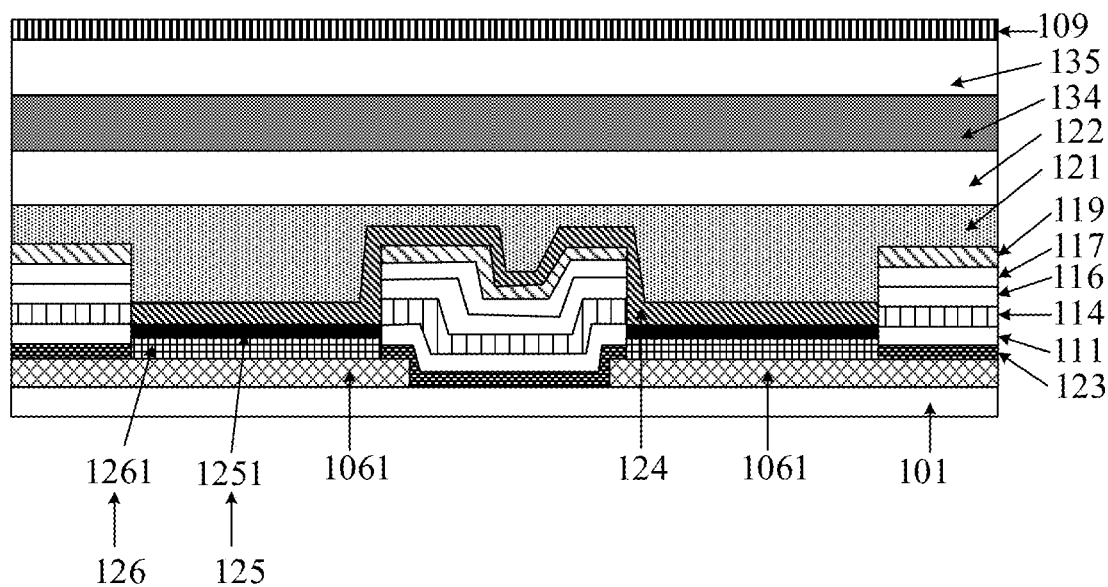
FIG. 9 is a sectional view of a display panel according to an embodiment of the present disclosure.

Referring to FIG. 9, the display panel 10 further includes a first conduction layer 125 disposed in a same layer as the first source/drain layer 118, and a second conduction layer 126 disposed in a same layer as the second gate layer 115.

The buffer layer 111, the first gate insulation layer 114, the second gate insulation layer 116 and the interlayer dielectric layer 117 are all provided with first via holes. The second conduction layer 126 and the first conduction layer 125 may be electrically connected to the auxiliary electrode patterns 1061 through the first via hole.

In addition, the plurality of first connection electrodes 124 are disposed between the passivation layer 119 and the first planarization layer 120, the passivation layer 119 is provided with a second via hole, and at least part of the first connection electrodes 124 is disposed in the second via and connected to the first conduction layer 125.

Referring to FIG. 9, two auxiliary electrode patterns 1061, two first conductive patterns 1251 included in the first conduction layer 125, two second conductive patterns 1261 included in the second conduction layer 126, and one first connection electrode 124 are shown in FIG. 9. The buffer layer 111, the first gate insulation layer 114, the second gate insulation layer 116, and the interlayer dielectric layer 117 are all provided with two first via holes. The two second conductive patterns 1261 and the two first conductive patterns 1251 are in one-to-one correspondence. The passivation layer 119 is provided with two second via holes. One end of the first connection electrode 124 is disposed in one second via hole and connected to one first conductive pattern 1251, and the other end of the first connection electrode 124 is disposed in the other second via hole and connected to the other first conductive pattern 1251. Thus, the two auxiliary electrode patterns 1061 may be connected to the first connection electrode 124 by the first conductive patterns 1251 and the second conductive patterns 1261, such that signal transmission between the two auxiliary electrode patterns 1061 is realized.

In an embodiment of the present disclosure, the first auxiliary electrode layer 102 may be connected to the auxiliary electrode patterns 1061 in the second auxiliary electrode layer 106 in two ways. For example, the first auxiliary electrode layer 102 is overlapped with the auxiliary electrode patterns 1061, proximal to the first display region 101a, in the second display region 101b. Alternatively, the first auxiliary electrode layer 102 is connected to the auxiliary electrode patterns 1061, proximal to the first display region 101a, in the second display region 101b by the first connection electrode 124. In addition, a reference may be made to the mode of connection between the auxiliary electrode patterns 1061 in the second display region 101b for their mode of connection, which is not repeated in the embodiment of the present disclosure.

Figure 10:
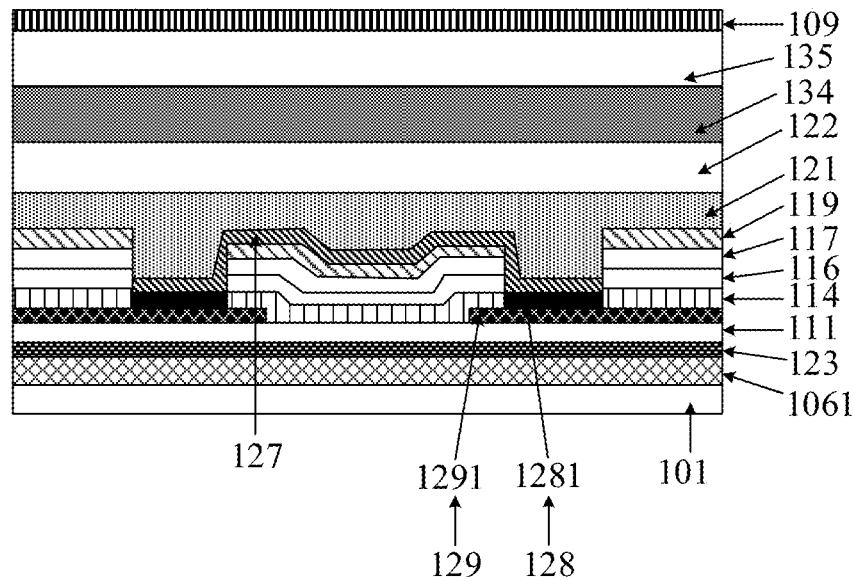
FIG. 10 is a sectional view of another display panel according to an embodiment of the present disclosure.

In an embodiment of the present disclosure, referring to FIG. 10, the display panel 10 may further include a plurality of second connection electrodes 127 disposed between the passivation layer 119 and the first planarization layer 120, a first signal transmission layer 128 disposed in a same layer as the first source/drain layer 118, and a third conduction layer 129 disposed in a same layer as the first gate layer 113.

The first gate insulation layer 114, the second gate insulation layer 116 and the interlayer dielectric layer 117 are all provided with a third via hole. The first signal transmission layer 128 is connected to the third conduction layer 129 through the third via hole. The passivation layer 119 is provided with a fourth via hole, and at least part of the second connection electrodes 127 is disposed in the fourth via hole and connected to the first signal transmission layer 128.

In an embodiment of the present disclosure, the third conduction layer 129 may include a plurality of first signal line segments, a plurality of second signal line segments, and a plurality of third signal line segments. Each signal line segment 1291 of the plurality of first signal line segments, the plurality of second signal line segments and the plurality of third signal line segments is connected to one pixel circuit 110.

The plurality of second connection electrodes 127 include a plurality of first-type second connection electrodes 127 that connect the plurality of first signal line segments, a plurality of second-type second connection electrodes 127 that connect the plurality of second signal line segments, and a plurality of third-type second connection electrodes 127 that connect the plurality of third signal line segments.

It is assumed that the two signal line segments 1291 shown in FIG. 10 are both first signal line segments, the second connection electrode 127 in FIG. 10 is the first-type second connection electrode 127. It is assumed that the two signal line segments 1291 shown in FIG. 10 are both second signal line segments, the second connection electrode 127 in FIG. 10 is the second-type second connection electrode 127. It is assumed that the two signal line segments 1291 shown in FIG. 10 are both third signal line segments, the second connection electrode 127 in FIG. 10 is the third-type second connection electrode 127.

For example, the two signal line segments 1291 shown in FIG. 10 are both first signal line segments. The first gate insulation layer 114, the second gate insulation layer 116, and the interlayer dielectric layer 117 are all provided with two third via holes. In addition, FIG. 10 shows two first signal transmission patterns 1281 of the first signal transmission layer 128, and each first signal transmission pattern 1281 is connected to the first signal line segment 1291 through one third via hole. The passivation layer 119 is provides with two fourth via holes. One end of the second connection electrode 127 is disposed in one fourth via hole and connected to one first signal transmission pattern 1281. The other end of the second connection electrode 127 is disposed in the other fourth via hole and connected to the other first signal transmission pattern 1281. Thus, the two first signal line segments 1291 may be connected to the second connection electrode 127 by the two first signal transmission patterns 128, so as to realize signal transmission by the two first signal line segments 1291.

The plurality of first signal line segments may all be gate signal line segments, the plurality of second signal line segments may all be reset control signal line segments, and the plurality of third signal line segments may all be emission (EM) control signal line segment. That is, the plurality of gate signal line segments may be connected by the plurality of first-type second connection electrodes 127 to realize transmission of gate signals by the plurality of gate signal line segments. The plurality of reset control signal line segments may be connected by the plurality of second-type second connection electrodes 127 to realize transmission of reset control signals by the plurality of reset control signal line segments. The plurality of emission control signal line segments may be connected by the plurality of third-type second connection electrodes 127 to realize transmission of emission control signals by the plurality of emission control signal line segments.

In an embodiment of the present disclosure, the first display region 101a includes a gate signal line, and the gate signal line may be connected to the gate signal line segment, proximal to the first display region 101a, in the second display region 101y by the second connection electrode 127. In addition, a reference may be made to the mode of connection between the gate signal line segments in the second display region 101b for their mode of connection, which is not repeated in the embodiment of the present disclosure. The first display region 101a includes a reset control signal line, and the reset control signal line may be connected to the reset control signal line, proximal to the first display region 101a, in the second display region 101b by the second connection electrode 127. In addition, a reference may be made to the mode of connection between the reset control signal line segments in the second display region 101b for their mode of connection, which is not repeated in the embodiment of the present disclosure. The first display region 101a includes an emission control signal line, and the emission control signal line may be connected to the emission control signal line segment, proximal to the first display region 101a, in the second display region 101b by the second connection electrode 127. In addition, a reference may be made to the mode of connection between the emission control signal line segments in the second display region 101b, which is not repeated in the embodiment of the present disclosure.

Figure 11:
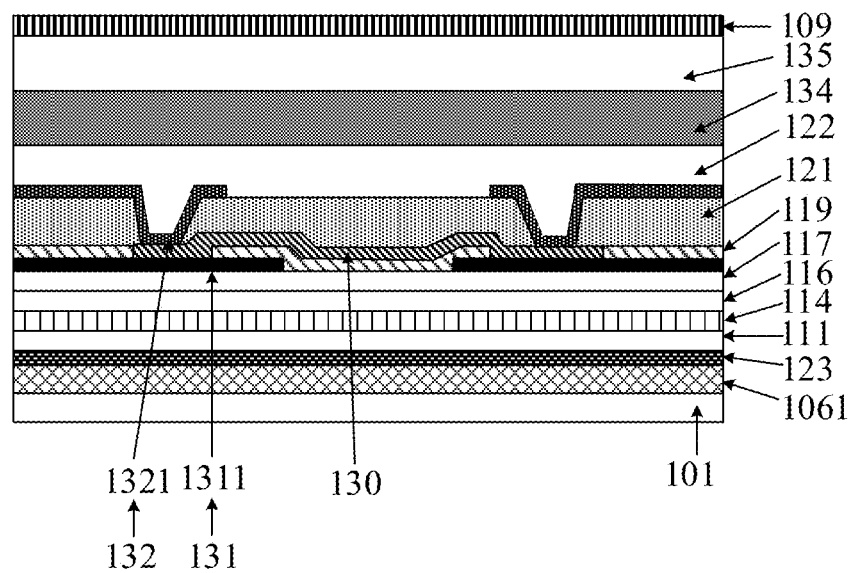
FIG. 11 is a sectional view of yet another display panel according to an embodiment of the present disclosure.

As a possible case, in an embodiment of the present disclosure, referring to FIG. 11, the display panel 10 may further include a plurality of third connection electrodes 130, a fourth conduction layer 131, and a fifth conduction layer 132. The plurality of third connection electrodes 130 may be disposed between the passivation layer 119 and the second planarization layer 122.

The fourth conduction layer 131 may be disposed in a same layer as the first source/drain layer 118, and may include a plurality of fourth signal line segments 1311. The fifth conduction layer 132 may be disposed in a same layer as the second source/drain layer 121, and may include a plurality of fifth signal line segments 1321. Each of the plurality of fourth signal line segments 1311 and the plurality of fifth signal line segments 1321 is connected to one pixel circuit 110, the plurality of fourth signal line segments 1311 are electrically connected by the plurality of third connection electrodes 130, and the plurality of fifth signal line segments 1321 are electrically connected by the plurality of third connection electrodes 130.

Referring to FIG. 11, the passivation layer 119 is provided with a fifth via hole. At least part of the third connection electrodes 130 are disposed in the fifth via hole and connected to the fourth signal line segment 1311. The first planarization layer 120 is provided with a sixth via hole, and at least part of the fifth signal line segments 1321 are disposed in the sixth via hole and connected to the third connection electrode 130.

Two fourth signal line segments 1311 and two fifth signal line segments 1321 are shown in FIG. 11. The passivation layer 119 is provided with two fifth via holes. One end of the third connection electrode 130 is disposed in one fifth via hole and connected to one fourth signal line segment 1311. The other end of the third connection electrode 130 is disposed in the other fifth via hole and connected to the other fourth signal line segment 1311. In addition, the first planarization layer 120 is provided with two sixth via holes, and at least part of each fifth signal line segment 1321 is disposed in one sixth via hole and connected to one third connection electrode 130. Thus, the two fourth signal line segments 1311 are connected to the two fifth signal line segments 1321 by the third connection electrodes 130, so as to realize signal transmission by the two fourth signal line segments 1311 and the two fifth signal line segments 1321.

Optionally, the plurality of fourth signal line segments 1311 and the plurality of fifth signal line segments 1321 are all positive power supply (voltage drain drain, VDD) signal line segments. That is, the plurality of fourth signal line segments 1311 are connected to the plurality of fifth signal line segments 1321 by the plurality of third connection electrodes 130 to realize transmission of positive power signals.

In an embodiment of the present disclosure, the first display region 101a includes a positive power signal line, and the positive power signal line may be connected to the positive power signal line segment, proximal to the first display region 101a, in the second display region 101b by the third connection electrode 127. In addition, a reference may be made to the mode of connection between the positive power signal line segments in the second display region 101b for their mode of connection, which is not repeated in the embodiment of the present disclosure.

Figure 12:
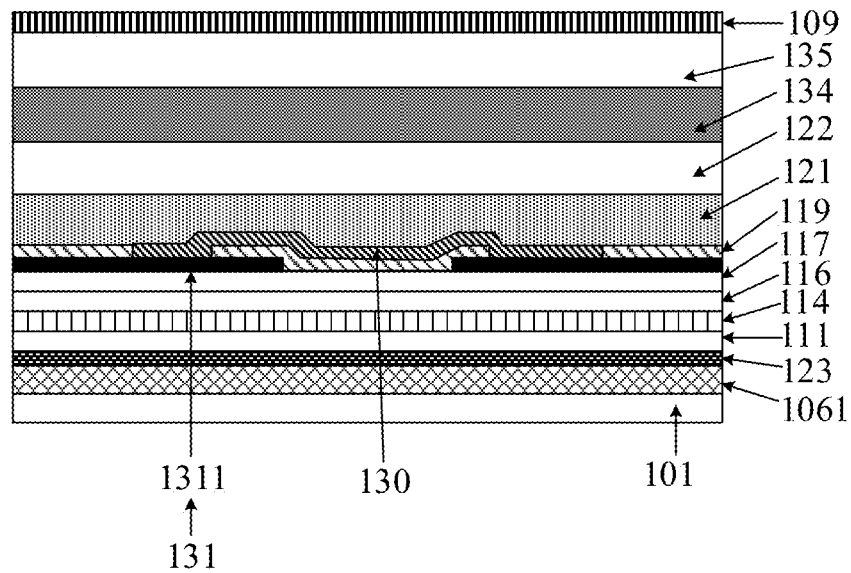
FIG. 12 is a sectional view of still another display panel according to an embodiment of the present disclosure.

As another possible case, in an embodiment of the present disclosure, referring to FIG. 12, the display panel 10 may further include a plurality of third connection electrodes 130 and a fourth conduction layer 131. The plurality of third connection electrodes 130 may be disposed in a same layer as the second source/drain layer 121. The fourth conduction layer 131 may be disposed in a same layer as the first source/drain layer 118, and may include a plurality of fourth signal line segments 1311. Each fourth signal line segment 1311 is connected to one pixel circuit 110, and at least part of the plurality of fourth signal line segments 1311 are electrically connected by at least part of the third connection electrode 130.

Referring to FIG. 12, the passivation layer 119 is provided with a seventh via hole, and at least part of the third connection electrodes 130 may be disposed in the seventh via hole and connected to the fourth signal line segment 1311. Two fourth signal line segments 1311 are shown in FIG. 12, and the passivation layer 119 is provided with two seventh via holes. One end of the third connection electrode 130 is disposed in one seventh via hole and connected to one fourth signal line segment 1311. The other end of the third connection electrode 130 is disposed in the other seventh via hole and connected to the other fourth signal line segment 1311. Thus, the two fourth signal line segments 1311 are connected by the third connection electrode 130, so that signal transmission by the two fourth signal line segments 1311 is realized.

Optionally, the plurality of fourth signal line segments 1311 are all data signal line segments. That is, at least part of the plurality of fourth signal line segments 1311 are connected by at least part of the third connection electrodes 130 to realize transmission of data signals. For example, the fourth signal line segments 1311 of each column of pixels are electrically connected by the third connection electrodes 130.

In an embodiment of the present disclosure, the first display region 101a includes a data signal line, and the data signal line may be connected to a data signal line, proximal to the first display region 101a, in the second display region 101b by the third connection electrode 127. In addition, a reference may be made to the mode of connection between the data signal line segments in the second display region 101b for their mode of connection, which is not repeated in the embodiment of the present disclosure.

Figure 13:
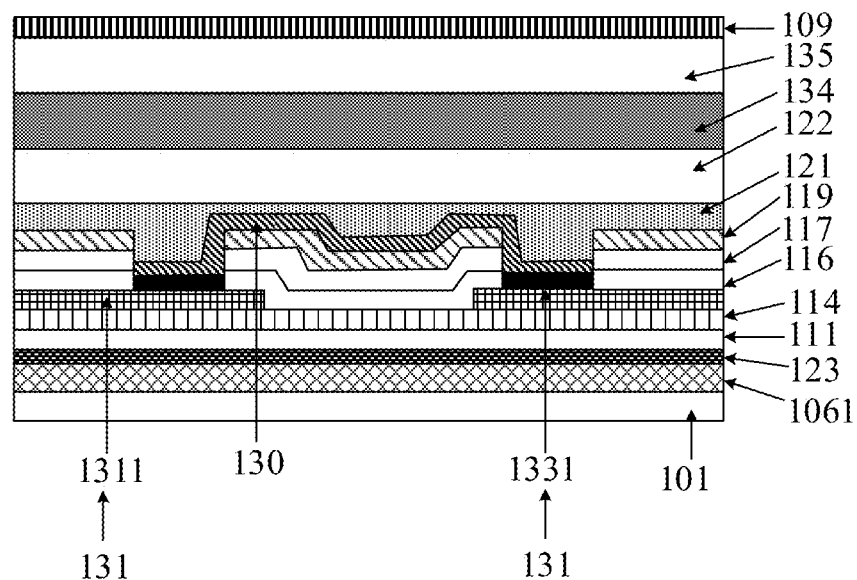
FIG. 13 is a sectional view of still yet another display panel according to an embodiment of the present disclosure.

As another possible case, referring to FIG. 13, in an embodiment of the present disclosure, the display panel 10 may further include a plurality of third connection electrodes 130, a fourth conduction layer 131, and a second signal transmission layer 133. The plurality of third connection electrodes 130 may be disposed in a same layer as the second source/drain layer 121. The fourth conduction layer 131 and the second gate layer 115 are disposed in a same layer, and the fourth conduction layer 131 includes a plurality of fourth signal line segments 1311. The second signal transmission layer 133 may be disposed in a same layer as the first source/drain layer 118.

The second gate insulation layer 116 and the interlayer dielectric layer 117 are all provided with an eighth via hole. The second signal transmission layer 133 may be disposed in the eighth via hole and connected to the fourth signal line segment 1311. The passivation layer 119 is provided with a ninth via hole, and at least part of the third connection electrodes 130 may be disposed in the ninth via hole and connected to the second signal transmission layer 133.

Two second signal transmission patterns 1331 included by the second signal transmission layer 133 and two fourth signal line segments 1311 are shown in FIG. 13. The second gate insulation layer 116 and the interlayer dielectric layer 117 are all provided with two eighth via holes. The two second signal transmission patterns 1331 are respectively disposed in the two eighth via holes, and are connected to one fourth signal line segment 1311. The passivation layer 119 is provided with two ninth via holes. One end of the third connection electrode 130 is disposed in one ninth via hole and connected to one second signal transmission pattern 1331. The other end of the third connection electrode 130 is disposed in the other ninth via hole and connected to the other second signal transmission pattern 1331. Thus, the two fourth signal line segments 1311 are connected by the third connection electrode 130, so that signal transmission by the two fourth signal line segments 1311 is realized.

Optionally, the plurality of fourth signal line segments 1311 may all be initializing (vinit) signal line segments. That is, the plurality of fourth signal line segments 1311 are connected by the plurality of third connection electrodes 130 to realize transmission of initialization signals.

In an embodiment of the present disclosure, the first display region 101a includes an initialization signal line, and the initialization signal line may be connected to the initialization signal line, proximal to the first display region 101a, in the second display region 101b by the third connection electrode 127. In addition, a reference may be made to the mode of connection between the initialization signal line segments in the second display region 101b for their mode of connection, which is not repeated in the embodiment of the present disclosure.

With reference to FIGS. 9 to 13, at least part of the plurality of connection electrodes (a plurality of first connection electrodes, a plurality of second connection electrodes, and a plurality of third connection electrodes) in the display panel may be configured to electrically connect at least one of the first gate layer, the second gate layer and the first source/drain layer in the first display region 101a, as well as at least one of the first gate layer, the second gate layer and the first source/drain layer in the second display region 101b. And/or, at least part of the plurality of connection electrodes in the display panel are configured to electrically connect the at least two auxiliary electrode patterns 1061 disposed in the second display region 101b. And/or, at least part of the plurality of connection electrodes in the display panel are configured to connect at least one layer of opaque patterns in at least two pixel circuits in the second display region 101b.

With reference to FIGS. 9 to 13, the plurality of connection electrodes are provided with a plurality of joints. The joints include connection via holes or lap structures, corresponding to the plurality of connection electrodes and patterns connected by the plurality of connection electrodes. For example, the joints include overlaps between the orthographic projections of the connection electrodes onto the base substrate 101 and an orthographic projection of the conduction layer onto the base substrate 101. An overlap area is present between the orthographic projections of the auxiliary electrode patterns 1061 onto the base substrate 101 and an orthographic projection of at least one of the joints onto the base substrate 101.

Optionally, the orthographic projections of the auxiliary electrode patterns 1061 onto the base substrate 101 may cover the orthographic projection of at least one joint onto the base substrate 101. For example, FIG. 9 shows two joints, and the orthographic projections of the auxiliary electrode patterns 1061 onto the base substrate 101 cover the orthographic projections of the two joints onto the base substrate 101.

Since the regions where the plurality of conductive film layers are superimposed (i.e., the regions where the joints are disposed) has a great diffraction effect on the camera, while the regions of the single conductive film layers have a weak diffraction effect on the camera, covering the orthographic projections of the joints onto the base substrate 101 with the orthographic projections of the auxiliary electrode patterns 1061 onto the base substrate 101 can greatly reduce diffraction and improve the display effect of the display panel.

With reference to FIG. 3 and FIG. 9 to FIG. 13, the display panel 10 may further include a pixel definition layer 134 disposed on a side, distal from the base substrate 101, of the second anode layer 107. Referring to FIG. 3, the pixel definition layer 134 may be provided with a plurality of tenth via holes, and at least part of the plurality of light-emitting layer patterns 1081 included by the second light-emitting layer 108 may be disposed in the tenth via holes. The second cathode layer 109 at least partially covers the tenth via hole, and at least one hollowed-out region of the second cathode layer 109 is not overlapped with the tenth via hole.

With reference to FIG. 3 and FIG. 9 to FIG. 13, the display panel 10 may further include a supporting layer 135 disposed on a side, distal from the base substrate 101, of the pixel definition layer 134. Referring to FIG. 3, the supporting layer 135 may have a plurality of supporting patterns. Orthographic projections of the plurality of supporting patterns onto the base substrate 101 are at least partially not overlapped with the orthographic projections of the light-emitting layer patterns 1081 onto the base substrate 101. The portion of the second cathode layer 109 other than the hollowed-out region may be connected to the light-emitting layer patterns 1081 to ensure that the first sub-pixel disposed in the second display region 101b may emit light normally.

In an embodiment of the present disclosure, referring to FIGS. 1 and 3, the first auxiliary electrode layer 102 and the second auxiliary electrode layer 106 may be disposed in a same layer, and the first light-emitting layer 104 and the second light-emitting layer 108 may be disposed in a same layer. The first cathode layer 105 and the second cathode layer 109 may be disposed in a same layer. For example, the first cathode layer 105 and the second cathode layer 109 may be of an integral structure.

That is, the first auxiliary electrode layer 102 and the second auxiliary electrode layer 106 may be manufactured by a same patterning process. The first light-emitting layer 104 and the second light-emitting layer 108 may be manufactured by a same patterning process. The first cathode layer 105 and the second cathode layer 109 may be manufactured by a same patterning process.

Figure 14:
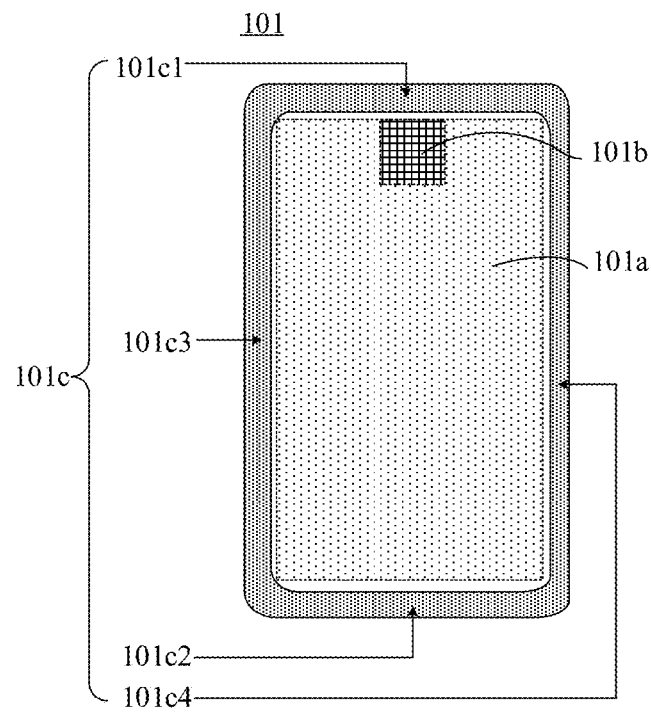
FIG. 14 is a top view of still yet another display panel according to an embodiment of the present disclosure.

FIG. 14 is a top view of another base substrate according to an embodiment of the present disclosure. As can be seen from FIG. 14, the base substrate 101 is further provided with a peripheral region 101c surrounding both the first display region 101a and the second display region 101b. The first auxiliary electrode layer 102 and the first cathode layer 105 may also be disposed in the peripheral region 101c. In addition, referring to FIG. 15, a portion disposed in the peripheral region 101c of the first auxiliary electrode layer 102 may be connected to a portion disposed in the peripheral region 101c of the first cathode layer 105.

Since the portion disposed in the peripheral region 101c of the first auxiliary electrode layer 102 is connected to the portion disposed in the peripheral region 101c of the first cathode layer 105, there is no need to make a portion disposed in the first display region 101a of the first auxiliary electrode layer 102 be connected to a portion disposed in the first display region 101a of the first cathode layer 105. Therefore, the display effect of the first display region 101a may not be adversely affected by the connection between the first auxiliary electrode layer 102 and the first cathode layer 105.

Optionally, the portion disposed in the peripheral region 101c of the first auxiliary electrode layer 102 and the portion disposed in the peripheral region 101c of the first cathode layer 105 may overlap at least one layer of conductive patterns between the first auxiliary electrode layer 102 and the first cathode layer 105 respectively, such that the portion disposed in the peripheral region 101c of the first auxiliary electrode layer 102 is electrically connected to the portion disposed in the peripheral region 101c of the first cathode layer.

Figure 15:
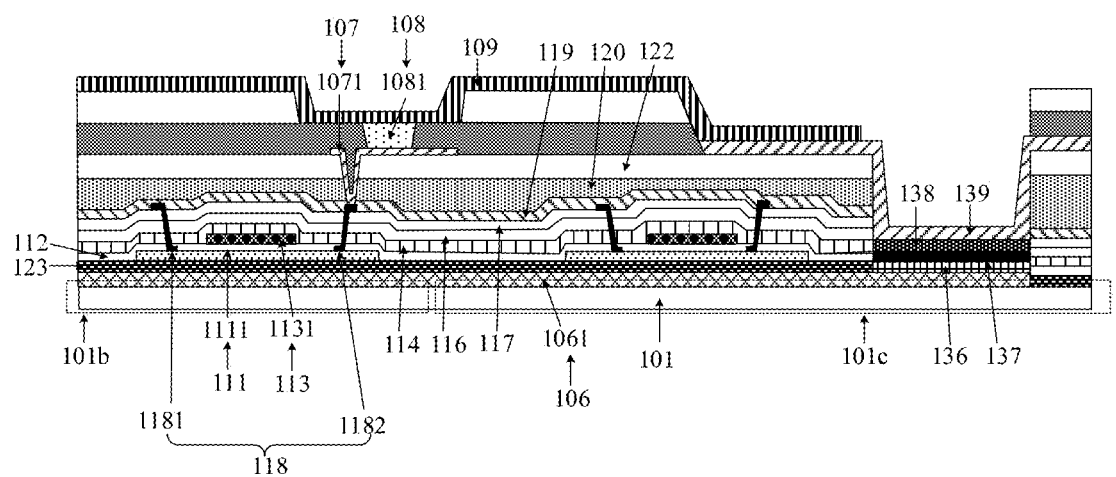
FIG. 15 is a sectional view of still yet another display panel according to an embodiment of the present disclosure.

Referring to FIG. 15, the buffer layer 111, the first gate insulation layer 114, the second gate insulation layer 116, the interlayer dielectric layer 117, the passivation layer 119, the first planarization layer 120 and the second planarization layer 122 are all provided with an eleventh via hole. Orthographic projections of the eleventh via holes onto the base substrate 101 are disposed in the peripheral region 101c, and the portion disposed in the peripheral region 101c of the first auxiliary electrode layer 102 is exposed by the eleventh via hole.

The display panel 10 further includes a third signal transmission layer 136, a fourth signal transmission layer 137, a fifth signal transmission layer 138, and a sixth signal transmission layer 139 that are disposed in the eleventh via hole. The third signal transmission layer 136 is disposed in a same layer as the second gate layer 115, and connected to the first auxiliary electrode layer 102. The fourth signal transmission layer 137 is disposed in a same layer as the first source/drain layer 118, the fifth signal transmission layer 138 is disposed in a same layer as the second source/drain layer 121, and the sixth signal transmission layer 139 is disposed in a same layer as the second anode layer 107.

The pixel definition layer 134 is provided with a twelfth via hole of which an orthographic projection onto the base substrate 101 is disposed in the peripheral region 101c, and the sixth signal transmission layer 139 is exposed by the twelfth via hole. An orthographic projection of the portion disposed in the peripheral region 101a of the first cathode layer 105 onto the base substrate 101 is at least partially overlapped with an orthographic projection of the sixth signal transmission layer 139 onto the base substrate 101, and the first cathode layer 105 is connected to the sixth signal transmission layer 139. Thus, the first auxiliary electrode layer 102 is connected to the first cathode layer 105 by the third signal transmission layer 136, the fourth signal transmission layer 137, the fifth signal transmission layer 138, and the sixth signal transmission layer 139 to realize signal transmission in the first auxiliary electrode layer 102 and the first cathode layer 105.

Referring to FIG. 14, the peripheral region 101c may include a first region 101c1 and a second region 101c2 arranged oppositely and in parallel, as well as a third region 101c3 and a fourth region 101c4 arranged oppositely and in parallel. A direction in which the first region 101c1 extends may be perpendicular to a direction in which the third region 101c3 extends, and a distance between the second display region 101b and the first region 101c1 may be less than a distance between the second display region 101b and the second region 101c2.

Referring to FIG. 14, the first region 101c1 may be disposed on the upper side of the first display region 101a, the second region 101c2 may be disposed on the lower side of the first display region 101a, the third region 101c3 may be disposed on the left side of the first display region 101a, and the fourth region 101c4 may be disposed on the right side of the first display region 101a. A distance between the second display region 101b and the third region 101c3 may be equal to a distance between the second display region 101b and the fourth region 101c4, i.e., the second display region 101b may be disposed in the middle of a side, proximal to the first region 101c1, of the first display region 101a.

In an embodiment of the present disclosure, the orthographic projection of the first auxiliary electrode layer 102 onto the base substrate 101 may cover the first display region 101a, i.e., the first auxiliary electrode layer 102 may be manufactured as a whole layer. Alternatively, the first auxiliary electrode layer 102 may only cover part of the first display region 101a. The shape of the first auxiliary electrode layer 102 is not limited in the embodiment of the present disclosure, and the only requirement is to guarantee that the first auxiliary electrode layer 102 may be connected to the first cathode layer 105 and the second auxiliary electrode layer 106.

On the premise that the orthographic projection of the first auxiliary electrode layer 102 onto the base substrate 101 covers the first display region 101a, the first auxiliary electrode layer 102 may be disposed in the first region 101c1, the second region 101c2, the third region 101c3 and the fourth region 101c4 of the peripheral region 101c. Besides, a portion disposed in the first region 101c1 of the first auxiliary electrode layer 102 is connected to a portion disposed in the first region 101c1 of the first cathode layer 105. A portion disposed in the third region 101c3 of the first auxiliary electrode layer 102 is connected to a portion disposed in the third region 101c3 of the first cathode layer 105. A portion disposed in the fourth region 101c4 of the first auxiliary electrode layer 102 is connected to a portion disposed in the fourth region 101c4 of the first cathode layer 105. In addition, a portion disposed in the second region 101c2 of the first auxiliary electrode layer 102 is not connected to a portion disposed in the second region 101c2 of the first cathode layer 105.

Since other wires usually need to be disposed in the second region 101c2, the portion disposed in the second region 101c2 of the first auxiliary electrode layer 102 is not connected to the portion disposed in the second region 101c2 of the first cathode layer 105. Thus, setting of other wires may not be adversely affected.

Optionally, the first connection electrode 124, the second connection electrode 127, and the third connection electrode 130 may all be made from a transparent conductive material. Therefore, the transmittance of the second display region 101b may be ensured, and an imaging effect of the camera may be improved. In an exemplary embodiment, the first connection electrode 124, the second connection electrode 127, and the third connection electrode 130 may all be made from indium tin oxide (ITO).

Figure 16:
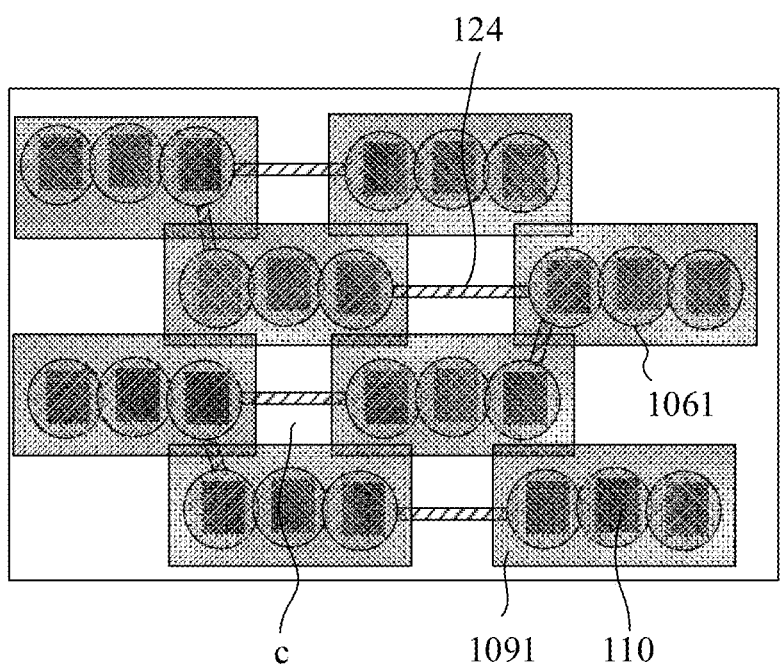
FIG. 16 is a schematic diagram of auxiliary electrode patterns and a second cathode layer according to an embodiment of the present disclosure.

As an optional embodiment, referring to FIG. 16, the second cathode layer 109 may include a plurality of cathode patterns 1091. The plurality of cathode patterns 1091 are overlapped with one another, and at least one hollowed-out region c may be defined by the plurality of cathode patterns 1091 that are overlapped with one another.

An orthographic projection of each cathode pattern 1091 onto the base substrate 101 may cover an orthographic projection of at least one light-emitting layer pattern 1081 onto the base substrate 101. For example, the orthographic projection of each cathode pattern 1091 onto the base substrate 101 may cover the orthographic projections of the three light-emitting layer patterns 1081 onto the base substrate 101. The three light-emitting layer patterns are respectively the light-emitting layer patterns of the three first sub-pixels. The three first sub-pixels are respectively a red (R) sub-pixel, a green (G) sub-pixel, and a blue (B) sub-pixel.

It can also be seen with reference to FIG. 16 that the orthographic projection of each auxiliary electrode pattern 1061 onto the base substrate 101 may cover the orthographic projections of at least one layer of opaque patterns in one pixel circuit 110 onto the base substrate 101. In addition, since the three pixel circuits 110 covered by the cathode patterns 1091 are proximal to one another, the three auxiliary electrode patterns 1061 covering the three pixel circuits 110 may directly overlap one another, instead of being connected by the first connection electrodes 124.

As another optional embodiment, referring to FIG. 4, each hollowed-out region in the second cathode layer 109 is formed by digging a hole in the second cathode layer 109.

Optionally, a boundary of the at least one hollowed-out region at least includes an arc shape. For example, the hollowed-out region may be circular or elliptical. Certainly, the at least one hollowed-out region may also be square or rectangular, which is not limited by the embodiment of the present disclosure. The hollowed-out region has an area ranging from 350 square microns to 630 square microns.

In the above two methods, the area of an overlap between the orthographic projection of each hollowed-out region onto the base substrate 101 and the orthographic projections of the auxiliary electrode patterns 1061 onto the base substrate 101 is less than 10% of the area of the hollowed-out region.

Figure 17:
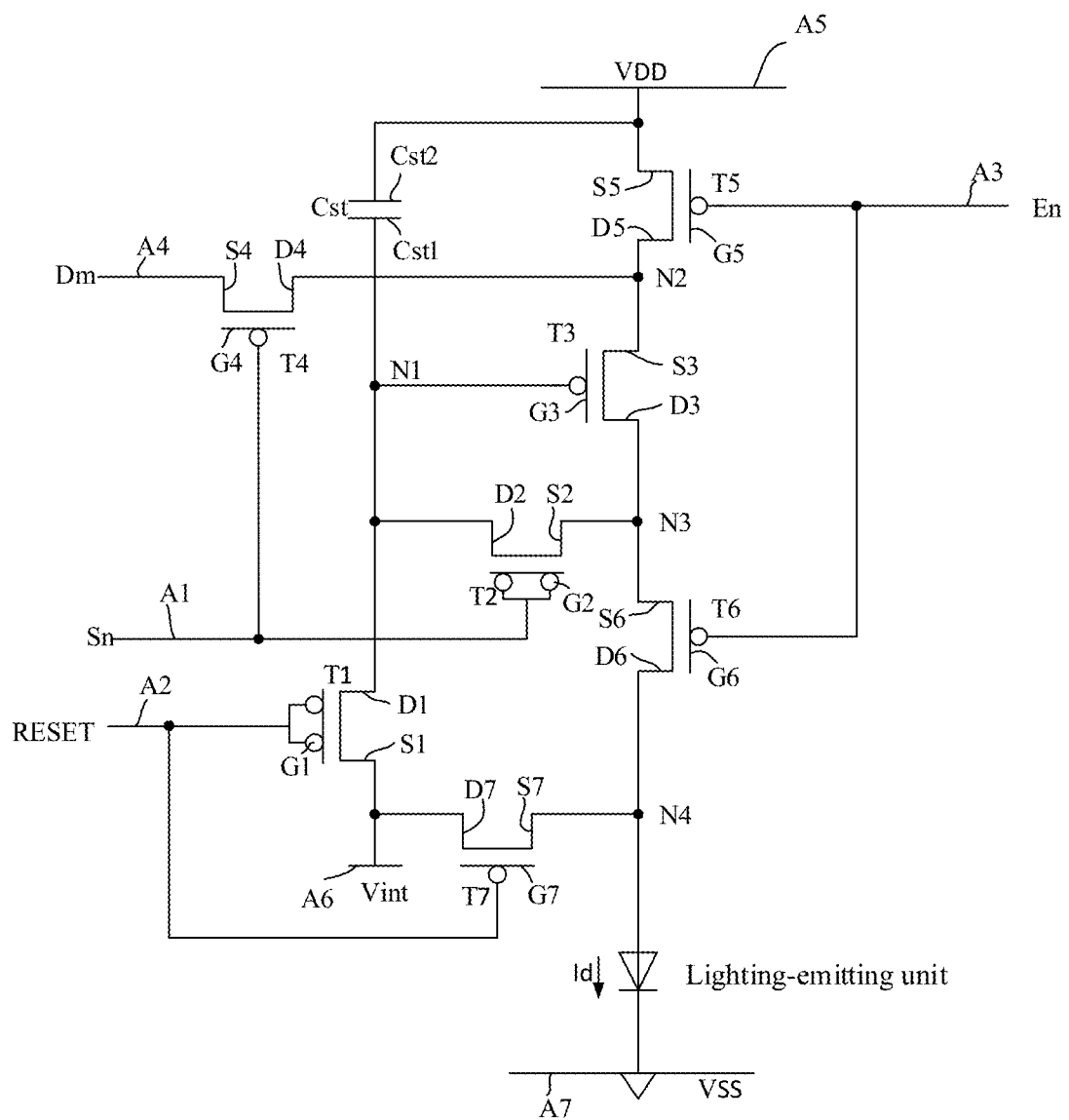
FIG. 17 is an equivalent circuit diagram of a pixel circuit according to an embodiment of the present disclosure.

FIG. 17 is an equivalent circuit diagram of a pixel circuit according to an embodiment of the present disclosure. It should be noted that in the embodiment of the present disclosure, an equivalent circuit diagram of the pixel circuit of the first sub-pixel disposed in the second display region 101b may be basically the same as that of the pixel circuit of the second sub-pixel disposed in the first display region 101a. That is, the equivalent circuit diagram shown in FIG. 17 may be an equivalent circuit diagram of a pixel circuit of a sub-pixel in the second display region 101b or the first display region 101a, to which the embodiment of the present disclosure is not limited however. In an embodiment of the present disclosure, the equivalent circuit diagram of the pixel circuit of the sub-pixel disposed in the second display region 101b may be different from the equivalent circuit diagram of the pixel circuit of the sub-pixel disposed in the first display region 101a.

Figure 18:
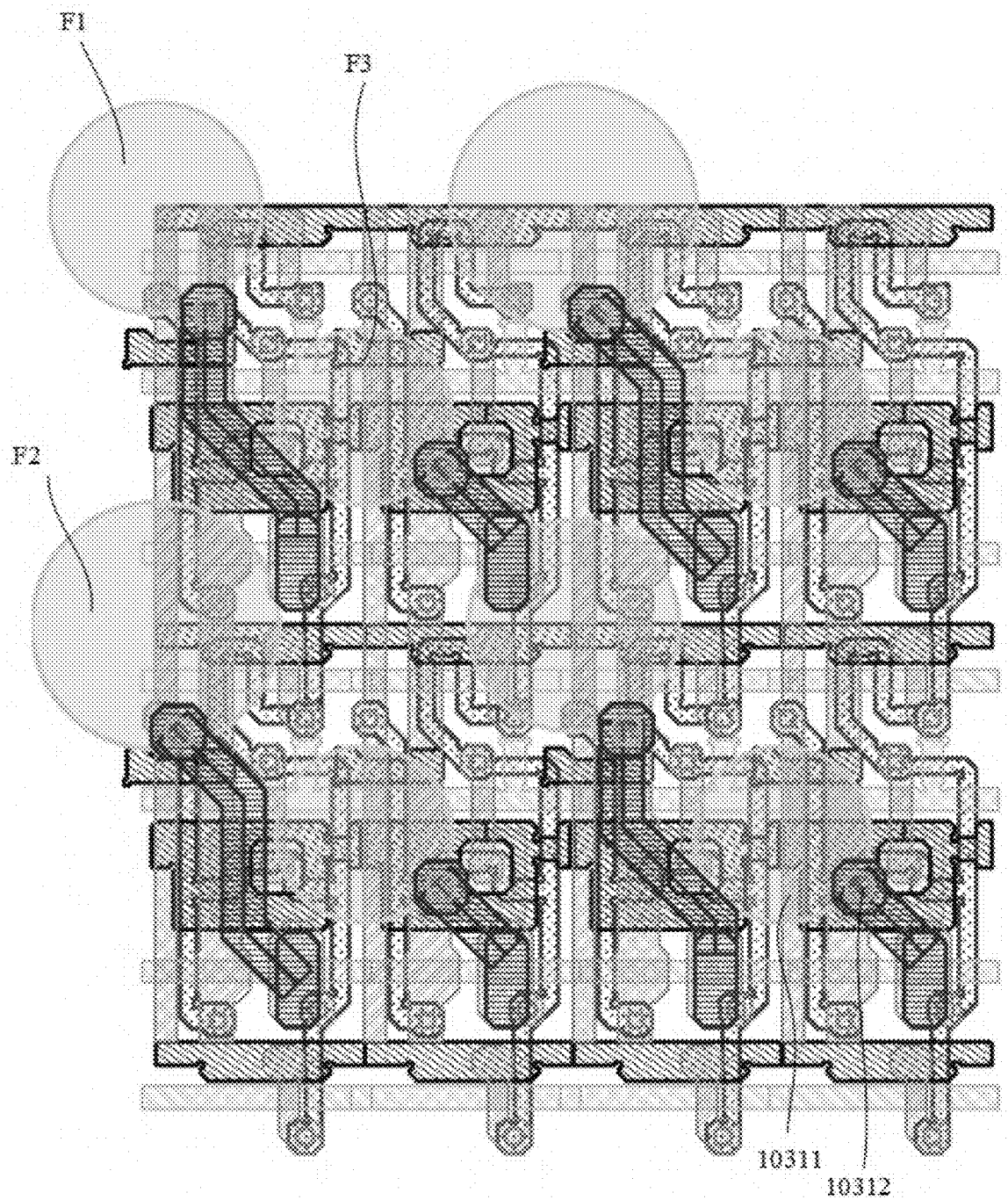
FIG. 18 is a planar diagram of a sub-pixel in a first display region according to an embodiment of the present disclosure.
Figure 19:
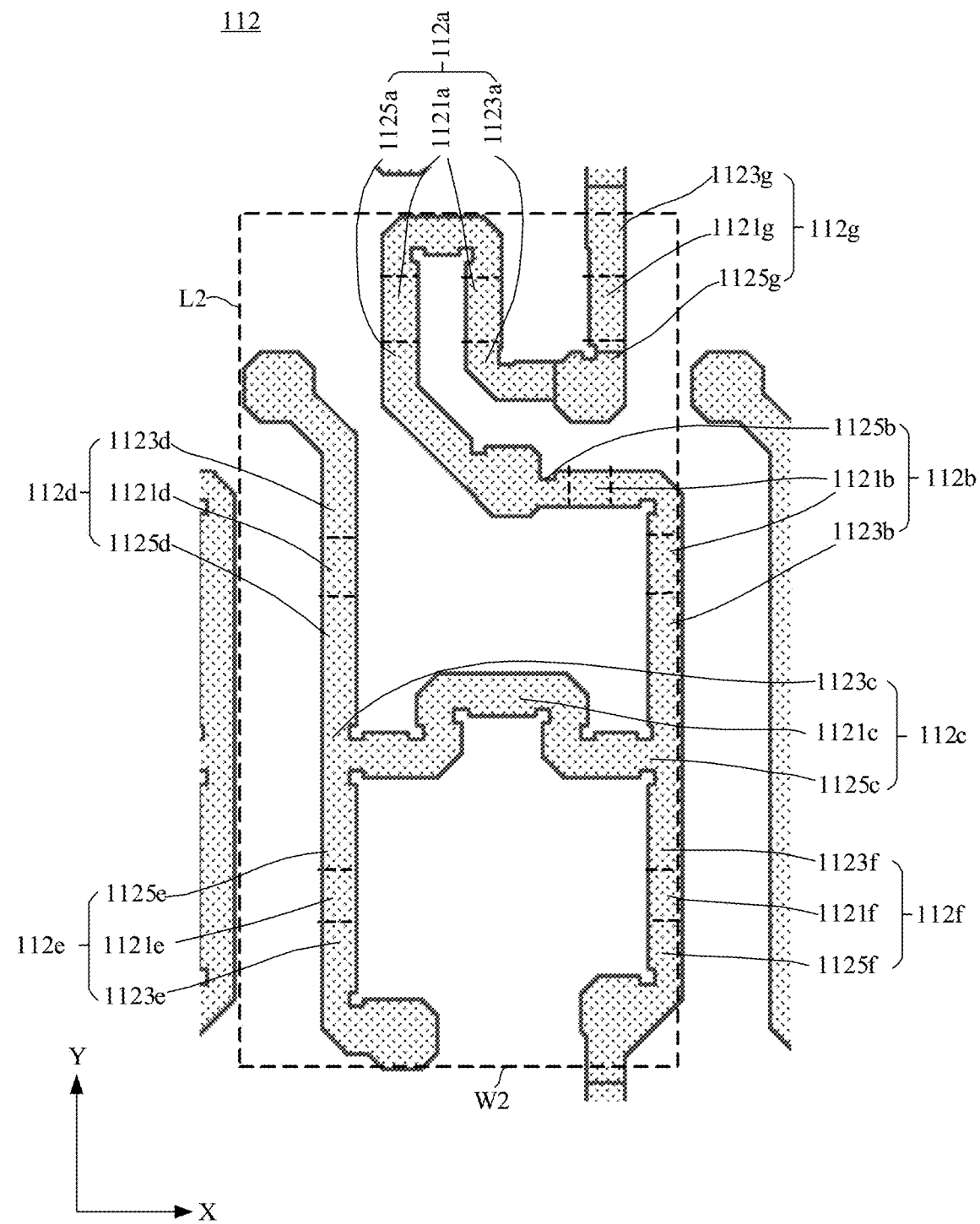
FIG. 19 is a planar diagram of an active layer of a sub-pixel included in one repeat unit in FIG. 18.
Figure 20:
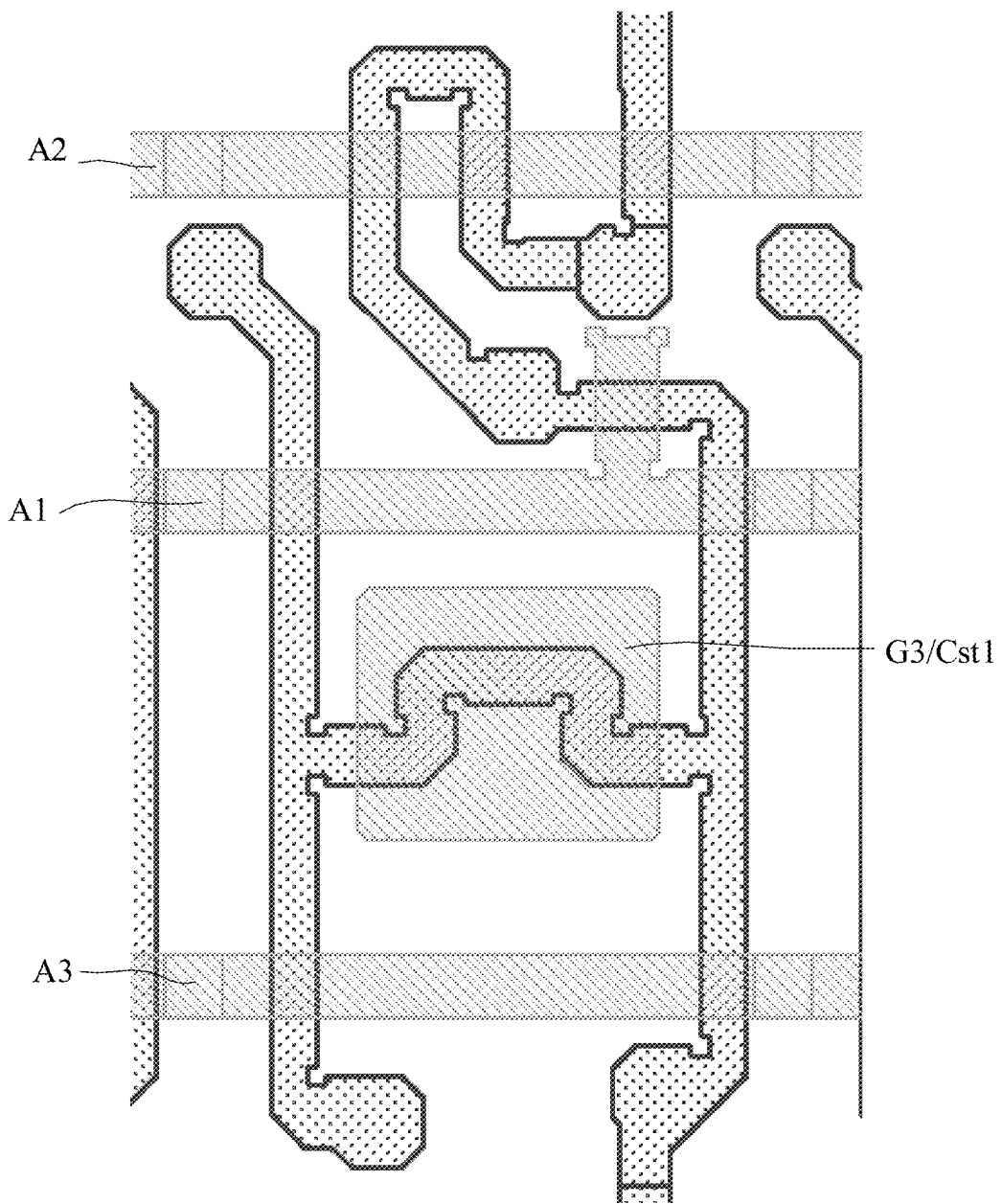
FIG. 20 is a planar diagram of a combination of an active layer and a first gate layer of a sub-pixel included in one repeat unit in FIG. 18.
Figure 21:
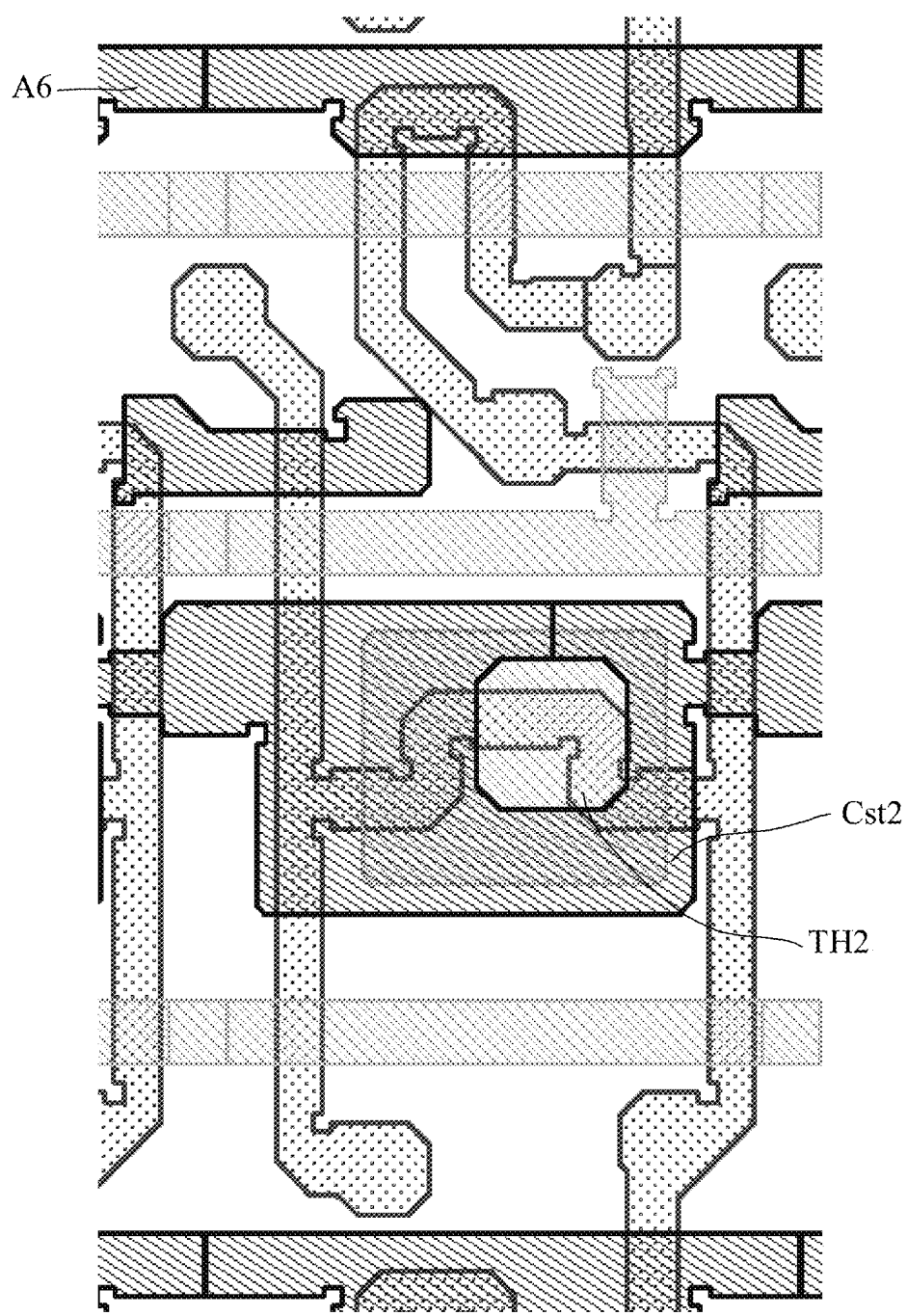
FIG. 21 is a planar diagram of a combination of an active layer and a first gate layer of a sub-pixel included in one repeat unit in FIG. 18.
Figure 22:
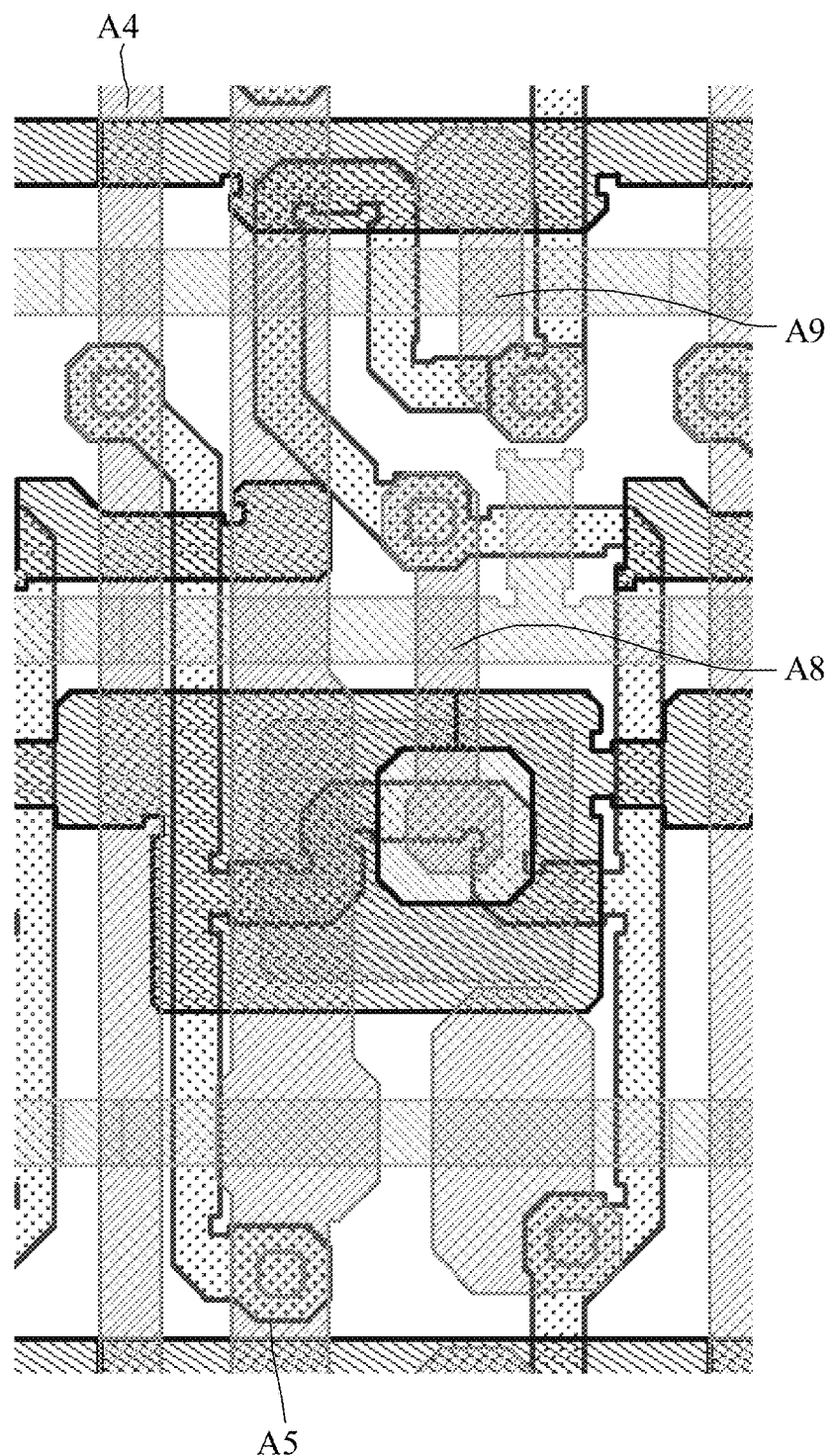
FIG. 22 is a planar diagram of a combination of an active layer, a first gate layer, a second gate layer and a first source/drain layer of a sub-pixel included by one repeat unit in FIG. 18.
Figure 23:
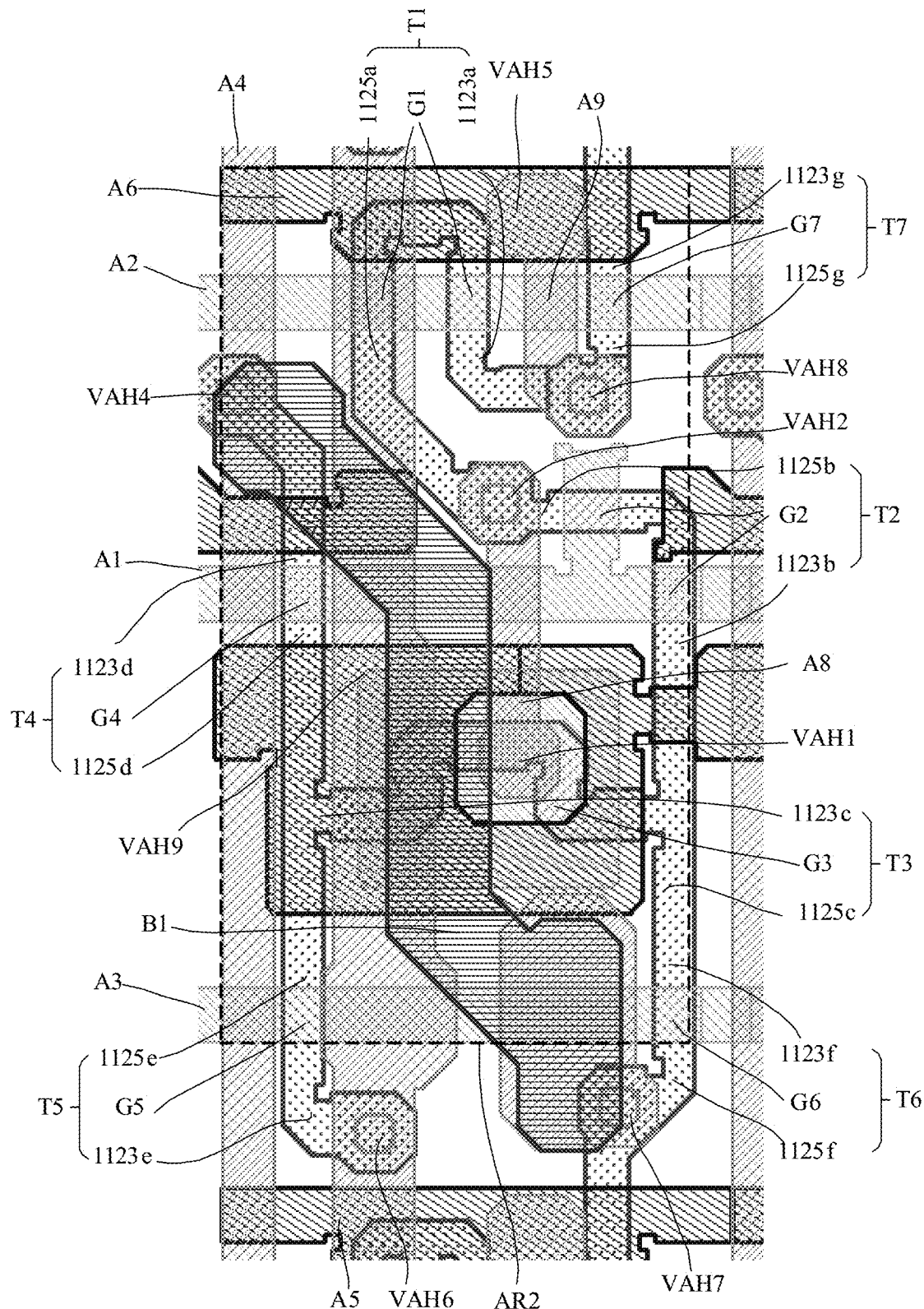
FIG. 23 is a planar diagram of a combination of an active layer, a first gate layer, a second gate layer, a first source/drain layer, and a second source/drain layer of a sub-pixel included in one repeat unit in FIG. 18.
Figure 24:
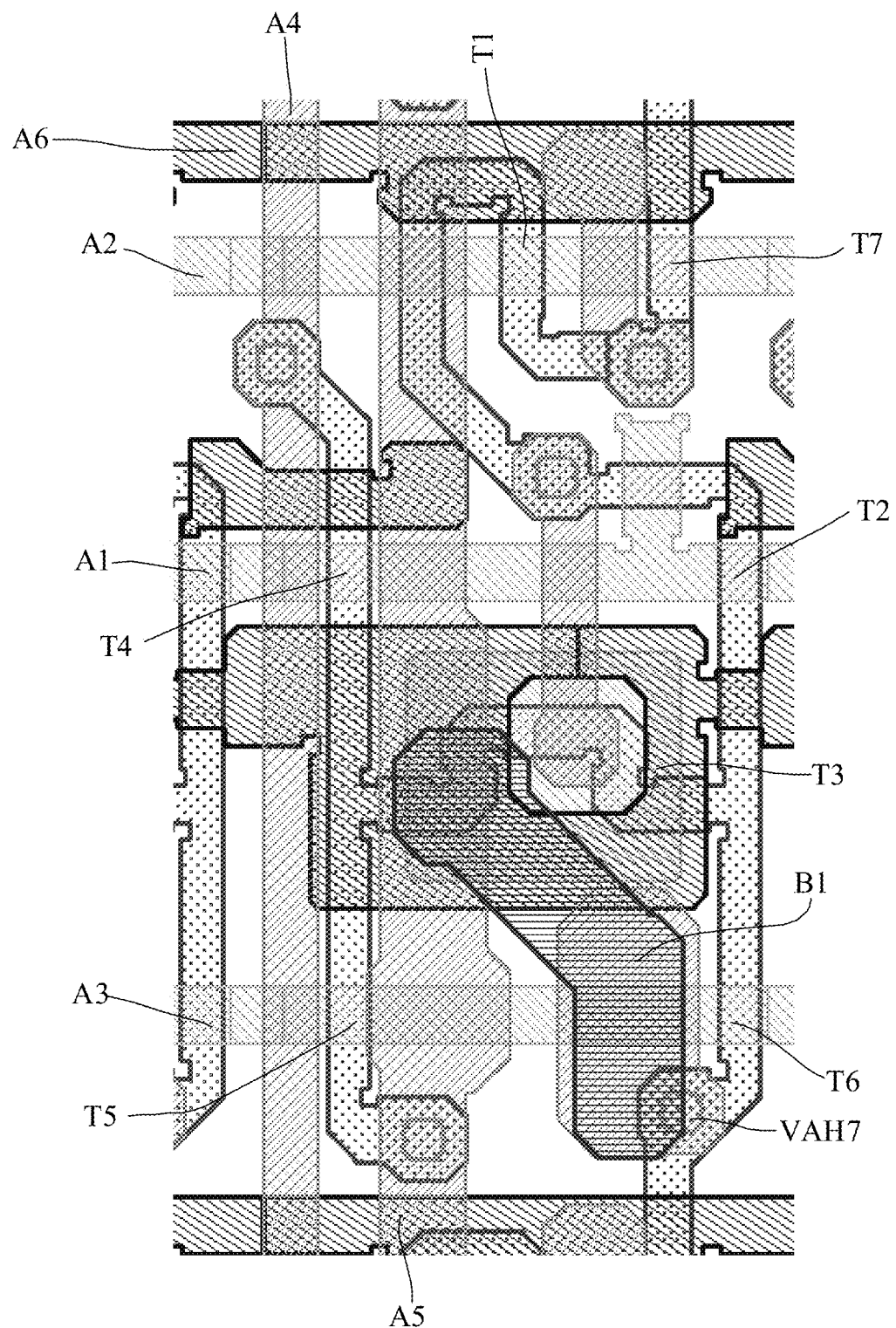
FIG. 24 is a planar diagram of a combination of an active layer, a first gate layer, a second gate layer, a first source/drain layer, and a second source/drain layer of a sub-pixel included in one repeat unit in FIG. 18.
Figure 25:
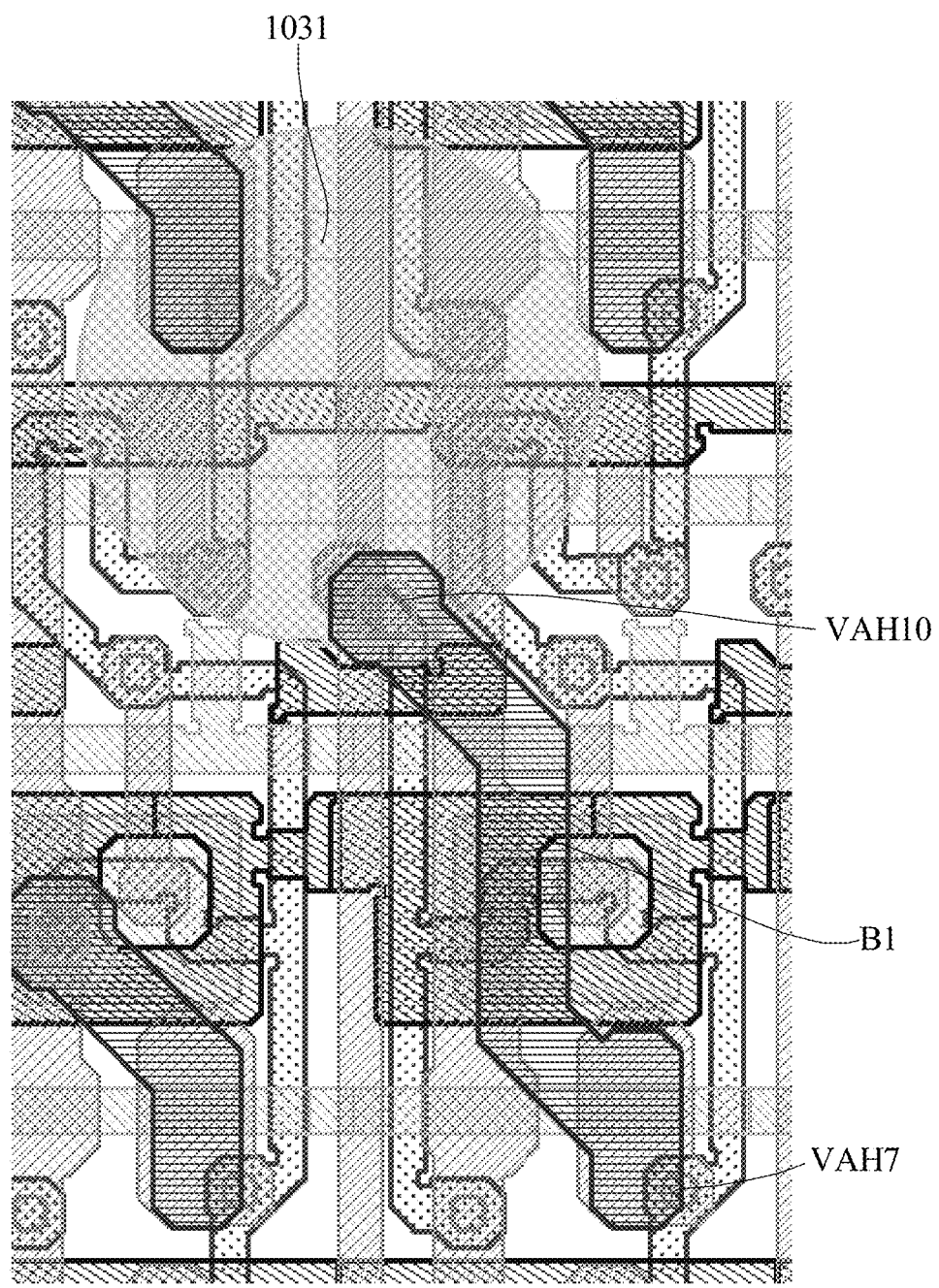
FIG. 25 is a planar diagram of a combination of an active layer, a first gate layer, a second gate layer, a first source/drain layer, a second source/drain layer, and a first anode of a sub-pixel included in one repeat unit in FIG. 18.

FIG. 18 is a planar diagram of a sub-pixel in a first display region according to an embodiment of the present disclosure, which schematically shows a planar diagram of one repeat unit in the first display region. FIG. 19 is a planar diagram of an active layer of a sub-pixel included in one repeat unit in FIG. 18. FIG. 20 is a planar diagram of a combination of an active layer and a first gate layer of a sub-pixel included by one repeat unit in FIG. 18. FIG. 21 is a planar diagram of a combination of an active layer, a first gate layer and a second gate layer of a sub-pixel included in one repeat unit in FIG. 18. FIG. 22 is a planar diagram of a combination of an active layer, a first gate layer, a second gate layer and a first source/drain layer of a sub-pixel included in one repeat unit in FIG. 18. FIG. 23 is a planar diagram of a combination of an active layer, a first gate layer, a second gate layer, a first source/drain layer, and a second source/drain layer of a sub-pixel included in one repeat unit in FIG. 18. FIG. 24 is a planar diagram of a combination of an active layer, a first gate layer, a second gate layer, a first source/drain layer, and a second source/drain layer of a sub-pixel included in one repeat unit in FIG. 18. FIG. 25 is a planar diagram of a combination of an active layer, a first gate layer, a second gate layer, a first source/drain layer, a second source/drain layer, and a first anode of a sub-pixel included in one repeat unit in FIG. 18.

In an embodiment of the present disclosure, the pixel circuit disposed in the first display region 101a and the pixel circuit disposed in the second display region 101b in the display panel 10 may each include a plurality of thin film transistors and one storage capacitor. The pixel circuit is configured to drive the light-emitting unit. The plurality of thin film transistors include a first transistor T1, a second transistor T2, a third transistor T3, a fourth transistor T4, a fifth transistor T5, a sixth transistor T6 and a seventh transistor T7. Each transistor includes a gate, a source and a drain.

In addition, the display panel 10 may further include a plurality of signal lines. For example, the plurality of signal lines include a scanning signal line (also referred to as a gate signal line) A1 for transmitting a scanning signal, a reset control signal line A2 for transmitting a reset control signal (e.g., the reset control signal may be a scanning signal of the previous row), an emission control line A3 for transmitting an emission control signal, a data signal line A4 for transmitting a data signal, a positive power line A5 for transmitting a positive power signal, an initializing voltage line A6 for transmitting an initializing voltage Vint, and a negative power line A7 for transmitting a negative power signal.

The storage capacitor Cst may include two capacitor plates Cst1 and Cst2. In this text, the capacitor plate Cst1 may be referred to as one end, a first end, or a first storage capacitor electrode of the storage capacitor Cst, and the capacitor plate Cst2 may be referred to as the other end, a second end, or a second storage capacitor electrode of the storage capacitor Cst.

The first transistor T1, the second transistor T2, the third transistor T3, the fourth transistor T4, the fifth transistor T5, the sixth transistor T6, and the seventh transistor T7 included by the pixel circuit may be formed along the active layer as shown in FIG. 19. The active layer may be in a curved or bent shape, and may include a first active pattern 112a corresponding to the first transistor T1, a second active pattern 112b corresponding to the second transistor T2, a third active pattern 112c corresponding to the third transistor T3, a fourth active pattern 112d corresponding to the fourth transistor T4, a fifth active pattern 112e corresponding to the fifth transistor T5, a sixth active pattern 112f corresponding to the sixth transistor T6, and a seventh active pattern 112g corresponding to the seventh transistor T7.

The active layer 112 may be made from, for example, polysilicon, and includes, for example, a channel region, a source region and a drain region. The channel region may not be doped or has a doping type different from those of the source region and the drain region, and therefore has features of a semiconductor. The source region and the drain region are respectively disposed on two sides of the channel region, are doped with impurities, and therefore have electrical conductivity. The impurities may vary depending on whether the thin film transistor is an N-type or P-type transistor.

The first transistor T1 includes a first active pattern 112*a* and a first gate G1. The first active pattern 112*a* includes a first channel region 1121*a*, a first source region 1123*a*, and a first drain region 1125*a*. The gate G1 of the first transistor T1 is electrically connected to the reset control signal line A2, and the source S1 of the first transistor T1 is electrically connected to the initialization voltage line A6. The drain D1 of the first transistor T1 is electrically connected to one end Cst1 of the storage capacitor Cst1, the drain D2 of the second transistor T2, and the gate G3 of the third transistor T3. The first transistor T1 is turned on according to the reset control signal RESET transmitted by the reset control signal line A2 to transmit the initialization voltage Vint to the gate G1 of the third transistor T3, so as to perform an initialization operation to initialize the voltage of the gate G3 of the third transistor T3. That is, the first transistor T1 is also called an initialization transistor.

The second transistor T2 includes a second active pattern 112*b* and a second gate G2. The second active pattern 112*b* includes a second channel region 1121*b*, a second source region 1123*b*, and a second drain region 1125*b*. The gate G2 of the second transistor T2 is electrically connected to the scanning signal line A1, the source S2 of the second transistor T2 is electrically connected to a node N3, and the drain D2 of the second transistor T2 is electrically connected to a node N1. The second transistor T2 is turned on according to a scanning signal transmitted by the scanning signal line A1 to electrically connect the gate G3 to the drain D3 of the third transistor T3, so as to perform diode connection on the third transistor T3.

The third transistor T3 includes a third active pattern 112*c* and a third gate G3. The third active pattern 112*c* includes a third source region 1123*c*, a third drain region 1125*c*, and a third channel region 1121*c* by which the third source region 1123*c* and the third drain region 1125*c* are connected. The third source region 1123*c* and the third drain region 1125*c* extend in two opposite directions with respect to the third channel region 1121*c*. The third source region 1123*c* of the third transistor T3 is connected to a fourth drain region 1125*d* and a fifth drain region 1125*e*. The third drain region 1125*c* is connected to a second source region 1123*b* and a sixth source region 1123*f*. The gate G3 of the third transistor T3 is electrically connected to a first connection portion A8 through via holes VAH1 and VAH2. The gate G3 of the third transistor T3 is electrically connected to a node N1, the source S3 of the third transistor T3 is electrically connected to a node N2, and the drain D3 of the third transistor T3 is electrically connected to a node N3. The third transistor T3 receives a data signal Dm according to an on-off operation of the fourth transistor T4 to supply driving current Id for the light-emitting unit. That is, the third transistor T3 is also called a driving transistor.

The fourth transistor T4 includes a fourth active layer 112*d* and a fourth gate G4. The fourth active layer 112*d* includes a fourth channel region 1121*d*, a fourth source region 1123*c*, and a fourth drain region 1125*d*. The fourth transistor T4 is used as a switching device for selecting a target sub-pixel for light emission. The fourth gate G4 is connected to the scanning signal line A1, the fourth source region 1123*c* is connected to a data signal line A4 through a via hole VAH4, and the fourth drain region 1125*d* is connected to the first transistor T1 and the fifth transistor T5, i.e., the fourth drain region 1125*d* is electrically connected to the node N2. The fourth transistor T4 is turned on according to the scanning signal Sn transmitted by the scanning signal line A1 to perform a switching operation so as to transmit the data signal Dm to the source S3 of the third transistor T3.

The fifth transistor T5 includes a fifth active layer 112*e* and a fifth gate G5. The fifth active layer 112*e* includes a fifth channel region 1121*e*, a fifth source region 1123*e*, and a fifth drain region 1125*e*. The fifth source region 1123*e* may be connected to a positive power line A5 through a via hole VAH6. The gate G5 of the fifth transistor T5 is electrically connected to an emission control line A3, and the source S5 of the fifth transistor T5 is electrically connected to the positive power supply line A5. Moreover, the drain D5 of the fifth transistor T5 is electrically connected to the node N2.

The sixth transistor T6 includes a sixth active layer 112*f* and a sixth gate G6, and the sixth active layer 112*f* includes a sixth channel region 1121*f*, a sixth source region 1123*f*, and a sixth drain region 1125*f*. The sixth drain region 1125*f* may be connected to the anode pattern through a via hole VAH7. The gate G6 of the sixth transistor T6 is electrically connected to the emission control line A3, the source S6 of the sixth transistor T6 is electrically connected to the node N3, and the drain D6 of the sixth transistor T6 is electrically connected to a node N4, i.e., the drain D6 of the sixth transistor T6 is electrically connected to an anode pattern of the light-emitting unit. The fifth transistor T5 and the sixth transistor T6 are turned on concurrently (for example, simultaneously) according to an emission control signal En transmitted by the emission control line A3 so as to transmit the driving voltage VDD to the light-emitting unit, thereby allowing driving current Id to flow into the light-emitting unit.

The seventh transistor T7 includes a seventh active layer 112*g* and a seventh gate G7. The seventh active layer 112*g* includes a seventh source region 1123*g*, a seventh drain region 1125*g*, and a seventh channel region 1121*g*. The seventh drain region 1125*g* is connected to a first source region 1123*a* of the first transistor T1. The seventh drain region 1125*g* may be electrically connected to an initialization voltage line A6 through a via hole VAH8, a second connection portion A9, and a via hole VAH5. The gate G7 of the seventh transistor T7 is electrically connected to the reset control signal line A2, the source S7 of the seventh transistor T7 is electrically connected to the node N4, and the drain D7 of the seventh transistor T7 is electrically connected to the initialization voltage line A6.

One end of the storage capacitor Cst (hereinafter referred to as a first storage capacitor electrode) Cst1 is electrically connected to the node N1, and the other end (hereinafter referred to as a second storage capacitor electrode) Cst2 is electrically connected to the positive power supply line A5.

It should be noted that each of the thin film transistors T1, T2, T3, T4, T5, T6, and T7 is a p-channel field effect transistor, which is not limited by the embodiment of the present disclosure, and at least some of the thin film transistors T1, T2, T3, T4, T5, T6, and T7 may be n-channel field effect transistors.

The display panel 10 includes the scanning signal line A1, the reset control signal line A2, the emission control line A3 and the initialization voltage line A6 that are disposed in a row direction to respectively apply the scanning signal Sn, the reset control signal RESET, the emission control signal En, and the initialization voltage Vint to each sub-pixel. The display panel may further include a data signal line A4 and a positive power line A5 that cross the scanning signal line A1, the reset control signal line A2, the emission control line A3, and the initialization voltage line A6 to apply the data signal Dm and the driving voltage VDD to each sub-pixel.

As shown in FIG. 20, the scanning signal line A1, the reset control signal line A2, and the emission control line A3 are all disposed in the first gate layer 113. The gates G1 to G7 of each of the above-mentioned transistors are also disposed in the first gate layer 113. For example, portions of the reset control signal line A2 overlapping the active layer 112 form the gate G1 of the first transistor T1 and the gate G7 of the seventh transistor T7 respectively, portions of the scanning signal line A1 overlapping the active layer 112 form the gate G2 of the second transistor T2 and the gate G4 of the fourth transistor T4, and portions of the emission control line A3 overlapping the active layer 112 form the gate G6 of the sixth transistor T6 and the gate G5 of the fifth transistor T5 respectively.

Continuously referring to FIG. 20, the display panel 10 may further include a plurality of first storage capacitor electrodes Cst1. The plurality of first storage capacitor electrodes Cst1 are also disposed in the first gate layer 113. A portion of the first storage capacitor electrode Cst1 overlapping the active layer 1120 forms the third gate G3 of the third transistor T3. The first storage capacitor electrode Cst1 also forms one terminal of the storage capacitor Cst. That is, the first storage capacitor electrode Cst1 simultaneously serves as the gate G3 of the third transistor T3 and one electrode of the storage capacitor Cst.

For example, an orthographic projection of the first storage capacitor electrode Cst1 onto the base substrate 101 may be substantially rectangular. The "substantially rectangular" herein may include a rectangle, a rectangle with at least one rounded corner, a rectangle with at least one chamfered corner, etc.

As shown in FIG. 21, the initialization voltage line A6 is disposed in the second gate layer 115. The display panel may further include a plurality of second storage capacitor electrodes Cst2. The plurality of second storage capacitor electrodes Cst2 are also disposed in the second gate layer 115. The plurality of second storage capacitor electrodes Cst2 are respectively arranged corresponding to the plurality of first storage capacitor electrodes Cst1. That is, orthographic projections of the plurality of second storage capacitor electrodes Cst2 onto the base substrate 101 are at least partially overlapped with orthographic projections of the corresponding first storage capacitor electrodes Cst1 onto the base substrate 101. The second storage capacitor electrode Cst2 forms another terminal of the storage capacitor Cst. That is, the first storage capacitor electrode Cst1 and the second storage capacitor electrode Cst2 are disposed oppositely, orthographic projections of the first storage capacitor electrode Cst1 are at least partially overlapped with orthographic projections of the second storage capacitor electrode Cst2 onto the base substrate 101, and a second gate insulation layer GI2 is disposed between the first storage capacitor electrode Cst1 and the second storage capacitor electrode Cst2. For example, the first storage capacitor electrode Cst1 may be electrically connected to the first connection portion A8 through the via holes VAH1 and VAH2, and the second storage capacitor electrode Cst2 may be electrically connected to the positive power line A5 through the via hole VAH9. In this way, the portion where the first storage capacitor electrode Cst1 and the second storage capacitor electrode Cst2 overlap each other may form the storage capacitor Cst.

With reference to FIGS. 21 and 23, the second storage capacitor electrode Cst2 may include a through hole TH2 to facilitate an electrical connection between the first storage capacitor electrode Cst1 disposed below the second storage capacitor electrode Cst2 and a component disposed in the third conduction layer 23. For example, the first connection portion A8 is partially formed in the via hole VAH1 to form a conductive plug. The conductive plug extends through a through hole TH2 and is electrically connected to the first storage capacitor electrode Cst1. In this way, one end of the first connection portion A8 is electrically connected to one end Cst1 of the storage capacitor.

For example, an orthographic projection of the through hole TH2 onto the base substrate 1 may be substantially rectangular. The "substantially rectangular" herein may include a rectangle or a square, a rectangle or square with at least one rounded corner, a rectangle or square with at least one chamfered corner, etc.

Referring to FIG. 22, the data signal line A4 and the positive power supply line A5 are disposed in the first source/drain layer 118. In addition, the first connection portion A8 and the second connection portion A9 are also disposed in the first source/drain layer 118.

Referring to FIGS. 23, 24, and 25, a third connection portion B1 is disposed in the second source/drain layer 121. One end of the third connection portion B1 is electrically connected to the sixth transistor T6, and the other end thereof is electrically connected to the anode pattern.

Referring to FIG. 25, there is a passivation layer PVX between the second source/drain layer 121 and the first anode layer 103. The via hole VAH10 may penetrate the passivation layer PVX. Part of the anode pattern of the first anode layer is formed in the via hole VAH10 and extends downwards to be electrically connected to part of the third connection portion B1.

In this way, one end of the third connection portion B1 is electrically connected to the sixth transistor T6 through the via hole VAH7, and the other end of the third connection portion B1 is electrically connected to the anode pattern of the first anode layer through the via hole VAH10. In order to meet the requirement for a preset pixel density, each sub-pixel on the display panel needs to be arranged in a prescribed manner. In this way, the third connection portions B1 in the sub-pixels may have the same or different extension lengths.

For example, referring to FIGS. 18, 23, and 24, FIG. 23 shows a planar diagram of a pixel circuit of a red sub-pixel or a blue sub-pixel, and FIG. 24 shows a planar diagram of a pixel circuit of a green sub-pixel. The third connection portion B1 in the sixth sub-pixel 23 may have an extension length less than that of the third connection portion B1 in the fourth sub-pixel 21 or the fifth sub-pixel 22.

It should be noted that differences between the structure of the first sub-pixel disposed in the second display region 101b and the structure of the second sub-pixel disposed in the first display region 101a are mainly explained in the following descriptions. For their similarities, a reference may be made to the above descriptions.

It should also be noted that in order to make the description of the text more concise, elements with the same or similar functions and/or structures in the first display region and the second display region may be represented by the same reference numerals. For example, the transistors, the storage capacitors, and the signal lines disposed in the second display region may be respectively represented by the reference numerals corresponding to the transistors, the storage capacitors, and the signal lines disposed in the first display region. It should be understood that in the following descriptions, these elements are disposed in the second display region 101b.

Figure 26:
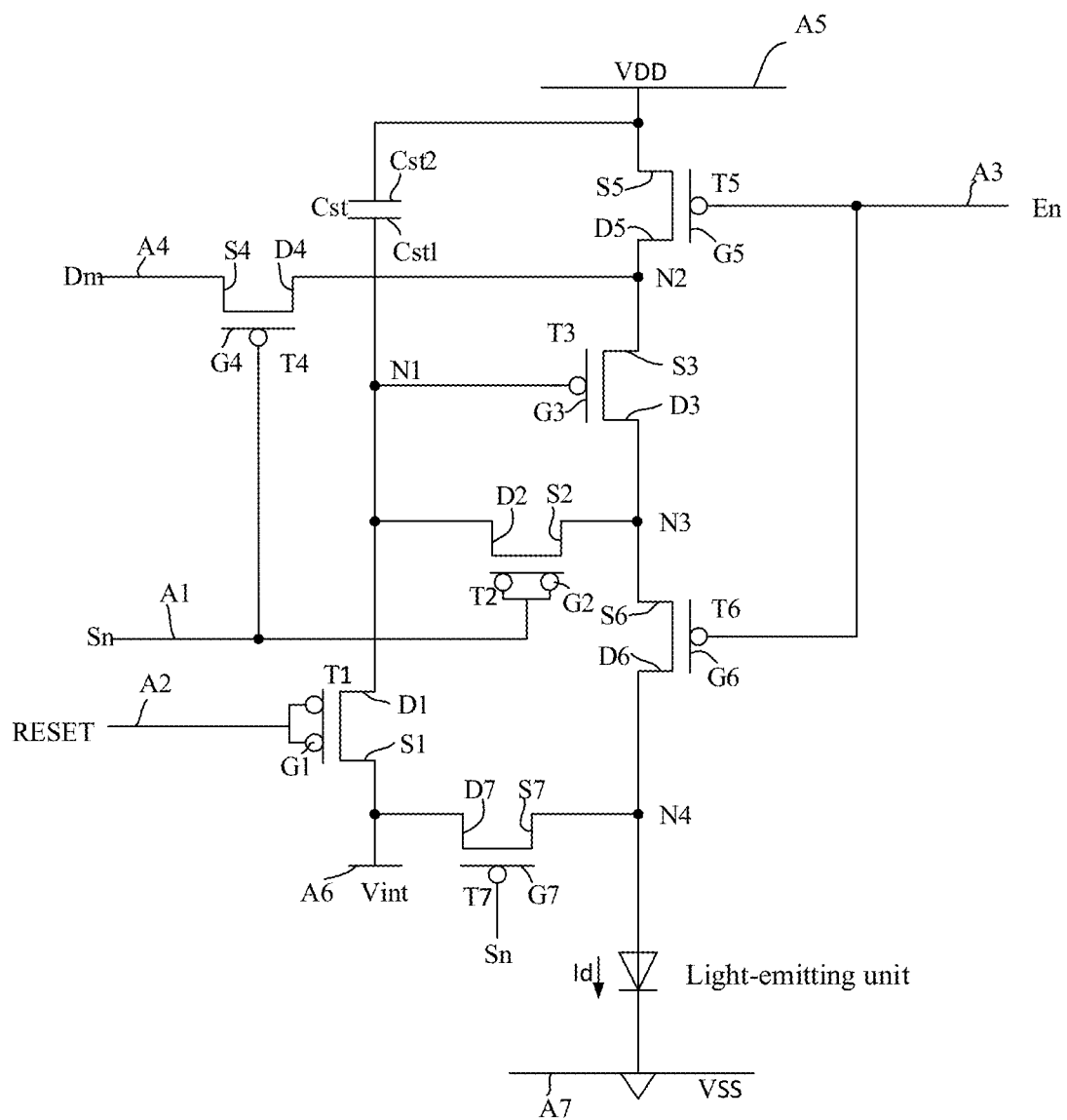
FIG. 26 is an equivalent circuit diagram of another pixel circuit according to an embodiment of the present disclosure.
Figure 27:
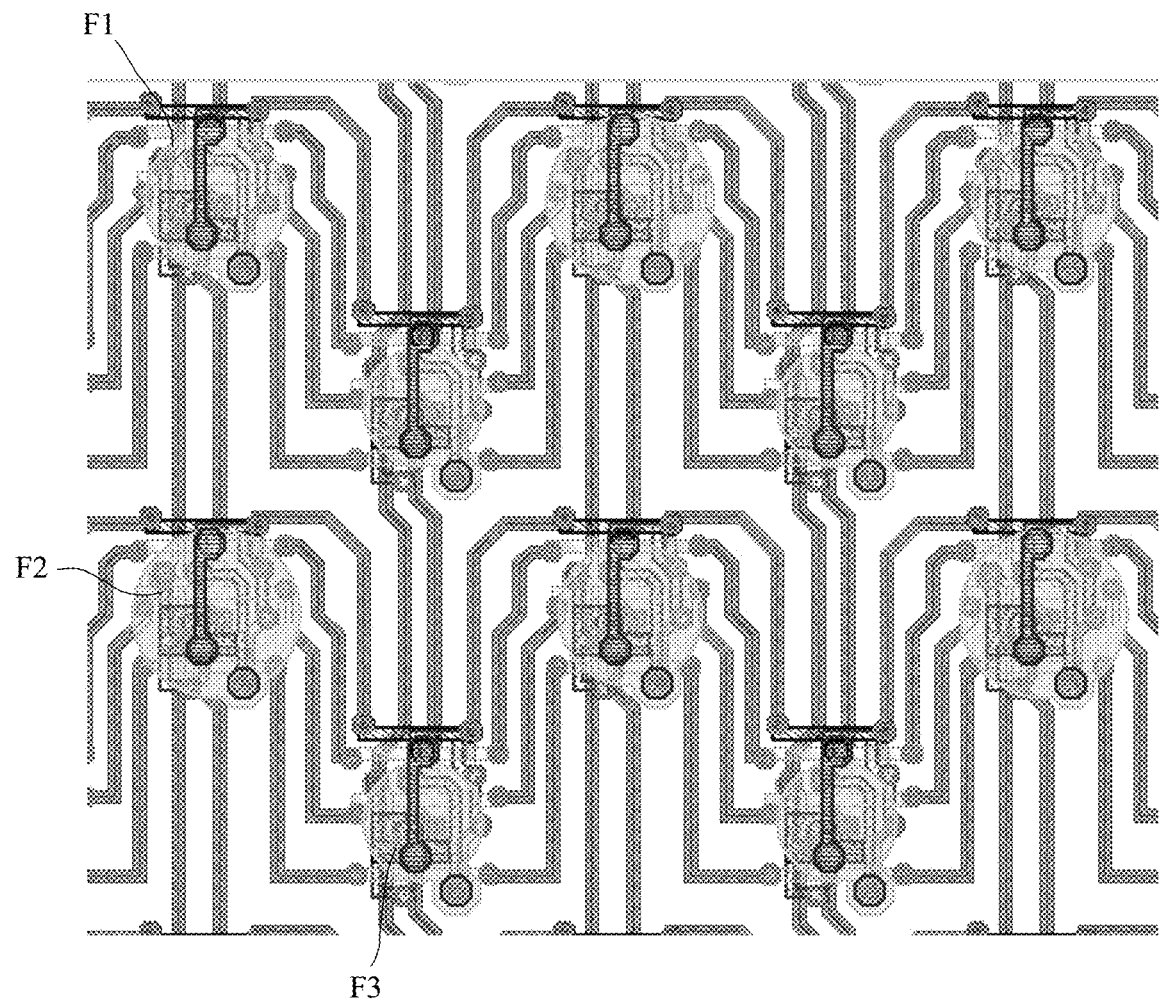
FIG. 27 is a planar diagram of a sub-pixel in a second display region according to an embodiment of the present disclosure.
Figure 28:
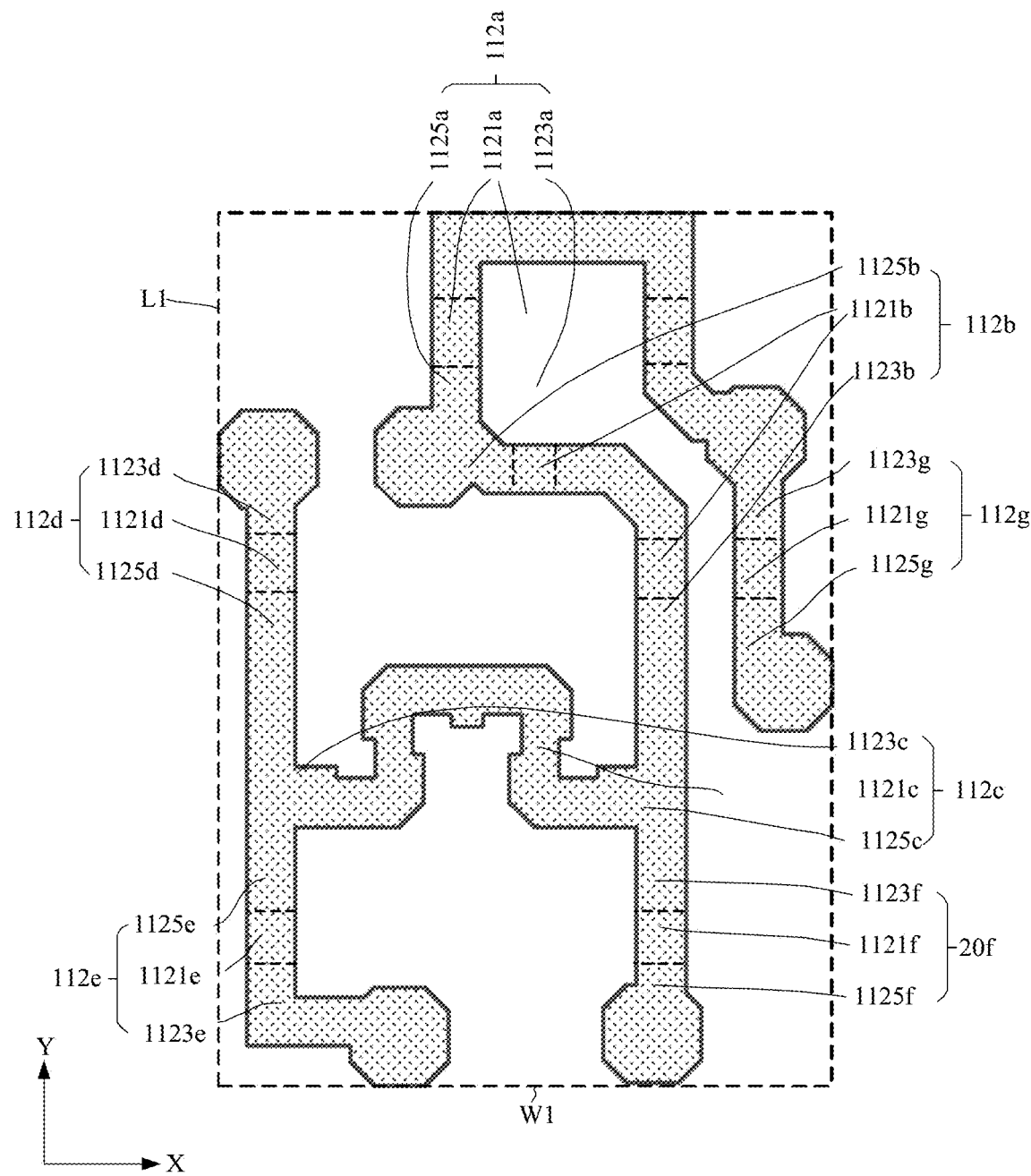
FIG. 28 is a planar diagram of an active layer of a sub-pixel included in one repeat unit in FIG. 27.
Figure 29:
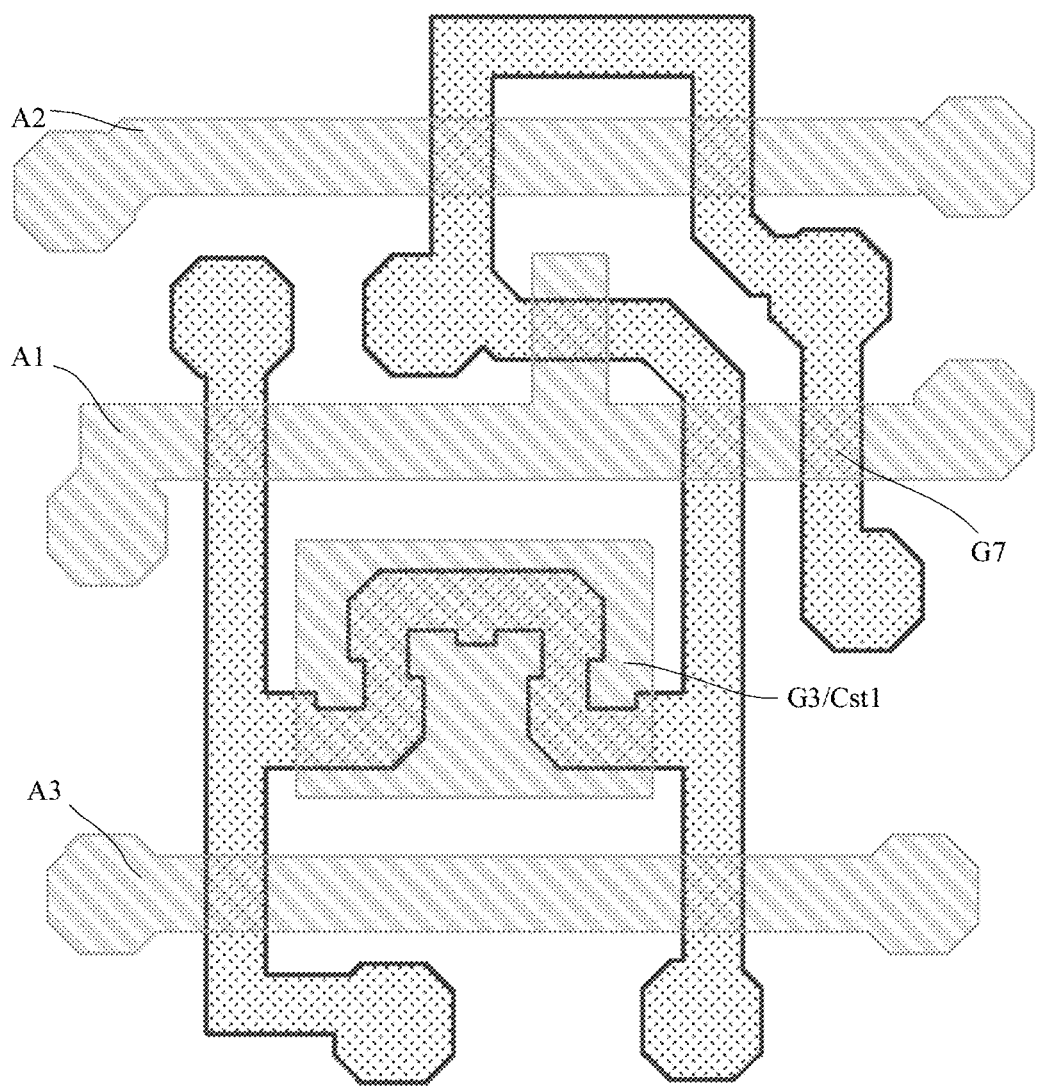
FIG. 29 is a planar diagram of a combination of an active layer and a first gate layer of a sub-pixel included in one repeat unit in FIG. 27.
Figure 30:
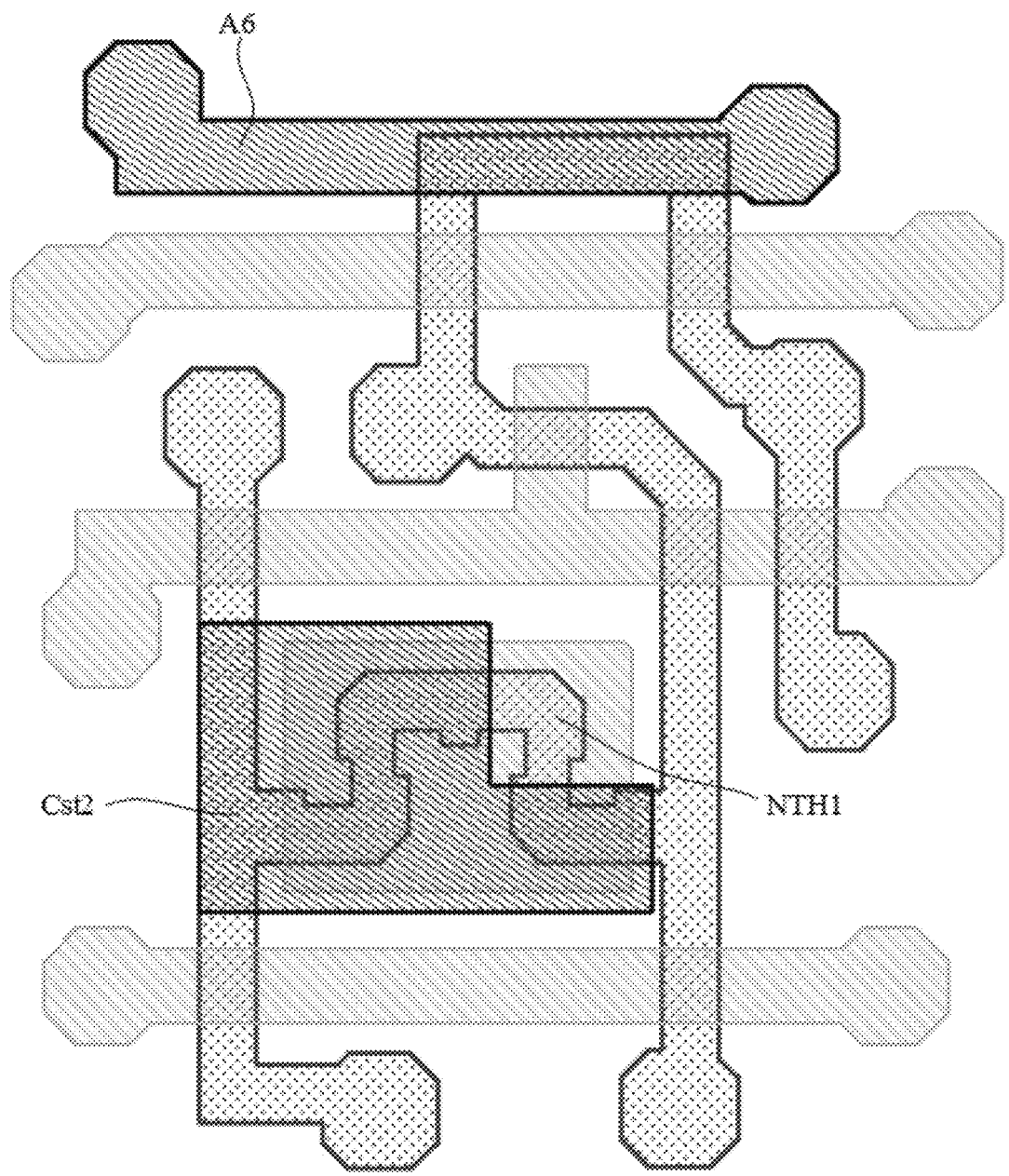
FIG. 30 is a planar diagram of a combination of an active layer, a first gate layer, and a second gate layer of a sub-pixel included in one repeat unit in FIG. 27.
Figure 31:
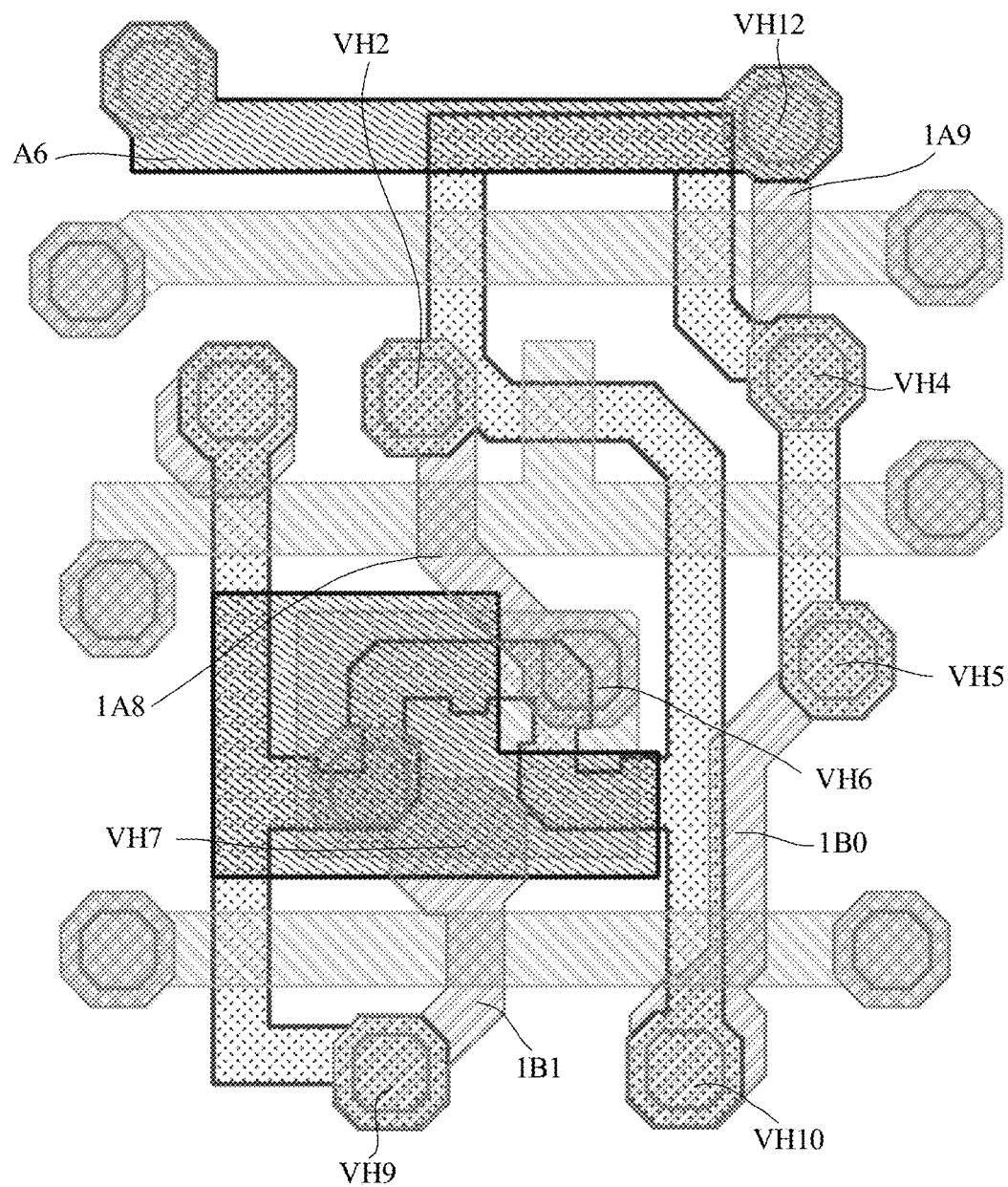
FIG. 31 is a planar diagram of a combination of an active layer, a first gate layer, a second gate layer, and a first source/drain layer of a sub-pixel included in one repeat unit in FIG. 27.
Figure 32:
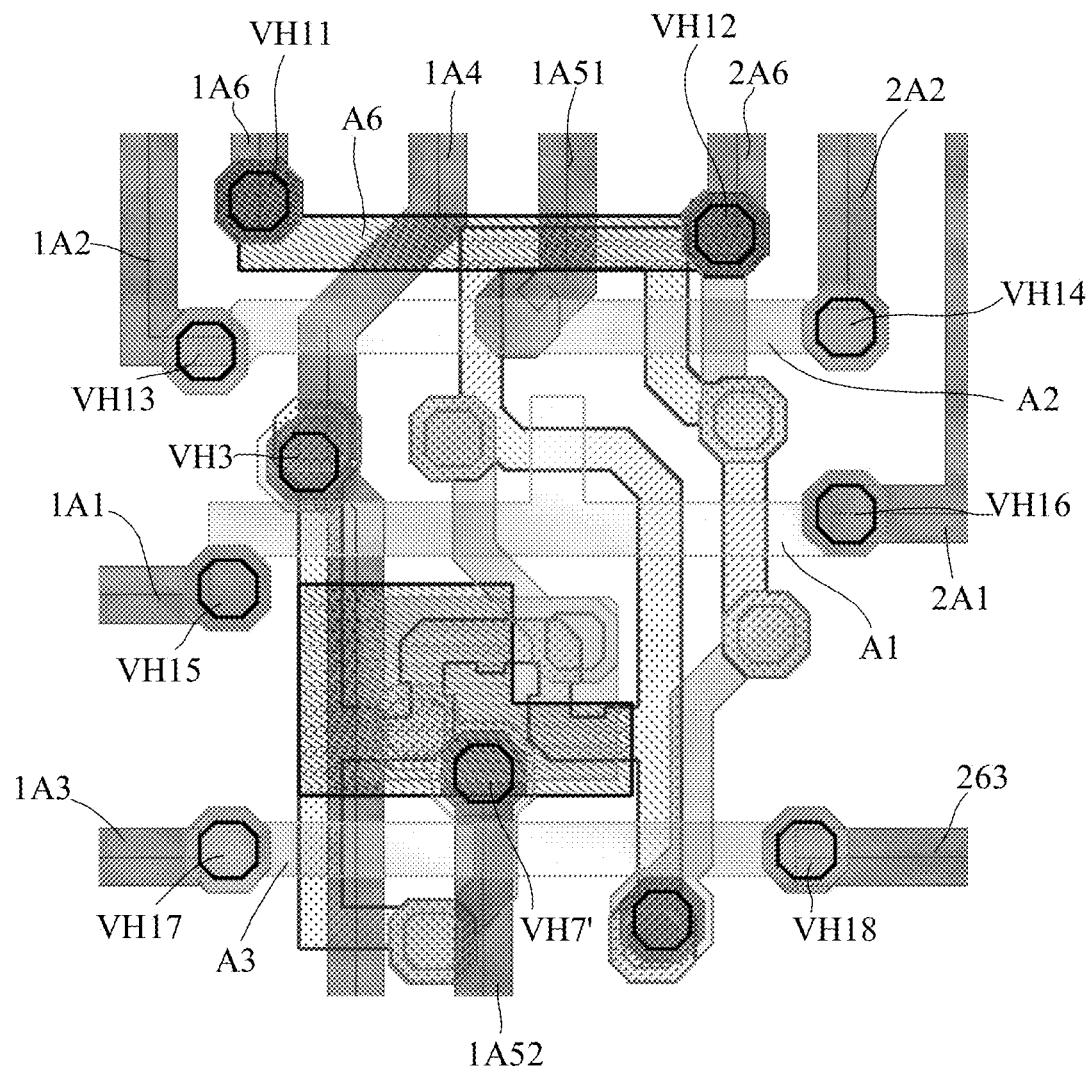
FIG. 32 is a planar diagram of a combination of an active layer, a first gate layer, a second gate layer, a first source/drain layer, and a connection electrode film layer of a sub-pixel included in one repeat unit in FIG. 27.
Figure 33:
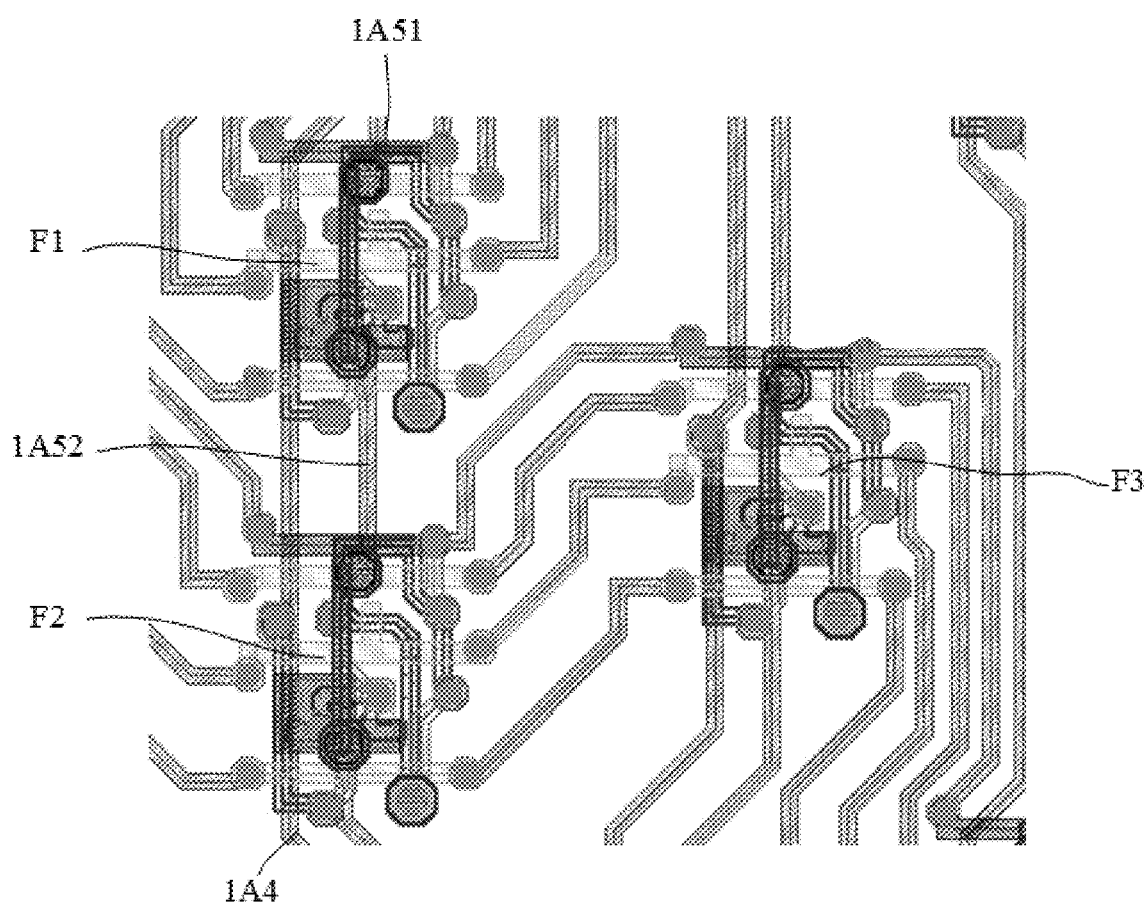
FIG. 33 is a planar diagram of a combination of an active layer, a first gate layer, a second gate layer, a first source/drain layer, and a connection electrode film layer of three sub-pixels included in one repeat unit in FIG. 27.
Figure 34:
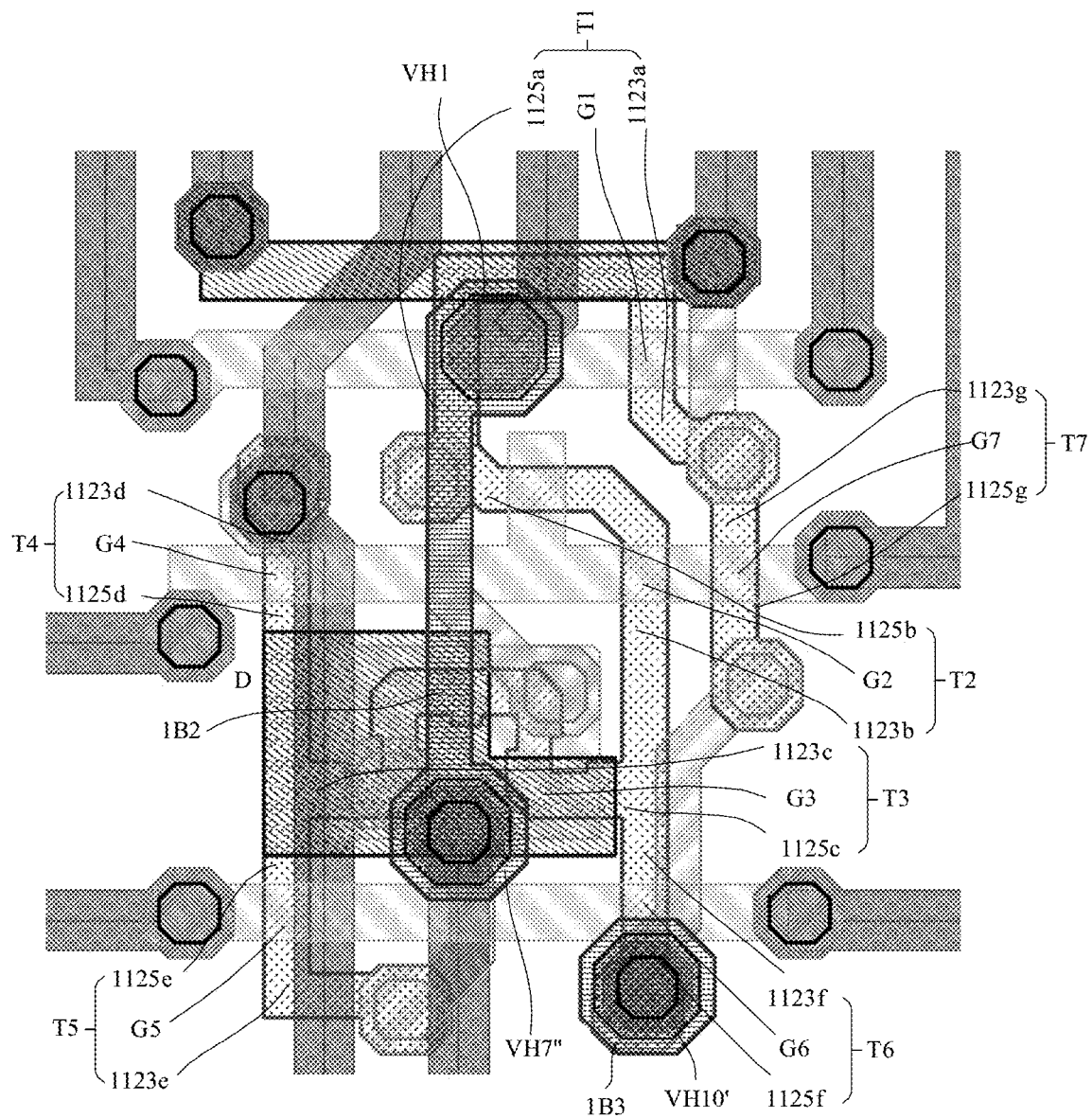
FIG. 34 is a planar diagram of a combination of an active layer, a first gate layer, a second gate layer, a first source/drain layer, a connection electrode film layer, and a second source/drain of one sub-pixel included in one repeat unit in FIG. 27.
Figure 35:
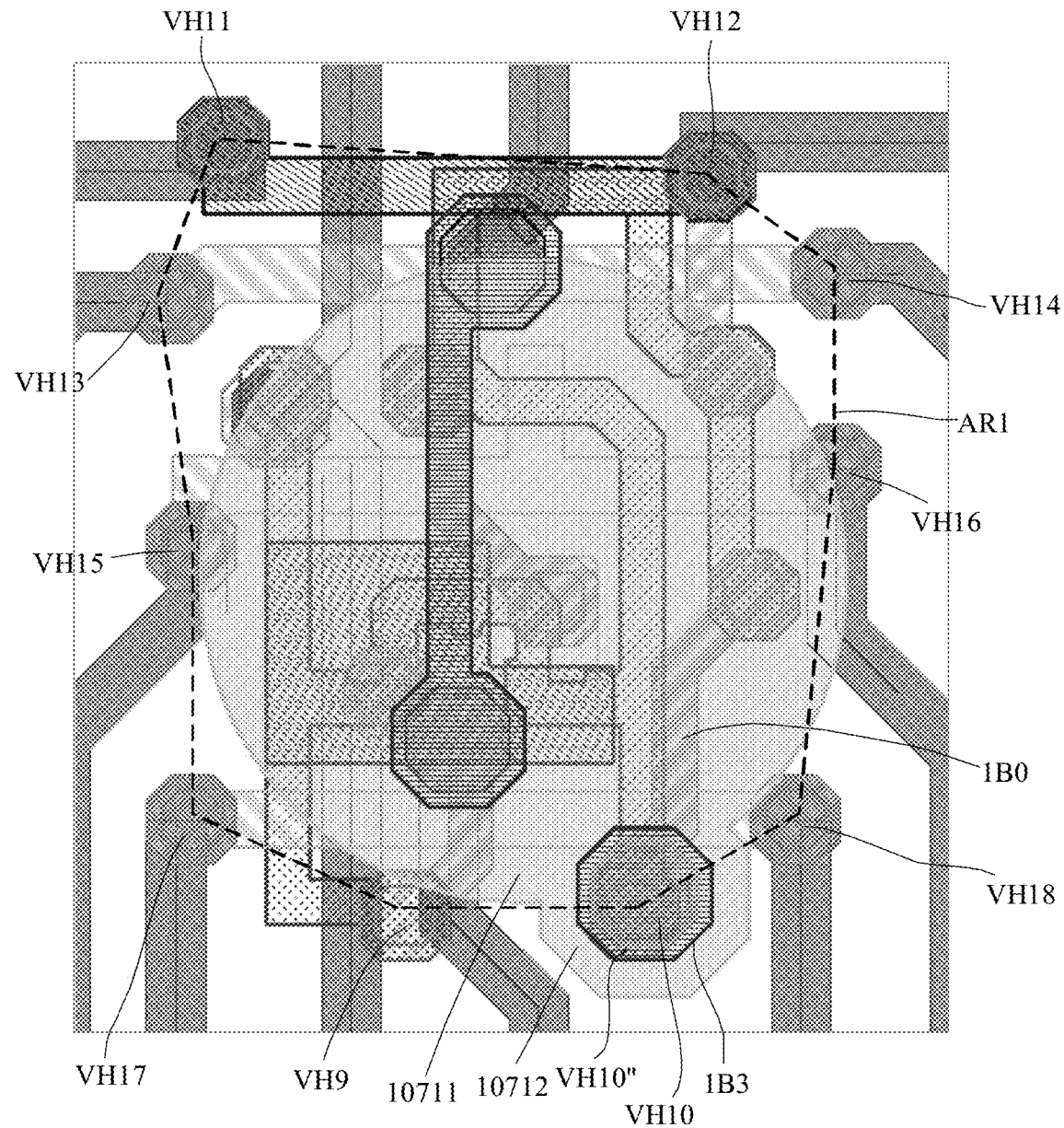
FIG. 35 is a planar diagram of a combination of an active layer, a first gate layer, a second gate layer, a first source/drain layer, a connection electrode film layer, a second source/drain, and a second anode layer of a sub-pixel included in one repeat unit in FIG. 27.
Figure 36:
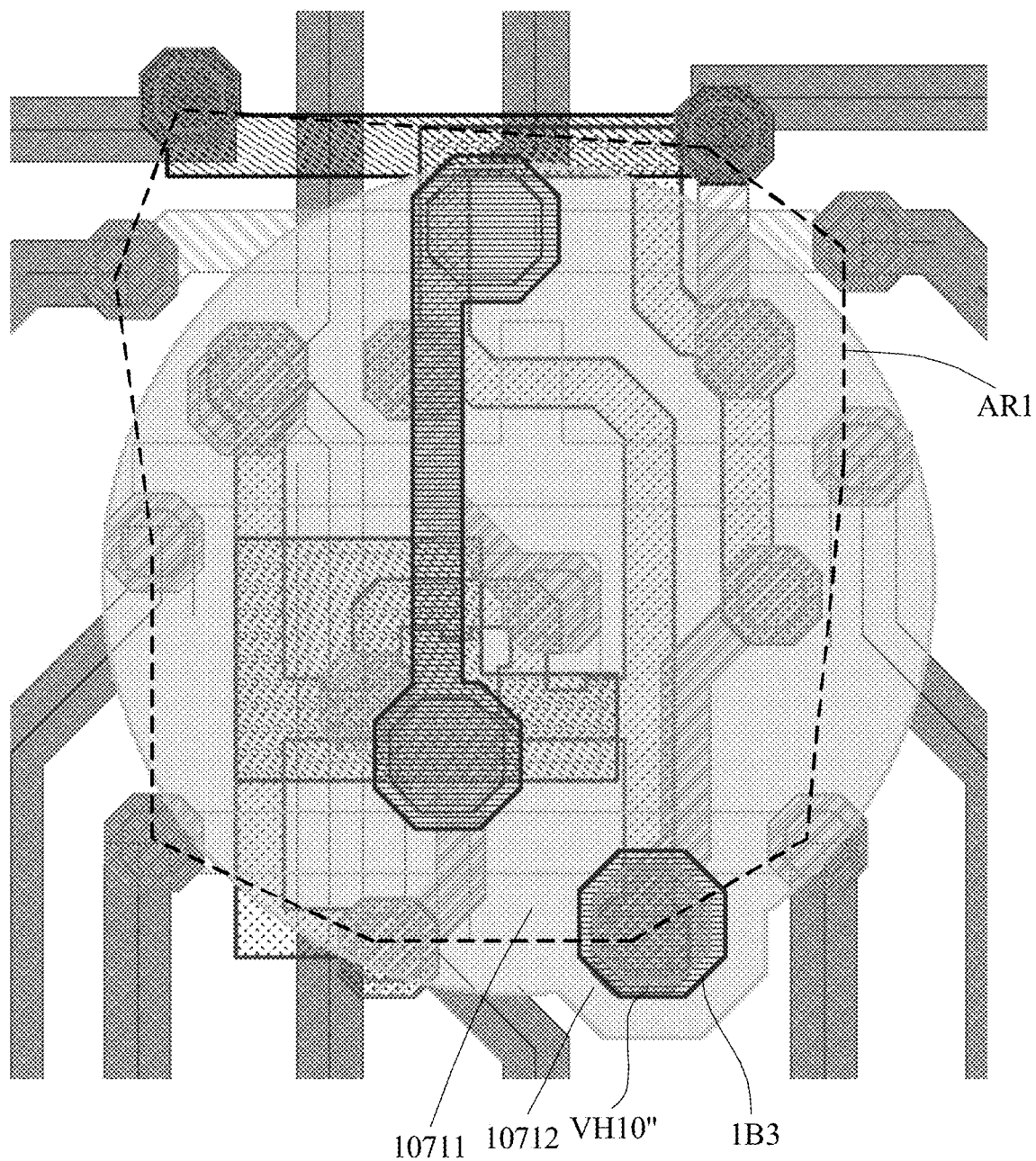
FIG. 36 is a planar diagram of a combination of an active layer, a first gate layer, a second gate layer, a first source/drain layer, a connection electrode film layer, a second source/drain layer, and a second anode layer of another sub-pixel included in one repeat unit in FIG. 27.
Figure 37:
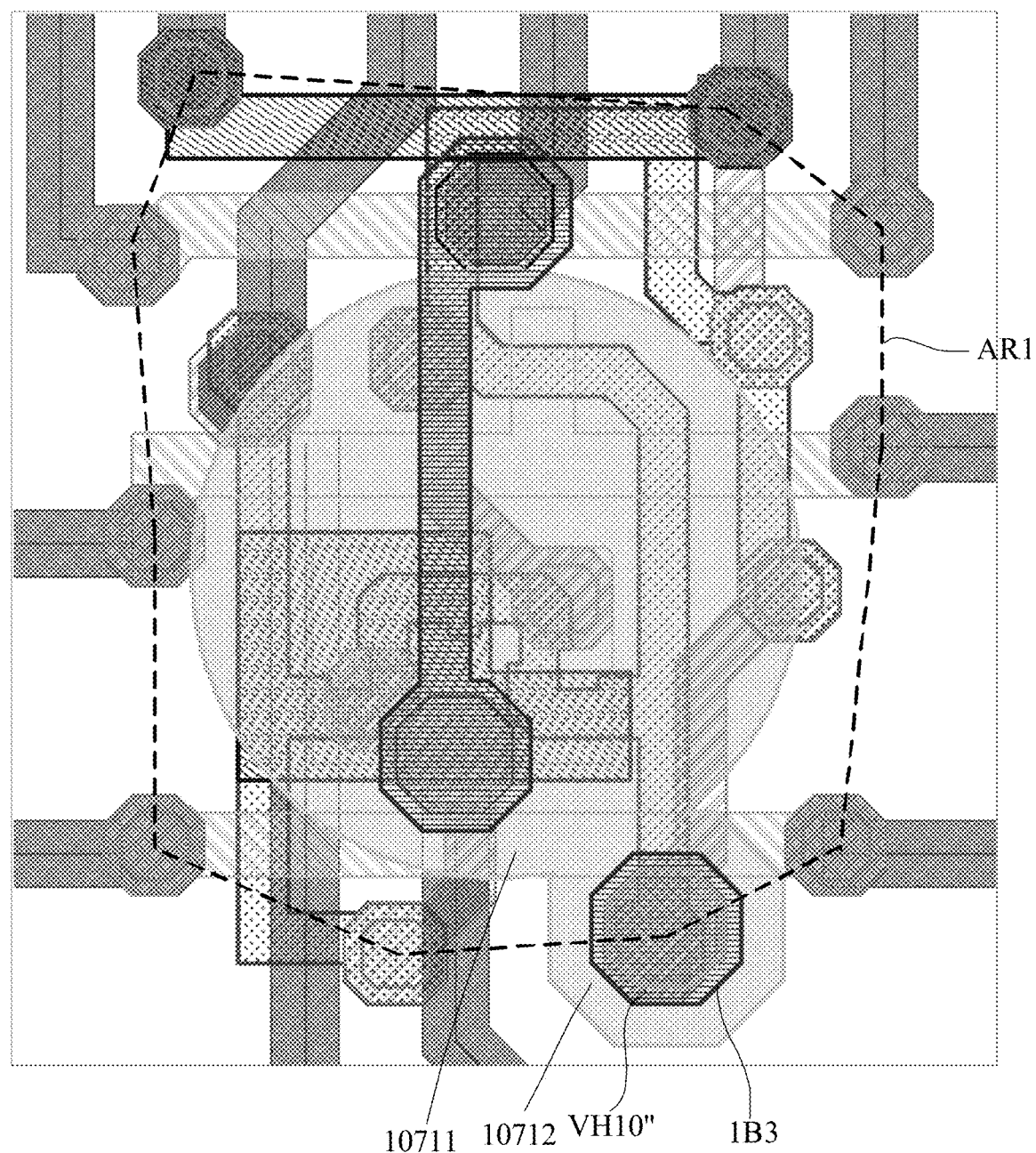
FIG. 37 is a planar diagram of a combination of an active layer, a first gate layer, a second gate layer, a first source/drain layer, a connection electrode film layer, a second source/drain layer, and a second anode layer of yet another sub-pixel included in one repeat unit in FIG. 27.

FIG. 26 is an equivalent circuit diagram of another pixel circuit according to an embodiment of the present disclosure. FIG. 27 is a planar diagram of a sub-pixel in a second display region according to an embodiment of the present disclosure, which schematically shows a planar diagram of one repeat unit in the second display region. FIG. 28 is a planar diagram of an active layer of a sub-pixel included in one repeat unit in FIG. 27. FIG. 29 is a planar diagram of a combination of an active layer and a first gate layer of a sub-pixel included in one repeat unit in FIG. 27. FIG. 30 is a planar diagram of a combination of an active layer, a first gate layer, and a second gate layer of a sub-pixel included in one repeat unit in FIG. 27. FIG. 31 is a planar diagram of a combination of an active layer, a first gate layer, a second gate layer, and a first source/drain layer of a sub-pixel included in one repeat unit in FIG. 27. FIG. 32 is a planar diagram of a combination of an active layer, a first gate layer, a second gate layer, a first source/drain layer, and a connection electrode film layer of a sub-pixel included in one repeat unit in FIG. 27. FIG. 33 is a planar diagram of a combination of an active layer, a first gate layer, a second gate layer, a first source/drain layer, and a connection electrode film layer of three sub-pixels included in one repeat unit in FIG. 27. FIG. 34 is a planar diagram of a combination of an active layer, a first gate layer, a second gate layer, a first source/drain layer, a connection electrode film layer and a second source/drain of one sub-pixel included in one repeat unit in FIG. 27. FIG. 35 is a planar diagram of a combination of an active layer, a first gate layer, a second gate layer, a first source/drain layer, a connection electrode film layer, a second source/drain and a second anode layer of a sub-pixel included in one repeat unit in FIG. 27. FIG. 36 is a planar diagram of a combination of an active layer, a first gate layer, a second gate layer, a first source/drain layer, a connection electrode film layer, a second source/drain layer and a second anode layer of another sub-pixel included in one repeat unit in FIG. 27. FIG. 37 is a planar diagram of a combination of an active layer, a first gate layer, a second gate layer, a first source/drain layer, a connection electrode film layer, a second source/drain layer and a second anode layer of yet another sub-pixel included in one repeat unit in FIG. 27.

With reference to FIGS. 26 to 37, in the first display region 101b, the pixel circuit may include a plurality of thin film transistors and one storage capacitor Cst. The pixel circuit is configured to drive the light-emitting unit. The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The plurality of signal lines include a scanning signal line A1 for transmitting a scanning signal Sn, a reset control signal line A2 for transmitting a reset control signal RESET (for example, the reset control signal RESET may be the scanning signal of the previous row), an emission control line A3 for transmitting an emission control signal En, a data signal line A4 for transmitting a data signal Dm, a positive power line A5 for transmitting a driving voltage VDD, an initialization voltage line A6 for transmitting an initialization voltage Vint, and a negative power line A7 for transmitting a VSS voltage.

Referring to FIG. 27, for one first sub-pixel, active patterns of the first transistor T1, the second transistor T2, the third transistor T3, the fourth transistor T4, the fifth transistor T5, the sixth transistor T6, and the seventh transistor T7 are formed as a continuously extending portion of the active layer 112. In an embodiment of the present disclosure, "continuously extending" means that there is no disconnection in the middle.

Referring to FIG. 27, the seventh active pattern 112g of the seventh transistor T7 is connected to the first active pattern 112a of the first transistor T1, the first active pattern 112a of the first transistor T1 is connected to the second active pattern 112b of the second transistor T2, the second active pattern 112b of the second transistor T2 is connected to the third active pattern 112c of the third transistor T3 and the sixth active pattern 112f of the sixth transistor T6, and the third active pattern 112c of the third transistor T3 is connected to the fourth active pattern 112d of the fourth transistor T4 and the fifth active pattern 112e of the fifth transistor T5.

Referring to FIGS. 27 and 28, for one first sub-pixel disposed in the second display region 101b, the seventh active pattern 112g of the seventh transistor T7 extends in a direction approaching the scanning signal line A1 of the first sub-pixel from the first active pattern 112a of the first transistor T1. That is, the seventh active pattern 112g of the seventh transistor T7 is disposed at the bottom right of the first active pattern 112a of the first transistor T1. Owing to this arrangement, an outline of an occupied region of the active layer of one first sub-pixel in the second display region 101b is square or approximately square.

In an embodiment of the present disclosure, "occupied region" means the largest region covered by an orthographic projection of one pattern or layer structure or the like onto the base substrate, specifically, the orthographic projection of the pattern or layer structure or the like onto the base substrate has two side edges farthest apart in a first direction X and two side edges farthest apart in a second direction Y, extension lines of these four side edges will cross to define one region, and this region is the occupied region of the pattern or layer structure or the like.

For one first sub-pixel disposed in the second display region 101b, the occupied region of the active layer is square or substantially square. As shown in FIG. 27, the occupied region of the active layer of one first sub-pixel disposed in the second display region 101b is schematically shown with a dashed box, and the occupied region has dimensions in the first direction X (i.e., width W1) and dimensions in the second direction Y (i.e., length L1), and the length L1 is substantially equal to the width W1.

In an embodiment of the present disclosure, the occupied region of the active layer of one first sub-pixel disposed in the second display region 101b is smaller than that of an active layer of one second sub-pixel of the same color disposed in the first display region 101a. Thus, the occupied region of the pixel circuit 10 of the first sub-pixel disposed in the second display region 101b may be made smaller than that of the pixel circuit of the second sub-pixel disposed in the first display region 101a.

As shown in FIG. 28, the scanning signal line A1, the reset control signal line A2, and the emission control line A3 are all disposed in the first gate layer 113. The gates G1 to G7 of each of the above-mentioned transistors are also disposed in the first gate layer 113. The first storage capacitor electrode Cst1 is also disposed in the first gate layer 113.

Referring to FIG. 28, portions of the scanning signal line A1 overlapping the active layer 112 form the gate G2 of the second transistor T2 and the gate G4 of the fourth transistor T4 respectively. In addition, another portion of the scanning signal line A1 overlapping the active layer 112 further forms the gate G7 of the seventh transistor T7. That is, in the embodiment of the present disclosure, in the second display region 101b, the gates of the seventh transistor T7, the second transistor T2, and the fourth transistor all supply the scanning signal Sn.

As shown in FIG. 29, the initialization voltage line A6 and the second storage capacitor electrode Cst2 are disposed in the second gate layer 115.

Referring to FIG. 21, for one second sub-pixel disposed in the first display region 101a, the second storage capacitor electrode Cst2 includes a through hole TH2, and an orthographic projection of a combination of an entity portion of the second storage capacitor electrode Cst2 and the through hole TH2 onto the base substrate 101 is in the shape of a rectangle or a rounded rectangle.

Referring to FIG. 29, for one first sub-pixel disposed in the second display region 101b, the second storage capacitor electrode Cst2 has a notch NTH1 at one corner. That is, an orthographic projection of the second storage capacitor electrode Cst2 on the base substrate 101 is L-shaped. In other words, an orthographic projection of a combination of the entity portion of the second storage capacitor electrode Cst2 and the notch NTH1 on the base substrate 101 is in the shape of a rectangle or a rounded rectangle.

The notch NTH1 exposes part of the first storage capacitor electrode Cst1 disposed below the second storage capacitor electrode Cst2, so that the first storage capacitor electrode Cst1 is electrically connected to other portions.

In an embodiment of the present disclosure, an area of an orthographic projection of the second storage capacitor electrode Cst2 of one first sub-pixel disposed in the second display region 101b onto the base substrate 101 is smaller than that of an orthographic projection of the second storage capacitor electrode Cst2 of one second sub-pixel disposed in the first display region 101a onto the base substrate 101. On this basis, the second storage capacitor electrode Cst2 of one first sub-pixel disposed in the second display region 101b is designed into an L shape without forming the through hole therein, which helps to ensure a large overlap area between the first storage capacitor electrode Cst1 and the second storage capacitor electrode Cst2 of one first sub-pixel disposed in the second display region 101b, i.e., the capacitance value of the storage capacitor Cst is guaranteed.

As shown in FIG. 31, a connection portion 1A8, a connection portion 1A9, a connection portion 1B0 and a connection portion 1B1 are disposed in the first source/drain layer 118.

Part of the connection portion 1A8 is formed in the via hole VH6, and extends downwards to be electrically connected to the portion of the first storage capacitor electrode Cst1 exposed by the notch NTH1. Another part of the connection portion 1A8 is formed in the via hole VH2, and extends downwards to be electrically connected to the drain D2 of the second transistor T2 and the drain D1 of the first transistor T1. By the connection portion 1A8, the first storage capacitor electrode Cst1, the drain D2 of the second transistor T2 and the drain D1 of the first transistor T1 may be electrically connected.

Part of the connection portion 1A9 is formed in the via hole VH12 and extends downwards to be electrically connected to the initialization voltage line A6. Another part of the connection portion 1A9 is formed in the via hole VH4 and extends downwards to be electrically connected to the drain D7 of the seventh transistor T7. By the connection portion 1A9, the initialization voltage Vint transmitted by the initialization voltage line A6 may be supplied to the drain D7 of the seventh transistor T7.

Part of the connection portion 1B0 is formed in the via hole VH5 and extends downwards to be electrically connected to the source S7 of the seventh transistor T7. Another part of the connection portion 1B0 is formed in the via hole VH10, and extends downwards to be electrically connected to the drain D6 of the sixth transistor T6. Owing to the connection portion 1B0, the source S7 of the seventh transistor T7 and the drain D6 of the sixth transistor T6 may be electrically connected.

Part of the connection portion 1B1 is formed in the via hole VH7 and extends downwards to be electrically connected to the second storage capacitor electrode Cst2. Another part of the connection portion 1B1 is formed in the via hole VH9, and extends downwards to be electrically connected to the source S5 of the fifth transistor T5. By the connection portion 1B1, the second storage capacitor electrode Cst2 may be electrically connected to the source S5 of the fifth transistor T5.

With reference to FIGS. 30 to 35, a connection electrode film layer f is disposed in the second display region 101b. For example, the connection electrode film layer f may be made from a transparent conductive material such as indium tin oxide (i.e., ITO). The connection electrode film layer f may include a plurality of first connection electrodes, a plurality of second connection electrodes, and a plurality of third connection electrodes.

For ease of description, referring to FIG. 32, in the second display region 101b, a plurality of first connection electrodes, a plurality of second connection electrodes, and a plurality of third connection electrodes that may be included in the connection electrode film layer f are divided into a plurality of conductive leads. For example, the plurality of conductive leads may include a first conductive lead 1A1, a second conductive lead 2A1, a third conductive lead 1A2, a fourth conductive lead 2A2, a fifth conductive lead 1A3, a sixth conductive lead 2A3, a seventh conductive lead 1A6, and an eighth conductive lead 2A6. That is, these conductive leads are all made from a transparent conductive material such as indium tin oxide (i.e., ITO).

Part of the data signal line segment 1A4 is formed in the via hole VH3, and extends downwards to be electrically connected to the source S4 of the fourth transistor T4, such that the data signal Dm transmitted by the data signal line segment 1A4 is supplied to the fourth transistor T4.

The positive power line segment 1A5 is disconnected at the pixel circuit of the first sub-pixel in the second display region 101b, and is divided into two portions. For ease of description, these two portions are respectively denoted as a first driving voltage sub-line 1A51 and a second driving voltage sub-line 1A52.

For example, an orthographic projection of the first driving voltage sub-line 1A51 onto the base substrate 101 crosses the orthographic projection of the initialization voltage line A6 onto the base substrate 101. Moreover, the orthographic projection of the first driving voltage sub-line 1A51 onto the base substrate 101 is at least partially overlapped with the orthographic projection of the reset control signal line A2 onto the base substrate 1.

For example, an orthographic projection of the second driving voltage sub-line 1A52 onto the base substrate 101 crosses the orthographic projection of the emission control line A3 onto the base substrate 1. Moreover, the orthographic projection of the second driving voltage sub-line 1A52 onto the base substrate 101 is at least partially overlapped with the orthographic projection of the second storage capacitor electrode Cst2 onto the base substrate 1. Part of the second driving voltage sub-line 1A52 is formed in a via hole VH7', and extends downwards to be electrically connected to part of the connection portion 1B1 so as to be electrically connected to the second storage capacitor electrode Cst2. In this way, the positive power supply line, the second storage capacitor electrode Cst2 and the source S5 of the fifth transistor T5 may be electrically connected.

The first driving voltage sub-line 1A51 and the second driving voltage sub-line 1A52 are spaced apart from each other by a certain distance in the second direction Y. For example, an orthographic projection of the end of the first driving voltage sub-line 1A51 proximal to the second driving voltage sub-line 1A52 onto the base substrate 101 is partially overlapped the orthographic projection of the reset control signal line A2 onto the base substrate 101, and an orthographic projection of the end of the second driving voltage sub-line 1A52 proximal to the first driving voltage sub-line 1A51 onto the base substrate 101 is overlapped with an orthographic projection of the portion of the second storage capacitor electrode Cst2 proximal to the emission control line A3 onto the base substrate 101. The first driving voltage sub-line 1A51 and the second driving voltage sub-line 1A52 that are spaced apart will be electrically connected together by a connection portion.

In the second display region 101b, the scanning signal lines A1, the reset control signal lines A2, the emission control lines A3, and the initialization voltage lines A6 in the sub-pixels, extending in the first direction X, are respectively electrically connected by the conductive leads disposed in the transparent conduction layer. In this way, only the transparent conductive leads but not conductive leads made from opaque materials such as metal are arranged in a light-transmitting region of the second display region 101b. In this way, the light transmittance of the second display region 101b may be high.

Specifically, the first conductive lead 1A1 and the second conductive lead 2A1 are respectively disposed on two sides of the scanning signal line A1 of one first sub-pixel. Part of the first conductive lead 1A1 is formed in the via hole VH15, and extends downwards to be electrically connected to one end of the scanning signal line A1. Part of the second conductive lead 2A1 is formed in the via hole VH16, and extends downward to be electrically connected to the other end of the scanning signal line A1. With the help of the first conductive lead 1A1 and the second conductive lead 2A1, the scanning signal lines A1 of the sub-pixels in the same row may be electrically connected to facilitate the supply of the scanning signal Sn.

The third conductive lead 1A2 and the fourth conductive lead 2A2 are respectively disposed on two sides of the reset control signal line A2 of one first sub-pixel. Part of the third conductive lead 1A2 is formed in the via hole VH13, and extends downwards to be electrically connected to one end of the reset control signal line A2. Part of the fourth conductive lead 2A2 is formed in the via hole VH14, and extends downwards to be electrically connected to the other end of the reset control signal line A2. With the help of the third conductive lead 1A2 and the fourth conductive lead 2A2, the reset control signal lines A2 of the sub-pixels in the same row may be electrically connected to facilitate supply of the reset signal Reset.

The fifth conductive lead 1A3 and the sixth conductive lead 2A3 are respectively disposed on two sides of the emission control line A3 of one sub-pixel. Part of the fifth conductive lead 1A3 is formed in the via hole VH17, and extends downwards to be electrically connected to one end of the emission control line A3. Part of the sixth conductive lead 2A3 is formed in the via hole VH18, and extends downwards to be electrically connected to the other end of the emission control line A3. With the help of the fifth conductive lead 1A3 and the sixth conductive lead 2A3, the emission control lines A3 of the sub-pixels in the same row may be electrically connected to facilitate the supply of the emission control signal Em.

A seventh conductive lead 1A6 and an eighth conductive lead 2A6 are respectively disposed on two sides of the initialization voltage line A6 of one first sub-pixel. Part of the seventh conductive lead 1A6 is formed in the via hole VH11, and extends downwards to be electrically connected to one end of the initialization voltage line A6. Part of the eighth conductive lead 2A6 is formed in the via hole VH12, and extends downwards to be electrically connected to the other end of the initialization voltage line A6. With the help of the seventh conductive lead 1A6 and the eighth conductive lead 2A6, the initialization voltage lines A6 of the sub-pixels in the same row may be electrically connected to facilitate supply of the emission initialization voltage signal Vinit.

In an embodiment of the present disclosure, a line width of at least one of the scanning signal line, the reset signal line, the emission control signal line, the initialization voltage line, the data signal line, and the positive power line in the second display region 101b may be less than or equal to that of the signal line for transmitting the same type of signal disposed in the first display region 101a.

For example, a line width of the data signal line segment 1A4 disposed in the second display region 101b may be less than or approximately equal to that of the data signal line A4 disposed in the first display region 101a. For example, the line width of the data signal line segment 1A4 disposed in the second display region 101b may range from 1.5 μm (micrometers) to 3 μm, and the line width of the data signal line A4 disposed in the first display region 101a may range from 2.5 μm to 4 μm.

For example, a line width of the positive power line segment 1A5 disposed in the second display region 101b may be less than or approximately equal to that of the positive power line A5 disposed in the first display region 101a. For example, the line width of the positive power line 1A5 disposed in the second display region 101b may range from 2 μm to 5 μm, and the line width of the positive power line A5 disposed in the first display region 101a may be range from 4 μm to 7 μm.

For example, a line width of the scanning signal line A1 disposed in the second display region 101b may be less than or approximately equal to that of the scanning signal line A1 disposed in the first display region 101a. For example, the line width of the scanning signal line A1 disposed in the second display region 101b may range from 2 μm to 3 μm, and the line width of the scanning signal line A1 disposed in the first display region 101a may range from 3 μm to 4 μm.

For example, a line width of the initialization voltage line A6 disposed in the second display region 101b may be less than or approximately equal to that of the initialization voltage line A6 disposed in the first display region 101a. For example, the line width of the initialization voltage line A6 disposed in the first display region 101a may range from 2

μm to 3 μm, and the line width of the initialization voltage line A6 disposed in the first display region 101a may range from 3 μm to 6 μm.

In an embodiment of the present disclosure, a width-to-length ratio of each of the transistors T1 to T7 of the pixel circuit disposed in the second display region 101b may be approximately equal to that of the same type of transistors T1 to T7 of the pixel circuit disposed in the first display region 101a, to which the embodiment of the present disclosure is not limited. For example, the width-to-length ratio of each of the transistors T1 to T7 of the pixel circuit disposed in the second display region 101b may be less than that of the same type of transistors T1 to T7 of the pixel circuit disposed in the first display region 101a.

For example, a width-to-length ratio of the transistor T3 of the pixel circuit disposed in the second display region 101b may be approximately equal to that of the transistor T3 of the pixel circuit disposed in the first display region 101a. For example, the width-to-length ratio of the transistor T3 of the pixel circuit disposed in the second display region 101b and the width-to-length ratio of the transistor T3 of the pixel circuit disposed in the first display region 101a may be (2–4)/(20–26).

For example, a width-to-length ratio of the transistor T4 of the pixel circuit disposed in the second display region 101b may be approximately equal to that of the transistor T4 of the pixel circuit disposed in the first display region 101a. For example, the width-to-length ratio of the transistor T4 of the pixel circuit disposed in the second display region 101b and the width-to-length ratio of the transistor T4 of the pixel circuit disposed in the first display region 101a may be (2–3)/(2–4).

As shown in FIG. 32, the connection portion 1B2 and the conductive connection portion 1B3 are disposed in the second gate layer 115.

Part of the connection portion 1B2 is formed in the via hole VH1, and extends downwards to be electrically connected to the first driving voltage sub-line 1A51. The other part of the connection portion 1B2 is formed in the via hole VH7", and extends downwards to be electrically connected to the second driving voltage sub-line 1A52. That is, the first driving voltage sub-line 1A51 is electrically connected to the second driving voltage sub-line 1A52 by the connection portion 1B2, so that the positive power lines of the sub-pixels in the same column may be connected to facilitate supply each sub-pixel with the driving voltage signal VDD.

Part of the conductive connection portion 1B3 is formed in the via hole VH10' which exposes part of the connection portion 1B0, so that the conductive connection portion 1B3 may be electrically connected to the connection portion 1B0.

As shown in FIGS. 33 to 35, the anode pattern of the first sub-pixel includes an anode body 10711 and an anode connection portion 10712.

Part of the anode connection portion 10712 may be formed in the via hole VH10" which exposes part of the conductive connection portion 1B3, so that the anode connection portion 10712 may be electrically connected to the conductive connection portion 1B3, and then connected to the connection part 1B0. That is, the anode pattern 1071, the source S7 of the seventh transistor T7, and the drain D6 of the sixth transistor T6 may be electrically connected by the conductive connection portion 1B3 and the connection portion 1B0.

For example, FIGS. 33 to 35 are respectively planar diagrams of a red sub-pixel F1, a blue sub-pixel F2, and a green sub-pixel F3 disposed in the second display region 101b. As shown in FIGS. 33 to 35, in the second display region 101b, the pixel circuits of the red sub-pixel F1, the blue sub-pixel F2, and the green sub-pixel F3 may all be basically reduced to the size of the light-emitting unit and placed under the light-emitting unit. In this way, in the second display region 101b (i.e., an under-screen image pickup region), the pixel circuit of each sub-pixel may be built in the corresponding sub-pixel. Moreover, in an embodiment of the present disclosure, the pixel circuit of each sub-pixel is built in the corresponding sub-pixel and hidden under the light-emitting unit of the corresponding sub-pixel, which can ensure high light transmittance of the second display region, i.e., helps to realize the high light transmittance of the second display region.

In an embodiment of the present disclosure, the occupied region of the pixel circuit of each sub-pixel in the second display region 101b may be represented by the following region: referring to FIG. 33 to FIG. 35, for the pixel circuit of each sub-pixel, in the first direction X, the fifth active pattern 112e of the fifth transistor T5 and the seventh active pattern 112g of the seventh transistor T7 are respectively disposed on the leftmost and rightmost sides, i.e., a distance between the two in the first direction X is the largest; and in the second direction Y, the initialization voltage line A6 and the emission control line A3 are respectively disposed on the uppermost and lowermost sides, i.e., a distance between the two in the second direction Y is the largest. In this way, in the orthographic projection of the pixel circuit of one sub-pixel on the base substrate, the fifth active pattern 112e of the fifth transistor T5 has a first side edge distal from the seventh active pattern 112g of the seventh transistor T7, the seventh source pattern 112g of the seven transistor T7 has a second side edge distal from the fifth active pattern 112e of the fifth transistor T5, the initialization voltage line A6 has a third side edge distal from the emission control line A3, and the emission control line A3 has a fourth side edge distal from initialization voltage line A6. The first side edge and the second side edge extend in the second direction Y, the third side edge and the fourth side edge extend in the first direction X, extension lines of these four side edges will cross to define an region. This region is the occupied region of the pixel circuit of one first sub-pixel disposed in the second display region 101b. In other words, the occupied region of the pixel circuit of each sub-pixel in the second display region 101b may be represented by the following region: referring to FIG. 30, and FIGS. 33 to 35, eight via holes VH11, VH12, VH13, VH14, VH15, VH16, VH17 and VH18 are disposed on the outermost side of the pixel circuit, and the via holes VH9 and VH10 are disposed on the outermost side of the pixel circuit. Sequentially connecting the centers of every two adjacent via holes in these 10 via holes may define an region, such as the region AR1 surrounded by a dashed box as shown in FIGS. 33 to 35, and the region AR1 may be an occupied region of the pixel circuit of one sub-pixel dispose in the second display region 101b.

In an embodiment of the present disclosure, the occupied region of the light-emitting unit of the sub-pixel in the second display region 101b may be represented by a coverage region of the orthographic projection of the anode pattern of the light-emitting unit onto the base substrate 101.

In an embodiment of the present disclosure, the pixel density in the second display region 101b is substantially equal to that in the first display region 101a. That is, within the same region, the number of the first sub-pixels disposed in the second display region 101b is substantially equal to that of the second sub-pixels of the same color disposed in the first display region 101a. In this way, both the first display region and the second display region have high pixel density, may achieve high display quality, and have excellent display uniformity.

In the embodiment of the present disclosure, unless otherwise specified, the expressions "substantially equal", "substantially equal to", etc. may indicate that a ratio of two values compared is approximately equal to 1, for example, the ratio of the two values compared may range from 0.8 to 1.2.

Referring to FIG. 28, for one first sub-pixel disposed in the second display region 101b, the seventh active pattern 112g of the seventh transistor T7 extends in a direction approaching the scanning signal line A1 of the first sub-pixel from the first active pattern 112a of the first transistor T1. That is, the seventh active pattern 112g of the seventh transistor T7 is disposed on the bottom right of the first active pattern 112a of the first transistor T1. Owing to this arrangement, an outline of the occupied region of the active layer of one first sub-pixel disposed in the second display region 101b is square or approximately square. In addition, an orthographic projection of the first pattern 10611 in the auxiliary electrode pattern 1061 onto the base substrate 101 is circular. This arrangement helps to realize that the auxiliary electrode pattern 1061 covers the pixel circuit of the first sub-pixel.

For example, the orthographic projection of the auxiliary electrode pattern 1061 onto the base substrate 101 may cover the orthographic projection of the occupied region AR1 of at least one pixel circuit onto the base substrate 101. That is, orthographic projections of the first transistor T1, the second transistor T2, the third transistor T3, the fourth transistor T4, the fifth transistor T5, the sixth transistor T6, the seventh transistor T7 and the storage capacitor Cst onto the base substrate 101 are covered. Owing to this arrangement, a diffraction effect on the camera in the second display region 101b from the pixel circuit of each sub-pixel may be reduced, and the display effect of the display panel 10 may be guaranteed.

In summary, the embodiment of the present disclosure provides the display panel. The second cathode layer included by the display panel has the hollowed-out region. Therefore, the second cathode layer will not entirely cover the second display region. Compared with a cathode layer that entirely covers the second display region, the second cathode layer can effectively reduce the impact on the light transmittance. Thus, the camera disposed in the second display region has an excellent imaging effect.

Figure 38:
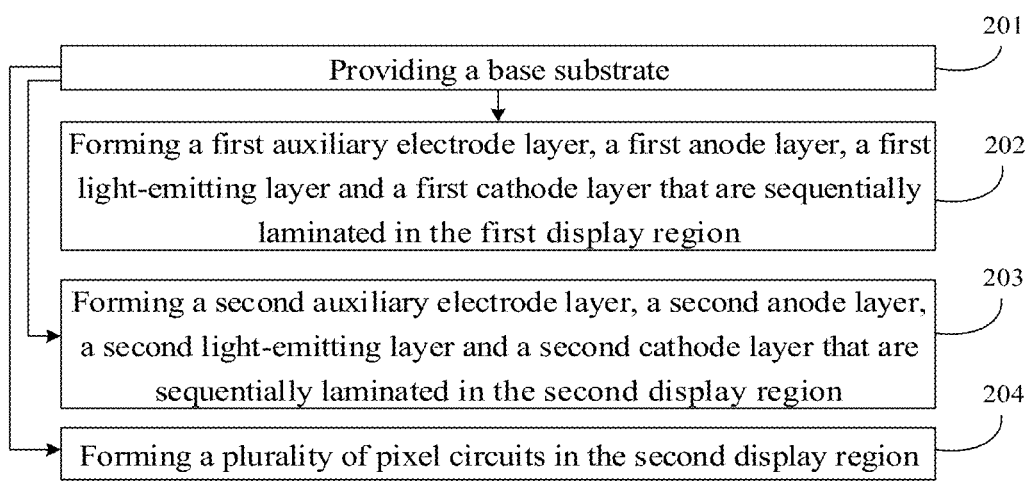
FIG. 38 is a flowchart of a method for manufacturing a display panel according to an embodiment of the present disclosure.
Figure 39:
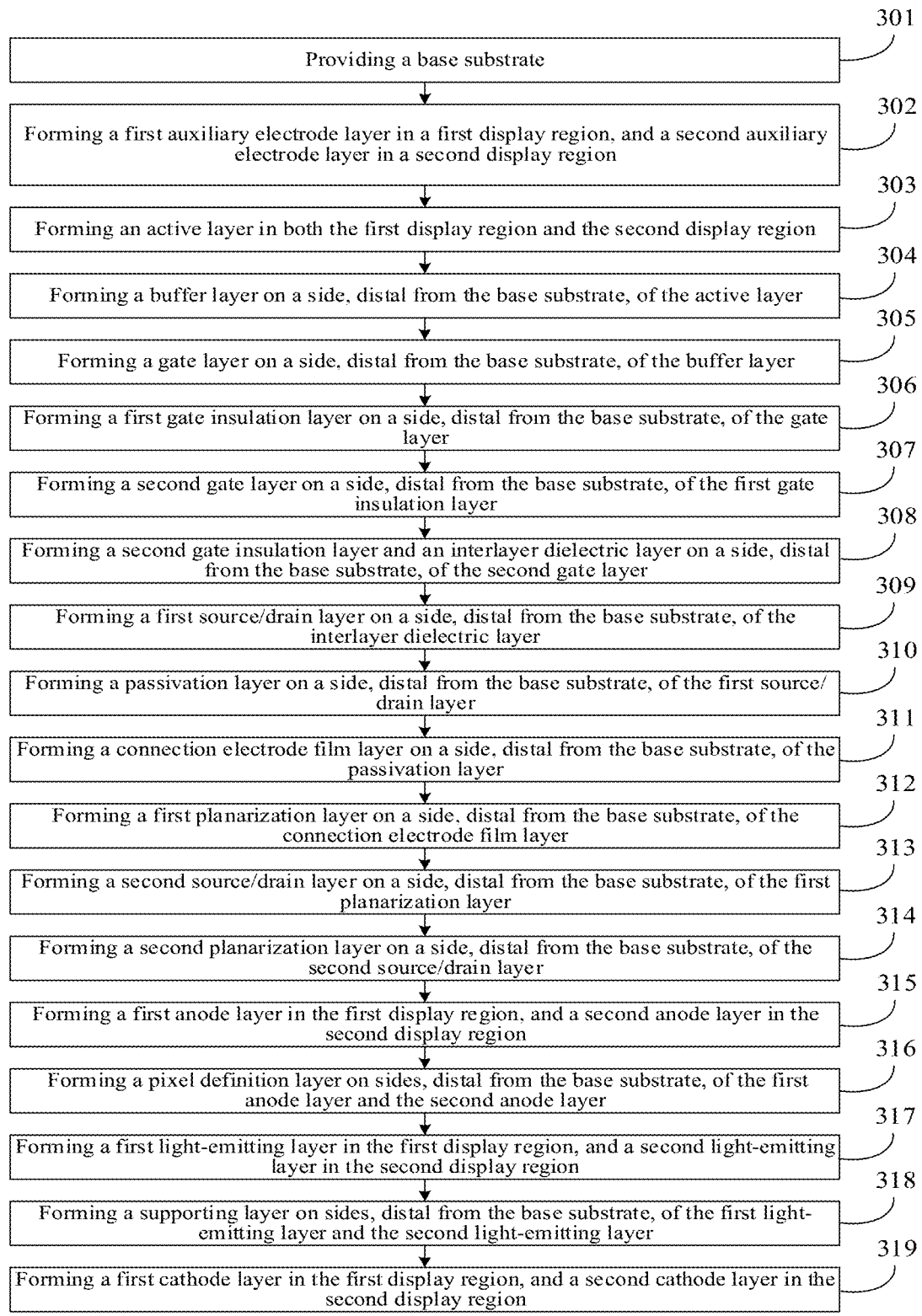
FIG. 39 is a flowchart of another method for manufacturing a display panel according to an embodiment of the present disclosure.

FIG. 38 is a flowchart of a method for manufacturing a display panel according to an embodiment of the present disclosure. This method may be configured to manufacture the display panel 10 as shown in FIG. 1. Referring to FIG. 38, the method may include the following steps.

In step 201, abase substrate is provided. The base substrate is provided with a first display region and a second display region.

In an embodiment of the present disclosure, a base substrate 101 may be acquired when the display panel 10 is manufactured. The base substrate 101 may be a glass substrate.

In step 202, a first auxiliary electrode layer, a first anode layer, a first light-emitting layer, and a first cathode layer that are sequentially laminated are formed in the first display region.

In an embodiment of the present disclosure, referring to FIG. 1, the first auxiliary electrode layer 102, the first anode layer 103, the first light-emitting layer 104, and the first cathode layer 105 may all be disposed in a first display region 101a of the base substrate 101 and sequentially laminated in a direction away from the base substrate 101. The first auxiliary electrode layer 102 may be connected to the first cathode layer 105.

In step 203, a second auxiliary electrode layer, a second anode layer, a second light-emitting layer, and a second cathode layer that are sequentially laminated are formed in a second display region.

In an embodiment of the present disclosure, referring to FIG. 1, a second auxiliary electrode 106, a second anode layer 107, a second light-emitting layer 108, and a second cathode layer 109 may all be sequentially laminated, in a direction away from the base substrate 101, in the second display region 101b of the base substrate 101.

The second auxiliary electrode layer 106 may be connected to the first auxiliary electrode layer 102, the second cathode layer 109 may be connected to the first cathode layer 105, and the second cathode layer 109 may be provided with at least one hollowed-out region.

Since the second cathode layer 109 included by the display panel 10 is provided with at least one hollowed-out region, the second cathode layer 109 will not entirely cover the second display region 101b. Compared with a cathode layer that entirely covers the second display region 101b, the second cathode layer can effectively reduce the impact on the light transmittance. Thus, a camera disposed in the second display region 101b has an excellent imaging effect.

In an embodiment of the present disclosure, the first auxiliary electrode layer 102 is connected to the first cathode layer 105 and the second auxiliary electrode layer 106, and the second cathode layer 109 is connected to the first cathode layer 105. That is, the first auxiliary electrode layer 102, the first cathode layer 105, the second auxiliary electrode layer 106, and the second cathode layer 109 are connected, so that power signals received by the first cathode layer 105 and the second cathode layer 109 may have a small voltage difference, which guarantees the luminance uniformity of the display panel 10. Thus, the display panel 10 has an excellent display effect.

In step 204, a plurality of pixel circuits are formed in the second display region.

In an embodiment of the present disclosure, each pixel circuit 110 may include at least one layer of opaque patterns b. The second auxiliary electrode layer 106 may include a plurality of auxiliary electrode patterns 1061 spaced apart from each other. At least 50% of areas of orthographic projections of at least one layer of opaque patterns b in at least one pixel circuit 110 onto the base substrate 101 is overlapped with an orthographic projection of one auxiliary electrode pattern 1061 onto the base substrate 101. Therefore, a diffraction effect on the camera disposed in the second display region 101b from the pixel circuit 110 may be weak, and the display effect of the display panel 10 may be guaranteed.

In summary, the embodiment of the present disclosure provides the method for manufacturing the display panel. The second cathode layer included by the display panel manufactured by the method is provided with the hollowed-out region. Therefore, the second cathode layer will not entirely cover the second display region. Compared with a cathode layer that entirely covers the second display region, the second cathode layer can effectively reduce the impact on the light transmittance. Thus, the camera disposed in the second display region has an excellent imaging effect.

Figure 40:
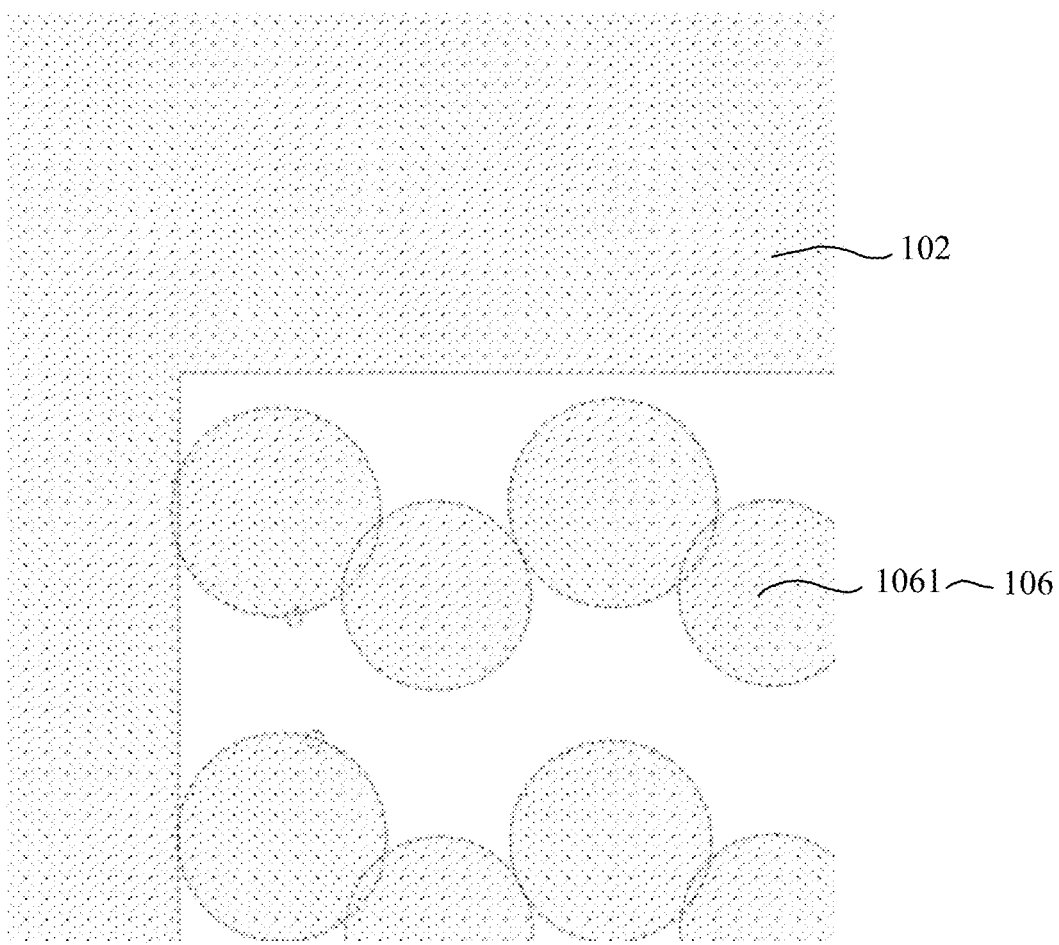
FIG. 40 is a schematic diagram of a first auxiliary electrode layer and a second auxiliary electrode layer according to an embodiment of the present disclosure.

FIG. 40 is a flowchart of another method for manufacturing a display panel according to an embodiment of the present disclosure. It can be seen with reference to FIG. 40 that the method may include the following steps.

In step 301, abase substrate is provided. The base substrate is provided with a first display region and a second display region.

In an embodiment of the present disclosure, a base substrate 101 may be acquired when the display panel 10 is manufactured. The base substrate 101 may be a glass substrate.

In step 302, a first auxiliary electrode layer is formed in a first display region, and a second auxiliary electrode layer is formed in a second display region.

In an embodiment of the present disclosure, referring to FIG. 40, the first auxiliary electrode layer 102 and the second auxiliary electrode layer 106 may be formed on one side of the base substrate 101 by a one-time patterning process. The first auxiliary electrode layer 102 may be disposed in a first display region 101a of the base substrate 101, and the second auxiliary electrode layer 106 may be disposed in a second display region 101b of the base substrate 101.

The first auxiliary electrode layer 102 and the second auxiliary electrode layer 106 may be made from the same material. Optionally, the first auxiliary electrode layer 102 and the second auxiliary electrode layer 106 may be made of metal. For example, both of them may be made from molybdenum or aluminum alloy.

Optionally, the second auxiliary electrode layer 106 may include a plurality of auxiliary electrode patterns 1061 spaced apart from each other, and at least part of an edge of an orthographic projection of each auxiliary electrode pattern 1061 onto the base substrate 101 may be arc-shaped.

In step 303, an active layer is formed in both the first display region and the second display region.

Figure 41:
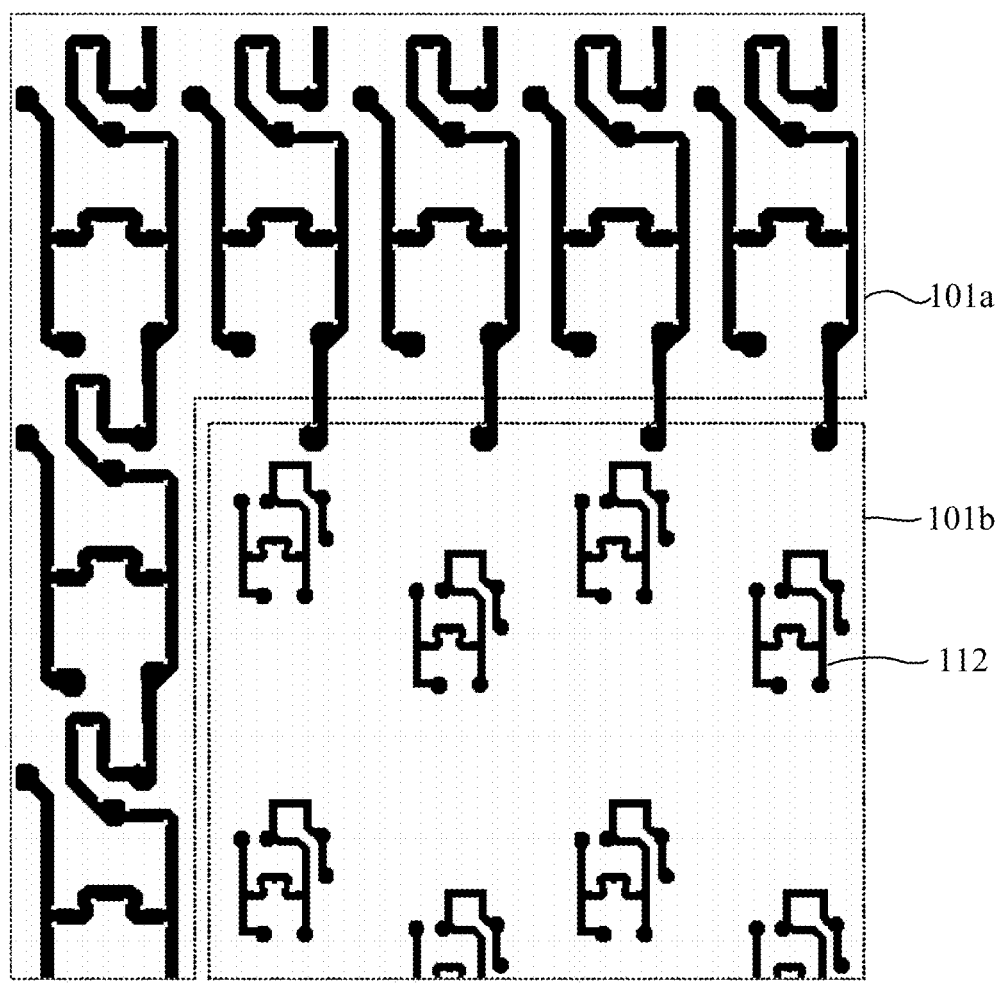
FIG. 41 is a schematic structural diagram of an active layer according to an embodiment of the present disclosure.

FIG. 41 is a schematic structural diagram of an active layer according to an embodiment of the present disclosure. Referring to FIG. 41, a width of the portion of the active layer 112 disposed in the first display region 101a is greater than that of the portion of the active layer 112 disposed in the second display region 101b. Therefore, the transmittance and the pixel density of the second display region 101b may be improved, and an imaging effect of a camera disposed in the second display region 101b may be guaranteed.

Optionally, the width of the portion of the active layer 112 disposed in the first display region 101a ranges from 2.0 µm to 2.5 µm, and the width of the portion of the active layer 112 disposed in the second display region 101b ranges from 1.4 µm to 1.6 µm.

Figure 42:
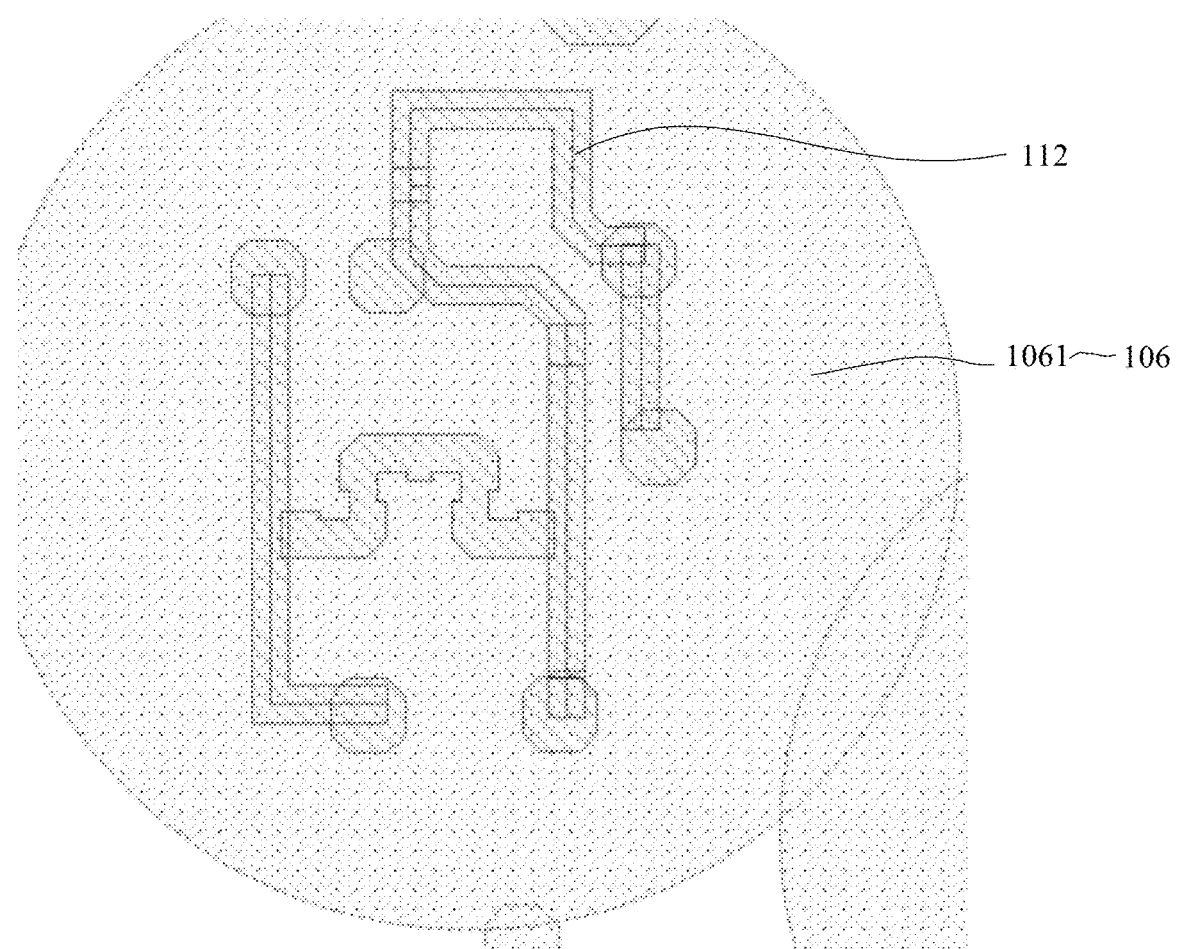
FIG. 42 is a schematic diagram showing an active layer has been formed in a second display region according to an embodiment of the present disclosure.
Figure 43:
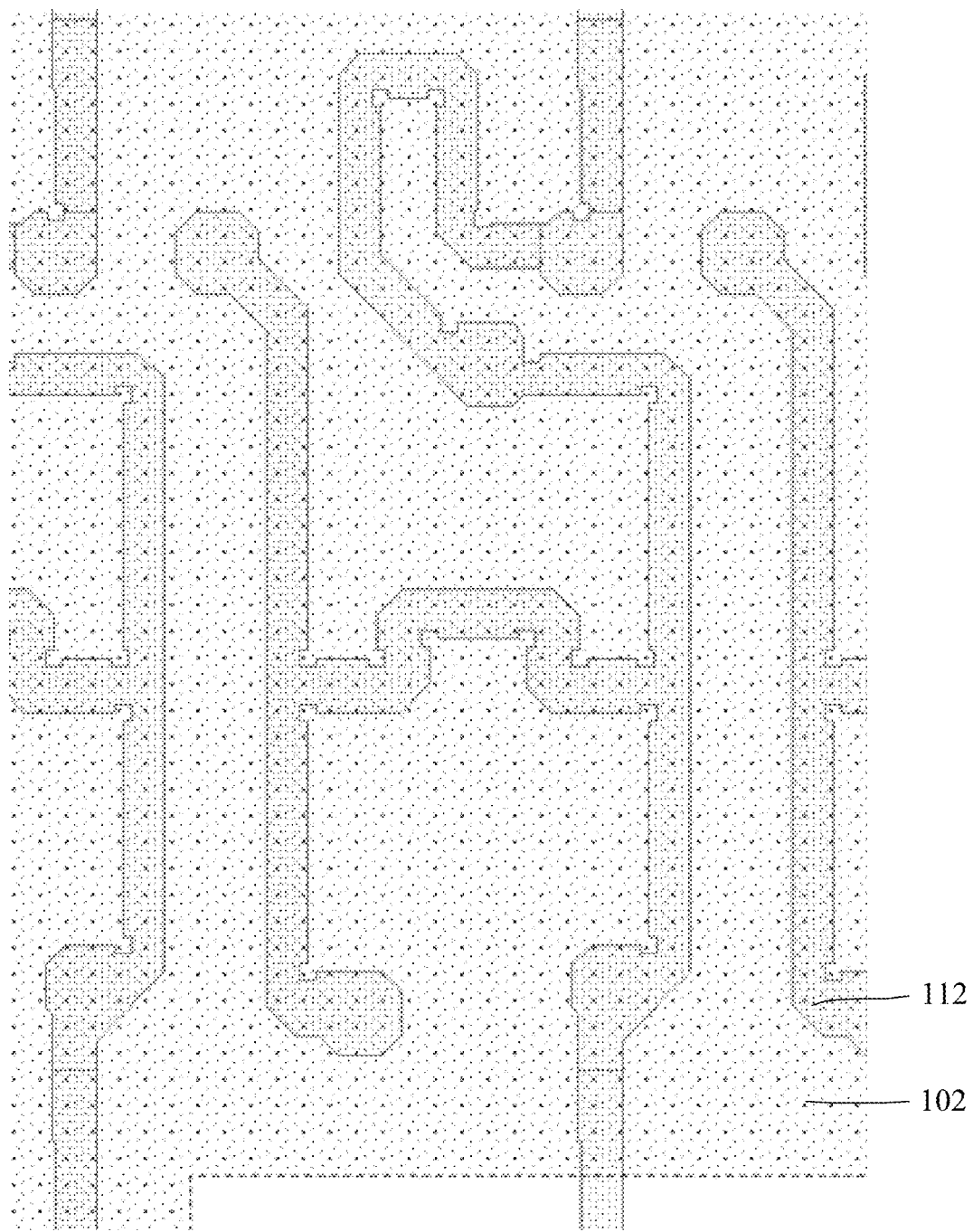
FIG. 43 is a schematic diagram showing an active layer has been formed in a first display region according to an embodiment of the present disclosure.
Figure 44:
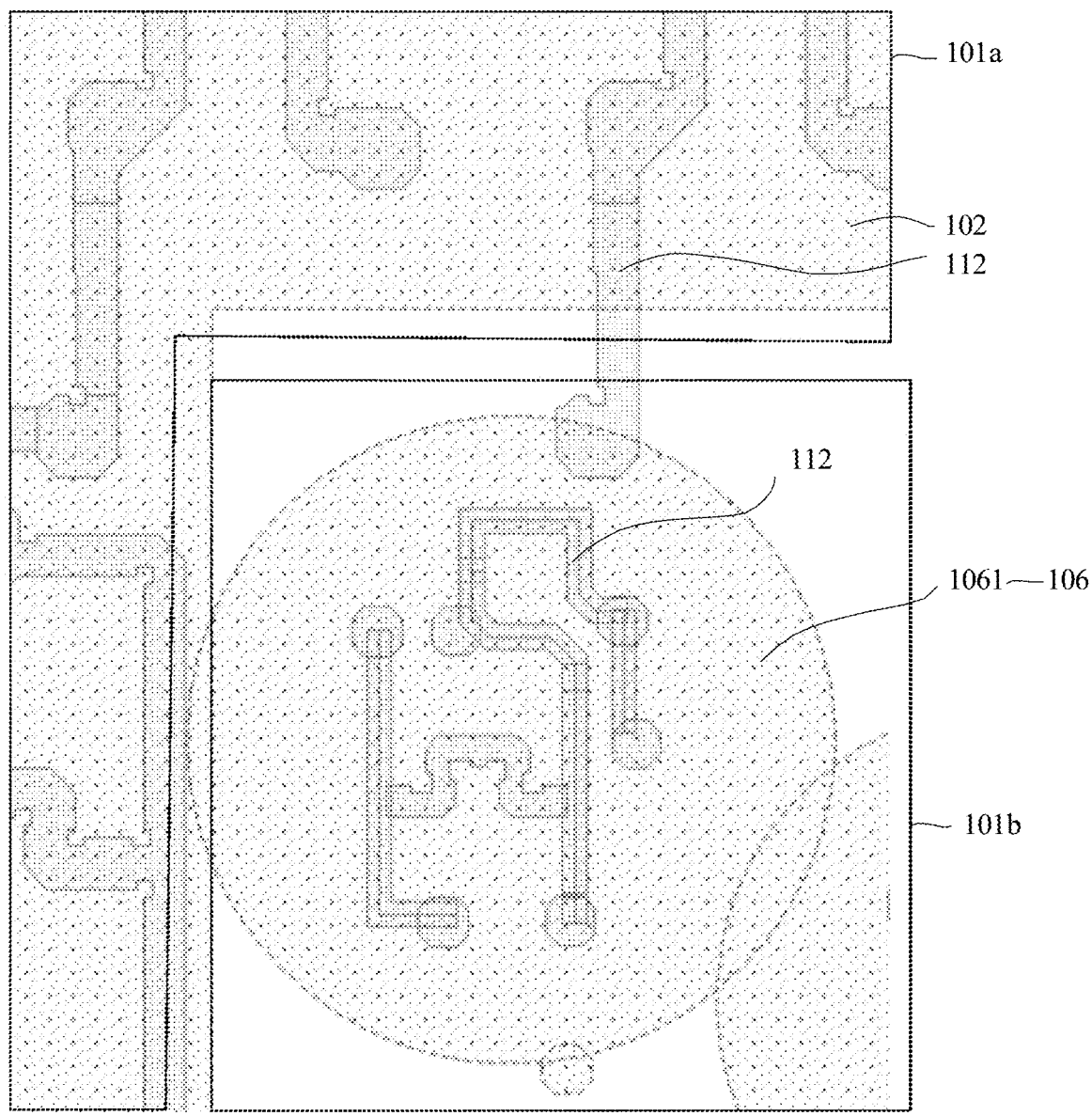
FIG. 44 is a schematic diagram showing an active layer has been formed in both a first display region and a second display region according to an embodiment of the present disclosure.

In an embodiment of the present disclosure, referring to FIGS. 42 to 44, the active layer 112 may include a plurality of stripe patterns. In addition, there is an overlap area between an orthographic projection of the pattern of the active layer 112 disposed in the first display region 101a onto the base substrate 101 and an orthographic projection of the first auxiliary electrode layer 102 onto the base substrate 101. An overlap area is present between an orthographic projection of the pattern of the active layer 112 disposed in the second display region 101b onto the base substrate 101 and orthographic projections of the auxiliary electrode patterns 1061 onto the base substrate 101.

The active layer 112 may be made from polycrystalline silicon.

In step 304, a buffer layer is formed on a side, distal from the base substrate, of the active layer.

In an embodiment of the present disclosure, the buffer layer 111 may be made from silicon nitride and silicon oxide.

In step 305, a first gate layer is formed on a side, distal from the base substrate, of the buffer layer.

Figure 45:
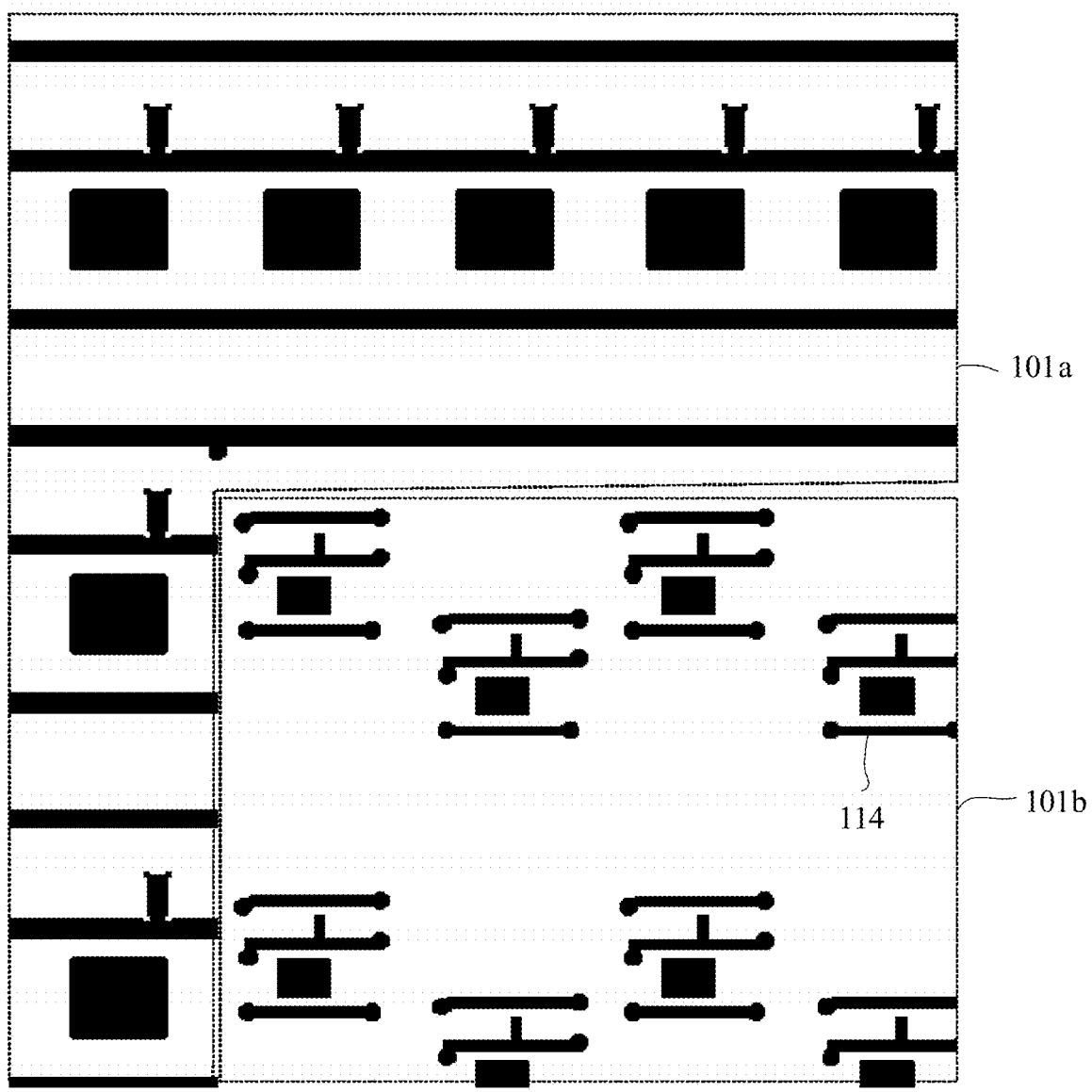
FIG. 45 is a schematic structural diagram of a first gate layer according to an embodiment of the present disclosure.

FIG. 45 is a schematic structural diagram of a first gate layer according to an embodiment of the present disclosure. Referring to FIG. 45, a width of a portion disposed in the first display region 101a of the first gate layer 113 is greater than that of a portion disposed in the second display region 101b of the first gate layer 113. Therefore, the transmittance and the pixel density of the second display region 101b may be improved, and the imaging effect of the camera disposed in the second display region 101b may be guaranteed.

Optionally, the width of the portion disposed in the first display region 101a of the first gate layer 113 ranges from 3.0 µm to 3.4 µm, and the width of the portion disposed in the second display region 101b of the first gate layer 113 ranges from 1.8 µm to 2.0 µm.

Figure 46:
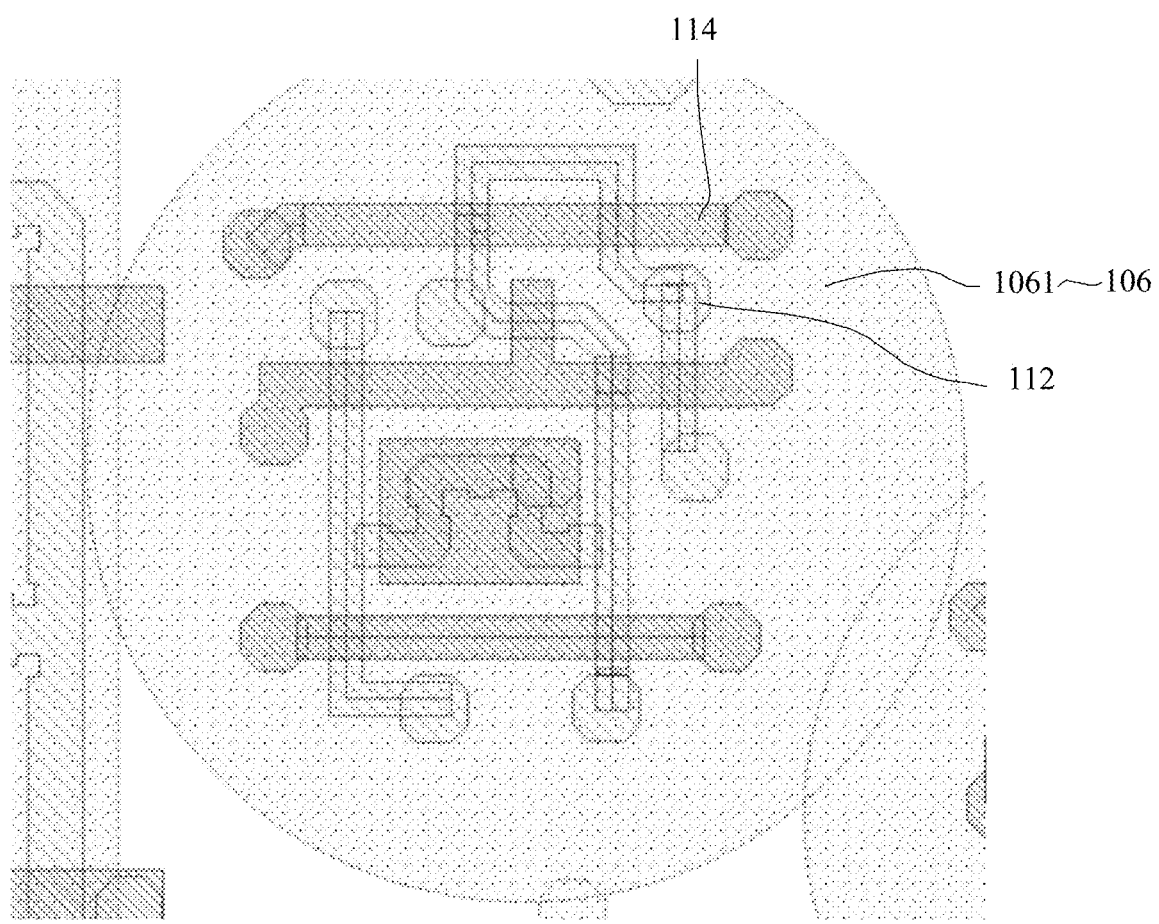
FIG. 46 is a schematic diagram showing a first gate layer has been formed in a second display region according to an embodiment of the present disclosure.
Figure 47:
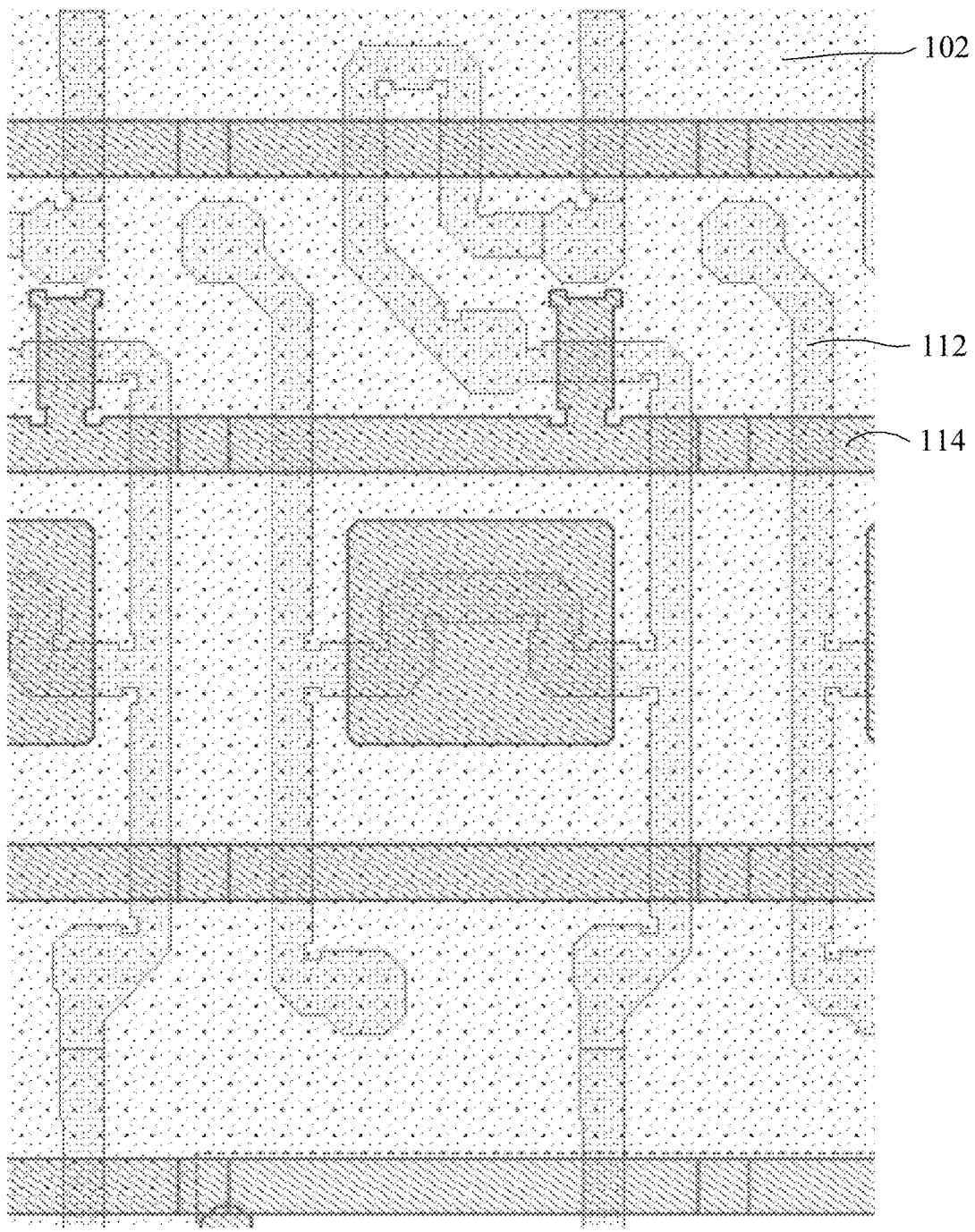
FIG. 47 is a schematic diagram showing a first gate layer has been formed in a first display region according to an embodiment of the present disclosure.
Figure 48:
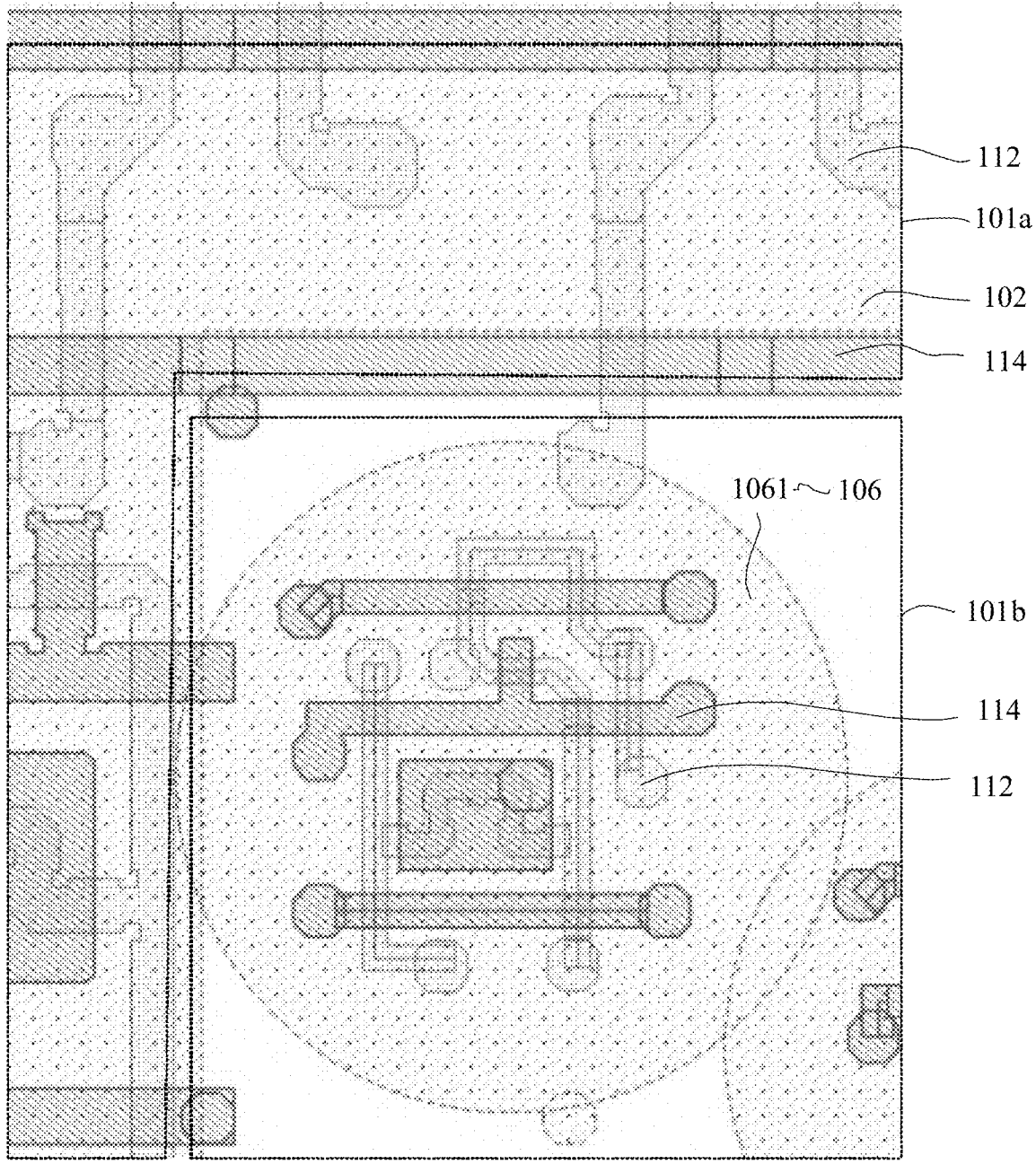
FIG. 48 is a schematic diagram showing a first gate layer has been formed in both a first display region and a second display region according to an embodiment of the present disclosure.

In an embodiment of the present disclosure, referring to FIGS. 46 to 48, the first gate layer 113 may be formed on the side, distal from the base substrate 101, of the buffer layer 111. With reference to FIGS. 45 to 48, the first gate layer 113 may include a plurality of stripe patterns. In addition, an overlap area is preset between an orthographic projection of the pattern of the first gate layer 113 disposed in the first display region 101a onto the base substrate 101 and the orthographic projection of the first auxiliary electrode layer 102 onto the base substrate 101. An overlap area is present between an orthographic projection of the pattern of the first gate layer 113 disposed in the second display region 101b onto the base substrate 101 and the orthographic projections of the auxiliary electrode patterns 1061 onto the base substrate 101.

In step 306, a first gate insulation layer is formed on a side, distal from the base substrate, of the first gate layer.

Figure 49:
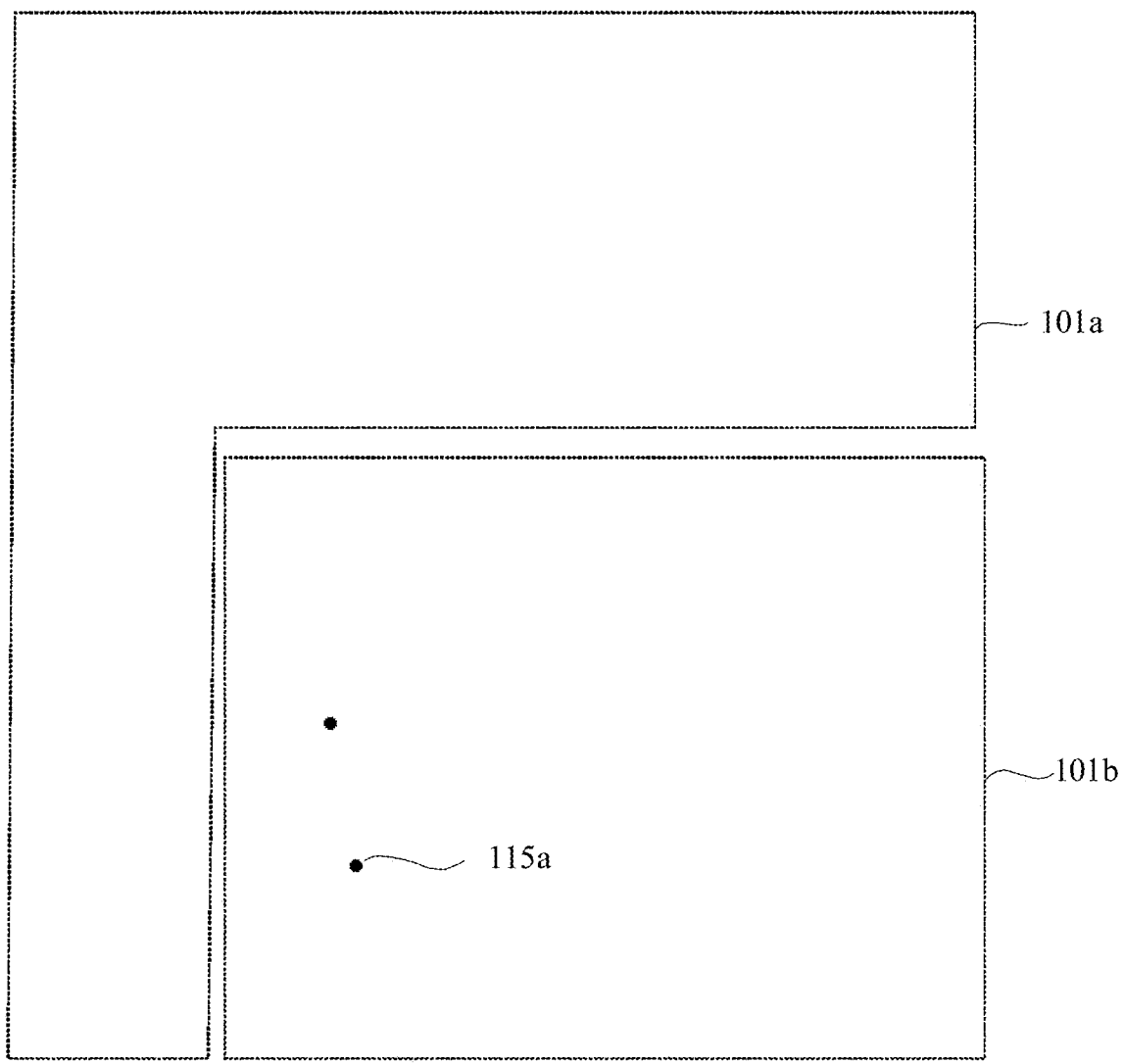
FIG. 49 is a schematic structural diagram of a first gate insulation layer according to an embodiment of the present disclosure.
Figure 50:
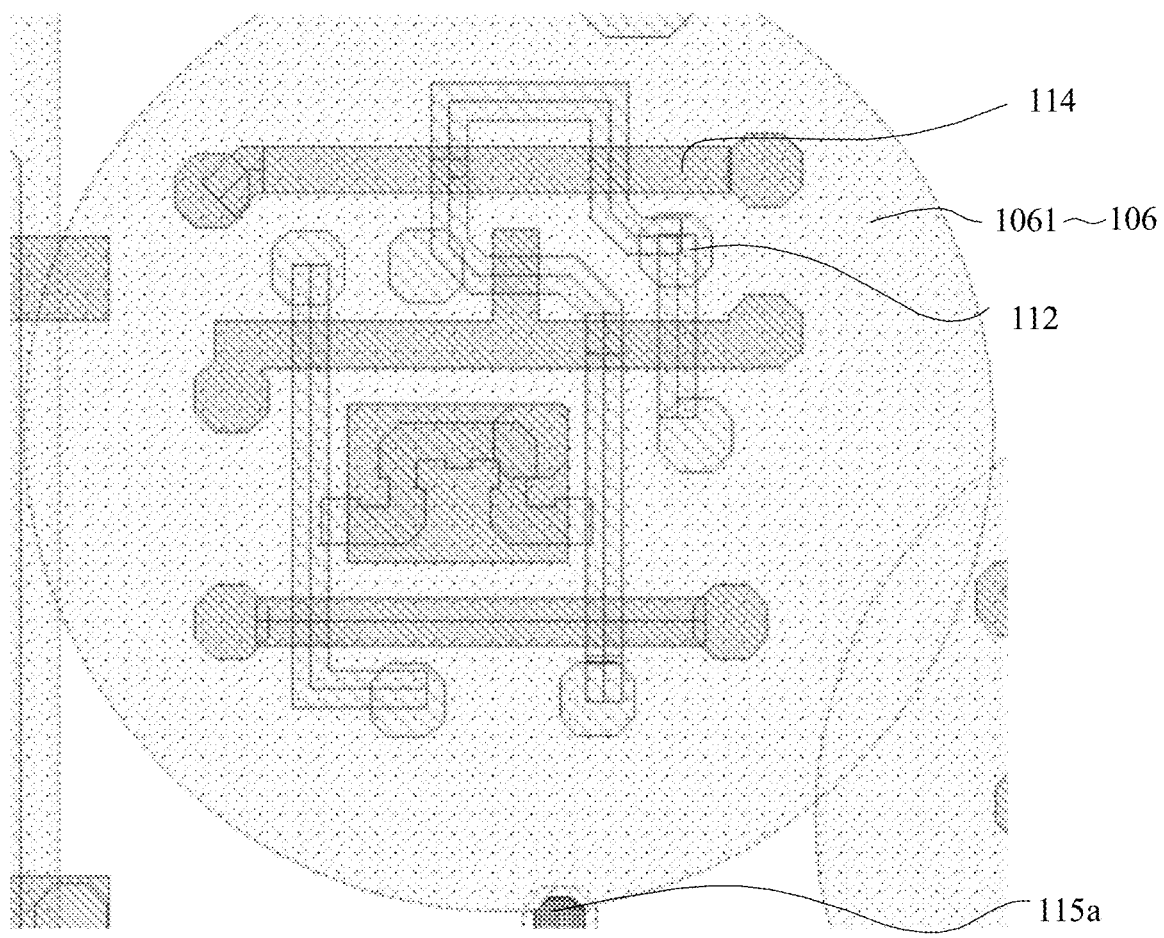
FIG. 50 is a schematic diagram showing a first gate insulation layer has been formed in a second display region according to an embodiment of the present disclosure.
Figure 51:
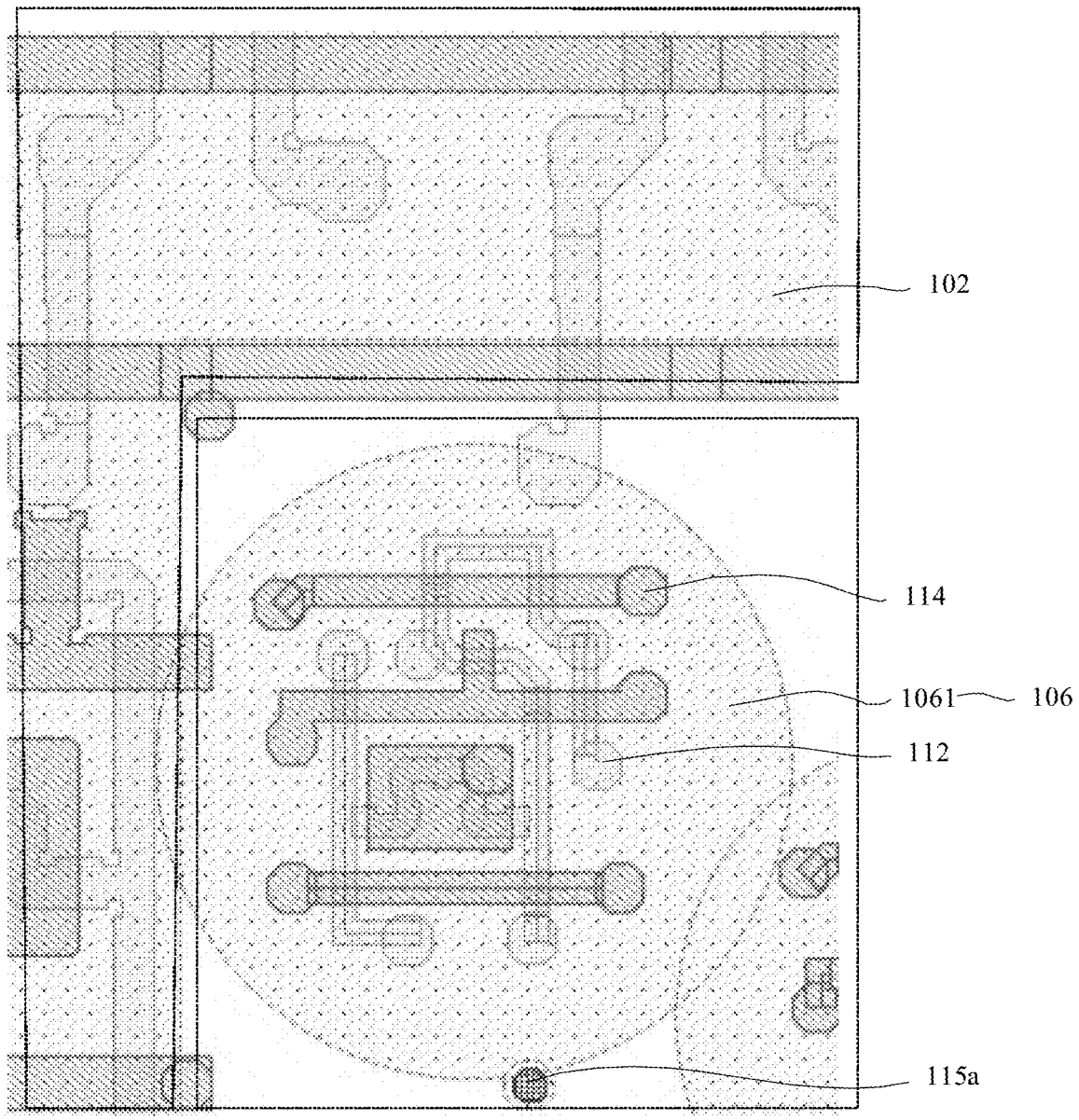
FIG. 51 is a schematic diagram showing a first gate insulation layer has been formed in both a first display region and a second display region according to an embodiment of the present disclosure.

Referring to FIGS. 49 to 51, in order to facilitate illustration of each via hole 115a in the first gate insulation layer 114, the via holes 115a are represented by filled patterns in FIGS. 49 to 51. Other regions where no filled pattern is drawn are intended to indicate regions of the first gate insulation layer 114 having solid materials. With reference to FIGS. 49 to 51, the via holes 115a are formed in a portion disposed in the second display region 101b of the first gate insulation layer 114 but not in a portion disposed in the first display region 101a.

In step 307, a second gate layer is formed on a side, distal from the base substrate, of the first gate insulation layer.

Figure 52:
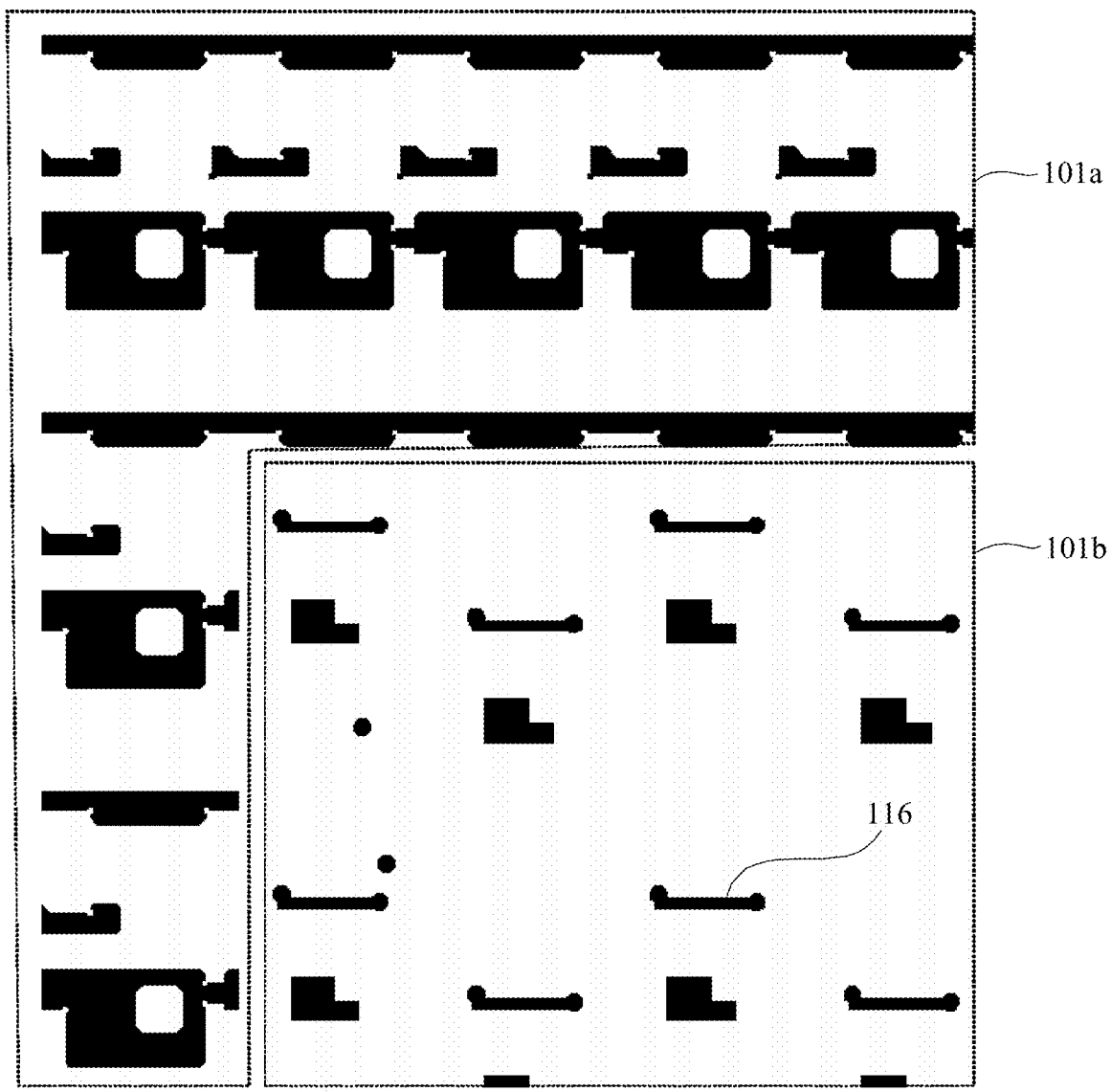
FIG. 52 is a schematic structural diagram of a second gate layer according to an embodiment of the present disclosure.

FIG. 52 is a schematic structural diagram of a second gate layer according to an embodiment of the present disclosure. Referring to FIG. 52, a width of a portion disposed the first display region 101a of the second gate layer 115 is greater than that of a portion disposed in the second display region 101b of the second gate layer 115. Therefore, the transmittance and the pixel density of the second display region 101b may be improved, and the imaging effect of the camera disposed in the second display region 101b may be guaranteed.

Optionally, the width of the portion disposed in the first display region 101a of the second gate layer 115 ranges from 3.0 µm to 3.4 µm, and the width of the portion disposed in the second display region 101b of the second gate layer 115 ranges from 1.8 µm to 2.0 µm.

Figure 53:
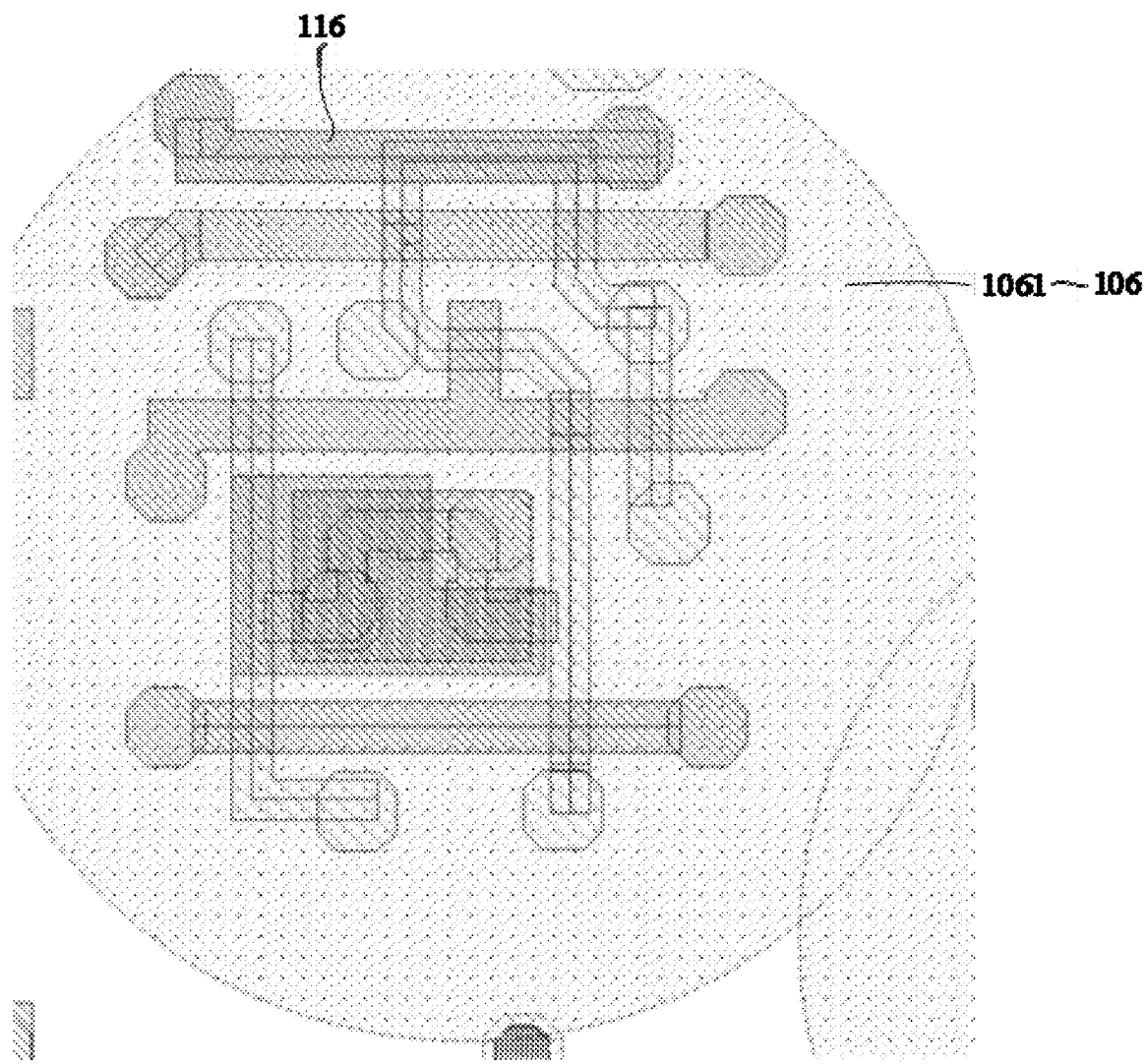
FIG. 53 is a schematic diagram showing a second gate layer has been formed in a second display region according to an embodiment of the present disclosure.
Figure 54:
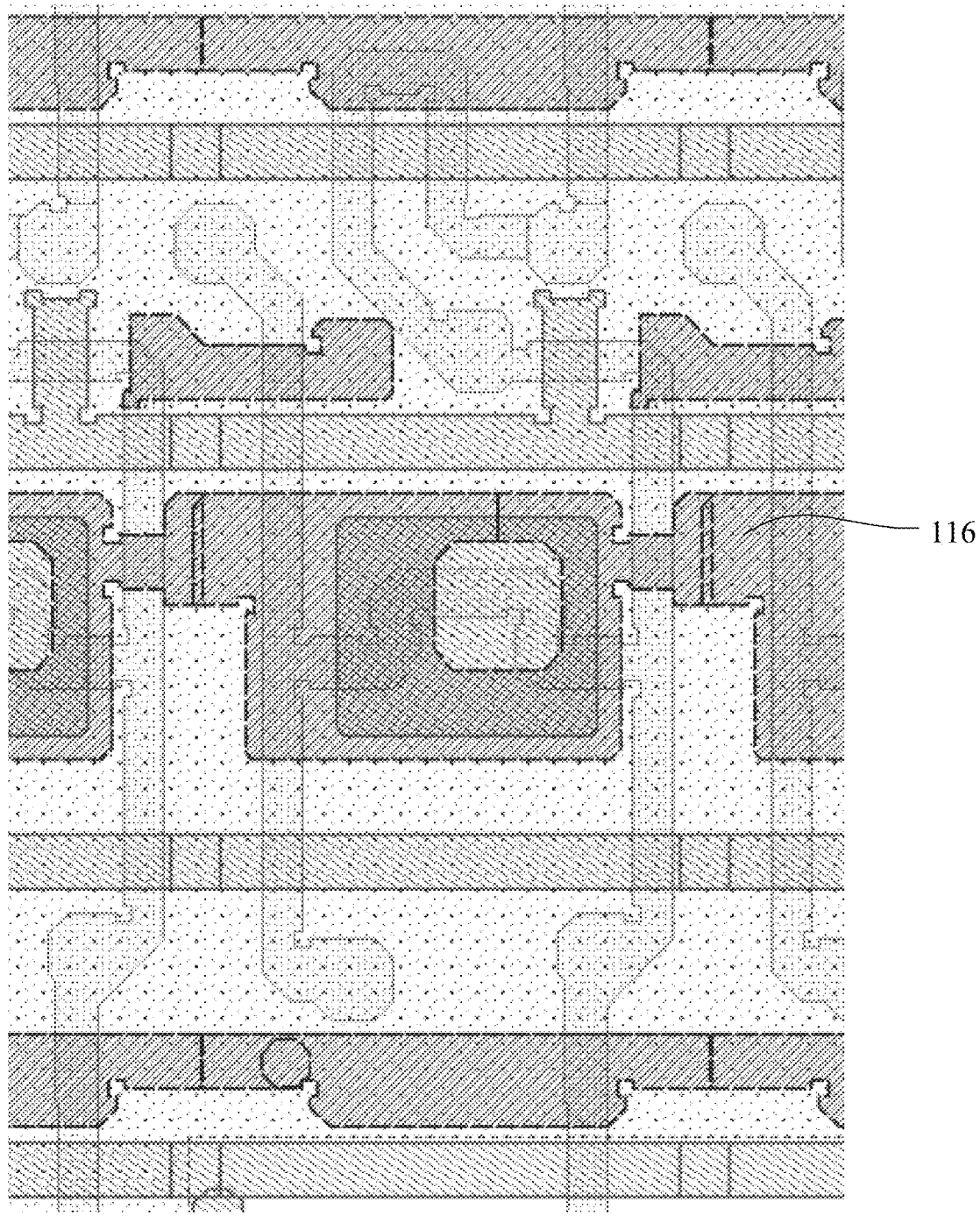
FIG. 54 is a schematic diagram showing a second gate layer has been formed in a first display region according to an embodiment of the present disclosure.
Figure 55:
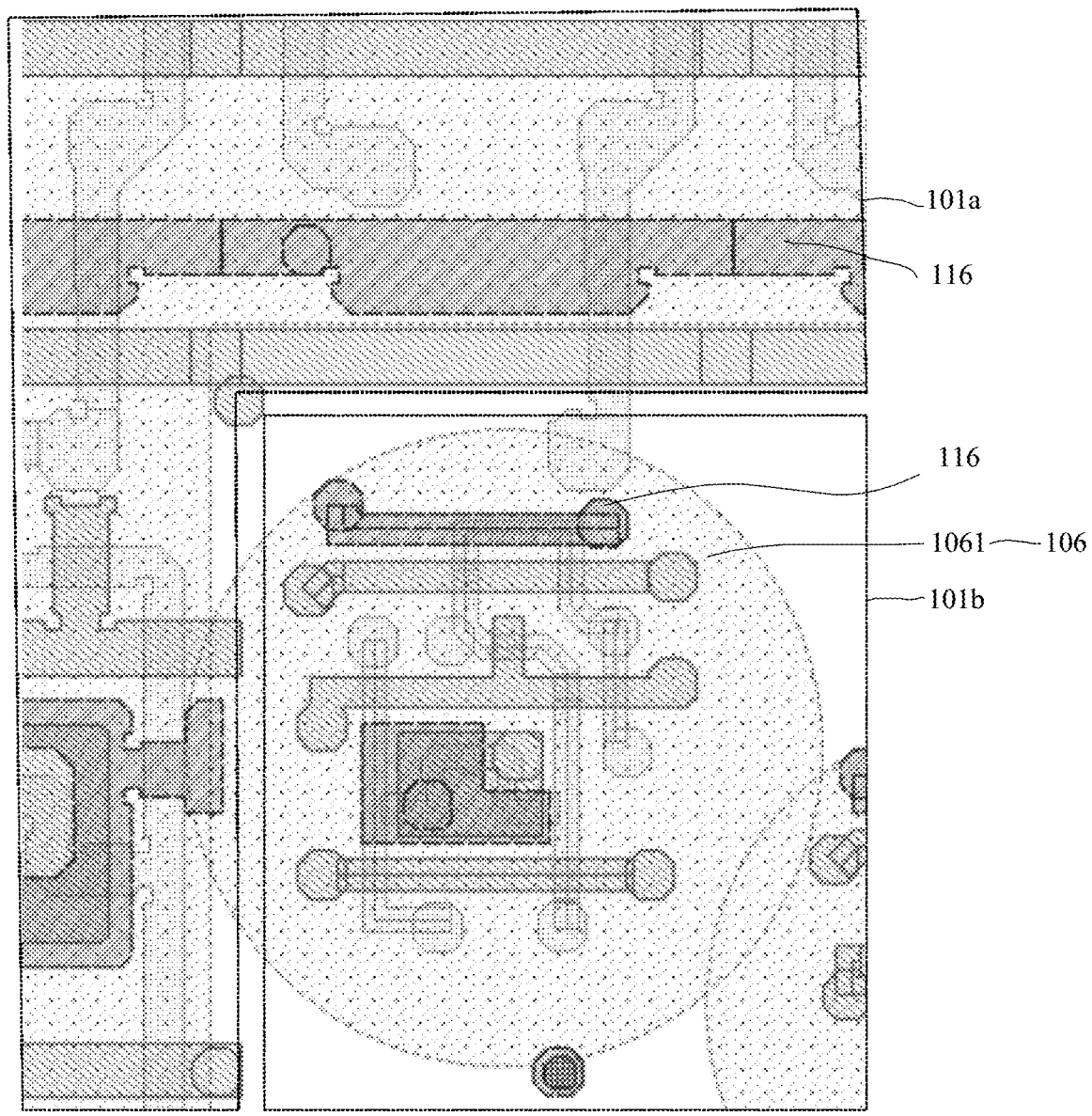
FIG. 55 is a schematic diagram showing a second gate layer has been formed in both a first display region and a second display region according to an embodiment of the present disclosure.

In an embodiment of the present disclosure, referring to FIGS. 53 to 55, the second gate layer 115 may be formed on a side, distal from the base substrate 101, of the first gate insulation layer 114. Referring to FIGS. 52 to 55, the second gate layer 115 may include a plurality of patterns. In addition, there is an overlap area between an orthographic projection of the pattern of the second gate layer 115 disposed in the first display region 101a onto the base substrate 101 and the orthographic projection of the first auxiliary electrode layer 102 onto the base substrate 101. There is an overlap area between an orthographic projection of the pattern of the second gate layer 115 disposed in the second display region 101b onto the base substrate 101 and the orthographic projections of the auxiliary electrode patterns 1061 onto the base substrate 101.

In step 308, a second gate insulation layer and an interlayer dielectric layer are formed on a side, distal from the base substrate, of the second gate layer.

Figure 56:
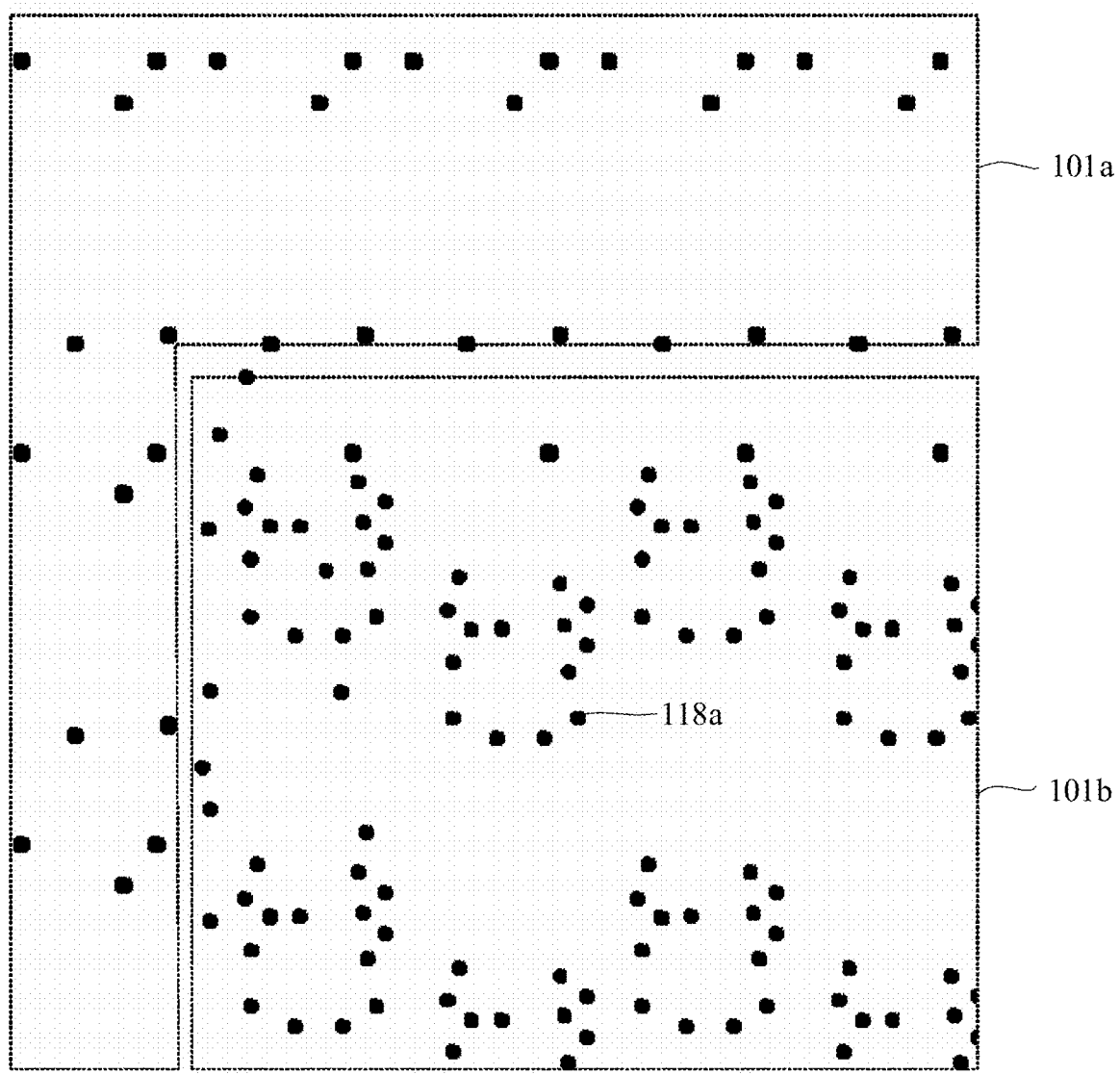
FIG. 56 is a schematic structural diagram of an interlayer dielectric layer according to an embodiment of the present disclosure.
Figure 57:
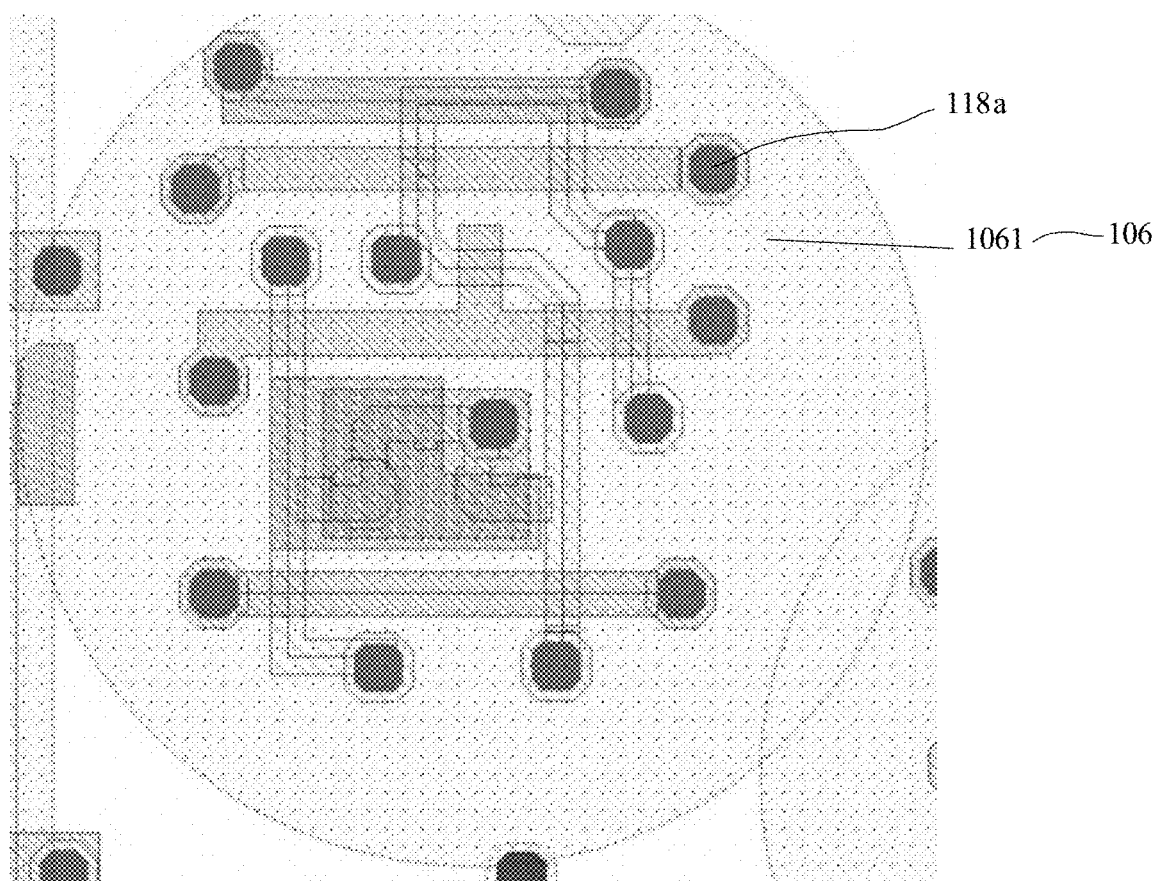
FIG. 57 is a schematic diagram showing an interlayer dielectric layer has been formed in a second display region according to an embodiment of the present disclosure.
Figure 58:
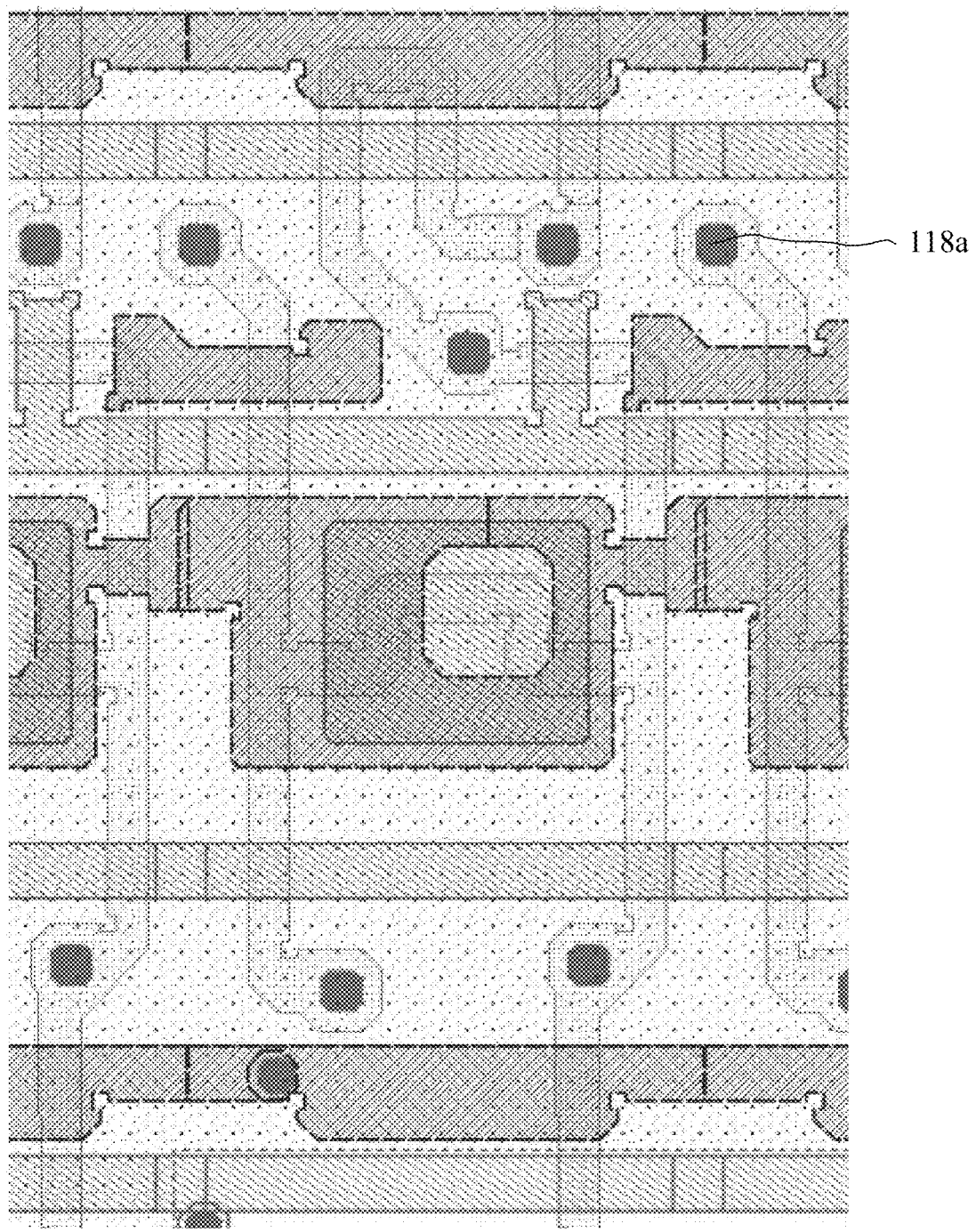
FIG. 58 is a schematic diagram showing an interlayer dielectric layer has been formed in a first display region according to an embodiment of the present disclosure.
Figure 59:
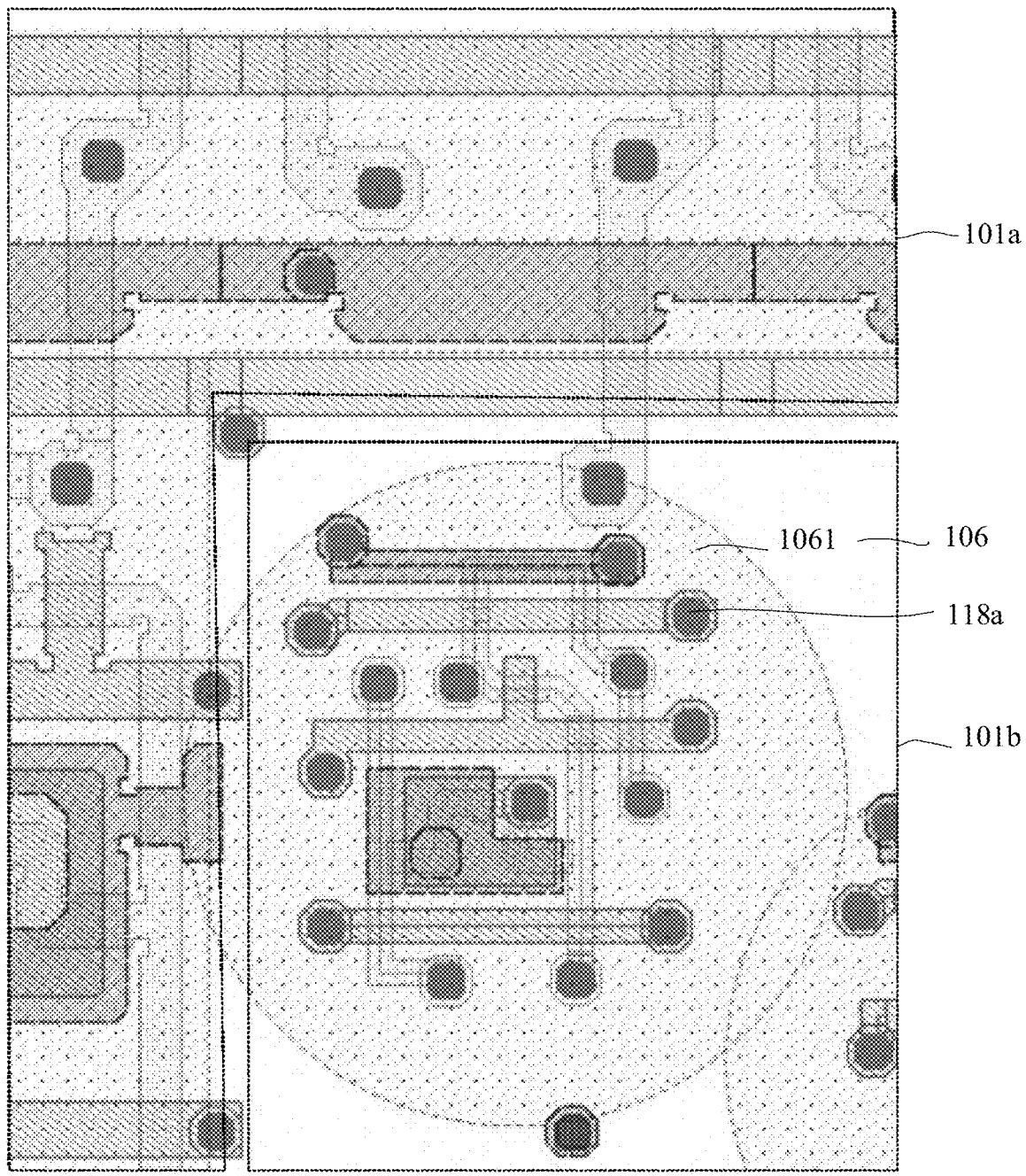
FIG. 59 is a schematic diagram showing an interlayer dielectric layer has been formed in both a first display region and a second display region according to an embodiment of the present disclosure.

FIG. 56 is a schematic structural diagram of an interlayer dielectric layer according to an embodiment of the present disclosure. FIG. 57 is a schematic diagram showing an interlayer dielectric layer has been formed in a second display region according to an embodiment of the present disclosure. FIG. 58 is a schematic diagram showing an interlayer dielectric layer has been formed in a first display region according to an embodiment of the present disclosure. FIG. 59 is a schematic diagram showing an interlayer dielectric layer has been formed in both a first display region and a second display region according to an embodiment of the present disclosure.

In order to facilitate the illustration of each via hole 118a in the interlayer dielectric layer 117, the via holes 118a are represented by filled patterns in FIGS. 56 to 59. Other regions where no filled pattern is drawn are intended to indicate regions of the interlayer dielectric layer 117 having solid materials. With reference to FIGS. 56 to 59, the via holes 118 are formed in a portion disposed in the first display region 101a of the interlayer dielectric layer 117 and in a portion disposed in the second display region 101b of the interlayer dielectric layer 117.

It should be noted that each via hole 118a formed in the interlayer dielectric layer 117 is used for connection between a subsequently formed film layer to a film layer on a side, proximal to the base substrate 101, of the interlayer dielectric layer 117. That is, each via hole 118a is a via hole for connecting the film layers. Therefore, the larger the aperture of the via hole is, the lower the transmittance is; and the smaller the aperture of the via hole is, the higher the transmittance is.

Therefore, in order to improve the transmittance and the pixel density of the second display region 101b and ensure the imaging effect of the camera disposed in the second display region 101b, an aperture of the via hole 118a of the interlayer dielectric layer 117 disposed in the second display region 101b may be less than that of the via hole 118a of the interlayer dielectric layer 117 disposed in the first display region 101a.

Optionally, the aperture of the via hole 118a of the interlayer dielectric layer 117 disposed in the first display region 101a ranges from 2.3 µm to 2.5 µm, and the aperture of the via hole 118 of the interlayer dielectric layer 117 disposed in the second display region 101b ranges from 1.8 µm to 2.0 µm.

In an embodiment of the present disclosure, the second gate insulation layer 116 and the interlayer dielectric layer 117 may have the same film structure, which is not repeated in the embodiment of the present disclosure.

In step 309, a first source/drain layer is formed on a side, distal from the base substrate, of the interlayer dielectric layer.

Figure 60:
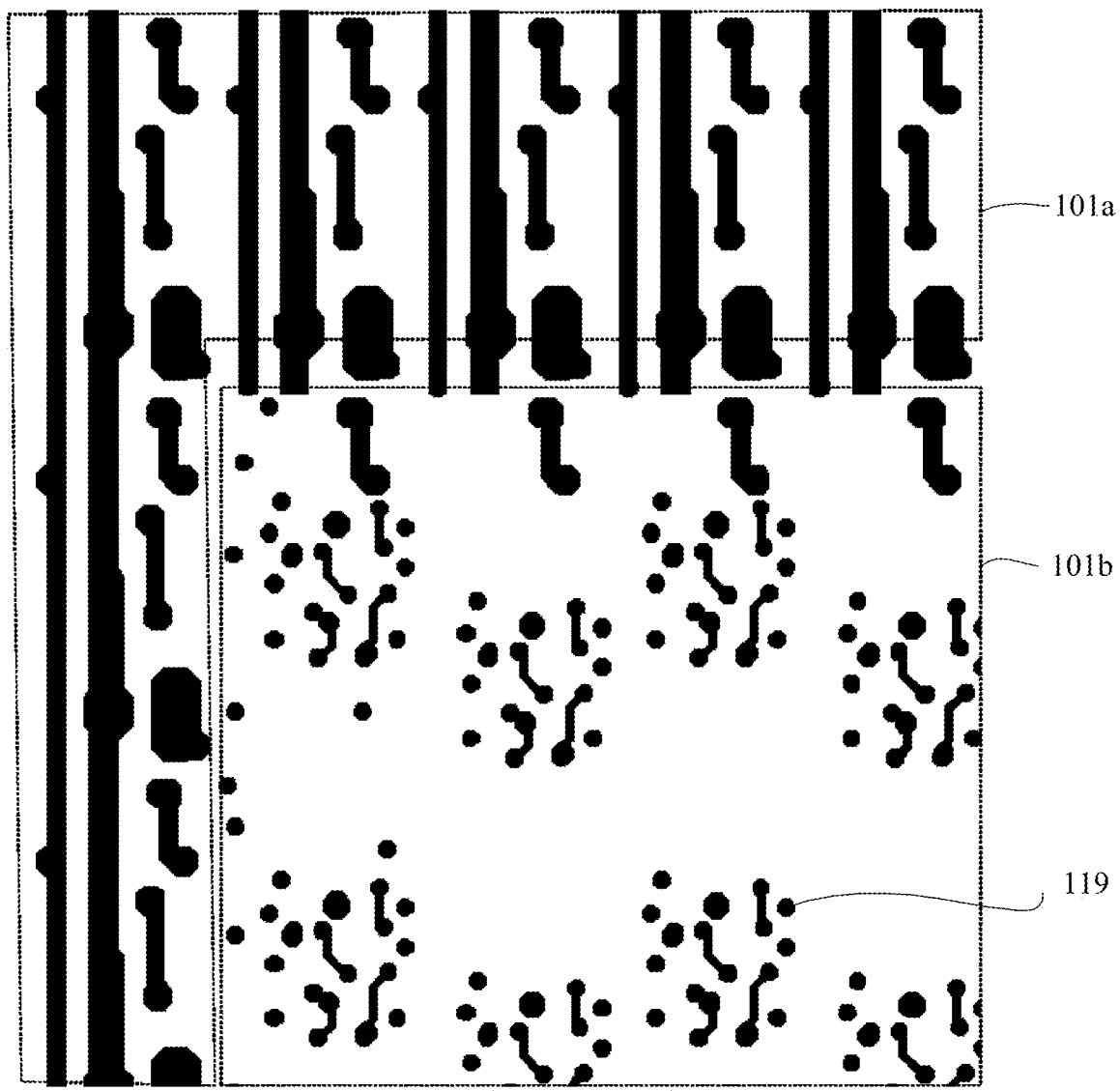
FIG. 60 is a schematic structural diagram of a first source/drain layer according to an embodiment of the present disclosure.

FIG. 60 is a schematic structural diagram of a first source/drain layer according to an embodiment of the present disclosure. Referring to FIG. 60, a width of a portion disposed in the first display region 101a of the first source/drain layer 118 is greater than that of a portion disposed in the second display region 101b of the first source/drain layer 118. Therefore, the transmittance and the pixel density of the second display region 101b may be improved, and the imaging effect of the camera disposed in the second display region 101b may be guaranteed.

Optionally, the width of the portion disposed in the first display region 101a of the first source/drain layer 118 ranges from 3.0 µm to 3.2 µm, and the width of the portion disposed in the second display region 101b of the first source/drain layer 118 ranges from 1.4 µm to 1.6 µm.

Figure 61:
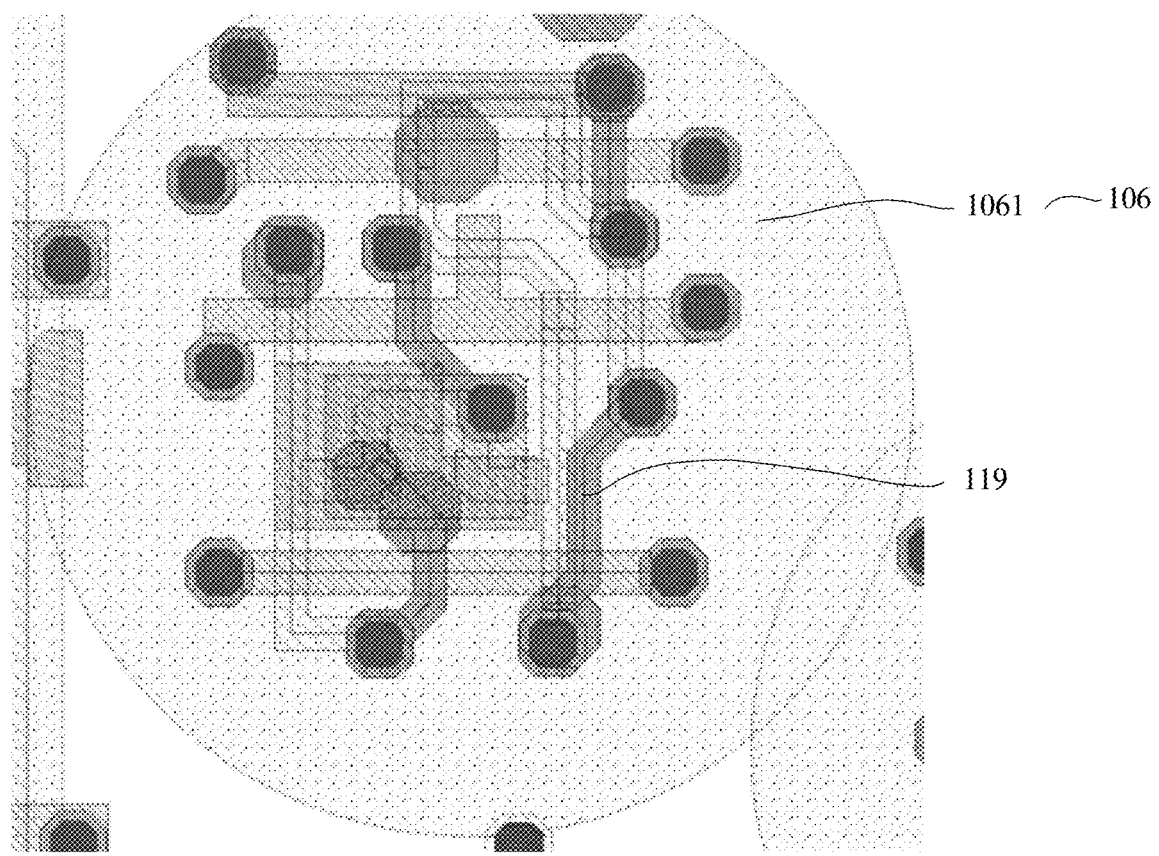
FIG. 61 is a schematic diagram showing a first source/drain layer has been formed in a second display region according to an embodiment of the present disclosure.
Figure 62:
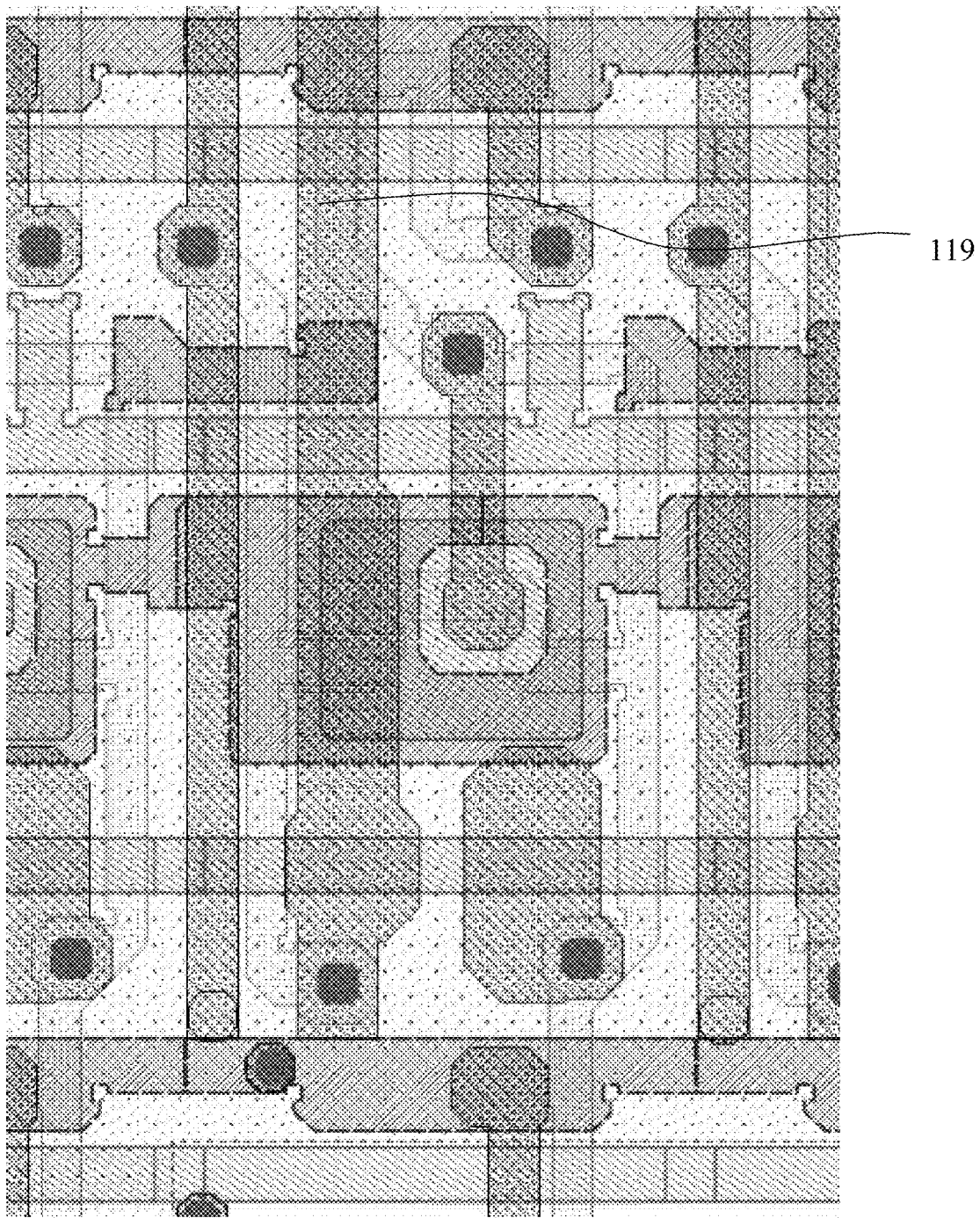
FIG. 62 is a schematic diagram showing a first source/drain layer has been formed in a first display region according to an embodiment of the present disclosure.
Figure 63:
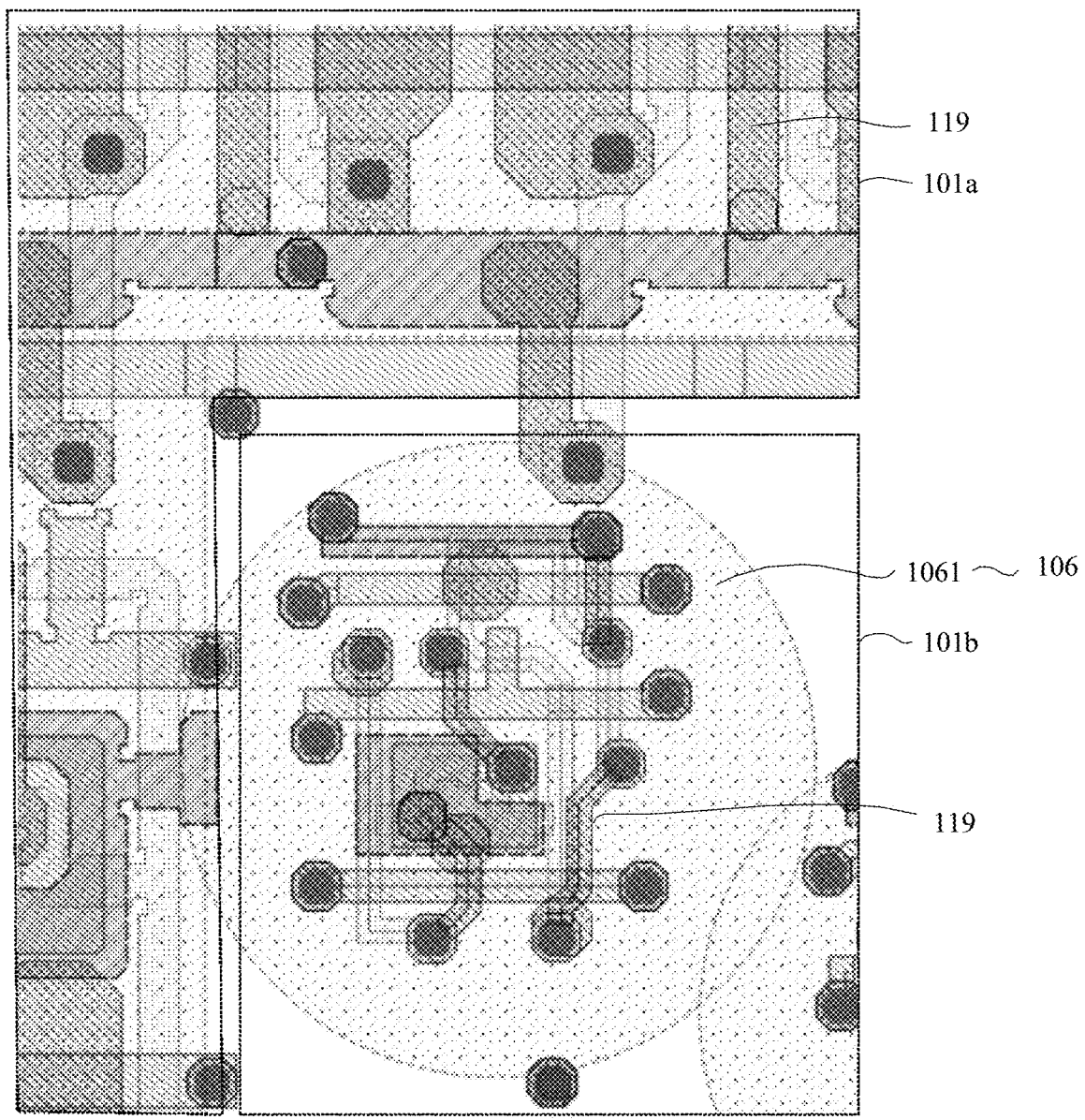
FIG. 63 is a schematic diagram showing a first source/drain layer has been formed in both a first display region and a second display region according to an embodiment of the present disclosure.

In an embodiment of the present disclosure, referring to FIGS. 61 to 63, the first source/drain layer 118 may be formed on a side, distal from the base substrate 101, of the interlayer dielectric layer 117. Referring to FIGS. 60 to 63, the first source/drain layer 118 may include a plurality of patterns. In addition, there is an overlap area between an orthographic projection of the pattern of the first source/drain layer 118 disposed in the first display region 101a onto the base substrate 101 and the orthographic projection of the first auxiliary electrode layer 102 onto the base substrate 101. There is an overlap area between an orthographic projection of the pattern of the first source/drain layer 118 disposed in the second display region 101b onto the base substrate 101 and the orthographic projections of the auxiliary electrode patterns 1061 onto the base substrate 101.

In step 310, a passivation layer is disposed on a side, distal from the base substrate, of the first source/drain layer.

Figure 64:
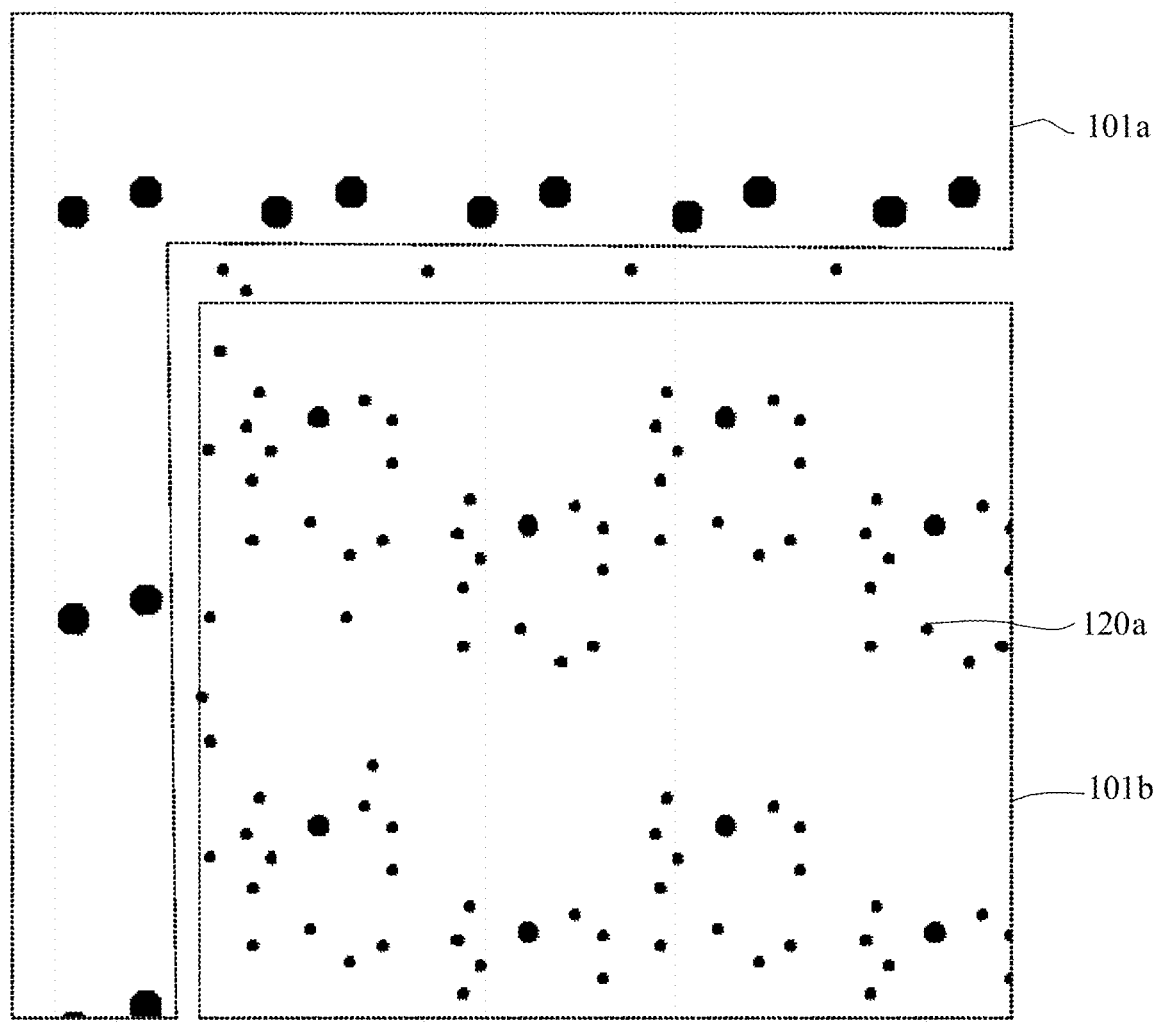
FIG. 64 is a schematic structural diagram of a passivation layer according to an embodiment of the present disclosure.
Figure 65:
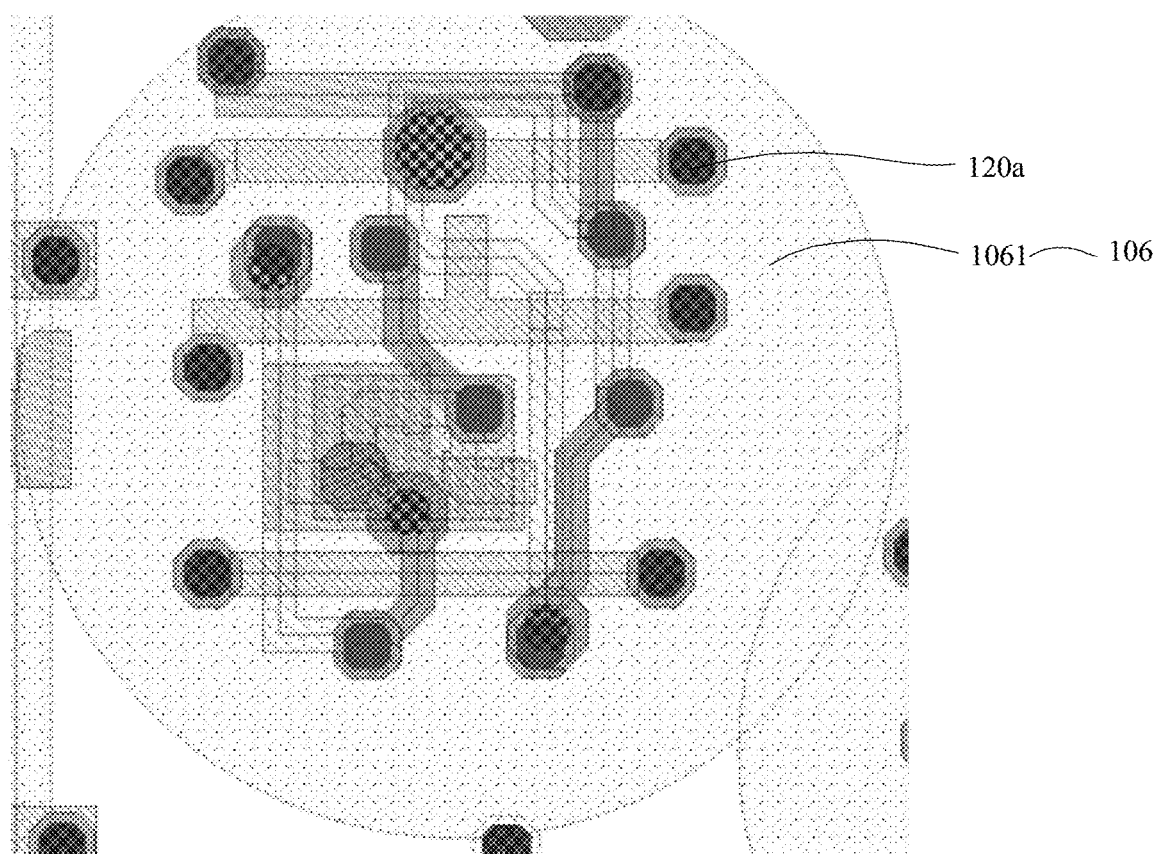
FIG. 65 is a schematic diagram showing a passivation layer has been formed in a second display region according to an embodiment of the present disclosure.
Figure 66:
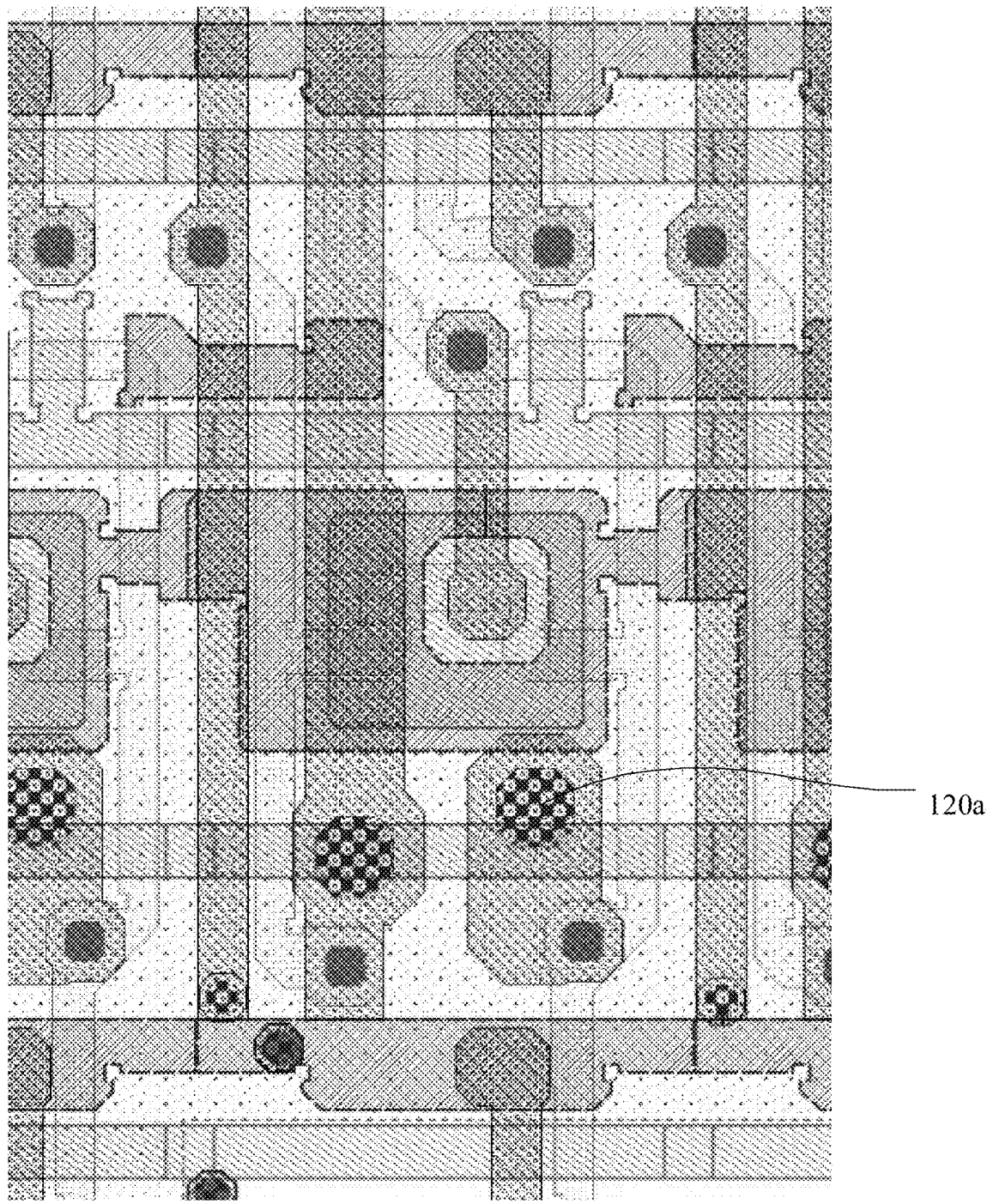
FIG. 66 is a schematic diagram showing a passivation layer has been formed in a first display region according to an embodiment of the present disclosure.
Figure 67:
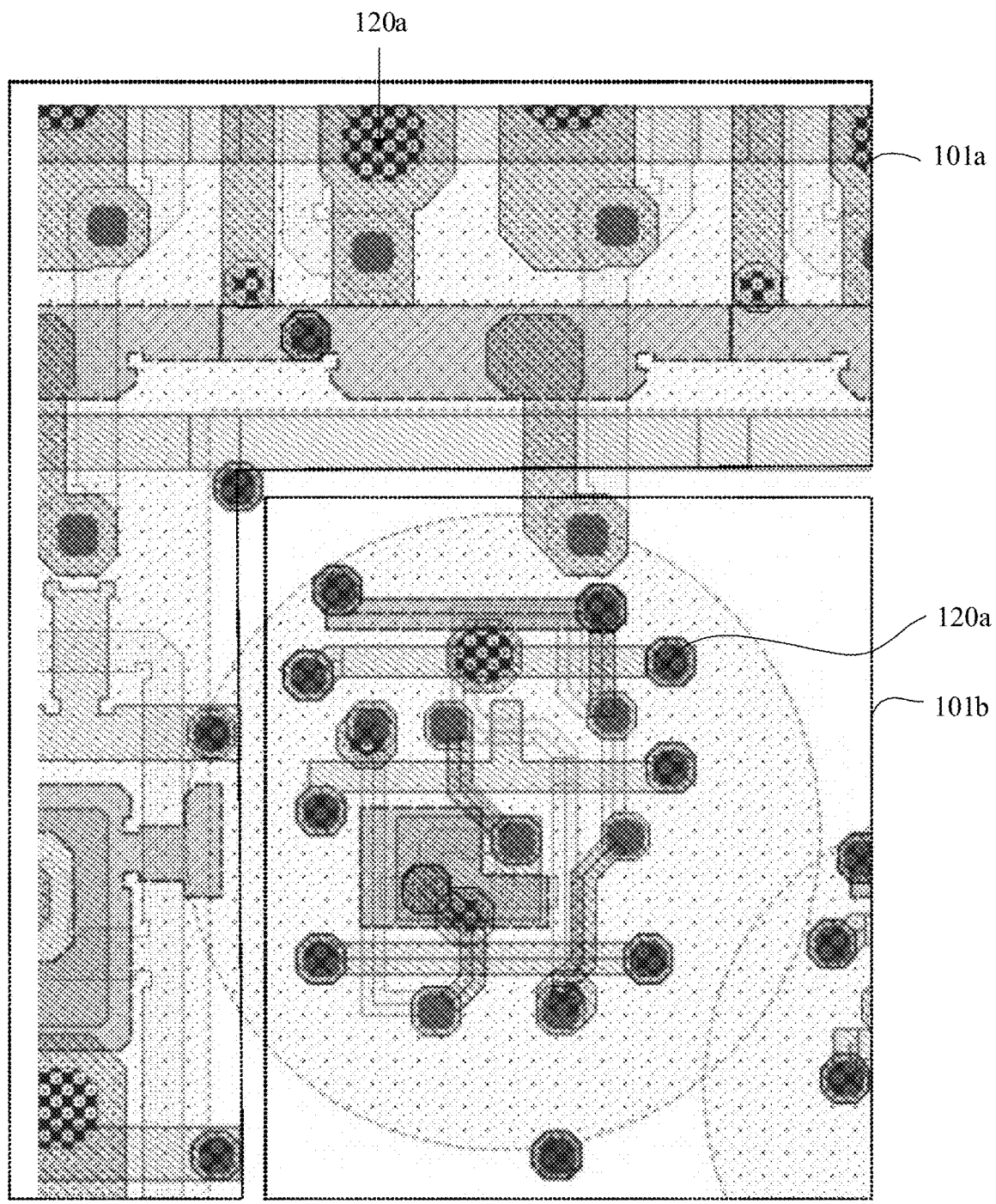
FIG. 67 is a schematic diagram showing a passivation layer has been formed in both a first display region and a second display region according to an embodiment of the present disclosure.
Figure 68:
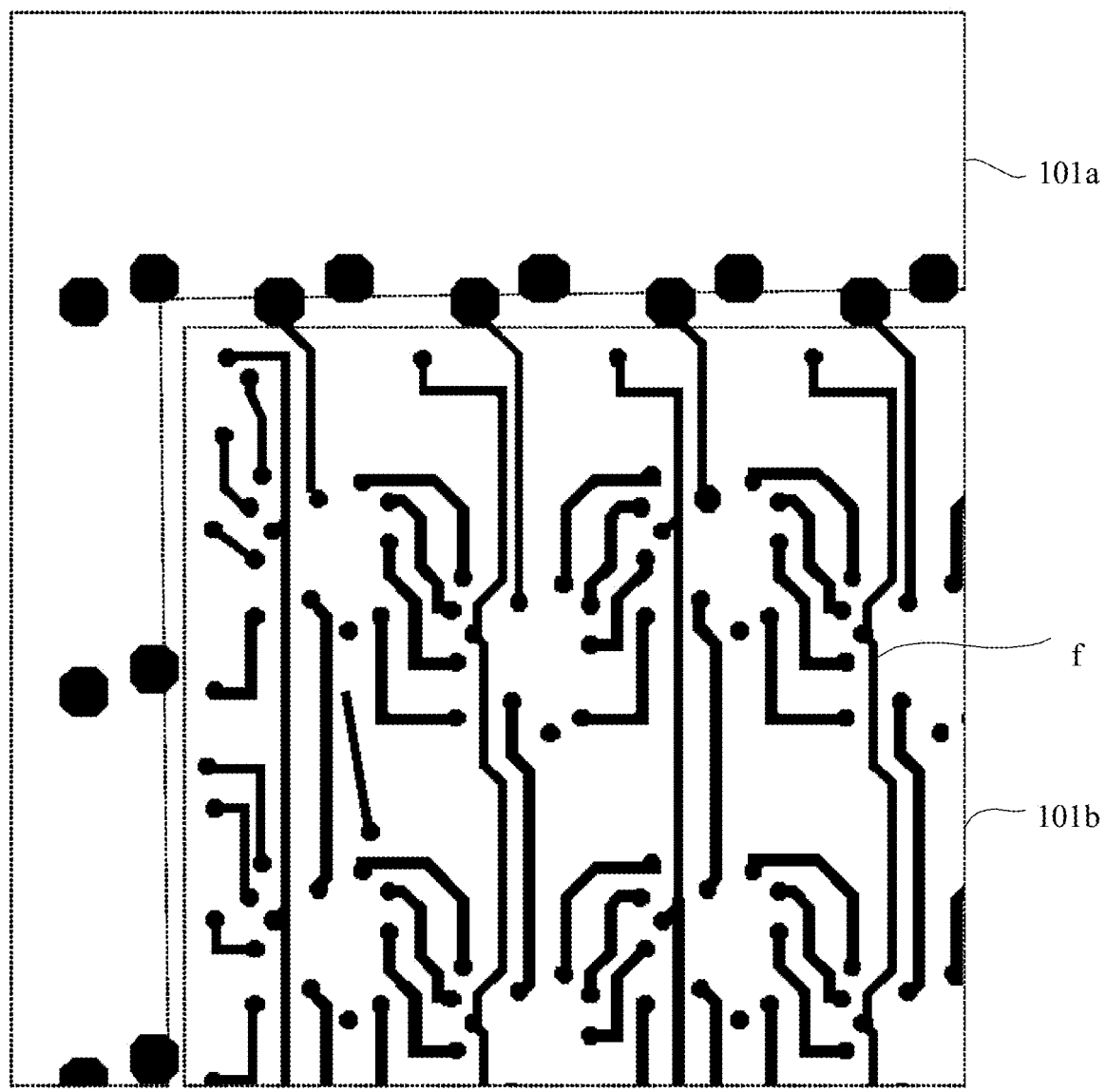
FIG. 68 is a schematic structural diagram of a connection electrode film layer according to an embodiment of the present disclosure.
Figure 69:
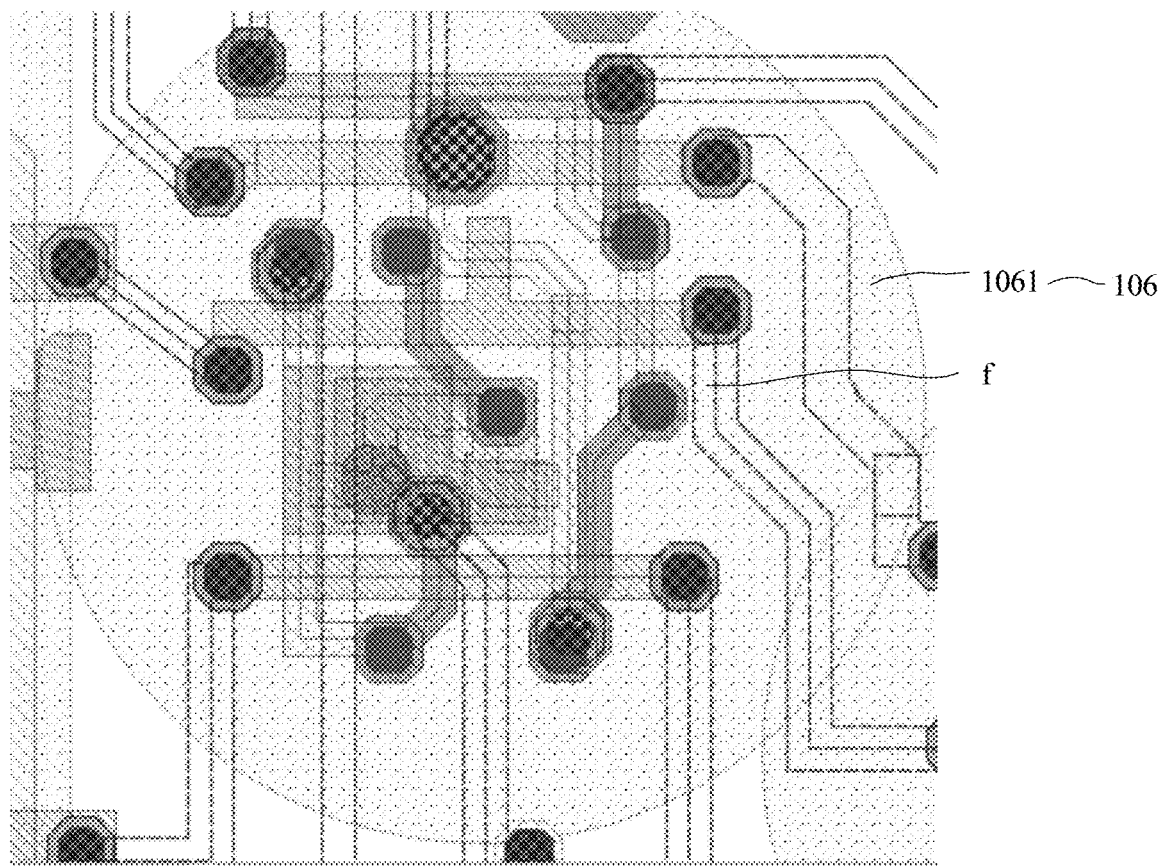
FIG. 69 is a schematic diagram showing a connection electrode film layer has been formed in a second display region according to an embodiment of the present disclosure.
Figure 70:
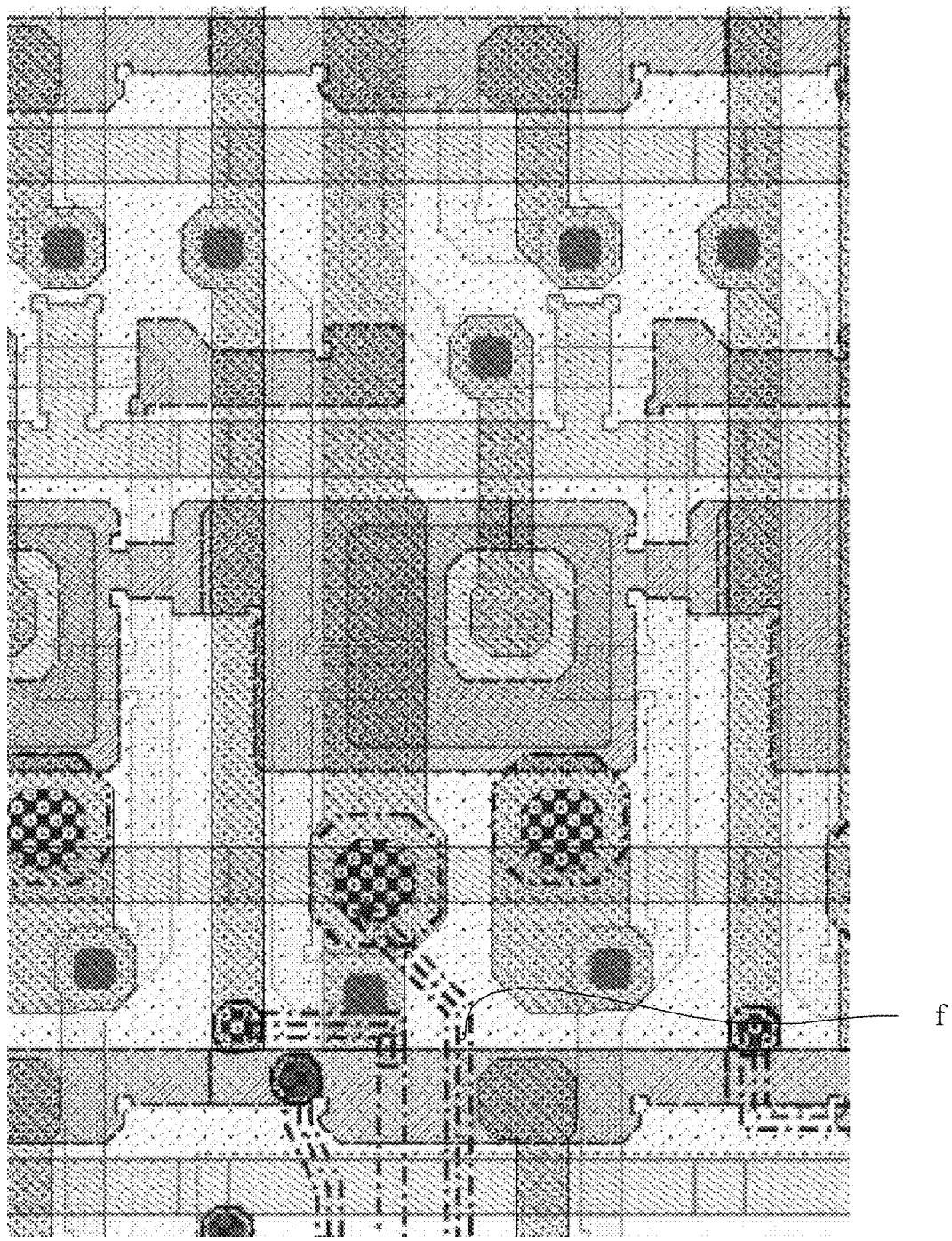
FIG. 70 is a schematic diagram showing a connection electrode film layer has been formed in a first display region according to an embodiment of the present disclosure.
Figure 71:
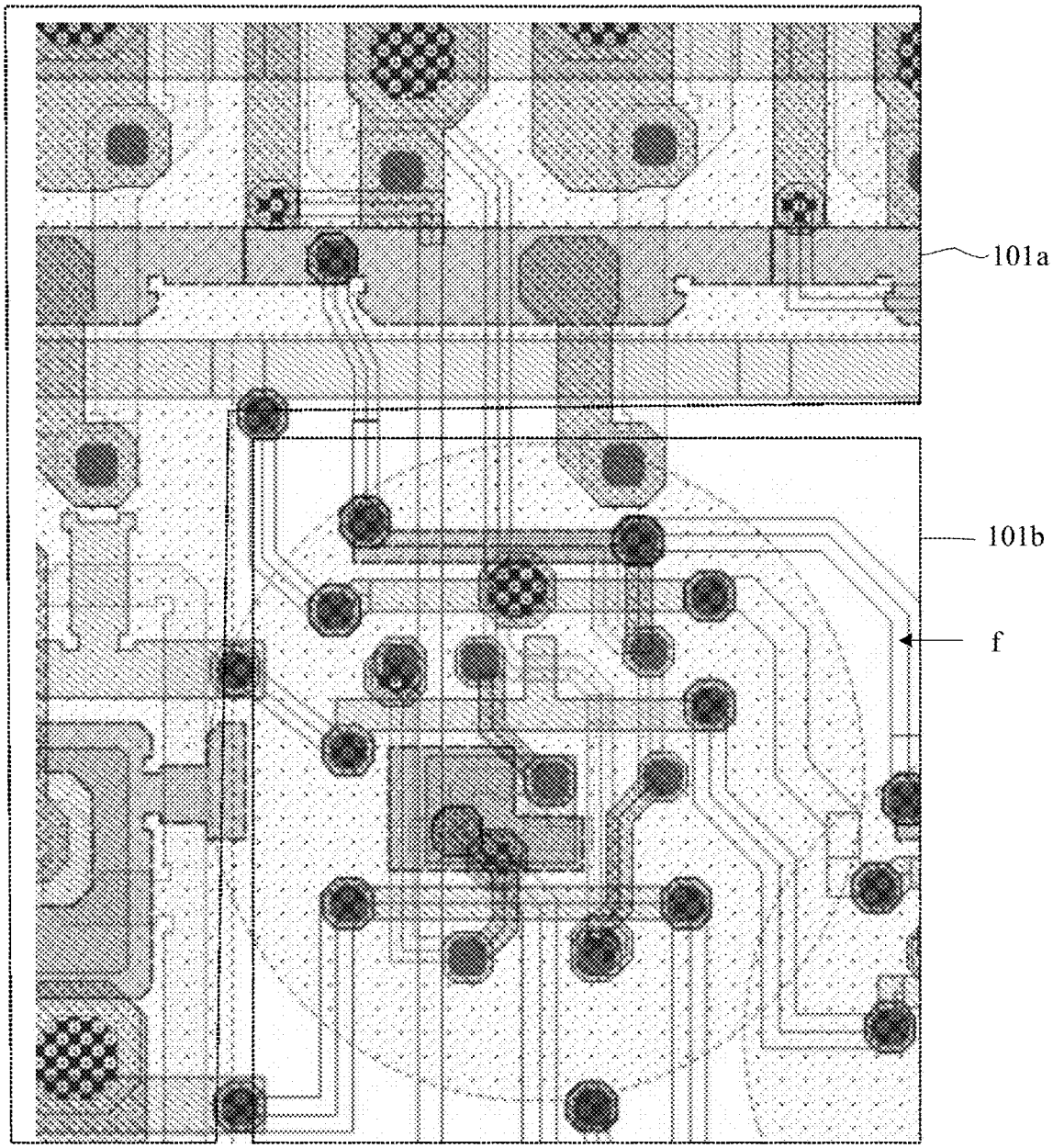
FIG. 71 is a schematic diagram showing a connection electrode film layer has been formed in both a first display region and a second display region according to an embodiment of the present disclosure.

FIG. 64 is a schematic structural diagram of a passivation layer according to an embodiment of the present disclosure. FIG. 65 is a schematic diagram showing a passivation layer has been formed in a second display region according to an embodiment of the present disclosure. FIG. 66 is a schematic diagram showing a passivation layer has been formed in a first display region according to an embodiment of the present disclosure. FIG. 67 is a schematic diagram showing a passivation layer has been formed in both a first display region and a second display region according to an embodiment of the present disclosure.

In order to facilitate the illustration of each via hole 120a in the passivation layer 119, the via holes 120a are represented by filled patterns in FIGS. 64 to 67. Other regions where no filled pattern is drawn are intended to indicate regions of the passivation layer 119 having solid materials. With reference to FIGS. 66 to 67, the via holes 120a are formed in a portion disposed in the first display region 101a of the passivation layer 119 and in a portion disposed in the second display region 101b of the passivation layer 119.

It should be noted that each via hole 120a formed in the passivation layer 119 is used for connection between a subsequently formed film layer and a film layer on a side, proximal to the base substrate 101, of the passivation layer 119. That is, each of the via holes 120a is a via hole for connecting the film layers. Therefore, the larger the aperture of the via hole is, the lower the transmittance is; and the smaller the aperture of the via hole is, the higher the transmittance is.

Therefore, in order to improve the transmittance and the pixel density of the second display region 101b and ensure the imaging effect of the camera disposed in the second display region 101b, an aperture of the via hole 120a of the passivation layer 119 disposed in the first display region 101a may be greater than that of the via hole 120a of the passivation layer 119 disposed in the second display region 101b.

Optionally, the aperture of the via hole 120a of the passivation layer 119 disposed in the first display region 101a ranges from 4.5 µm to 5 µm, and the aperture of the via hole 120a of the passivation layer 119 disposed in the second display region 101b ranges from 1.8 µm to 2.0 µm.

In step 311, a connection electrode film layer is formed on a side, distal from the base substrate, of the passivation layer.

In an embodiment of the present disclosure, referring to FIGS. 68 to 71, the connection electrode film layer f may include a plurality of first connection electrodes 124, a plurality of second connection electrodes 127, and a plurality of third connection electrodes 130. That is, the plurality of first connection electrodes 124, the plurality of second connection electrodes 127, and the plurality of third connection electrodes 130 may be manufactured by the same preparation process. Each of the plurality of first connection electrodes 124, the plurality of second connection electrodes 127 and the plurality of third connection electrodes 130 may be made from a transparent conductive material. Therefore, the transmittance of the second display region 101b may be guaranteed, and the imaging effect of the camera may be improved. In an exemplary embodiment, the first connection electrodes 124, the second connection electrodes 127, and the third connection electrodes 130 may all be made from ITO.

In step 312, a first planarization layer is formed on a side, distal from the base substrate, of the connection electrode film layer.

Figure 72:
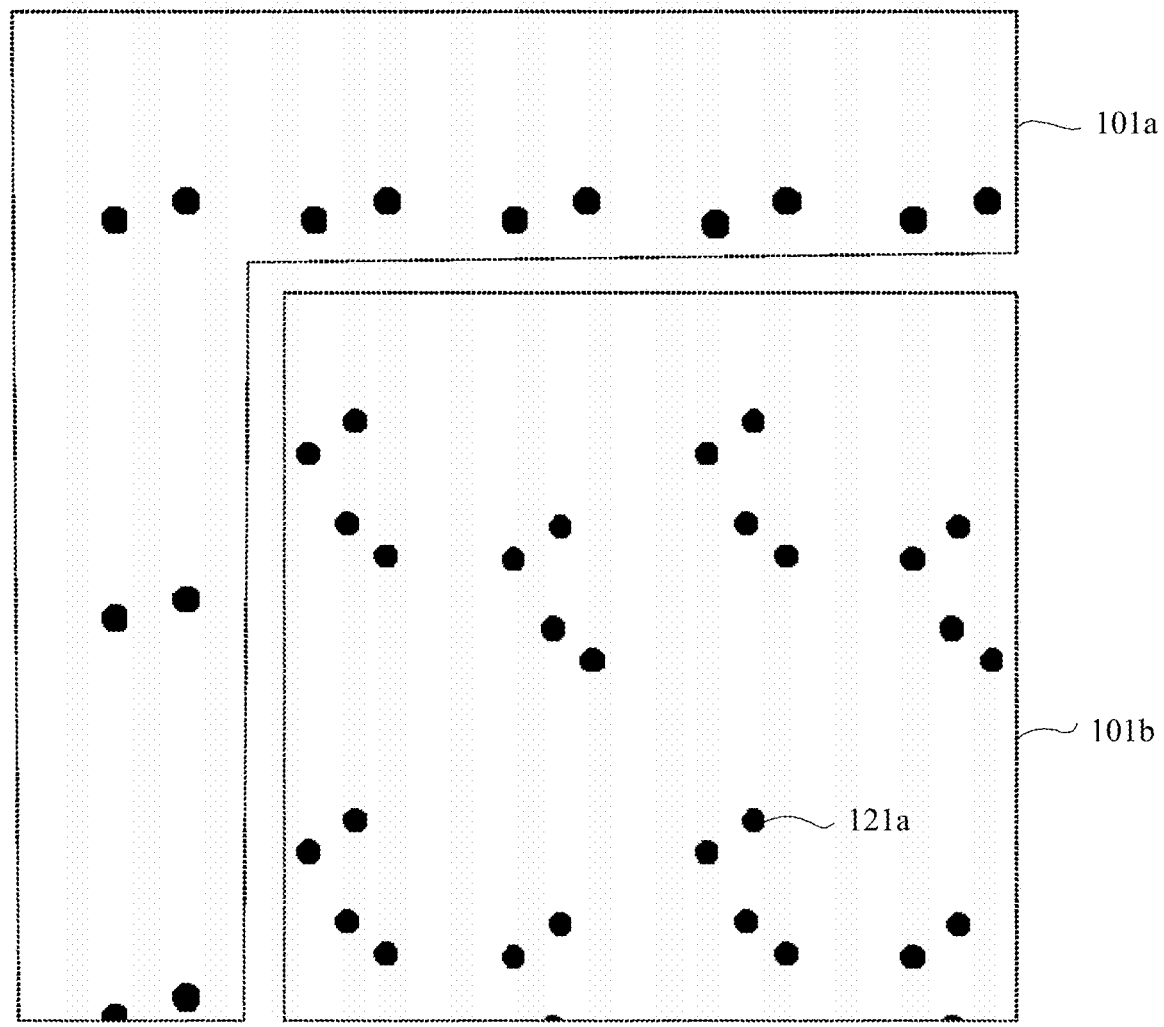
FIG. 72 is a schematic structural diagram of a first planarization layer according to an embodiment of the present disclosure.
Figure 73:
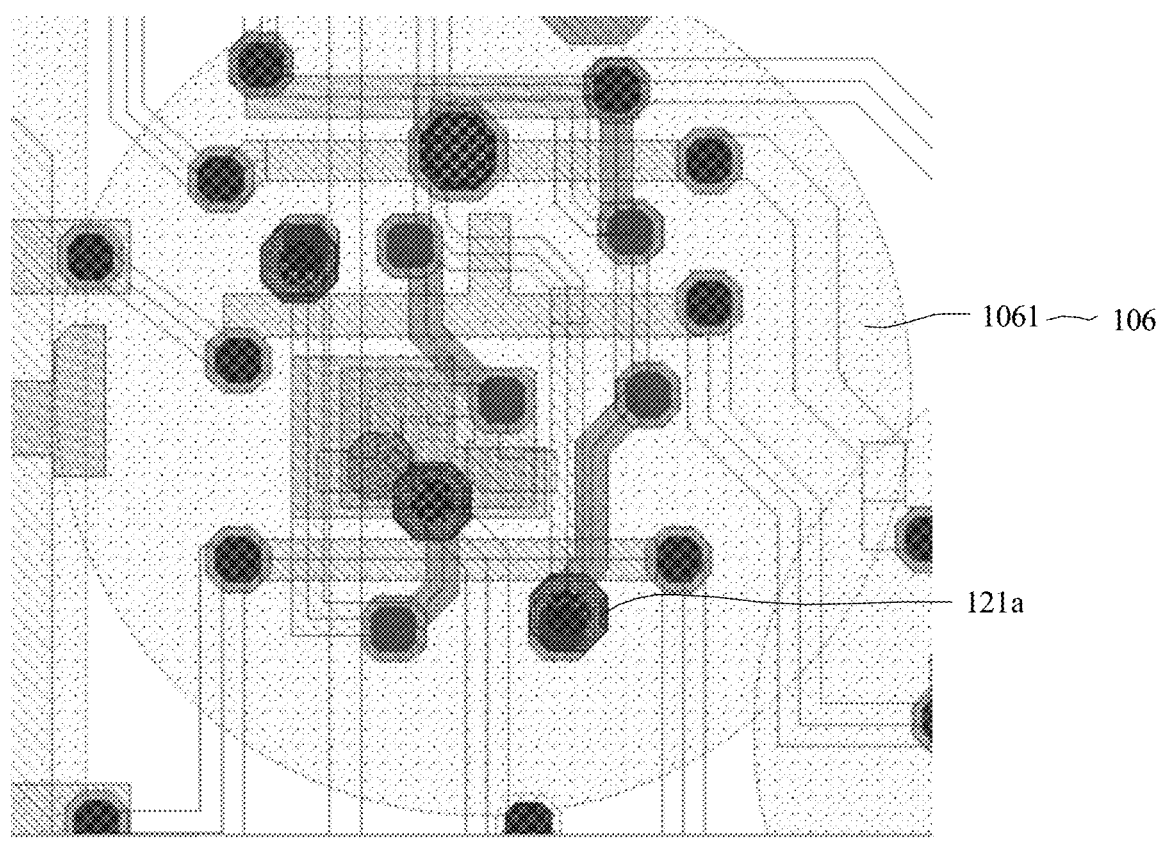
FIG. 73 is a schematic diagram showing a first planarization layer has been formed in a second display region according to an embodiment of the present disclosure.
Figure 74:
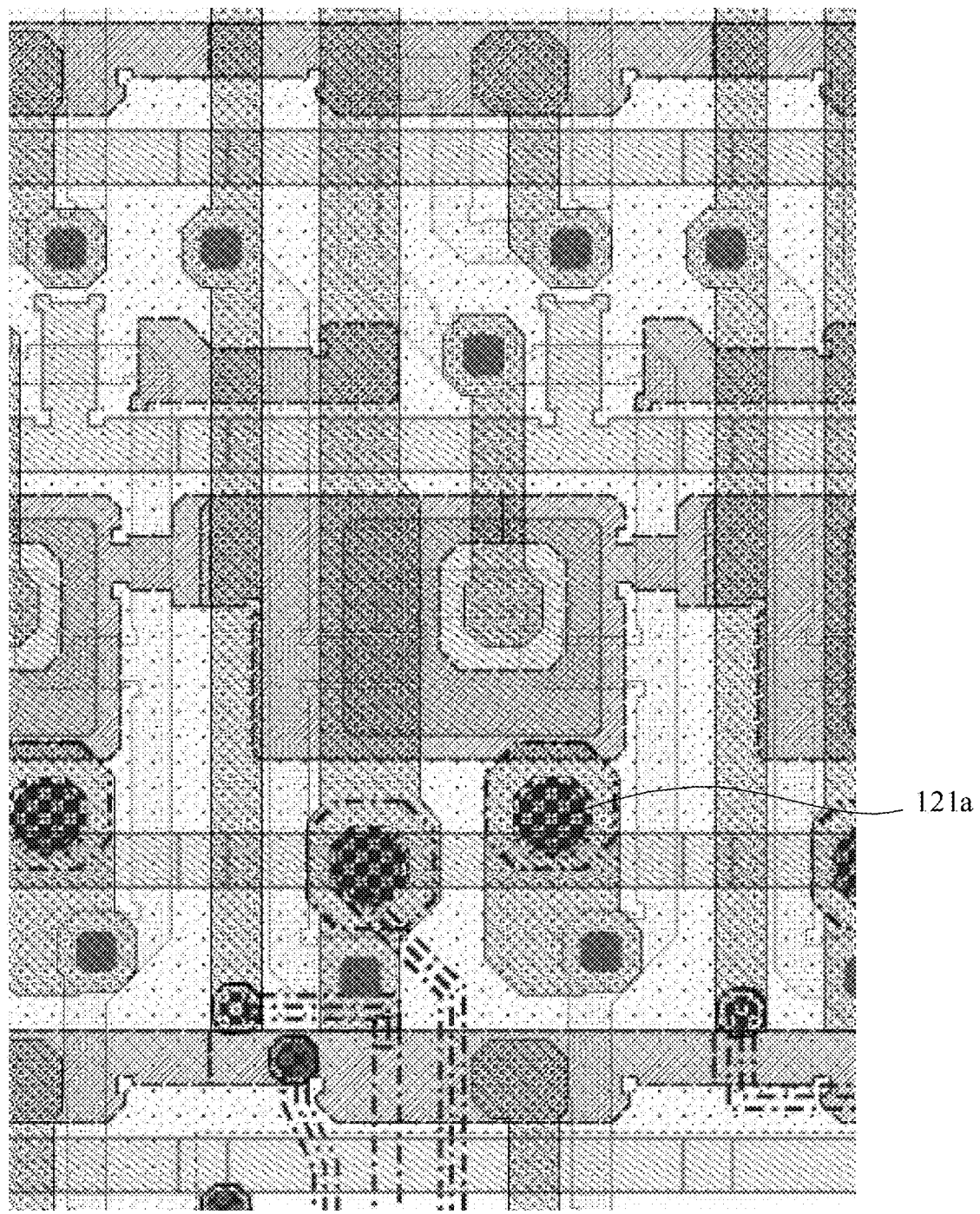
FIG. 74 is a schematic diagram showing a first planarization layer has been formed in a first display region according to an embodiment of the present disclosure.
Figure 75:
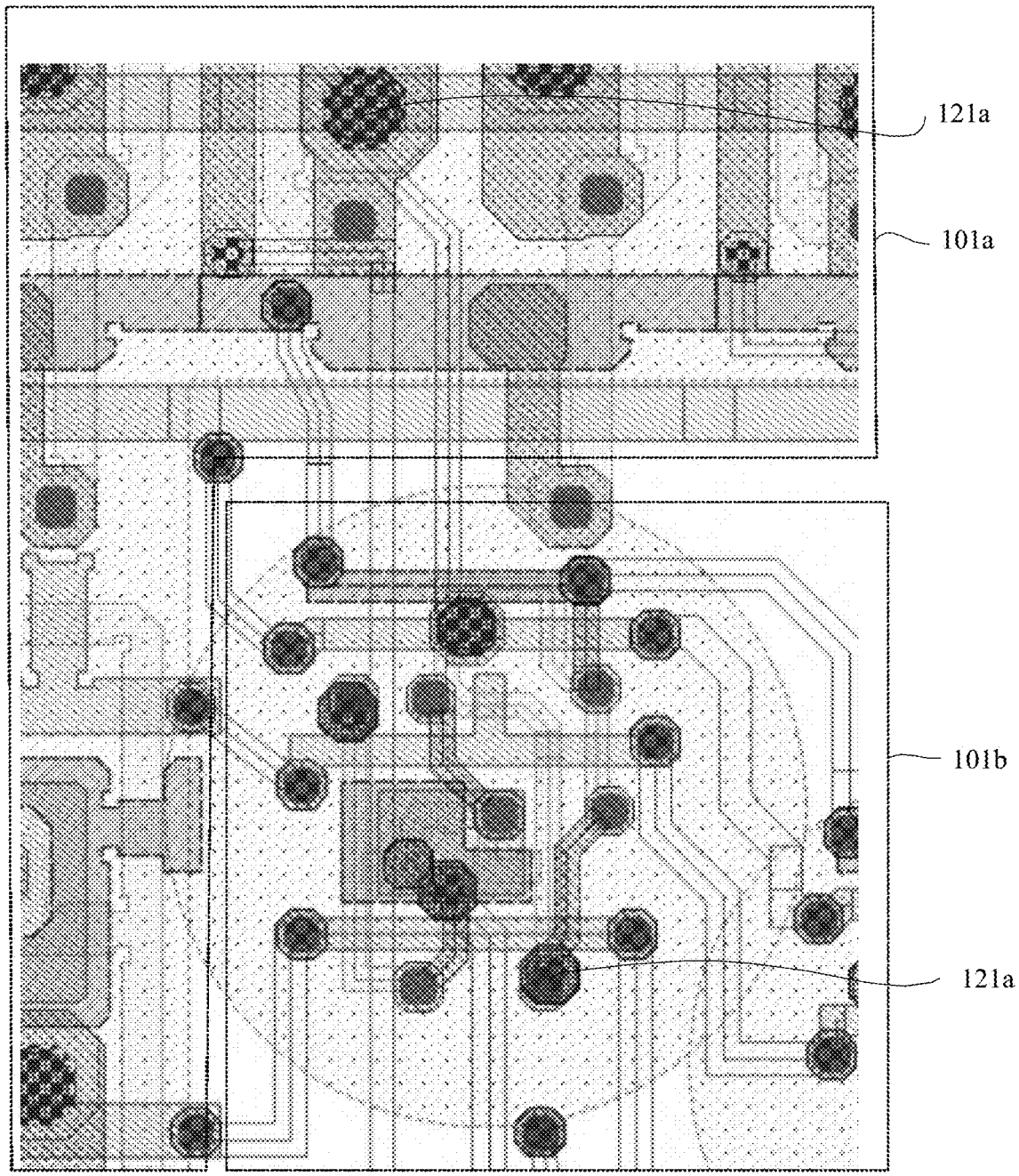
FIG. 75 is a schematic diagram showing a first planarization layer has been formed in both a first display region and a second display region according to an embodiment of the present disclosure.

FIG. 72 is a schematic structural diagram of a first planarization layer according to an embodiment of the present disclosure. FIG. 73 is a schematic diagram showing a first planarization layer has been formed in a second display region according to an embodiment of the present disclosure. FIG. 74 is a schematic diagram showing a first planarization layer has been formed in a first display region according to an embodiment of the present disclosure. FIG. 75 is a schematic diagram showing a first planarization layer has been formed in both a first display region and a second display region according to an embodiment of the present disclosure.

In order to facilitate the illustration of each via hole 121a in the first planarization layer 120, the via holes 121a are represented by filled patterns in FIGS. 72 to 75. Other regions where no filled pattern is drawn are intended to indicate regions of the first planarization layer 120 having solid materials. With reference to FIGS. 72 to 75, the via holes 120a are formed in a portion disposed in the first display region 101a of the first planarization layer 120 and in a portion disposed in the second display region 101b of the first planarization layer 120.

It should be noted that each via hole 121a formed in the first planarization layer 120 is used for connection between a subsequently formed film layer and a film layer on a side, proximal to the base substrate 101, of the first planarization layer 120. That is, each of the via holes 121a is a via hole for connecting the film layers. Therefore, the larger the aperture of the via hole is, the lower the transmittance is; and the smaller the aperture of the via hole is, the higher the transmittance is.

Therefore, in order to improve the transmittance and the pixel density of the second display region 101b and ensure the imaging effect of the camera disposed in the second display region 101b, an aperture of the via hole 121a of the first planarization layer 120 disposed in the first display region 101a may be greater than that of the via hole 121a of the first planarization layer 120 disposed in the second display region 101b.

Optionally, the aperture of the via hole 120a of the first planarization layer 120 disposed in the first display region 101a ranges from 2.3 µm to 2.5 µm, and the aperture of the via hole 120a of the first planarization layer 120 disposed in the second display region 101b ranges from 1.8 µm to 2.0 µm.

In step 313, a second source/drain layer is formed on a side, distal from the base substrate, of the first planarization layer.

Figure 76:
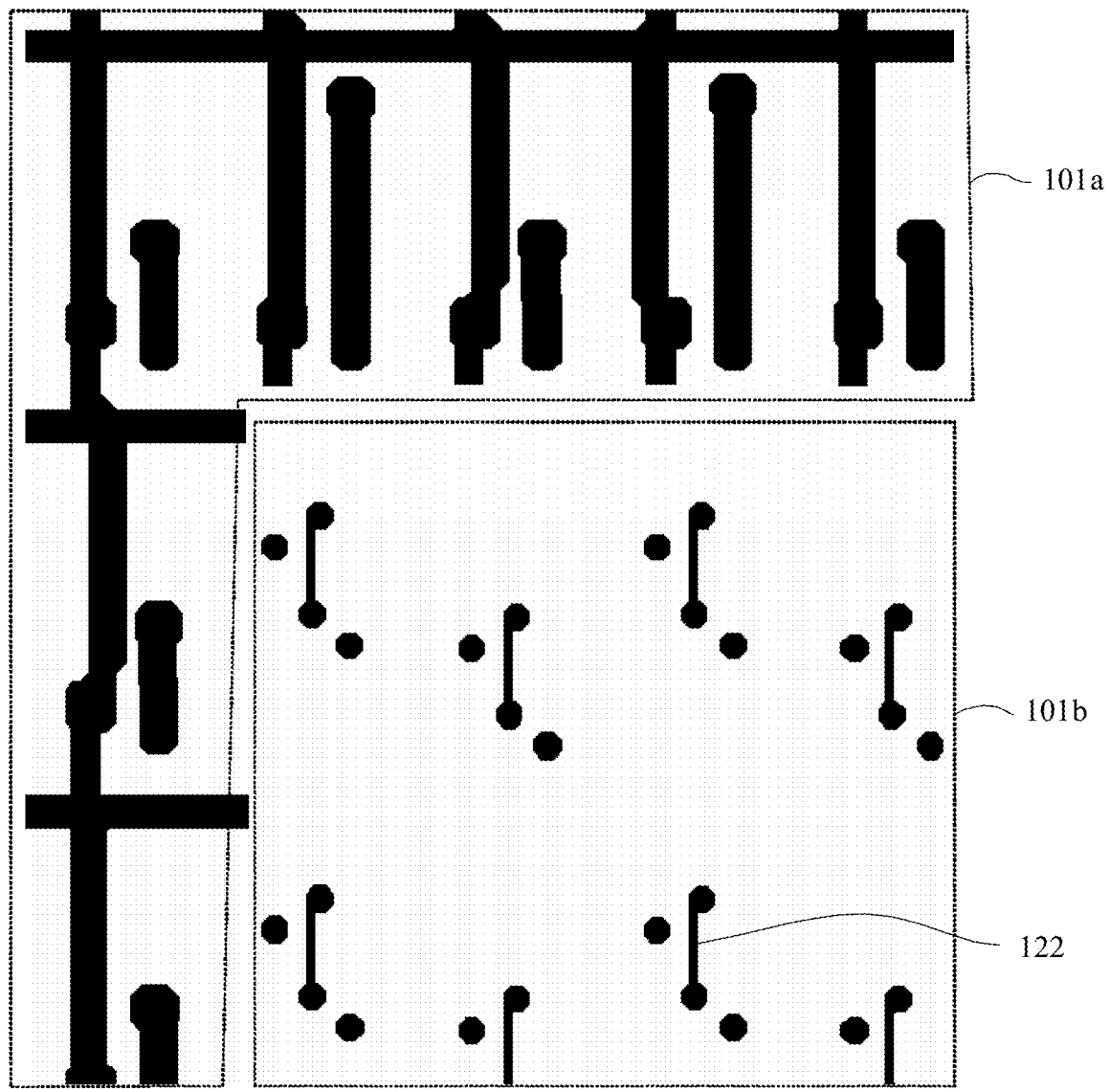
FIG. 76 is a schematic structural diagram of a second source/drain layer according to an embodiment of the present disclosure.
Figure 77:
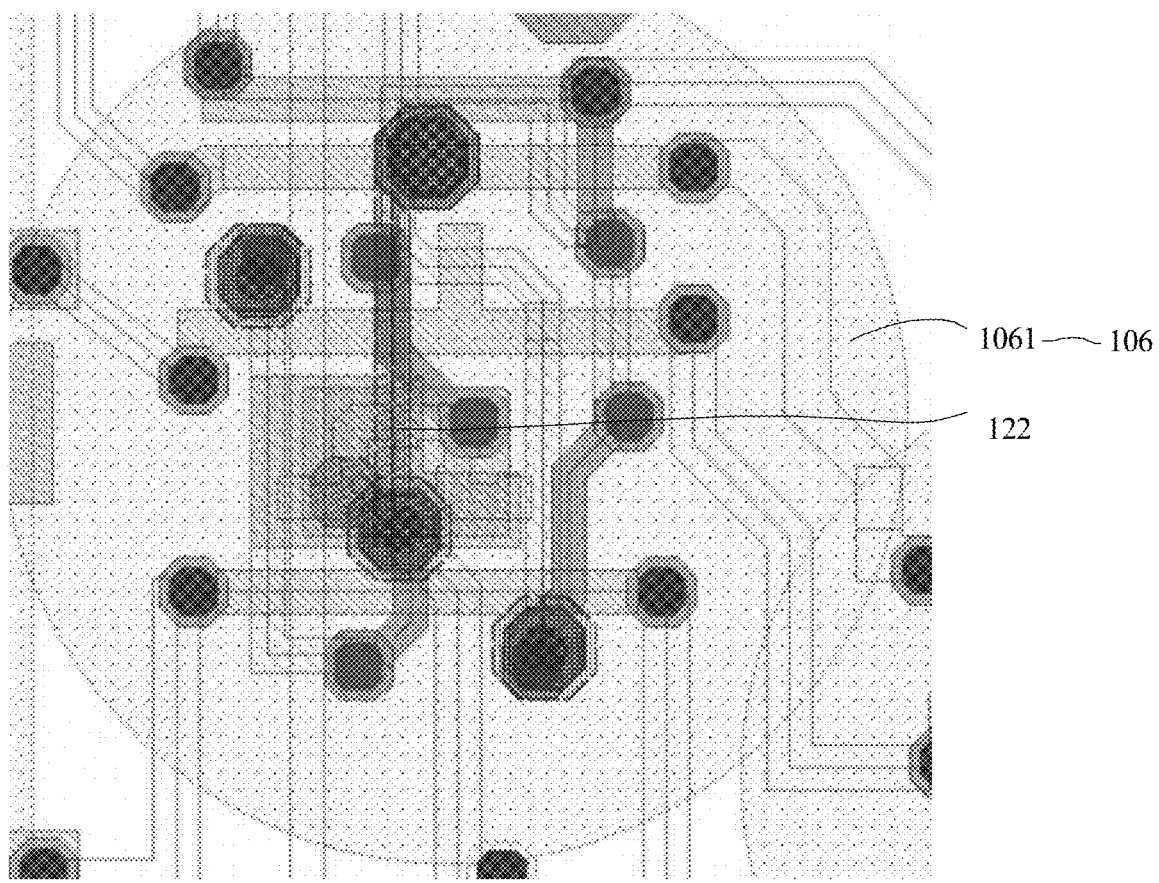
FIG. 77 is a schematic diagram showing a second source/drain layer has been formed in a second display region according to an embodiment of the present disclosure.
Figure 78:
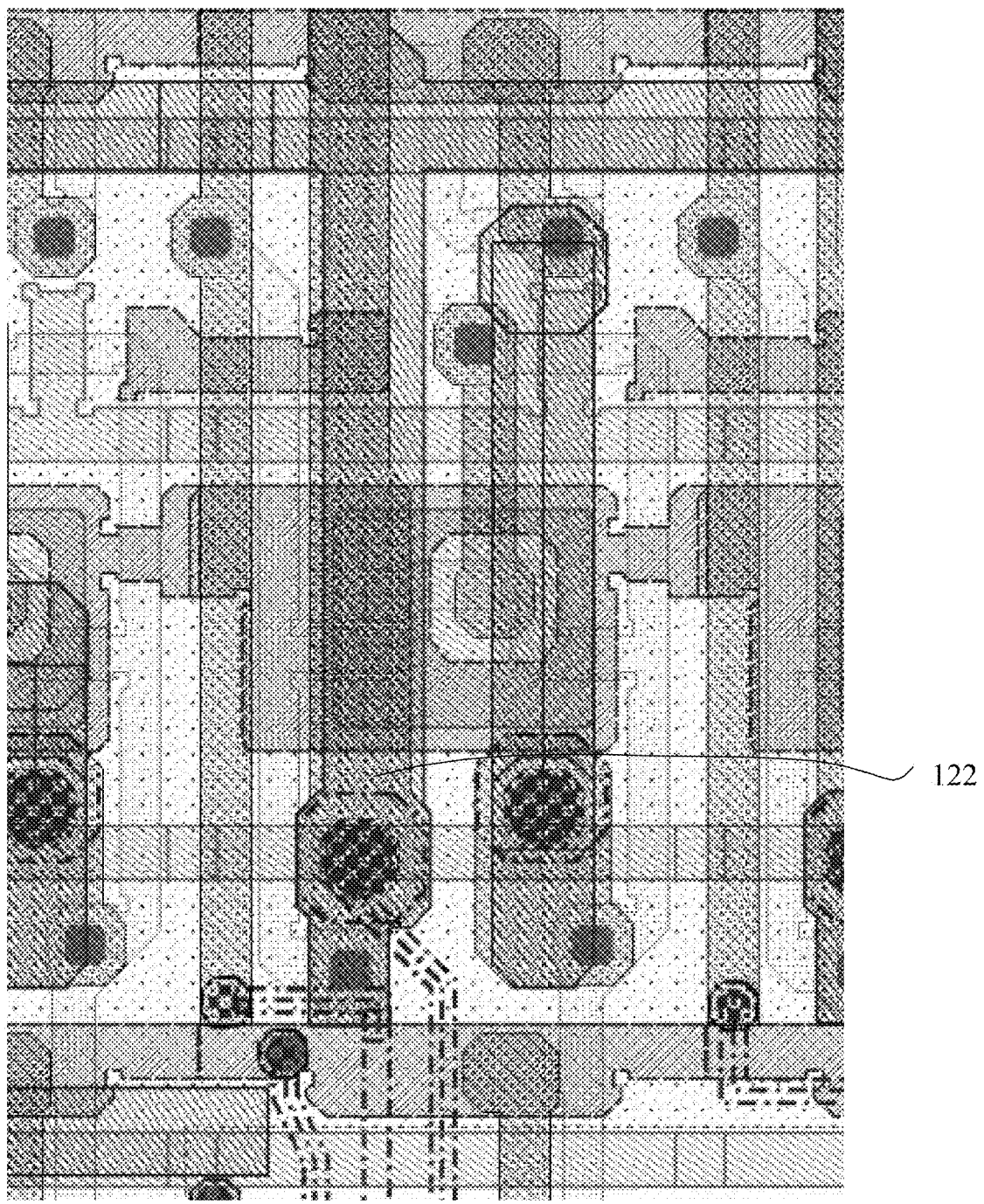
FIG. 78 is a schematic diagram showing a second source/drain layer has been formed in a first display region according to an embodiment of the present disclosure.
Figure 79:
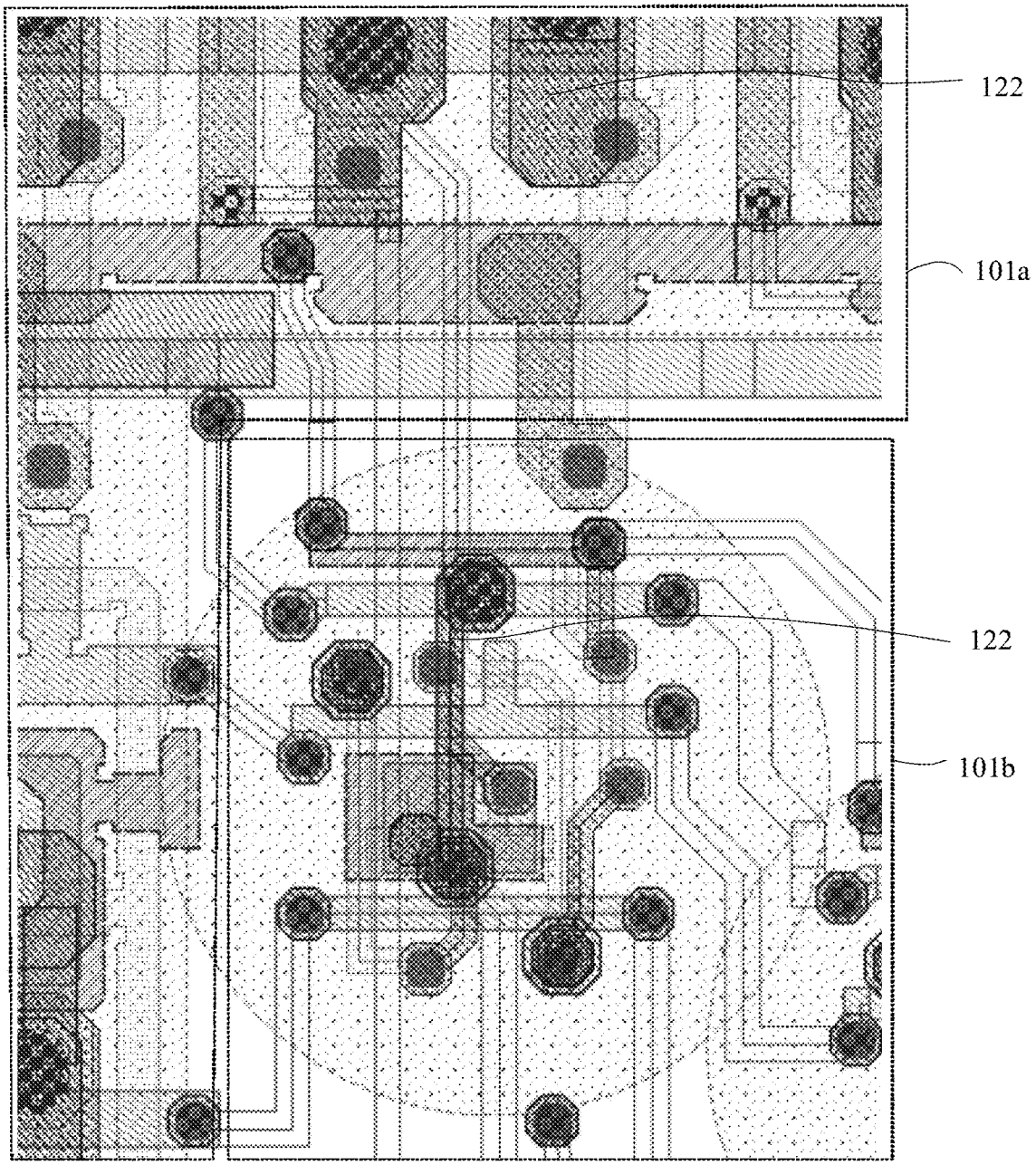
FIG. 79 is a schematic diagram showing a second source/drain layer has been formed in both a first display region and a second display region according to an embodiment of the present disclosure.

FIG. 76 is a schematic structural diagram of a second source/drain layer according to an embodiment of the present disclosure. Referring to FIG. 76, a width of a portion disposed in the first display region 101a of the second source/drain layer 121 is greater than that of a portion disposed in the second display region 101b of the second source/drain layer 121. Therefore, the transmittance and the pixel density of the second display region 101b may be improved, and the imaging effect of the camera disposed in the second display region 101b may be guaranteed.

Optionally, the width of the portion disposed in the first display region 101a of the second source/drain layer 121 ranges from 4.5 µm to 5 µm, and the width of the portion disposed in the second display region 101b of the second source/drain layer 121 ranges from 1.4 µm to 1.6 µm.

In an embodiment of the present disclosure, referring to FIGS. 76 to 79, the second source/drain layer 121 may be formed on a side, distal from the base substrate 101, of the first planarization layer 120. Referring to FIGS. 76 to 79, the second source/drain layer 121 may include a plurality of patterns. In addition, there is an overlap area between an orthographic projection of the pattern of the second source/drain layer 121 disposed in the first display region 101a onto the base substrate 101 and the orthographic projection of the first auxiliary electrode layer 102 onto the base substrate 101. There is an overlap area between an orthographic projection of the pattern of the second source/drain layer 121 disposed in the second display region 101b onto the base substrate 101 and the orthographic projections of the auxiliary electrode patterns 1061 on the base substrate 101.

In step 314, a second planarization layer is formed on a side, distal from the base substrate, of the second source/drain layer.

Figure 80:
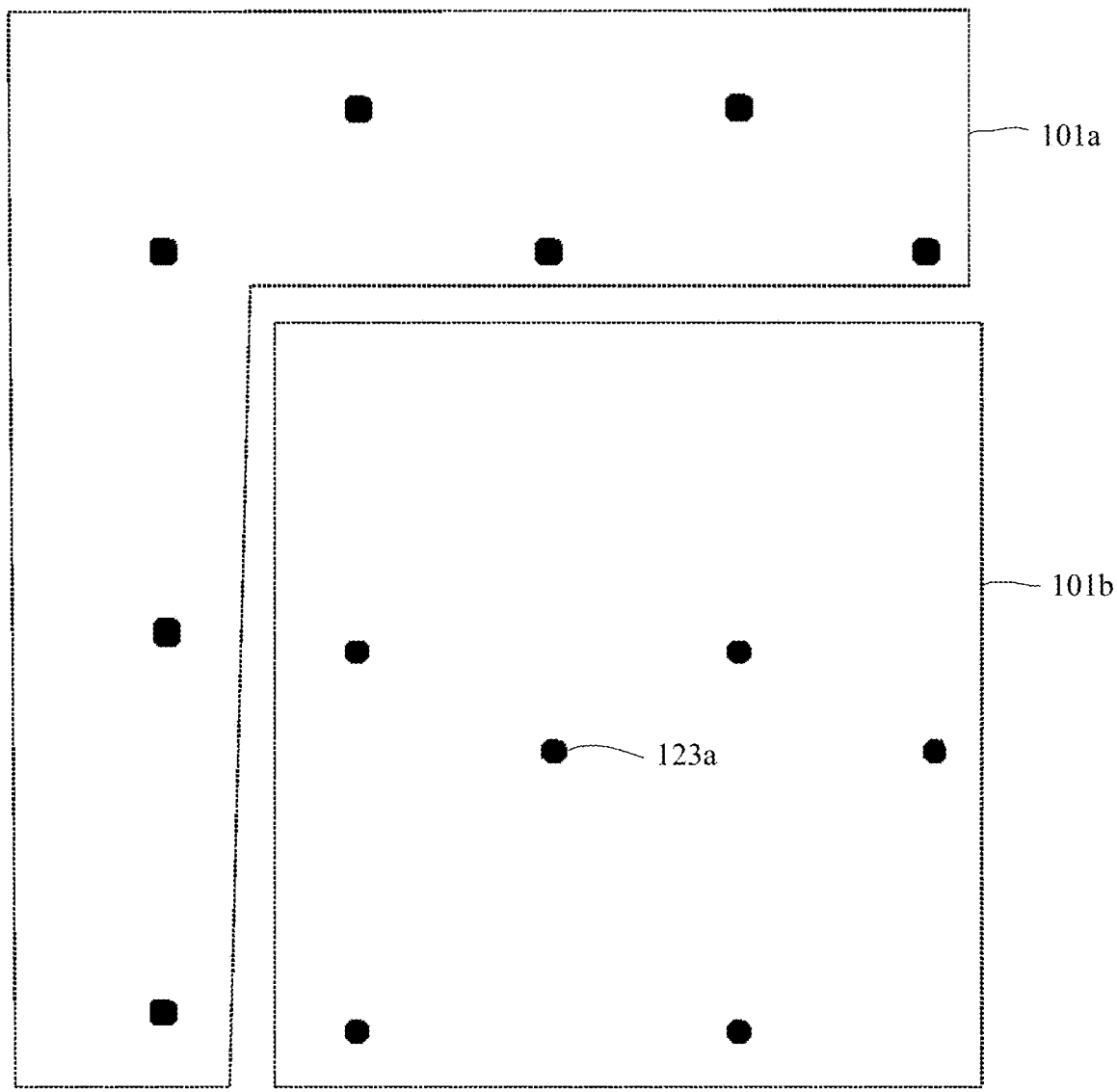
FIG. 80 is a schematic structural diagram of a second planarization layer according to an embodiment of the present disclosure.
Figure 81:
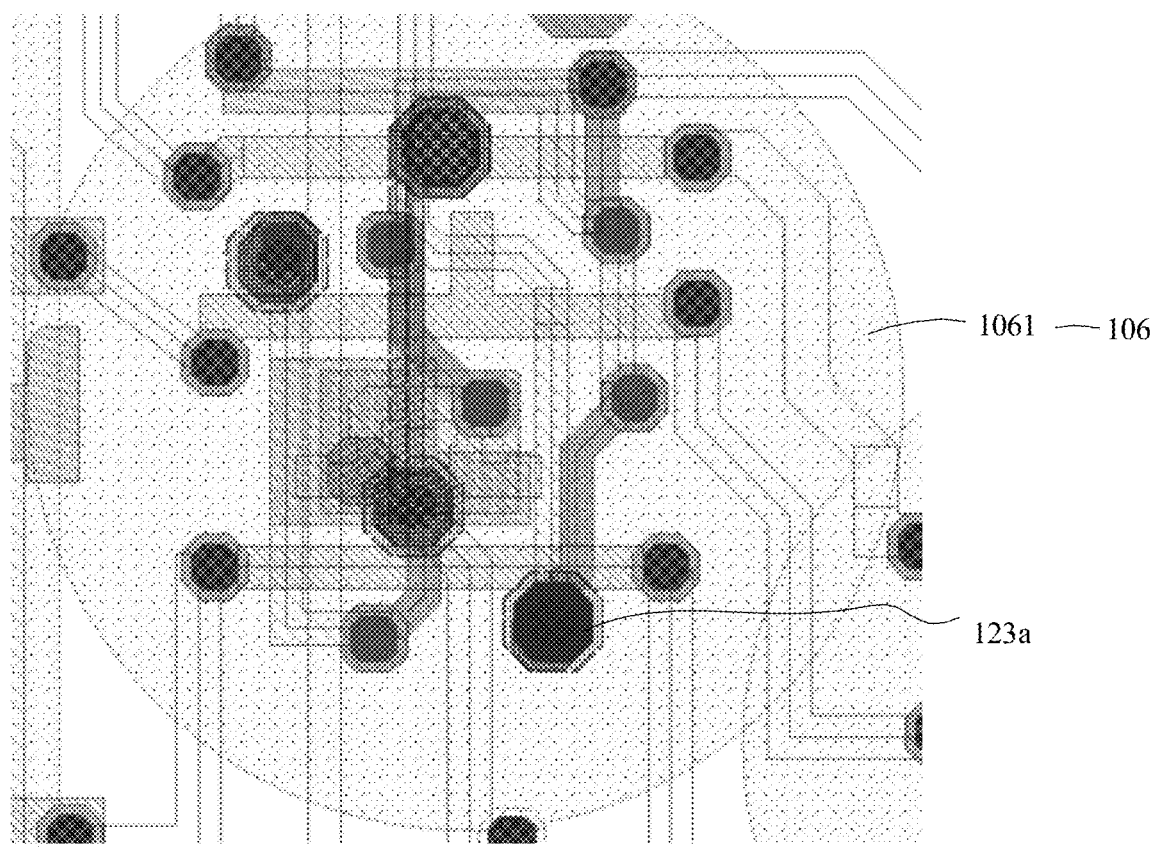
FIG. 81 is a schematic diagram showing a second planarization layer has been formed in a second display region according to an embodiment of the present disclosure.
Figure 82:
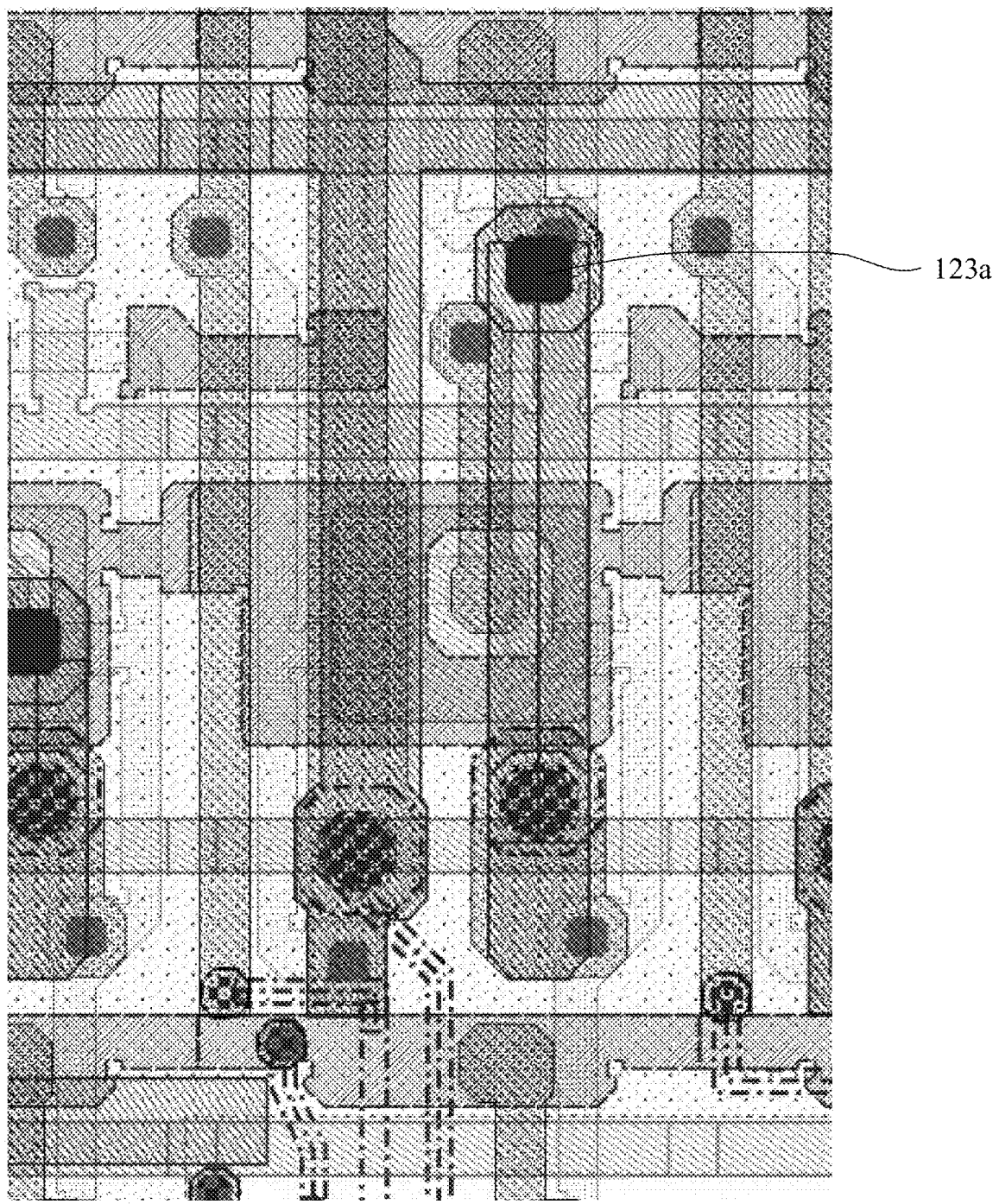
FIG. 82 is a schematic diagram showing a second planarization layer has been formed in a first display region according to an embodiment of the present disclosure.
Figure 83:
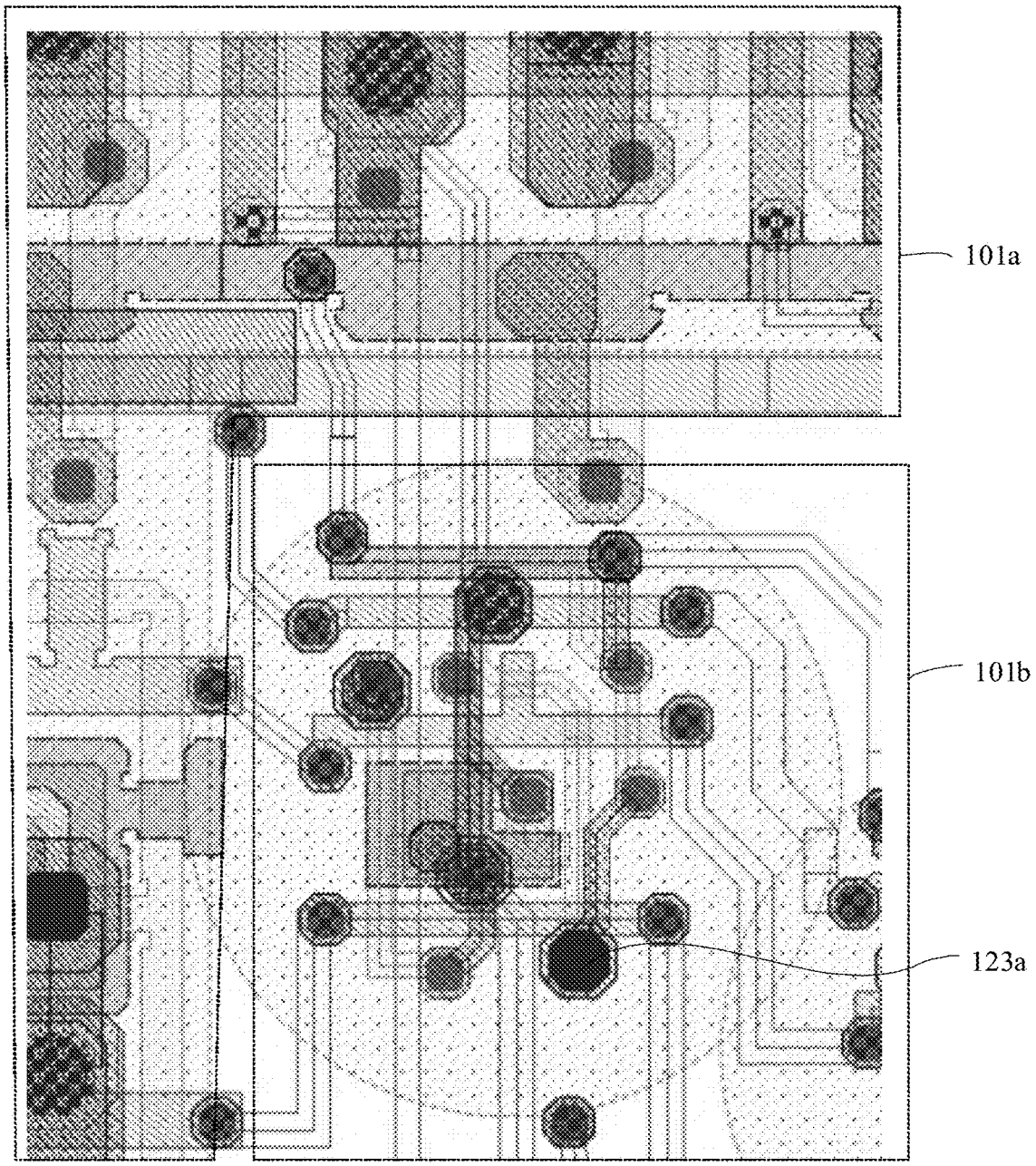
FIG. 83 is a schematic diagram showing a second planarization layer has been formed in both a first display region and a second display region according to an embodiment of the present disclosure.

FIG. 80 is a schematic structural diagram of a second planarization layer according to an embodiment of the present disclosure. FIG. 81 is a schematic diagram showing a second planarization layer has been formed in a second display region according to an embodiment of the present disclosure. FIG. 82 is a schematic diagram has been formed a second planarization layer in a first display region according to an embodiment of the present disclosure. FIG. 83 is a schematic diagram showing a second planarization layer has been formed in both a first display region and a second display region according to an embodiment of the present disclosure.

In order to facilitate the illustration of each via 123a in the second planarization layer 122, the via holes 123a are represented by filled patterns in FIGS. 80 to 83. Other regions where no filled pattern is drawn are intended to indicate regions of the second planarization layer 122 having solid materials. With reference to FIGS. 80 to 83, the via holes 123a are formed in a portion disposed in the first display region 101a of the second planarization layer 122 and a portion disposed in the second display region 101b of the second planarization layer 122.

It should be noted that each via hole 123a formed in the second planarization layer 122 is used for connection between a subsequently formed film layer and a film layer on a side, proximal to the base substrate 101, of the second planarization layer 122. That is, each of the via holes 123a is a via hole for connecting the film layers. Therefore, the larger the aperture of the via hole is, the lower the transmittance is; and the smaller the aperture of the via hole is, the higher the transmittance is.

Therefore, in order to improve the transmittance and the pixel density of the second display region 101b and ensure the imaging effect of the camera disposed in the second display region 101b, an aperture of the via hole 123a of the second planarization layer 122 disposed in the first display region 101a may be greater than that of the via hole 123a of the second planarization layer 122 disposed in the second display region 101b.

Optionally, the aperture of the via hole 123a of the second planarization layer 122 disposed in the first display region 101a ranges from 3.8 µm to 4.1 µm, and the aperture of the via hole 123a of the second planarization layer 122 disposed in the second display region 101b ranges from 3.3 µm to 3.5 µm.

In step 315, a first anode layer is formed in the first display region, and a second anode layer is formed in the second display region.

In an embodiment of the present disclosure, the first anode layer 103 and the second anode layer 107 may be formed by the same patterning process. The first anode layer 103 may be disposed in the first display region 101a of the base substrate 101, and the second anode layer 107 may be disposed in the second display region 101b of the base substrate 101.

Figure 84:
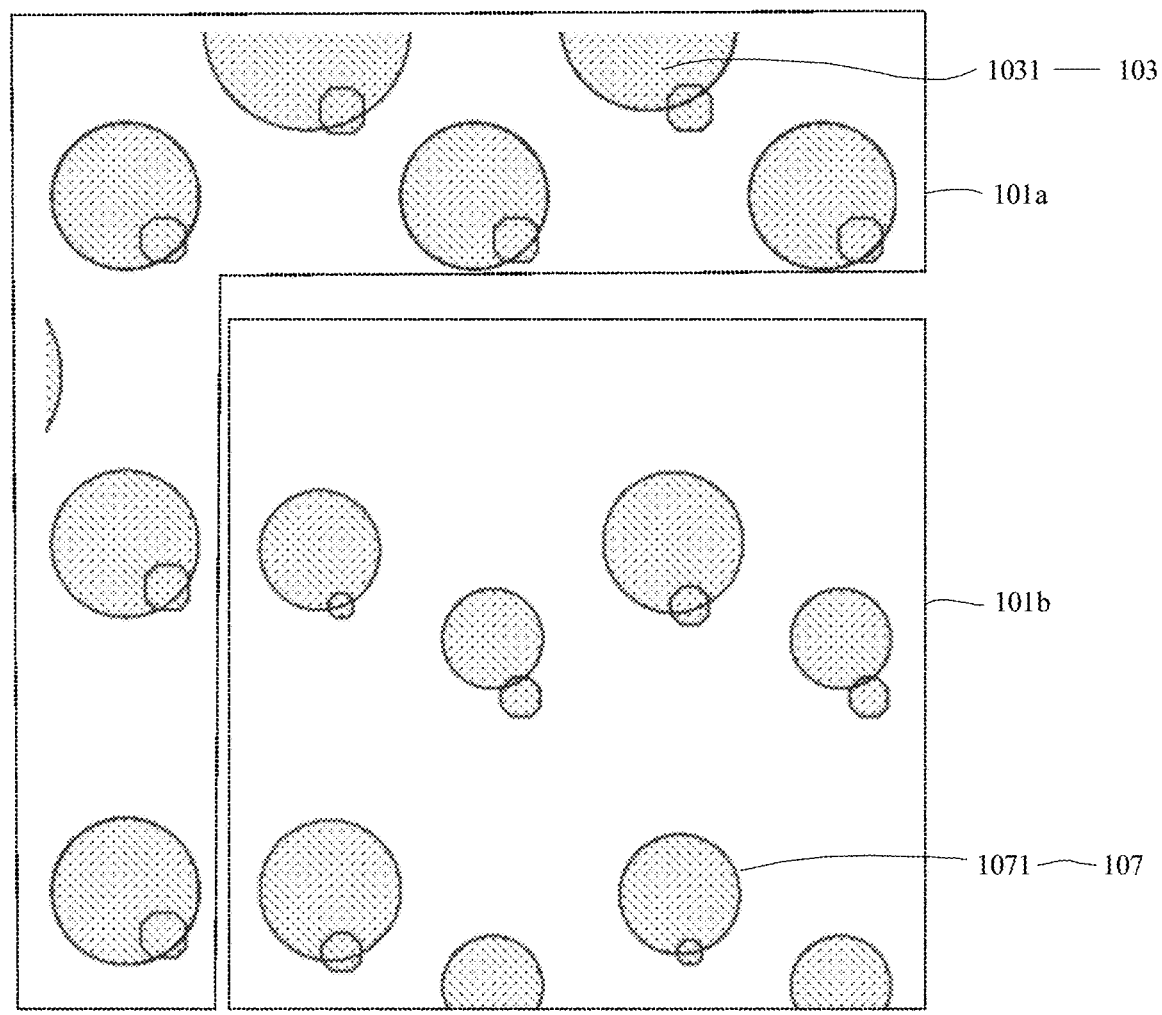
FIG. 84 is a schematic diagram of a first anode layer and a second anode layer according to an embodiment of the present disclosure.
Figure 85:
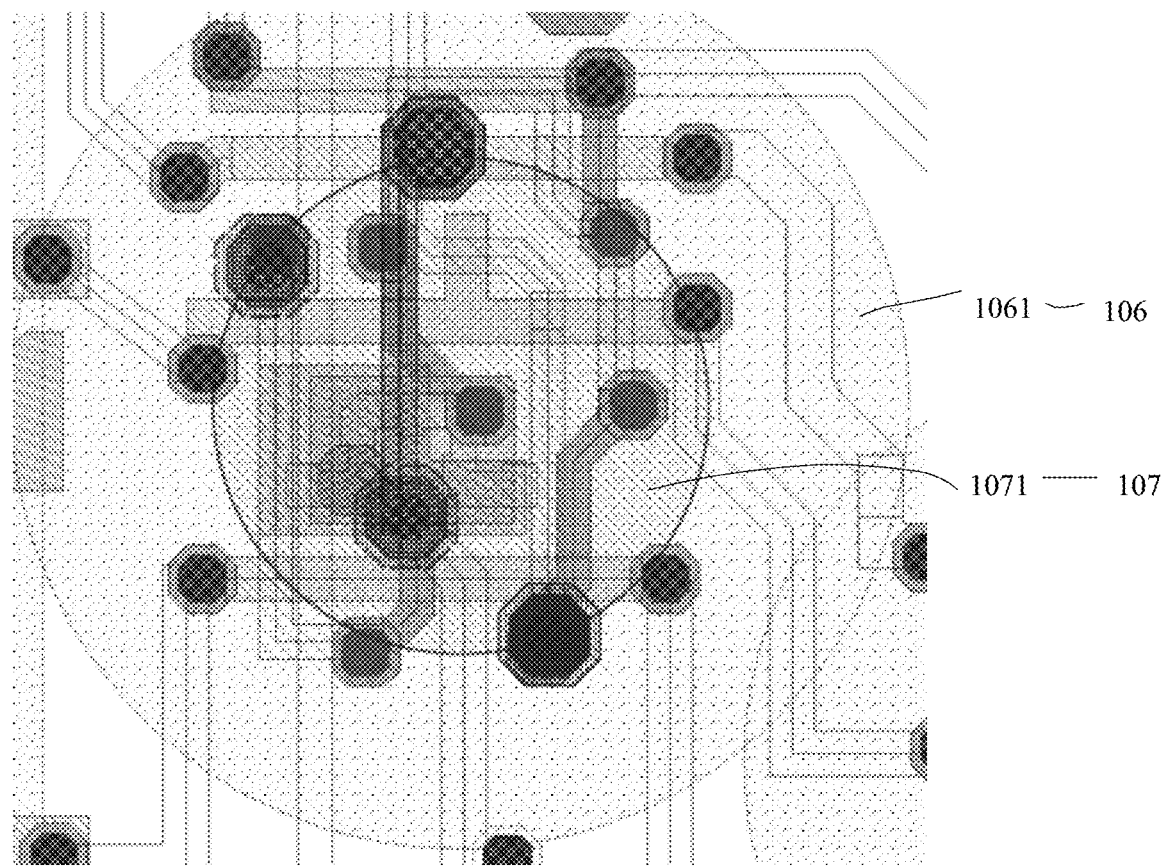
FIG. 85 is a schematic diagram showing a second anode layer has been formed in a second display region according to an embodiment of the present disclosure.
Figure 86:
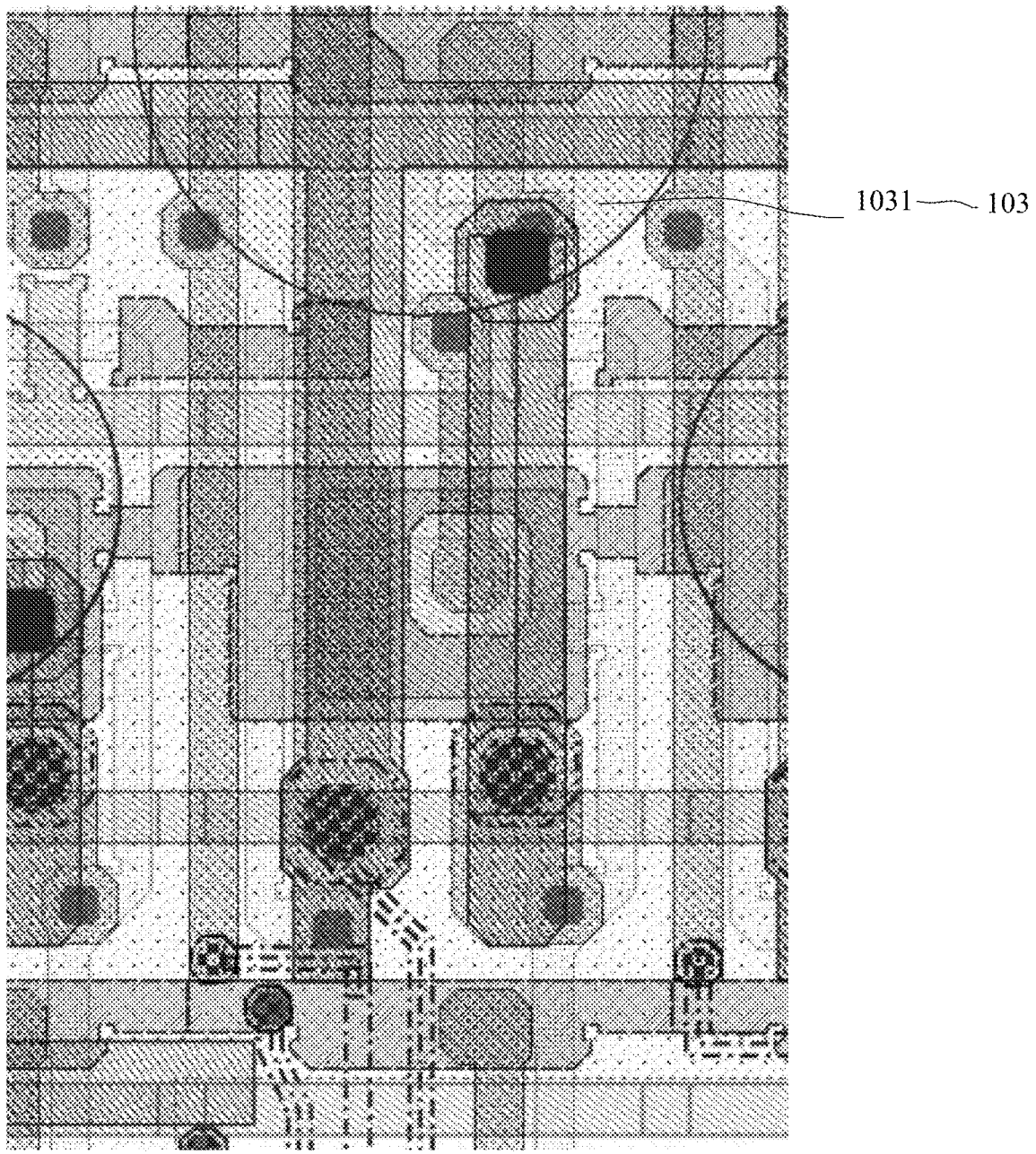
FIG. 86 is a schematic diagram showing a first anode layer has been formed in a first display region according to an embodiment of the present disclosure.
Figure 87:
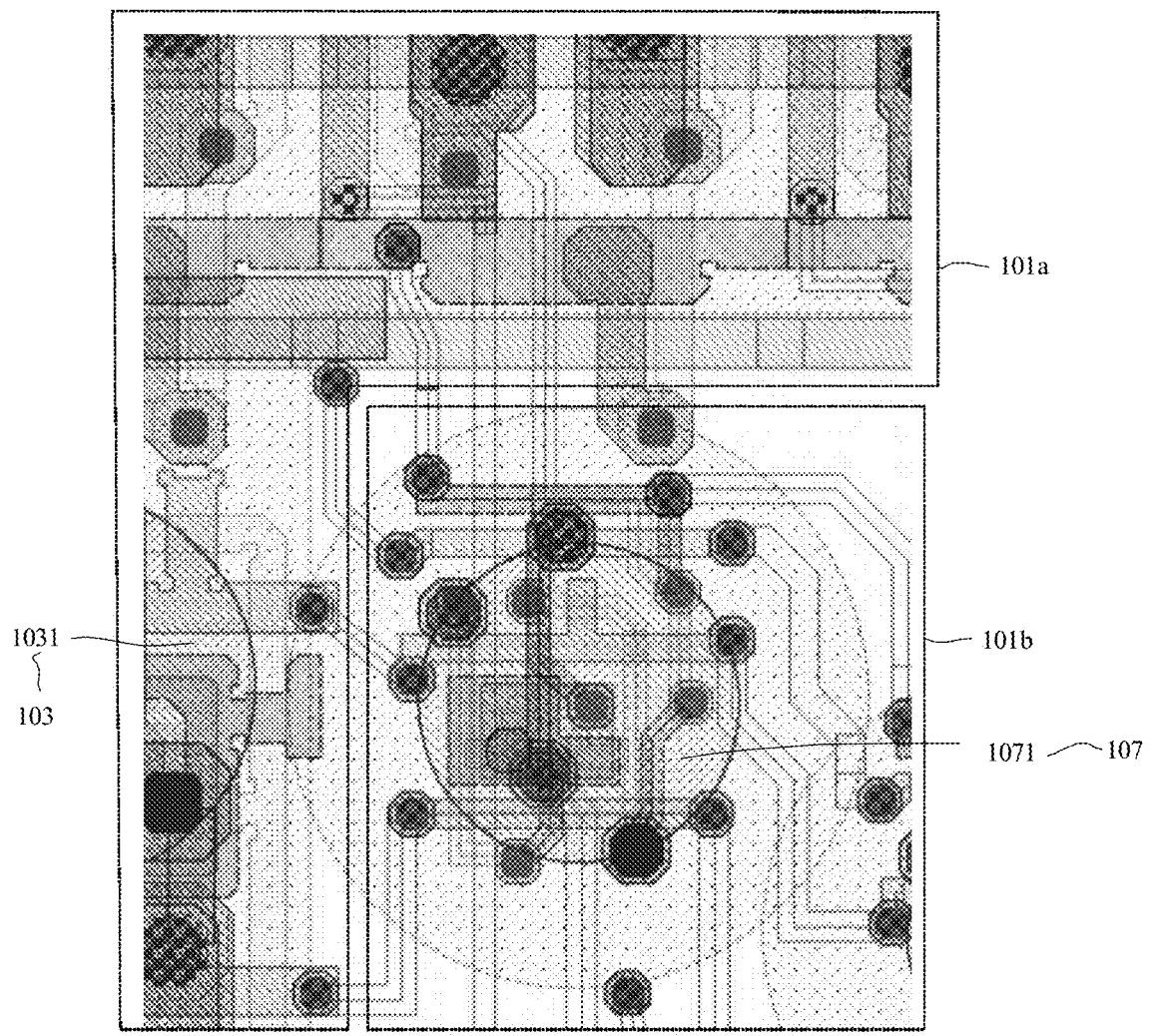
FIG. 87 is a schematic diagram showing a first anode layer has been formed in a first display region and a second anode layer has been formed in a second display region according to an embodiment of the present disclosure.

FIG. 84 is a schematic diagram of a first anode layer and a second anode layer according to an embodiment of the present disclosure. FIG. 85 is a schematic diagram showing a second anode layer has been formed in a second display region according to an embodiment of the present disclosure. FIG. 86 is a schematic diagram showing a first anode layer has been formed in a first display region according to an embodiment of the present disclosure. FIG. 87 is a schematic diagram showing a first anode layer has been formed in a first display region and forming a second anode layer in a second display region according to an embodiment of the present disclosure.

Referring to FIG. 84, the second anode layer 107 may include a plurality of anode patterns 1071 spaced apart from each other. Referring to FIGS. 85 and 87, an orthographic projection of each of the plurality of anode patterns 1071 onto the base substrate 101 may be disposed within the orthographic projections of one auxiliary electrode patterns 1061 onto the base substrate 101. Referring to FIG. 84, the first anode layer 103 may include a plurality of anode patterns 1031 spaced apart from each other. Referring to FIGS. 86 and 87, orthographic projections of the plurality of anode patterns 1031 onto the base substrate 101 are all disposed within the orthographic projection of the first auxiliary electrode layer 102 on the base substrate 101.

In an embodiment of the present disclosure, each anode pattern 1071 included by the second anode layer 107 may be configured to constitute a light-emitting unit of one first sub-pixel. Each anode pattern 1031 included by the first anode layer 103 may be configured to constitute a light-emitting unit of one second sub-pixel. The display panel 10 may include a plurality of sub-pixels, some of the plurality of sub-pixels disposed in the second display region 101b are the first sub-pixels, and some of the plurality of sub-pixels disposed in the first display region 101a are the second sub-pixels.

The plurality of sub-pixels include a red sub-pixel, a green sub-pixel, and a blue sub-pixel. The sub-pixels of various colors may be disposed in both the first display region 101a and the second display region 101b. That is, the plurality of first sub-pixels in the first display region 101a include the red sub-pixel, the green sub-pixel, and the blue sub-pixel. The plurality of second sub-pixels in the second display region 101b also include the red sub-pixel, the green sub-pixel, and the blue sub-pixel.

In order to improve the transmittance and the pixel density of the second display region 101b and ensure the imaging effect of the camera disposed in the second display region 101b, the size of the anode pattern 1071 of the first sub-pixel disposed in the second display region 101b may be smaller than that of the anode pattern 1031 of the second sub-pixel disposed in the first display region 101a.

Optionally, the size of the anode pattern 1071 of the red sub-pixel disposed in the second display region 101b is smaller than that of the anode pattern 1031 of the red sub-pixel disposed in the first display region 101a. The size of the anode pattern 1071 of the green sub-pixel disposed in the second display region 101b is smaller than that of the anode pattern 1031 of the green sub-pixel disposed in the first display region 101a. The size of the anode pattern 1071 of the blue sub-pixel disposed in the second display region 101b is smaller than that of the anode pattern 1031 of the blue sub-pixel disposed in the first display region 101a.

In an exemplary embodiment, the anode pattern 1031 of the red sub-pixel disposed in the first display region 101a has a diameter of 30 µm to 32 µm, and the anode pattern 1071 of the red sub-pixel disposed in the second display region 101b has a diameter of 20 µm to 22 µm. The anode pattern 1031 of the green sub-pixel disposed in the first display region 101a has a diameter of 25 µm to 27 fm, and the anode pattern 1071 of the green sub-pixel disposed in the second display region 101b has a diameter of 16 µm to 18 µm. The anode pattern 1031 of the blue sub-pixel disposed in the first display region 101a has a diameter of 35 µm to 37 µm, and the anode pattern 1031 of the blue sub-pixel disposed in the second display region 101b has a diameter of 23 µm to 25 µm.

In step 316, a pixel definition layer is formed on sides, distal from the base substrate, of the first anode layer and the second anode layer.

Figure 88:
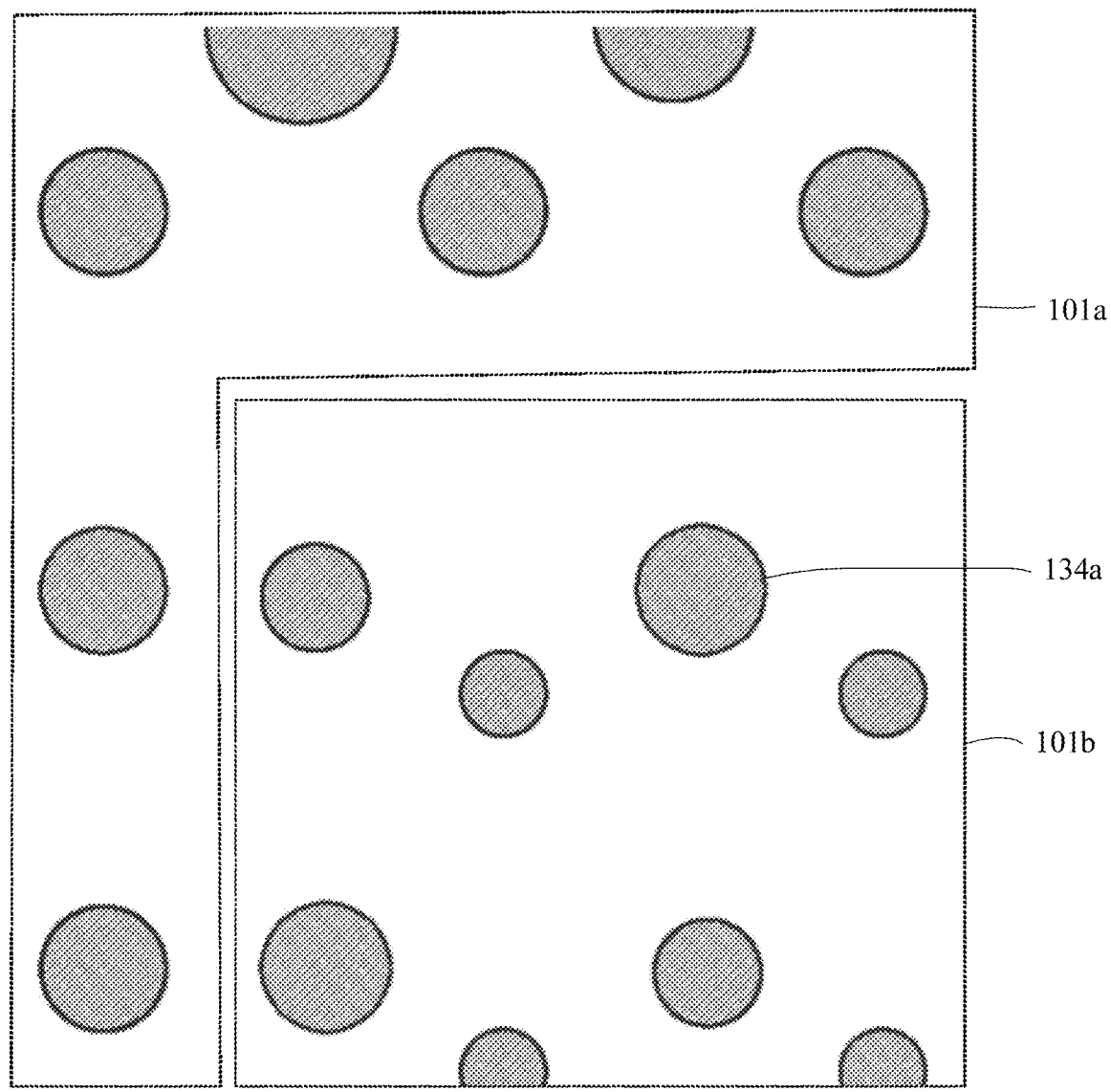
FIG. 88 is a schematic structural diagram of a pixel definition layer according to an embodiment of the present disclosure.
Figure 89:
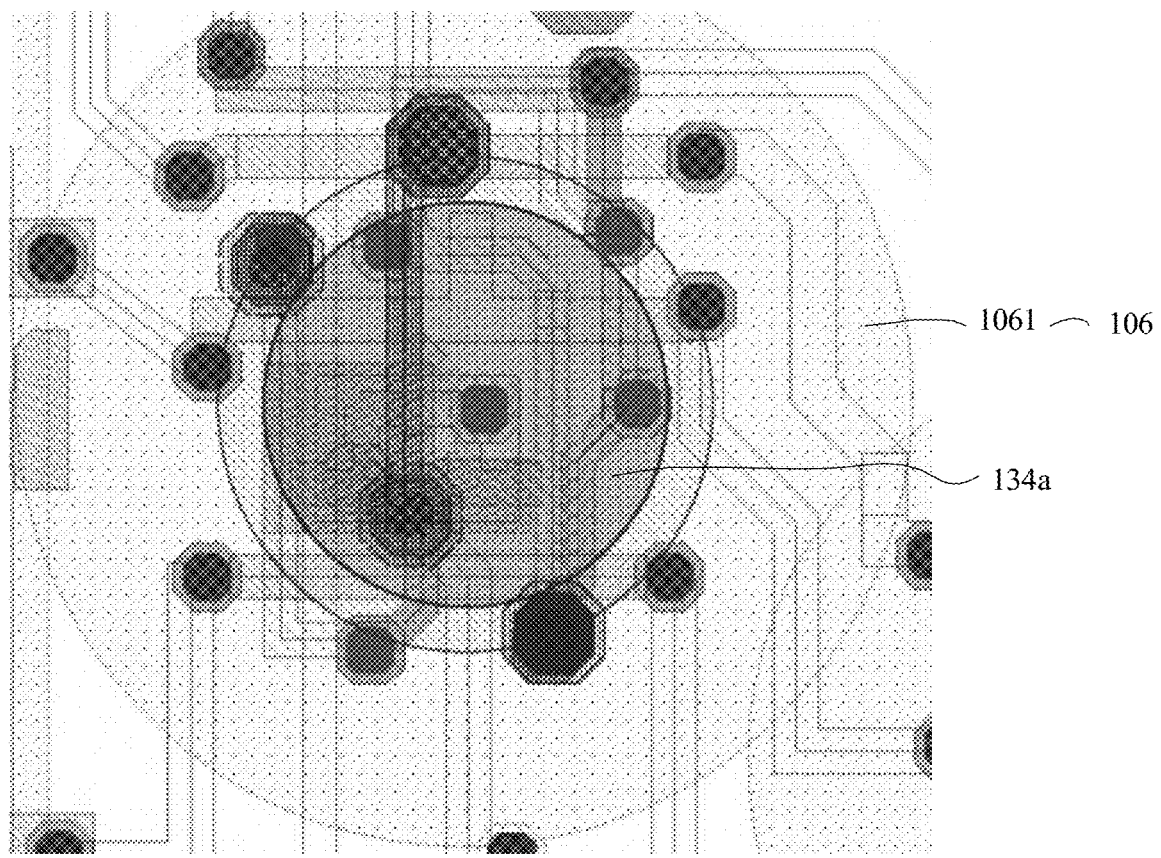
FIG. 89 is a schematic diagram showing a pixel definition layer has been formed in a second display region according to an embodiment of the present disclosure.
Figure 90:
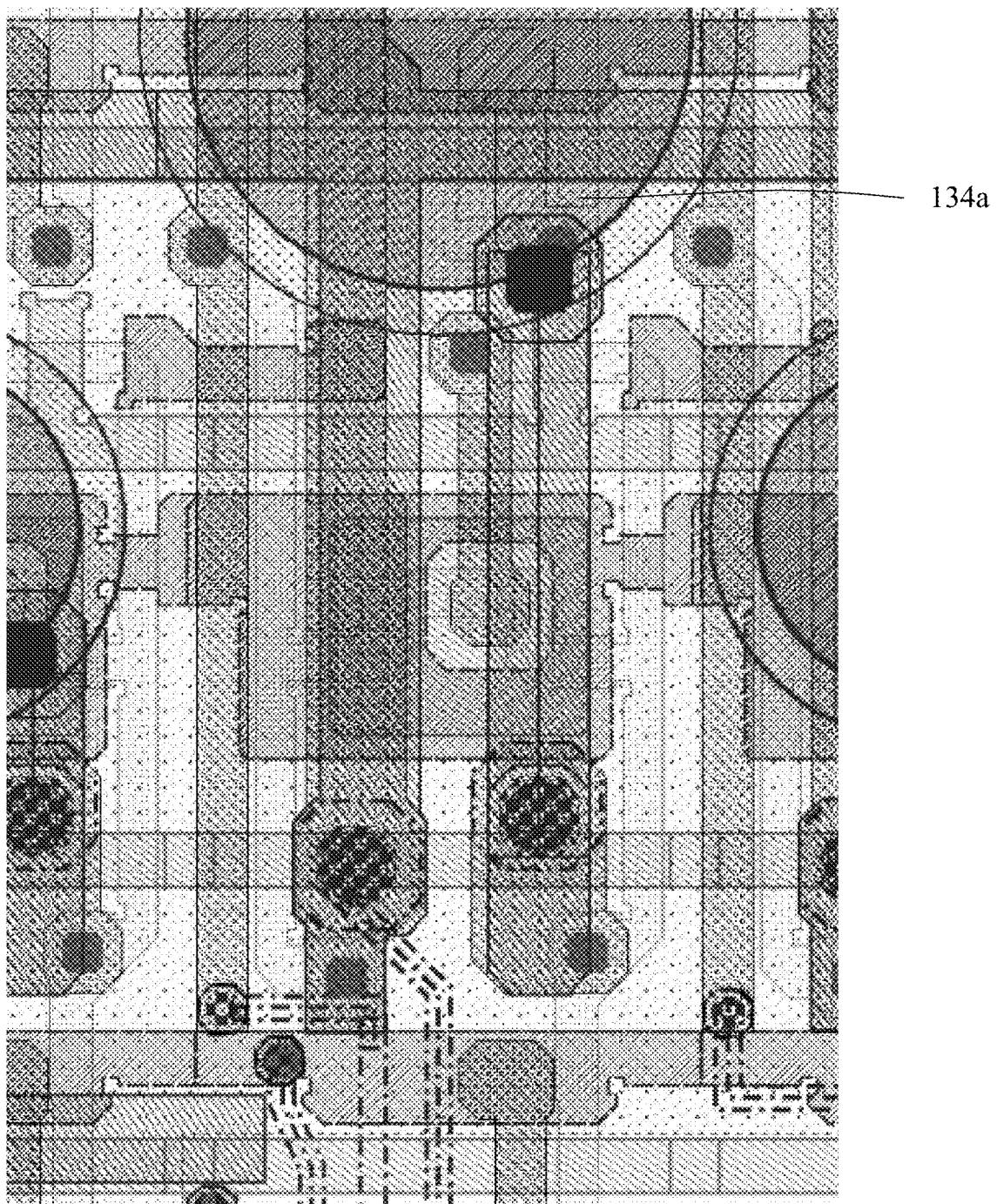
FIG. 90 is a schematic diagram showing a pixel definition layer has been formed in a first display region according to an embodiment of the present disclosure.
Figure 91:
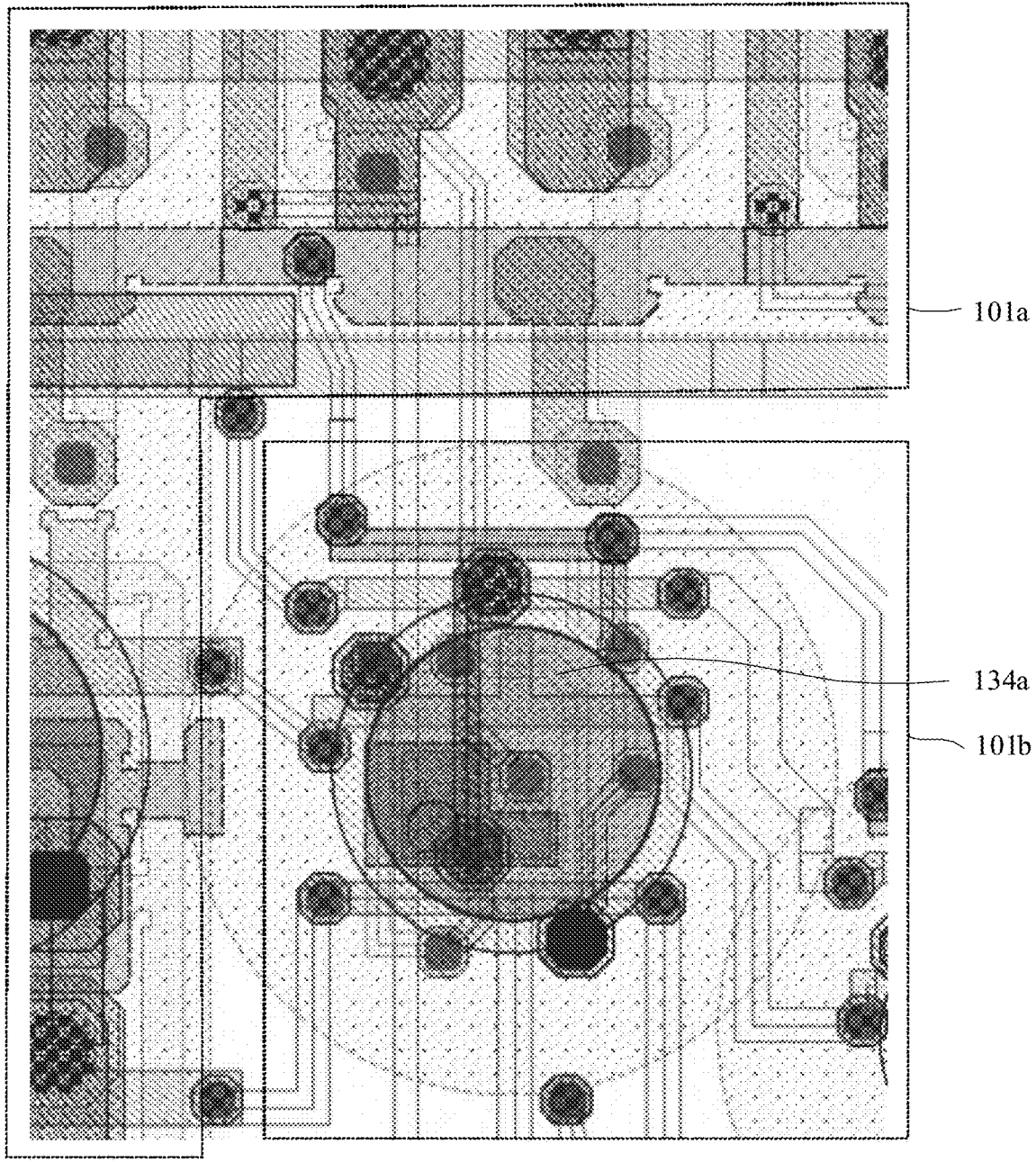
FIG. 91 is a schematic diagram showing a pixel definition layer has been formed in both a first display region and a second display region according to an embodiment of the present disclosure.

FIG. 88 is a schematic structural diagram of a pixel definition layer according to an embodiment of the present disclosure. FIG. 89 is a schematic diagram showing a pixel definition layer has been formed in a second display region according to an embodiment of the present disclosure. FIG. 90 is a schematic diagram showing a pixel definition layer has been formed in a first display region according to an embodiment of the present disclosure. FIG. 91 is a schematic diagram showing a pixel definition layer has been formed in both a first display region and a second display region according to an embodiment of the present disclosure.

Referring to FIGS. 88 to 91, the pixel definition layer 134 is provided with a plurality of tenth via holes 134a, and each tenth via hole 134a may expose one anode pattern. For example, the tenth via hole 134a of the pixel definition layer 134 disposed in the first display region 101a may expose one anode pattern 1031 in the first anode layer 103, and the tenth via hole 134a of the pixel definition layer 134 disposed in the second display region 101b may expose one anode pattern 1071 in the second anode layer 107.

In order to facilitate the illustration of each tenth via 134a in the pixel definition layer 134, the first via holes 134a are represented by filled patterns in FIGS. 88 to 91. Other regions where no filled pattern is drawn are intended to indicate regions of the pixel definition layer 134 having solid materials. With reference to FIGS. 88 to 91, the tenth via holes 134a are formed in a portion disposed in the first display region 101a of the pixel definition layer 134 and a portion disposed in the second display region 101b of the pixel definition layer 134.

It should be noted that each tenth via hole 134a formed in the pixel definition layer 134 is used for connection between a subsequently formed film layer and a film layer on aside, proximal to the base substrate 101, of the pixel definition layer 134. That is, each of the tenth via holes 134a is a via hole for connecting the film layers. Therefore, the larger the aperture of the via hole is, the lower the transmittance is; and the smaller the aperture of the via hole is, the higher the transmittance is.

Therefore, in order to improve the transmittance and the pixel density of the second display region 101b and ensure the imaging effect of the camera disposed in the second display region 101b, an aperture of the tenth via hole 134a of the pixel definition layer 134 disposed in the first display region 101a is greater than that of the tenth via hole 134a of the pixel definition layer 134 disposed in the second display region 101b.

Optionally, the aperture of the tenth via hole 134a in the pixel definition layer 134 for exposing the anode pattern 1071 of the red sub-pixel disposed in the second display region 101b is less than that of the tenth via hole 134a in the pixel definition layer 134 for exposing the anode pattern 1031 of the red sub-pixel disposed in the first display region 101b. The aperture of the tenth via hole 134a in the pixel definition layer 134 for exposing the anode pattern 1071 of the green sub-pixel disposed in the second display region 101b is less than that of the tenth via hole 134a in the pixel definition layer 134 for exposing the anode pattern 1031 of the green sub-pixel in the first display region 101a. The aperture of the tenth via hole 134a in the pixel definition layer 134 for exposing the anode pattern 1071 of the blue sub-pixel disposed in the second display region 101b is less than that of the tenth via hole 134a in the pixel definition layer 134 for exposing the anode pattern 1031 of the blue sub-pixel disposed in the first display region 101a.

In an exemplary embodiment, the tenth via hole 134a in the pixel definition layer 134 for exposing the anode pattern 1031 of the red sub-pixel disposed in the first display region 101a has an aperture of 24 μm to 26 μm. The tenth via hole 134a in the pixel definition layer 134 for exposing the anode pattern 1071 of the red sub-pixel disposed in the second display region 101b has an aperture of 16 μm to 18 μm. The tenth via hole 134a in the pixel definition layer 134 for exposing the anode pattern 1031 of the green sub-pixel disposed in the first display region 101a has an aperture of 18 μm to 20 μm. The tenth via hole 134a in the pixel definition layer 134 for exposing the anode pattern 1071 of the green sub-pixel disposed in the second display region 101b has an aperture of 12 μm to 14 μm. The tenth via hole 134a in the pixel definition layer 134 for exposing the anode pattern 1031 of the blue sub-pixel disposed in the first display region 101a has an aperture of 29 μm to 31 μm. The tenth via hole 134a in the pixel definition layer 134 for exposing the anode pattern 1071 of the blue sub-pixel disposed in the second display region 101b has an aperture of 19 μm to 21 μm.

In step 317, a first light-emitting layer is formed in the first display region, and a second light-emitting layer is formed in the second display region.

In an embodiment of the present disclosure, the first light-emitting layer 104 and the second light-emitting layer 108 may be formed by the same patterning process. The first light-emitting layer 104 may be disposed in the first display region 101a of the base substrate 101, and the second light-emitting layer 108 may be disposed in the second display region 101b of the base substrate 101.

Optionally, the first light-emitting layer 104 and the second light-emitting layer 108 may be manufactured by a fine metal mask (FMM).

Referring to FIG. 88, a portion disposed in the first display region 101a of the pixel definition layer 134 and a portion disposed in the second display region 101b of the pixel definition layer 134 are all provided with a tenth via hole. A light-emitting layer pattern of the first light-emitting layer 104 may be disposed in the tenth via hole 134a in the portion disposed in the first display region 101a of the pixel definition layer 134 and may be connected to one anode pattern exposed by the tenth via hole 134a. A light-emitting layer pattern 1081 of the second light-emitting layer 108 may be disposed in the tenth via hole in the portion of the second display region 101b in the pixel definition layer 134 and connected to one anode pattern exposed by the tenth via hole.

It should be noted that each light-emitting layer pattern included by the first light-emitting layer 104 may be configured to form a light-emitting unit of one second sub-pixel, and each light-emitting layer pattern 1081 included by the second light-emitting layer 108 may be configured to form a light-emitting unit of one first sub-pixel.

In step 318, a supporting layer is formed on sides, distal from the base substrate, of the first light-emitting layer and the second light-emitting layer.

In an embodiment of the present disclosure, the supporting layer 135 may be formed on the sides, distal from the base substrate 101, of the first light-emitting layer 104 and the second light-emitting layer 108. The supporting layer 135 may be provided with a plurality of supporting patterns, and orthographic projections of the plurality of supporting patterns onto the base substrate 101 at least do not overlap orthographic projections of the light-emitting layer patterns onto the base substrate 101. Therefore, a subsequently formed cathode layer (a first cathode layer 105 or a second cathode layer 109) may be in contact with the light-emitting layer patterns, ensuring that the display panel 10 may emit light normally.

In step 319, a first cathode layer is formed in the first display region, and a second cathode layer is formed in the second display region.

Figure 92:
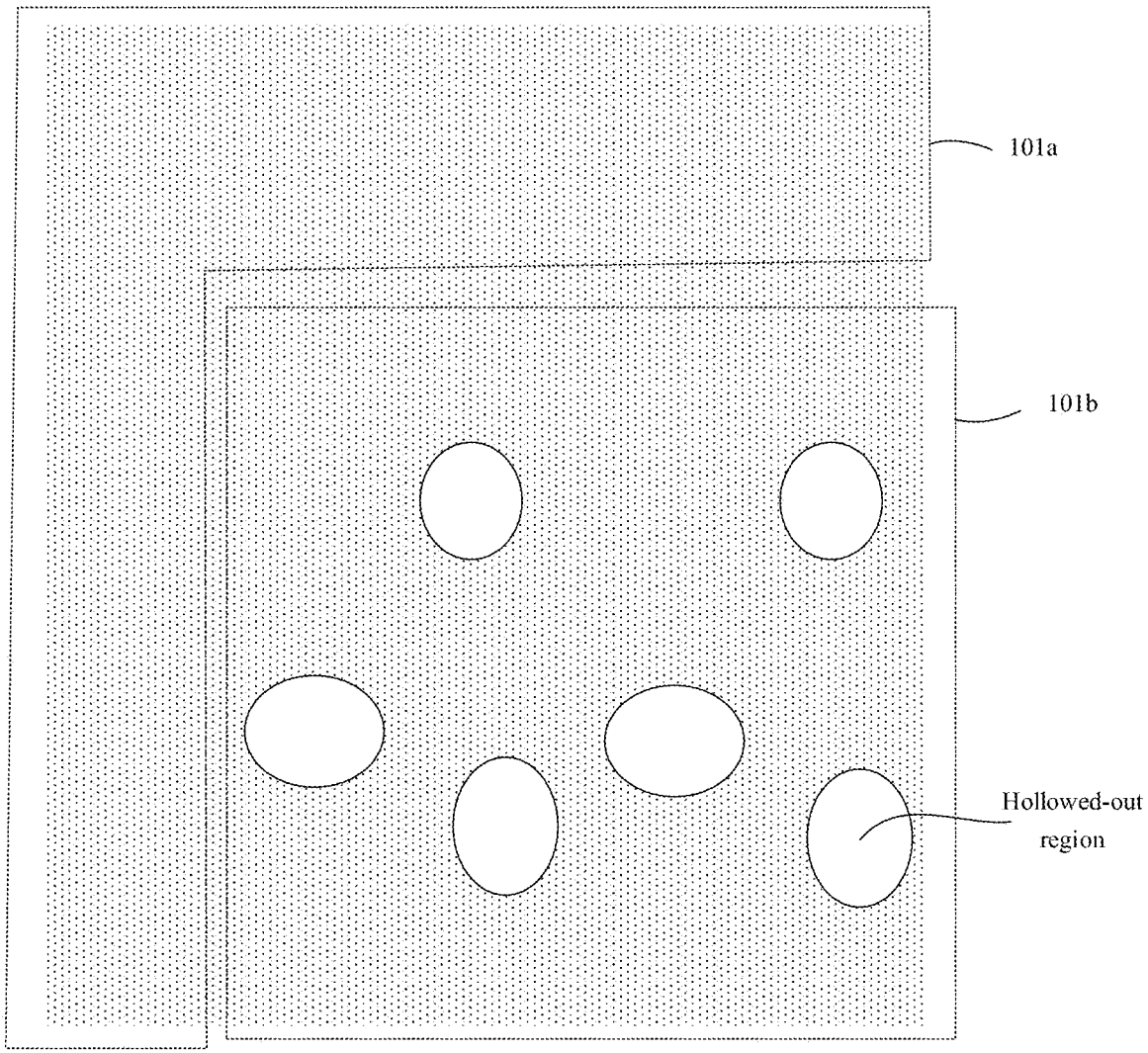
FIG. 92 is a schematic structural diagram of a first cathode layer and a second cathode layer according to an embodiment of the present disclosure.
Figure 93:
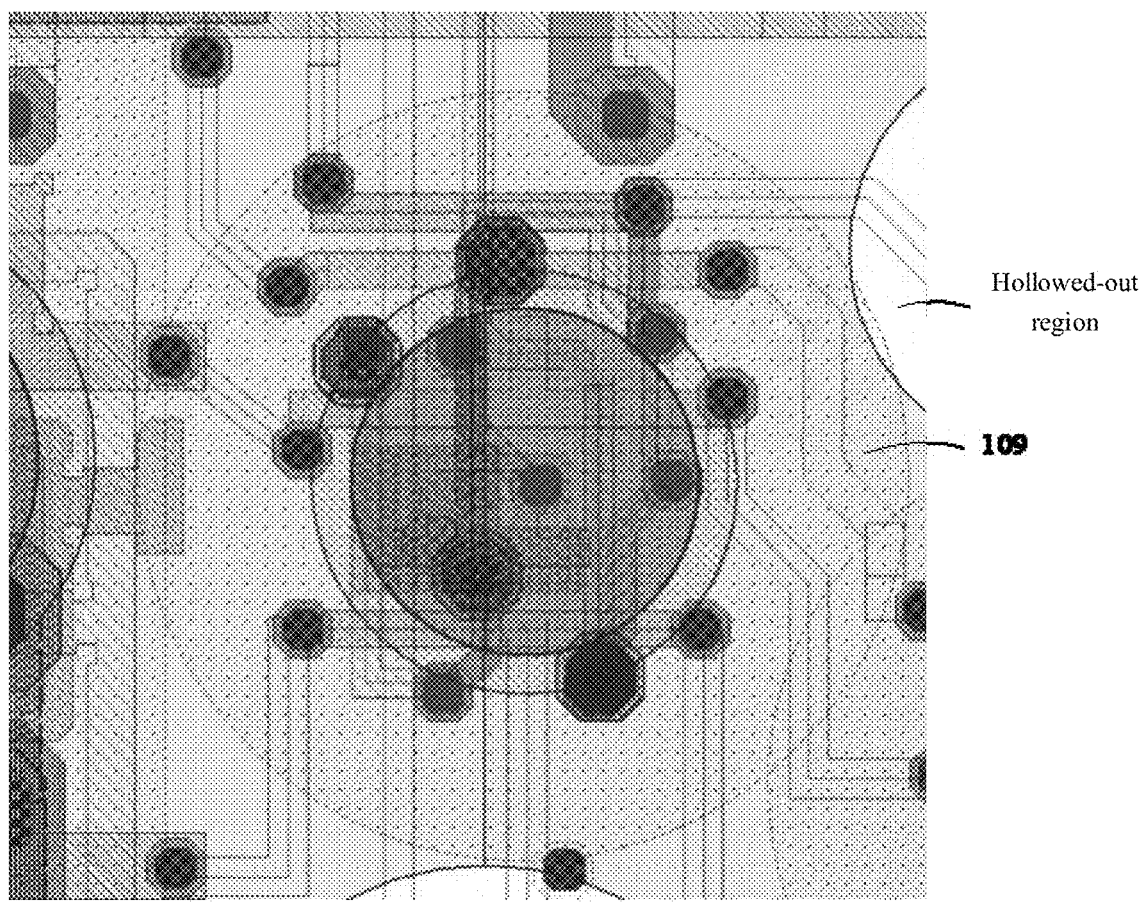
FIG. 93 is a schematic diagram showing a second cathode layer has been formed in a second display region according to an embodiment of the present disclosure.
Figure 94:
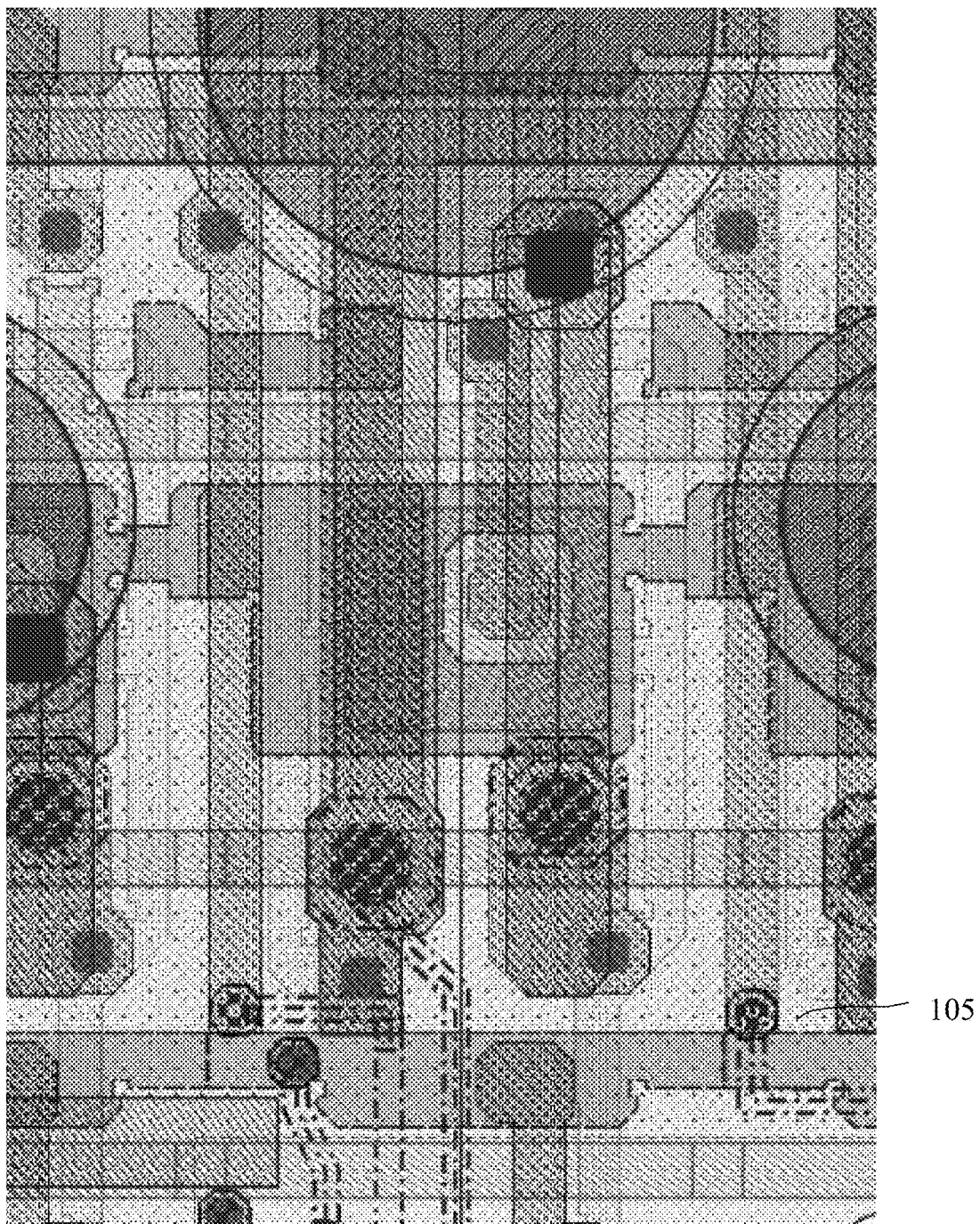
FIG. 94 is a schematic diagram showing a first cathode layer has been formed in a first display region according to an embodiment of the present disclosure.
Figure 95:
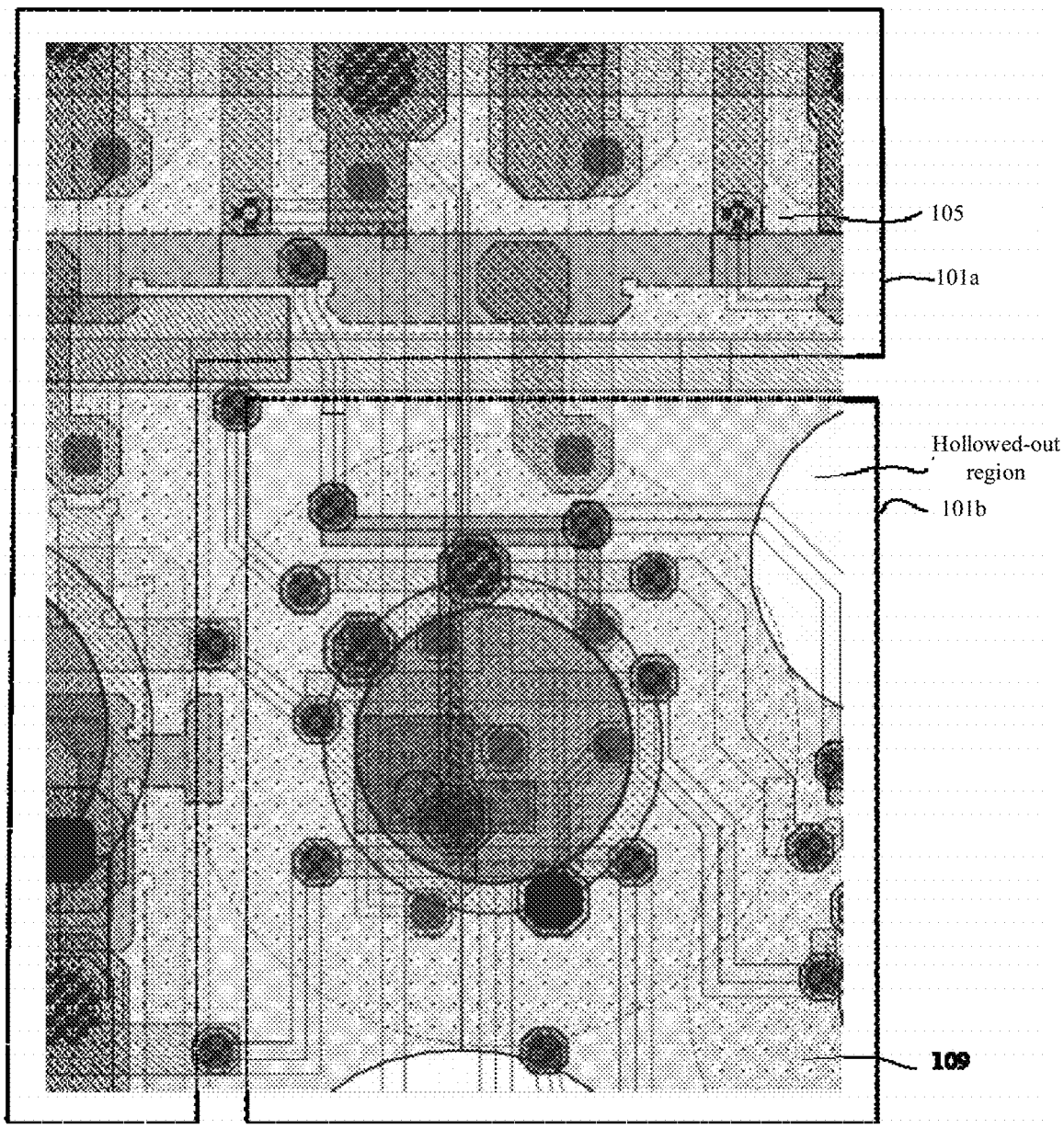
FIG. 95 is a schematic diagram showing a first cathode layer has been formed in a first display region and a second cathode layer has been formed in a second display region according to an embodiment of the present disclosure.

In an embodiment of the present disclosure, referring to FIG. 92, the first cathode layer 105 and the second cathode layer 109 may be formed by the same patterning process. The first cathode layer 105 may be disposed in the first display region 101a of the base substrate 101, and the second cathode layer 109 may be disposed in the second display region 101b of the base substrate 101. The first cathode layer 105 may be connected to the second cathode layer 109.

Referring to FIGS. 92 to 95, the first cathode layer 105 is not provided with a hollowed-out region and is connected to the light-emitting layer pattern of the first light-emitting layer 104. The second cathode layer 109 is provided with at least one hollowed-out region, so that the portion of the second cathode layer 109 excluding the at least one hollowed-out region may be connected to the light-emitting layer pattern 1081 of the second light-emitting layer 108.

In an embodiment of the present disclosure, the first cathode layer 105 and the first auxiliary electrode layer 102 formed in step 302 may also be disposed in a peripheral region 101c of the base substrate 101. A portion disposed in the peripheral region 101c of the first cathode layer 105 may be connected to a portion disposed in the peripheral region 101c of the first auxiliary electrode layer 102.

Since other wires usually need to be disposed in a second region 101c2 of the peripheral region 101c, a portion disposed in the second region 101c2 of the first auxiliary electrode layer 102 is not connected to the portion disposed in the second region 101c2 of the first cathode layer 105. Thus, setting of other wires may not be adversely affected.

In addition, a portion disposed in a first region 101c1 of the first auxiliary electrode layer 102 is connected to a portion disposed in the first region 101c1 of the first cathode layer 105. A portion disposed in a third region 101c3 of the first auxiliary electrode layer 102 is connected to a portion disposed in the third region 101c3 of the first cathode layer 105. A portion disposed in the fourth region 101c4 of the first auxiliary electrode layer 102 is connected to a portion disposed in the fourth region 101c4 of the first cathode layer 105.

In summary, the embodiment of the present disclosure provides the method for manufacturing the display panel. The second cathode layer included by the display panel manufactured by the method is provided with the hollowed-out region. Therefore, the second cathode layer will not entirely cover the second display region. Compared with a cathode layer that entirely covers the second display region, the second cathode layer can effectively reduce the impact on the light transmittance. Thus, the camera disposed in the second display region has an excellent imaging effect.

Figure 96:
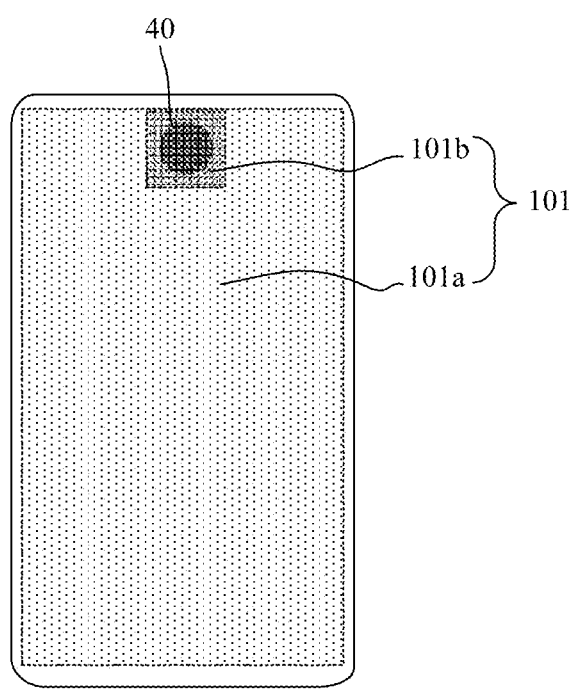
FIG. 96 is a schematic structural diagram of a display device according to an embodiment of the present disclosure.

FIG. 96 is a schematic structural diagram of a display device according to an embodiment of the present disclosure. It can be seen with reference to FIG. 96 that the display device may include an image sensor 40 and the display panel 10 as provided in the above-mentioned embodiments. The image sensor 40 may be disposed on a side, distal from a second auxiliary electrode layer 106, of a base substrate 101 in the display panel 10 and disposed in a second display region 101b of the base substrate 101. The image sensor 30 may be a front camera of the display device, which is configured to capture images.

Optionally, the display device may be any product or component having a display function, such as an OLED display device, a liquid crystal display device, electronic paper, a mobile phone, a tablet computer, a television, a display, a notebook computer, a digital photo frame or a navigator.

The above descriptions are merely optional embodiments of the present disclosure, and are not intended to limit the present disclosure. Any modifications, equivalent substitutions, improvements, and the like made within the spirits and principles of the present disclosure shall all fall within the protection scope of the present disclosure.

What is claimed is:

1. A display panel, comprising:
a base substrate provided with a first display region and a second display region;
a first auxiliary electrode layer, a first anode layer, a first light-emitting layer and a first cathode layer that are sequentially laminated, in a direction away from the base substrate, in the first display region; and
a second auxiliary electrode layer, a second anode layer, a second light-emitting layer, and a second cathode layer that are sequentially laminated, in the direction away from the base substrate, in the second display region;
wherein the first auxiliary electrode layer is connected to the first cathode layer and the second auxiliary electrode layer, and the second cathode layer is connected to the first cathode layer, the second cathode layer is provided with at least one hollowed-out region;
the display panel further comprising a plurality of pixel circuits disposed in the second display region, and each of the pixel circuits comprising at least one layer of opaque patterns; wherein the second auxiliary electrode layer comprises a plurality of auxiliary electrode patterns electrically connected; and at least 50% of areas of orthographic projections of the at least one layer of opaque patterns in at least one of the pixel circuits onto the base substrate is overlapped with orthographic projections of the auxiliary electrode patterns onto the base substrate.

2. The display panel according to claim 1, wherein the orthographic projections of the auxiliary electrode patterns onto the base substrate cover the orthographic projections of the at least one layer of opaque patterns in at least one of the pixel circuits onto the base substrate.

3. The display panel according to claim 1, wherein edges of the orthographic projection of the auxiliary electrode pattern onto the base substrate are at least partially arc-shaped.

4. The display panel according to claim 1, wherein the auxiliary electrode pattern comprises a first pattern and a second pattern;
an orthographic projection of the first pattern onto the base substrate is overlapped with 50% or more of the areas of the orthographic projections of the at least one layer of opaque patterns in at least one of the pixel circuits onto the base substrate; and
the second pattern is configured to be electrically connected to the auxiliary electrode patterns adjacent to the second pattern.

5. The display panel according to claim 4, wherein the orthographic projection of the first pattern onto the base substrate is circular.

6. The display panel according to claim 1, wherein the base substrate is further provided with a peripheral region surrounding both the first display region and the second display region; and
the first auxiliary electrode layer and the first cathode layer are further disposed in the peripheral region, and a portion disposed in the peripheral region of the first auxiliary electrode layer is electrically connected to a portion disposed in the peripheral region of the first cathode layer.

7. The display panel according to claim 6, wherein an orthographic projection of the first auxiliary electrode layer onto the base substrate covers the first display region;
the peripheral region comprises a first region and a second region that are arranged oppositely and in parallel, as well as a third region and a fourth region that are arranged oppositely and in parallel, a direction in which the first region extends is perpendicular to a direction in which the third region extends, and a distance between the second display region and the first region is less than a distance between the second display region and the second region;
wherein a portion disposed in the first region of the first auxiliary electrode layer is connected to a portion disposed in the first region of the first cathode layer, a portion disposed in the third region of the first auxiliary electrode layer is connected to a portion disposed in the third region of the first cathode layer, and a portion disposed in the fourth region of the first auxiliary electrode layer is connected to a portion disposed in the fourth region of the first cathode layer; and a portion disposed in the second region of the first auxiliary electrode layer is not connected to a portion disposed in the second region of the first cathode layer.

8. The display panel according to claim 1, wherein the plurality of auxiliary electrode patterns are overlapped with each other.

9. The display panel according to claim 1, further comprising a plurality of first connection electrodes disposed in the second display region, wherein the plurality of auxiliary electrode patterns are electrically connected by the plurality of first connection electrodes.

10. The display panel according to claim 1, further comprising an active layer, a buffer layer, a first gate insulation layer, a first gate layer, a second gate insulation layer, a second gate layer, an interlayer dielectric layer and a first source/drain layer that are sequentially laminated, in the direction away from the base substrate, in both the first display region and the second display region;

the first source/drain layer comprises a plurality of sets of first source/drain layer patterns corresponding to the pixel circuits, the active layer comprises a plurality of sets of active patterns corresponding to the pixel circuits, the first gate layer comprises a plurality of sets of first gate layer patterns corresponding to the pixel circuits, and the second gate layer comprises a plurality of sets of second gate layer patterns corresponding to the pixel circuits; and the at least one layer of opaque patterns of the pixel circuit comprise one set of the first source/drain layer patterns disposed in the first source/drain layer, one set of the active patterns disposed in the active layer, one set of the first gate patterns disposed in the first gate layer, and one set of the second gate patterns disposed in the second gate layer.

11. The display panel according claim 10, further comprising a first conduction layer disposed in a same layer as the first source/drain layer, and a second conduction layer disposed in a same layer as the second gate layer, wherein the buffer layer, the first gate insulation layer, the second gate insulation layer and the interlayer dielectric layer are all provided with a first via hole, the second conduction layer and the first conduction layer being electrically connected to the auxiliary electrode patterns through the first via holes; and further comprising a passivation layer and a first planarization layer that are disposed on a side, distal from the base substrate, of the first source/drain layer, as well as a plurality of first connection electrodes disposed between the passivation layer and the first planarization layer;

wherein the passivation layer is provided with a second via hole, at least part of the first connection electrodes is disposed in the second via hole and connected to the first conduction layer, and the plurality of first connection electrodes are configured to connect the plurality of auxiliary electrode patterns.

12. The display panel according to claim 10, further comprising a passivation layer and a first planarization layer that are disposed on a side, distal from the base substrate, of the first source/drain layer, a plurality of second connection electrodes disposed between the passivation layer and the first planarization layer, a first signal transmission layer disposed in a same layer as the first source/drain layer, and a third conduction layer disposed in a same layer as the first gate layer;

the first gate insulation layer, the second gate insulation layer and the interlayer dielectric layer are all provided with a third via hole, and the first signal transmission layer is electrically connected to the third conduction layer through the third via hole; and the passivation layer is provided with a fourth via hole, and at least part of the second connection electrodes is disposed in the fourth via hole and connected to the first signal transmission layer.

13. The display panel according to claim 12, wherein the third conduction layer comprises a plurality of first signal line segments, a plurality of second signal line segments and a plurality of third signal line segments;

wherein each of the plurality of first signal line segments, the plurality of second signal line segments, and the plurality of third signal line segments is connected to one of the pixel circuits; and the plurality of second connection electrodes comprise a plurality of first-type second connection electrodes connected to the plurality of first signal line segments, a plurality of second-type second connection electrodes connected to the plurality of second signal line segments, and a plurality of third-type second connection electrodes connected to the plurality of third signal line segments; and wherein the plurality of first signal line segments are gate signal line segments for transmitting gate signals, the plurality of second signal line segments are reset control signal line segments for transmitting reset control signals, and the plurality of third signal line segments are emission control signal line segments for transmitting emission control signals.

14. The display panel according to claim 10, further comprising a plurality of third connection electrodes, and a fourth conduction layer, wherein the fourth conduction layer comprises a plurality of fourth signal line segments;

each of the fourth signal line segments is connected to at least one of the pixel circuits, and at least part of the plurality of fourth signal line segments are electrically connected by at least part of the third connection electrodes.

15. The display panel according to claim 1, further comprising an active layer, a buffer layer, a first gate insulation layer, a first gate layer, a second gate insulation layer, a second gate layer, an interlayer dielectric layer, a first source/drain layer, a passivation layer and a first planarization layer that are sequentially laminated, in the direction away from the base substrate, in both the first display region and the second display region; wherein the display panel further comprises a plurality of connection electrodes disposed between the passivation layer and the first planarization layer; at least part of the plurality of connection electrodes is configured to electrically connect at least one of the first gate layer, the second gate layer and the first source/drain layer in the first display region, and electrically connect at least one of the first gate layer, the second gate layer and the first source/drain layer in the second display region, and/or, at least part of the plurality of connection electrodes are configured to electrically connect at least two of the auxiliary electrode patterns disposed in the second display region, and/or, at least part of the plurality of connection electrodes are configured to connect the at least one layer of opaque patterns in at least two of the pixel circuits in the second display region;

wherein the plurality of connection electrodes are provided with a plurality of joints, the joints comprise connection via holes or lap structures, corresponding to the plurality of connection electrodes and patterns connected by the plurality of connection electrodes, and an overlapping area is present between the orthographic projections of the auxiliary electrode patterns onto the base substrate and an orthographic projection of at least one of the joints onto the base substrate.

16. The display panel according to claim 1, wherein the second anode layer comprises a plurality of anode patterns spaced apart from each other, and the display panel further comprises a pixel definition layer disposed on a side, distal from the base substrate, of the second anode layer;

the pixel definition layer is provided with a plurality of tenth via holes, through which the corresponding anode patterns are exposed, and the second light-emitting layer comprises a plurality of light-emitting layer patterns at least partially disposed in the tenth via holes; and the second cathode layer at least partially covers the tenth via holes, and the at least one hollowed-out region of the second cathode layer is not overlapped with the tenth via holes.

17. The display panel according to claim 1, wherein a boundary of the at least one hollowed-out region at least partially comprises an arc shape.

18. The display panel according to claim 1, wherein the first cathode layer and the second cathode layer are of an integral structure.

19. The display panel according to claim 1, wherein an area of an overlap between an orthographic projection of the hollowed-out region onto the base substrate and the orthographic projections of the auxiliary electrode patterns onto the base substrate is 10% smaller than an area of the hollowed-out region.

20. A display device, comprising an image sensor and a display panel, wherein the display panel comprises:

a base substrate provided with a first display region and a second display region;

a first auxiliary electrode layer, a first anode layer, a first light-emitting layer and a first cathode layer that are sequentially laminated, in a direction away from the base substrate, in the first display region; and a second auxiliary electrode layer, a second anode layer, a second light-emitting layer, and a second cathode layer that are sequentially laminated, in the direction away from the base substrate, in the second display region;

wherein the first auxiliary electrode layer is connected to the first cathode layer and the second auxiliary electrode layer, and the second cathode layer is connected to the first cathode layer, the second cathode layer is provided with at least one hollowed-out region;

the display panel further comprises a plurality of pixel circuits disposed in the second display region, and each of the pixel circuits comprising at least one layer of opaque patterns; wherein the second auxiliary electrode layer comprises a plurality of auxiliary electrode patterns electrically connected; and at least 50% of areas of orthographic projections of the at least one layer of opaque patterns in at least one of the pixel circuits onto the base substrate is overlapped with orthographic projections of the auxiliary electrode patterns onto the base substrate; and the image sensor is disposed on a side, distal from the second anode layer, of the base substrate in the display panel, and is overlapped with the second display region of the base substrate.

* * * * *